(12) United States Patent
Okajima

(10) Patent No.: US 12,238,929 B2
(45) Date of Patent: Feb. 25, 2025

(54) MEMORY DEVICE

(71) Applicant: Kioxia Corporation, Tokyo (JP)

(72) Inventor: Mutsumi Okajima, Mie (JP)

(73) Assignee: Kioxia Corporation, Tokyo (JP)

( * ) Notice: Subject to any disclaimer, the term of this patent is extended or adjusted under 35 U.S.C. 154(b) by 921 days.

(21) Appl. No.: 17/349,126

(22) Filed: Jun. 16, 2021

(65) Prior Publication Data

US 2021/0313340 A1 Oct. 7, 2021

Related U.S. Application Data

(63) Continuation of application No. PCT/JP2019/035567, filed on Sep. 10, 2019.

(51) Int. Cl.
| | |
|---|---|
| *H10B 43/30* | (2023.01) |
| *H10B 43/10* | (2023.01) |
| *H10B 43/20* | (2023.01) |

(52) U.S. Cl.
CPC ............. *H10B 43/30* (2023.02); *H10B 43/10* (2023.02); *H10B 43/20* (2023.02)

(58) Field of Classification Search
CPC ........ H10B 43/30; H10B 43/10; H10B 43/20; H10B 43/27; G11C 16/0416; H01L 29/7926
See application file for complete search history.

(56) References Cited

U.S. PATENT DOCUMENTS

| | | |
|---|---|---|
| 2008/0217673 A1 | 9/2008 | Maruyama |
| 2010/0128509 A1 | 5/2010 | Kim |
| 2012/0012921 A1* | 1/2012 | Liu ............ H10B 43/10 257/E27.06 |
| 2015/0249092 A1* | 9/2015 | Sakui .............. H01L 29/7889 438/268 |
| 2017/0077118 A1 | 3/2017 | Cheng |
| 2018/0108423 A1 | 4/2018 | Harari |
| 2018/0366489 A1* | 12/2018 | Harari .............. H10B 43/20 |
| 2019/0006009 A1 | 1/2019 | Harari |
| 2019/0371813 A1* | 12/2019 | Oike ............. H10B 43/10 |
| 2020/0043940 A1* | 2/2020 | Sawa ............. H10B 41/10 |
| 2020/0273876 A1* | 8/2020 | Kashima ........... H10B 43/27 |
| 2021/0225859 A1* | 7/2021 | Sawa ............ H01L 29/7889 |

FOREIGN PATENT DOCUMENTS

| | | |
|---|---|---|
| JP | 2008-192804 A | 8/2008 |
| JP | 2010-130016 A | 6/2010 |
| JP | 2010-251572 A | 11/2010 |
| WO | WO-2018/039654 A1 | 3/2018 |

* cited by examiner

*Primary Examiner* — Khaja Ahmad
*Assistant Examiner* — Khatib A Rahman
(74) *Attorney, Agent, or Firm* — Foley & Lardner LLP

(57) ABSTRACT

A memory device includes a first conductor and a charge storage film extending along a first direction; a first semiconductor of a first conductive type; a second and third semiconductor each of a second conductive type; and a stack comprising a second conductor, a first insulator, and a third conductor sequentially stacked along the first direction and each extending along a second direction. The first conductor, the charge storage film, the first semiconductor, and the stack are arranged in this order along a third direction. The second semiconductor is in contact with the first semiconductor and the second conductor, between the second conductor or the first insulator and the charge storage film.

5 Claims, 97 Drawing Sheets

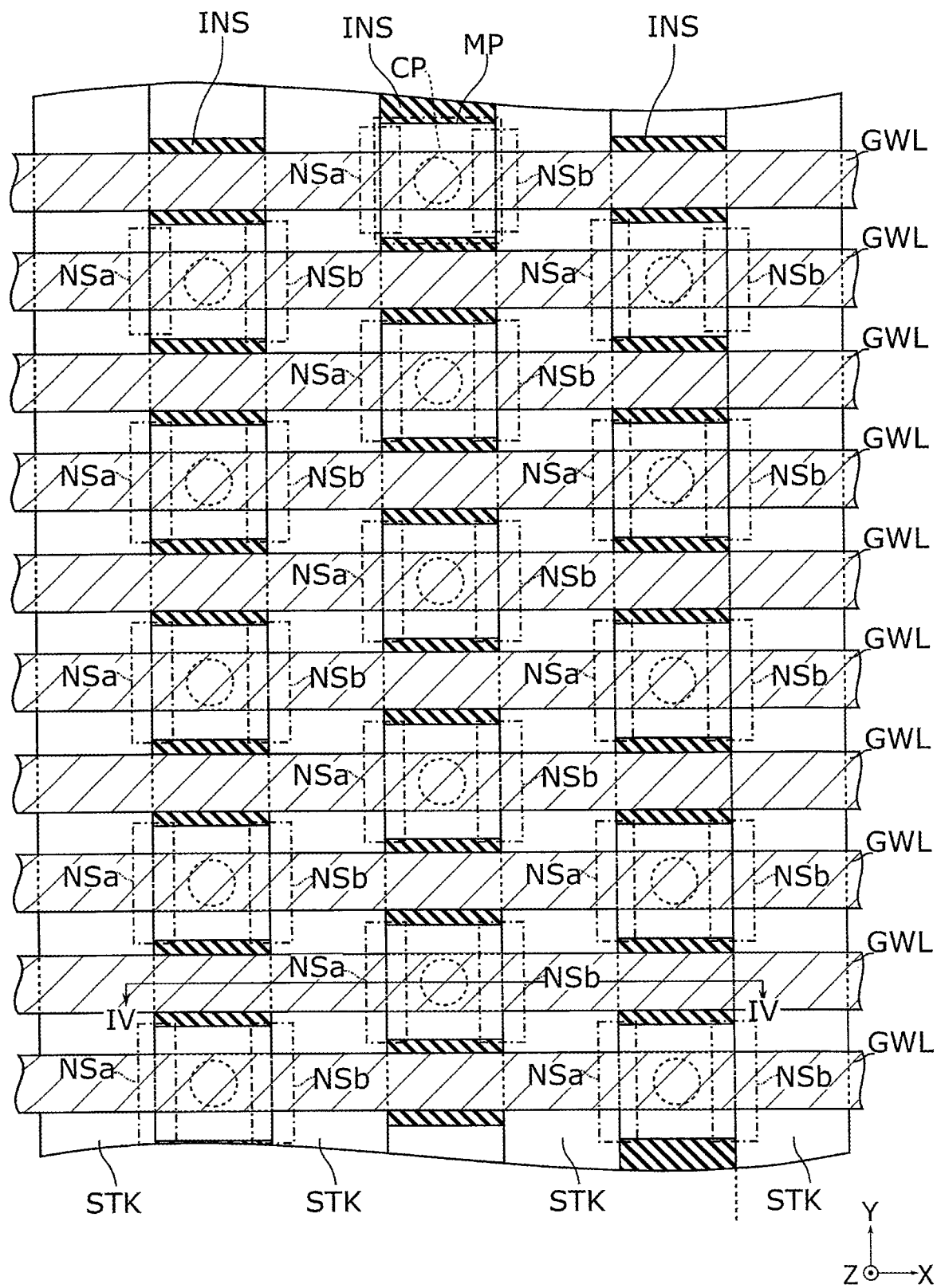
F I G. 3

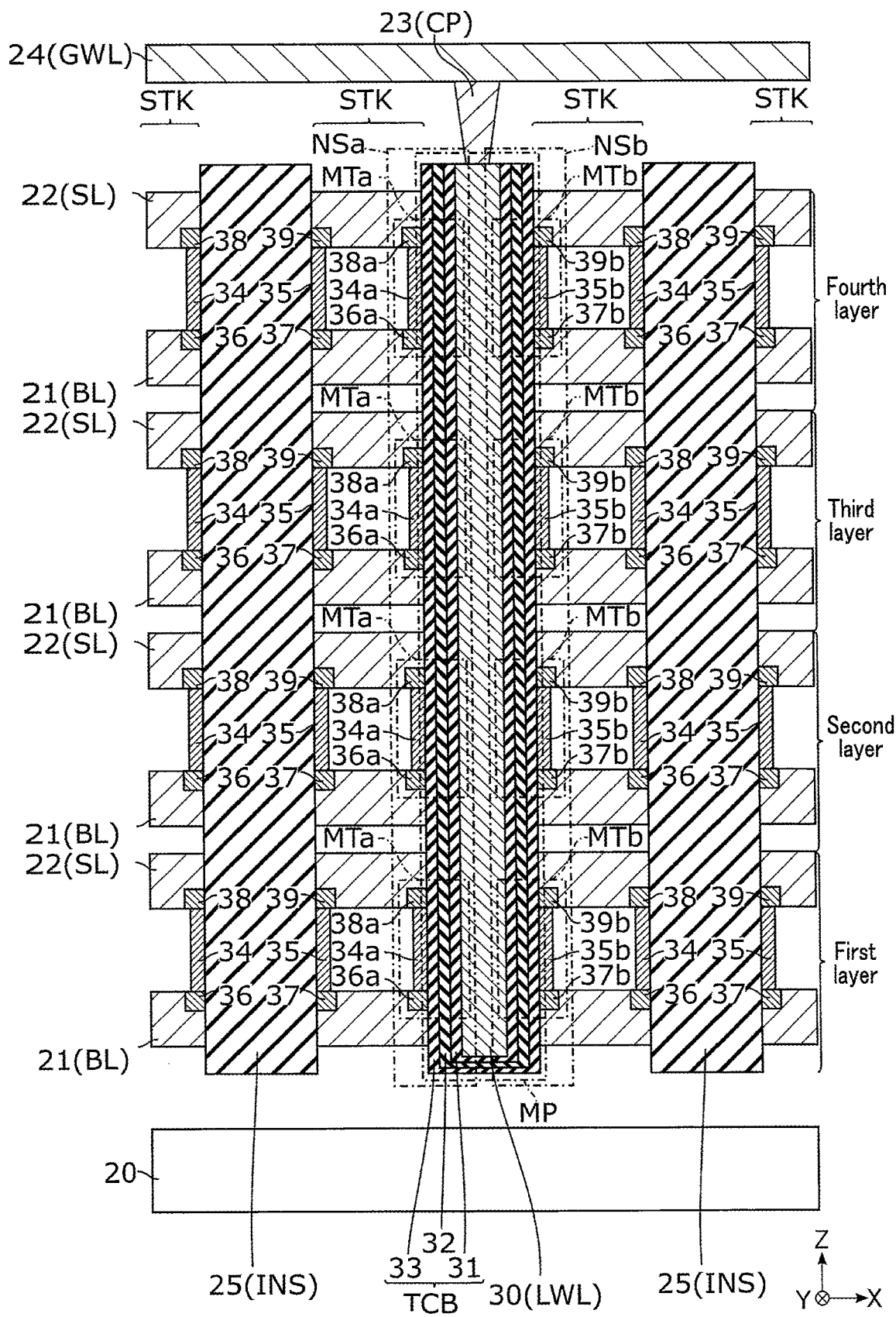
F I G. 4

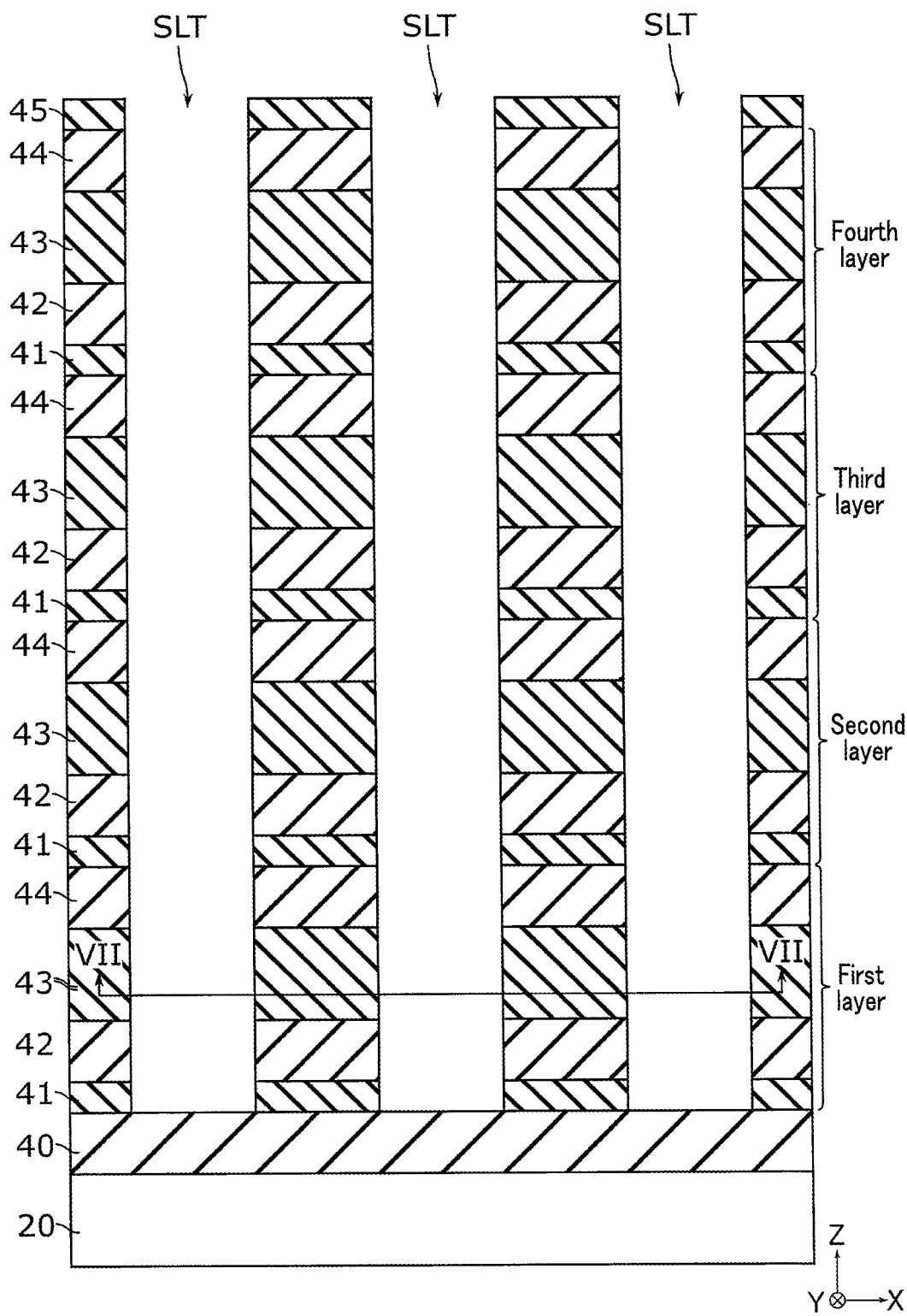
F I G. 6

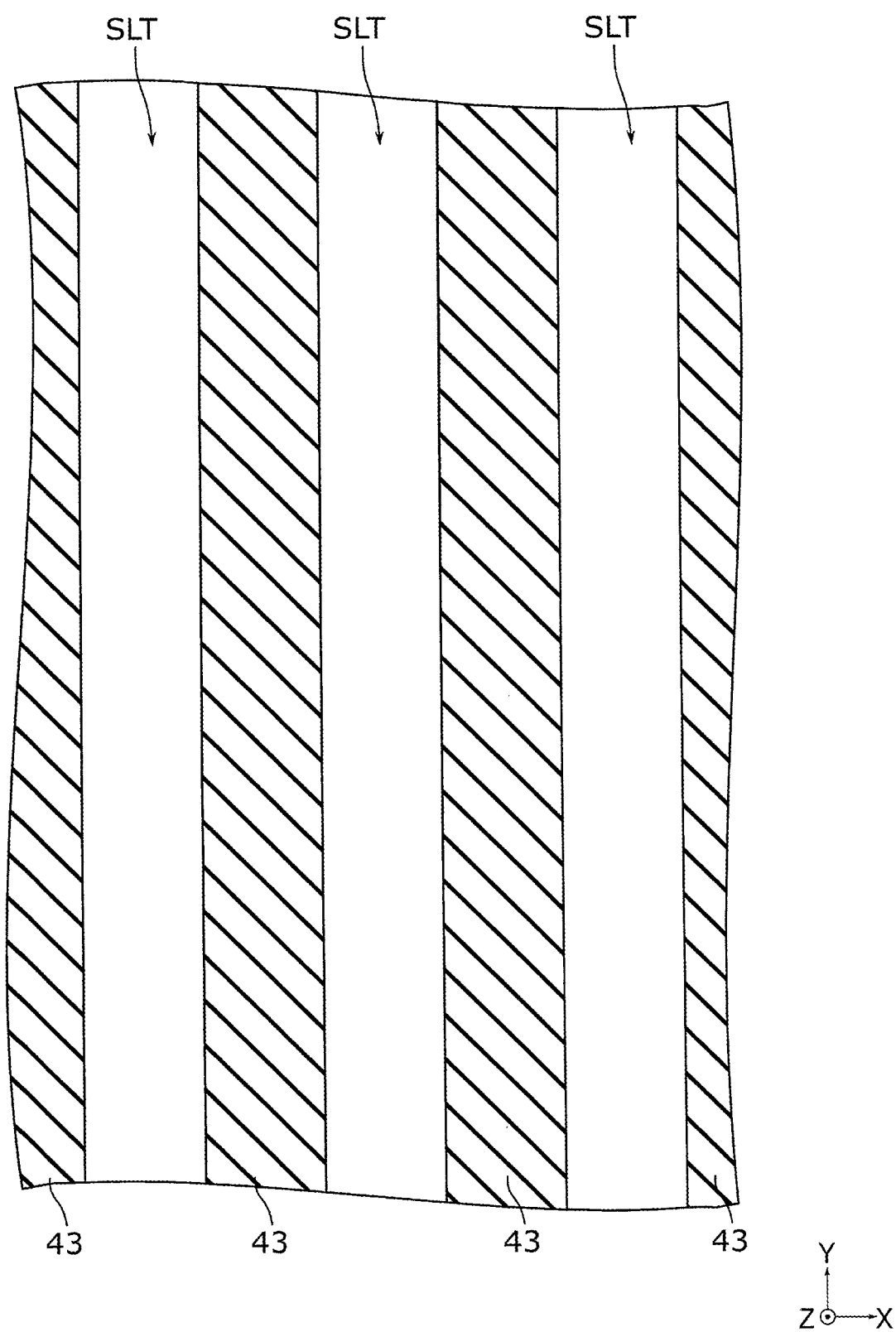
F I G. 7

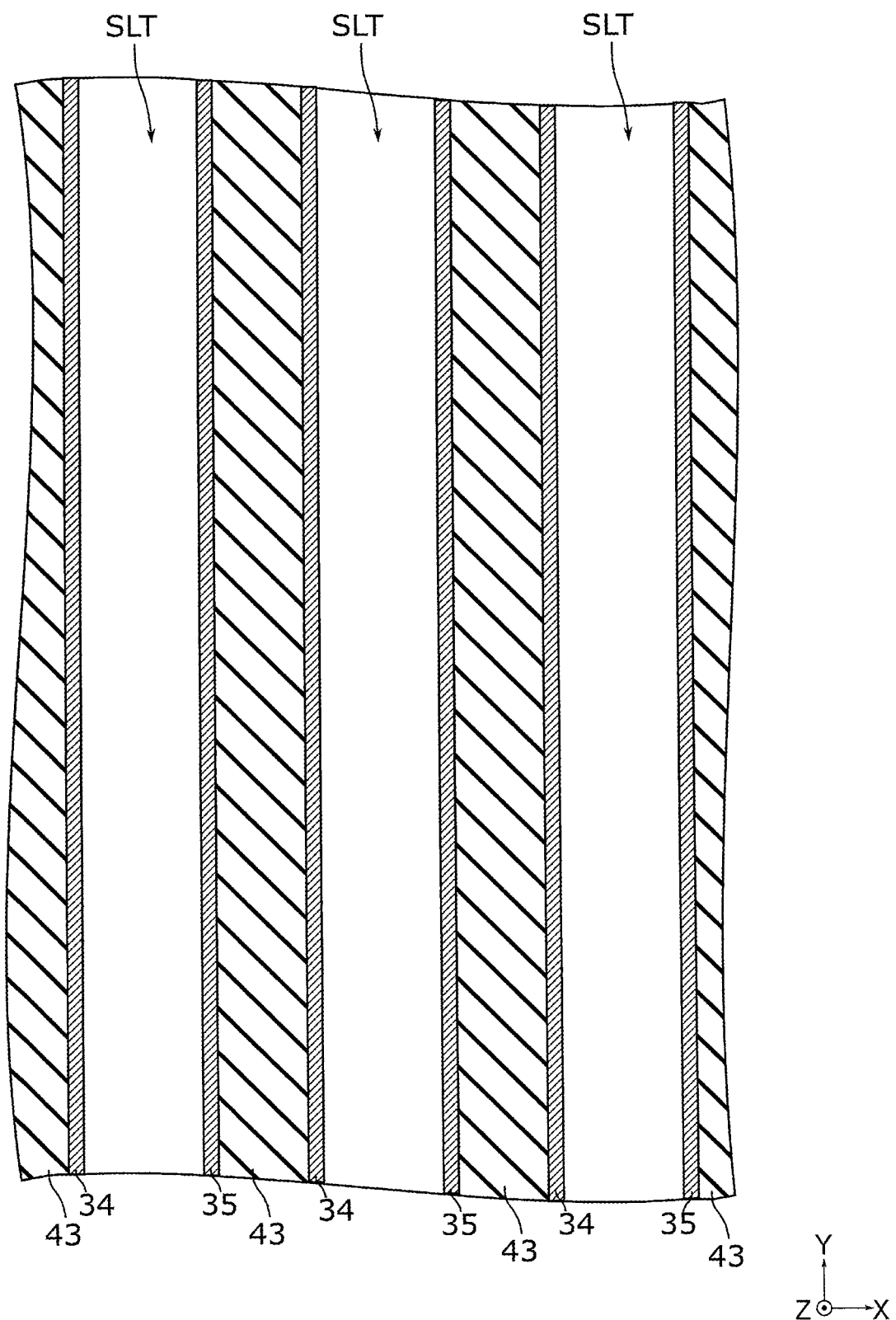
F I G. 9

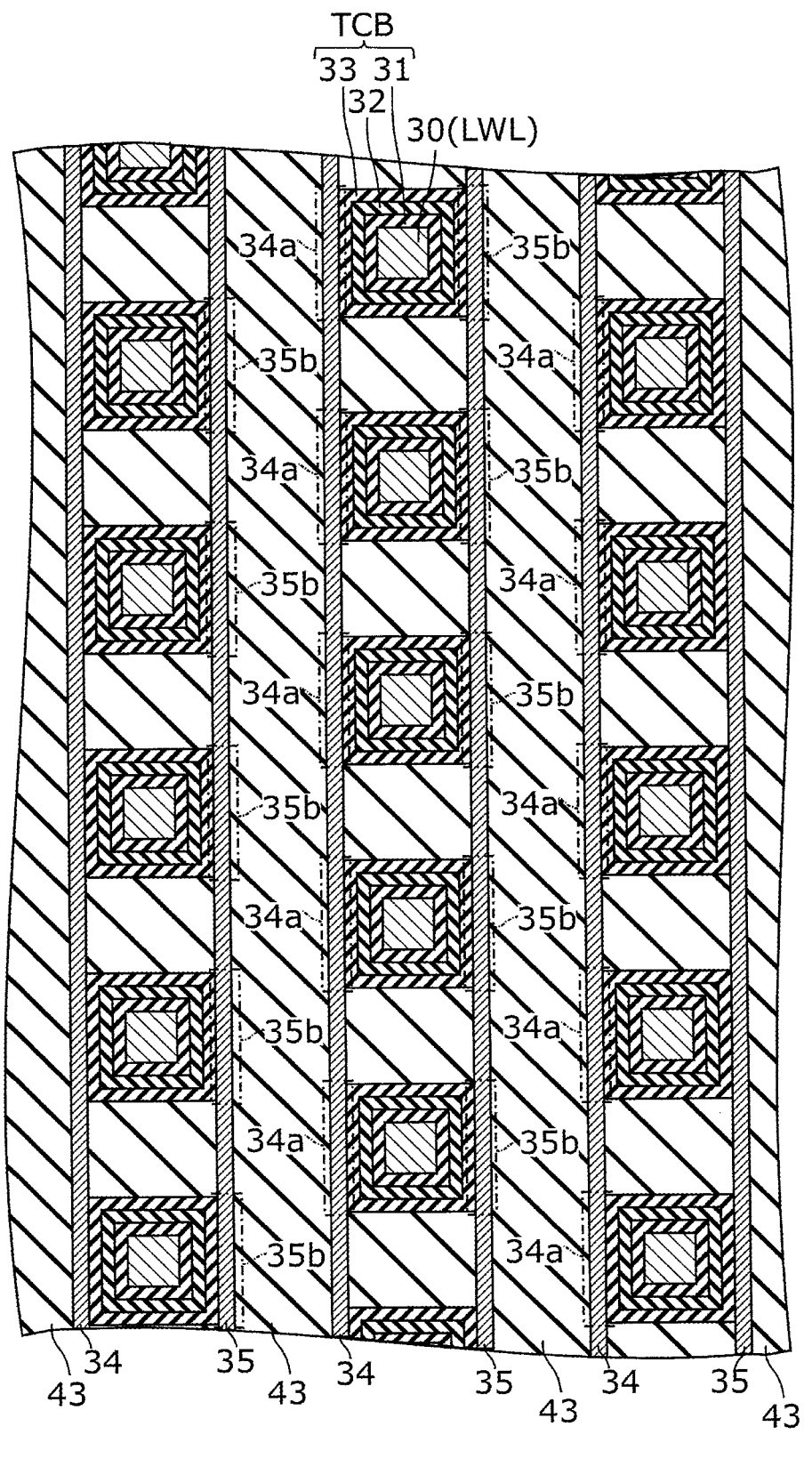
F I G. 13

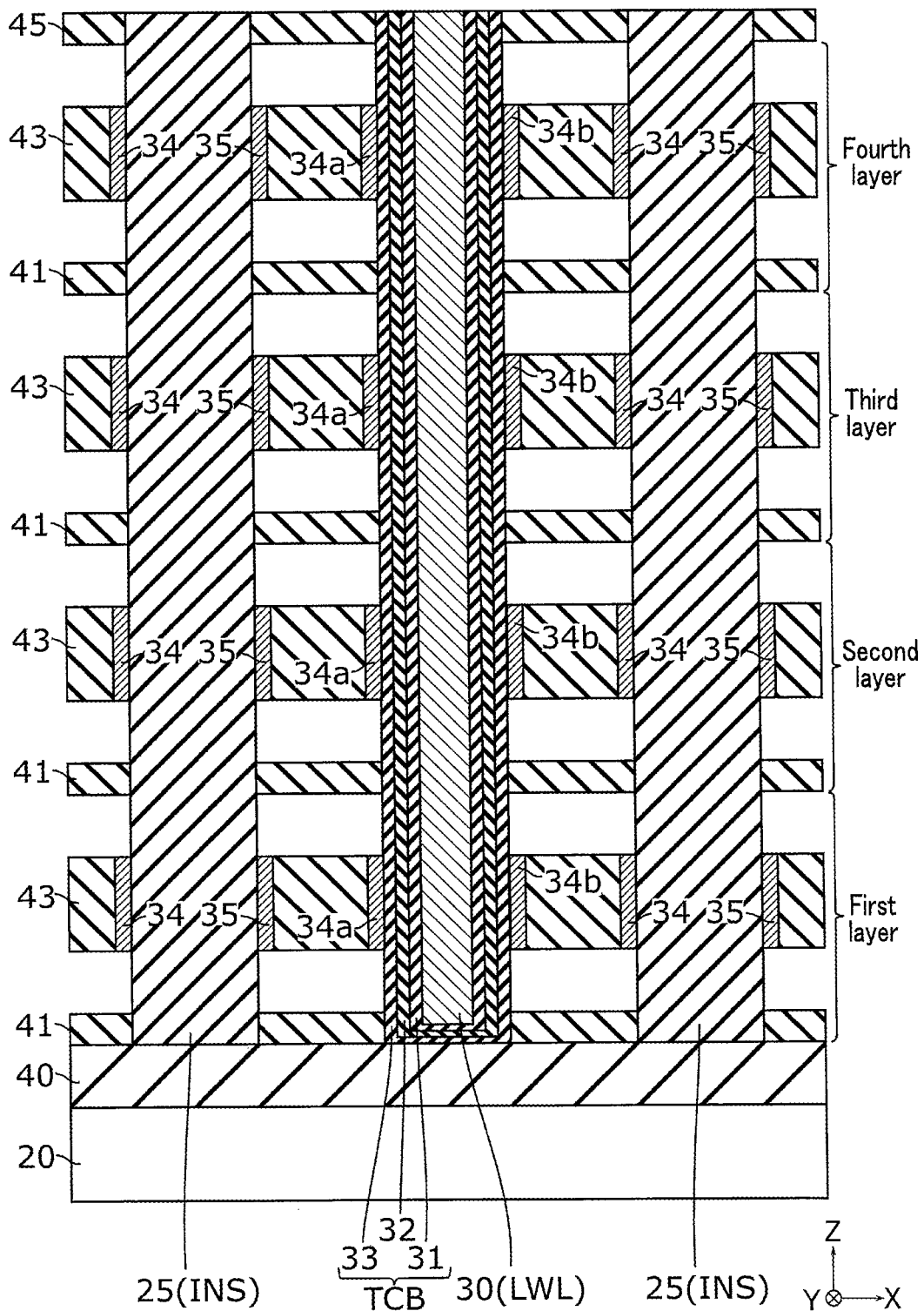
F I G. 14

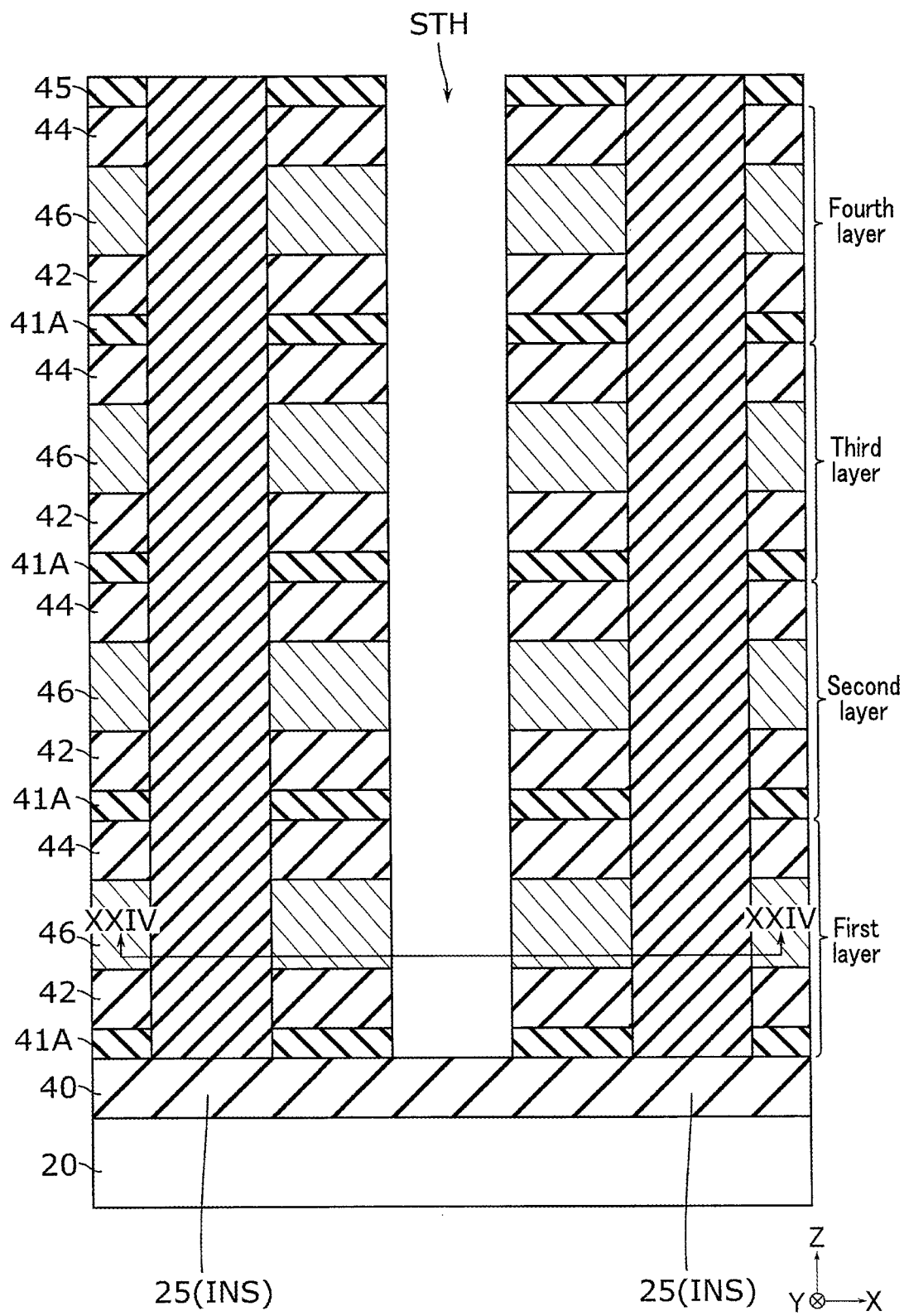
F I G. 23

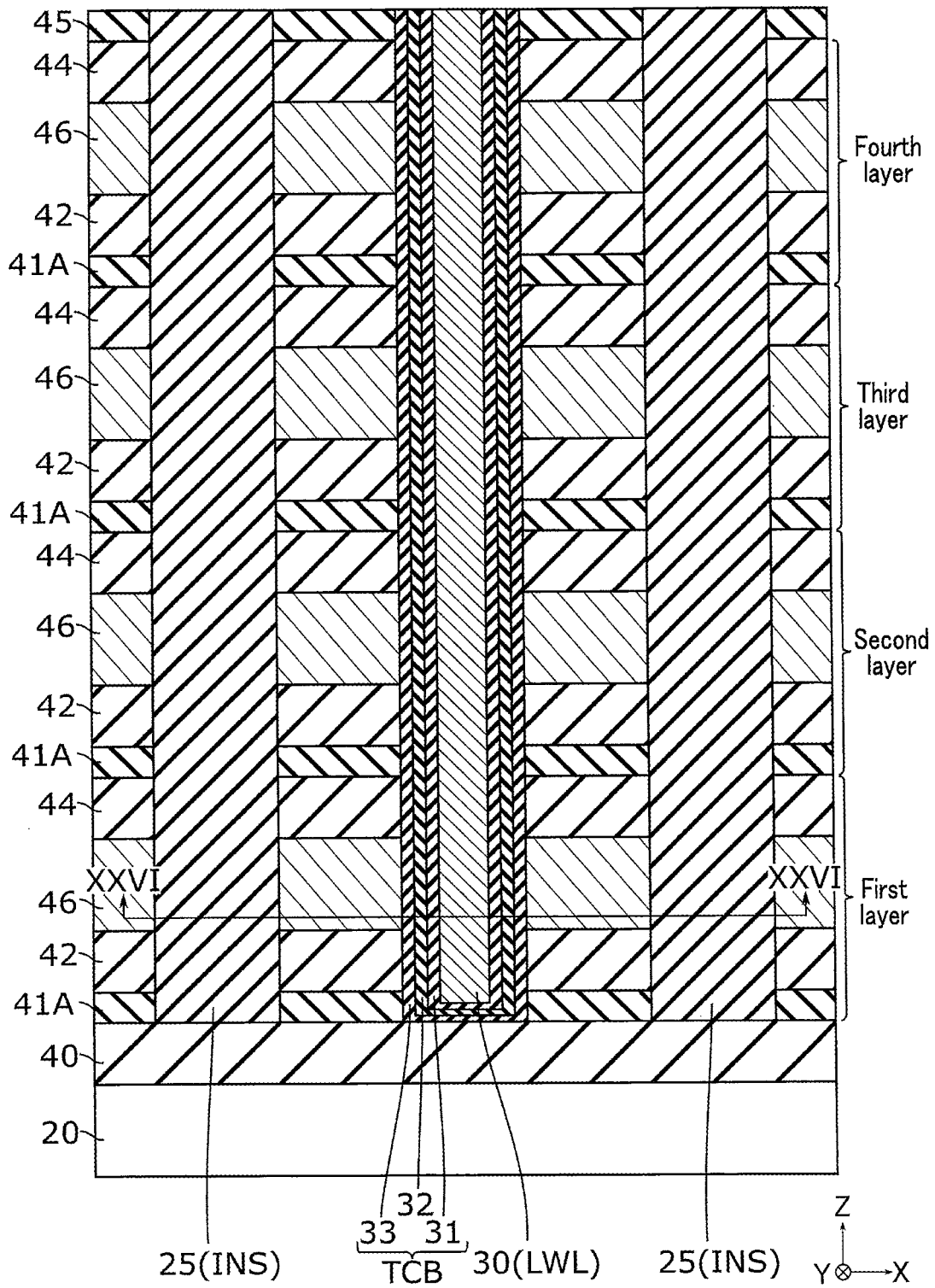
F I G. 25

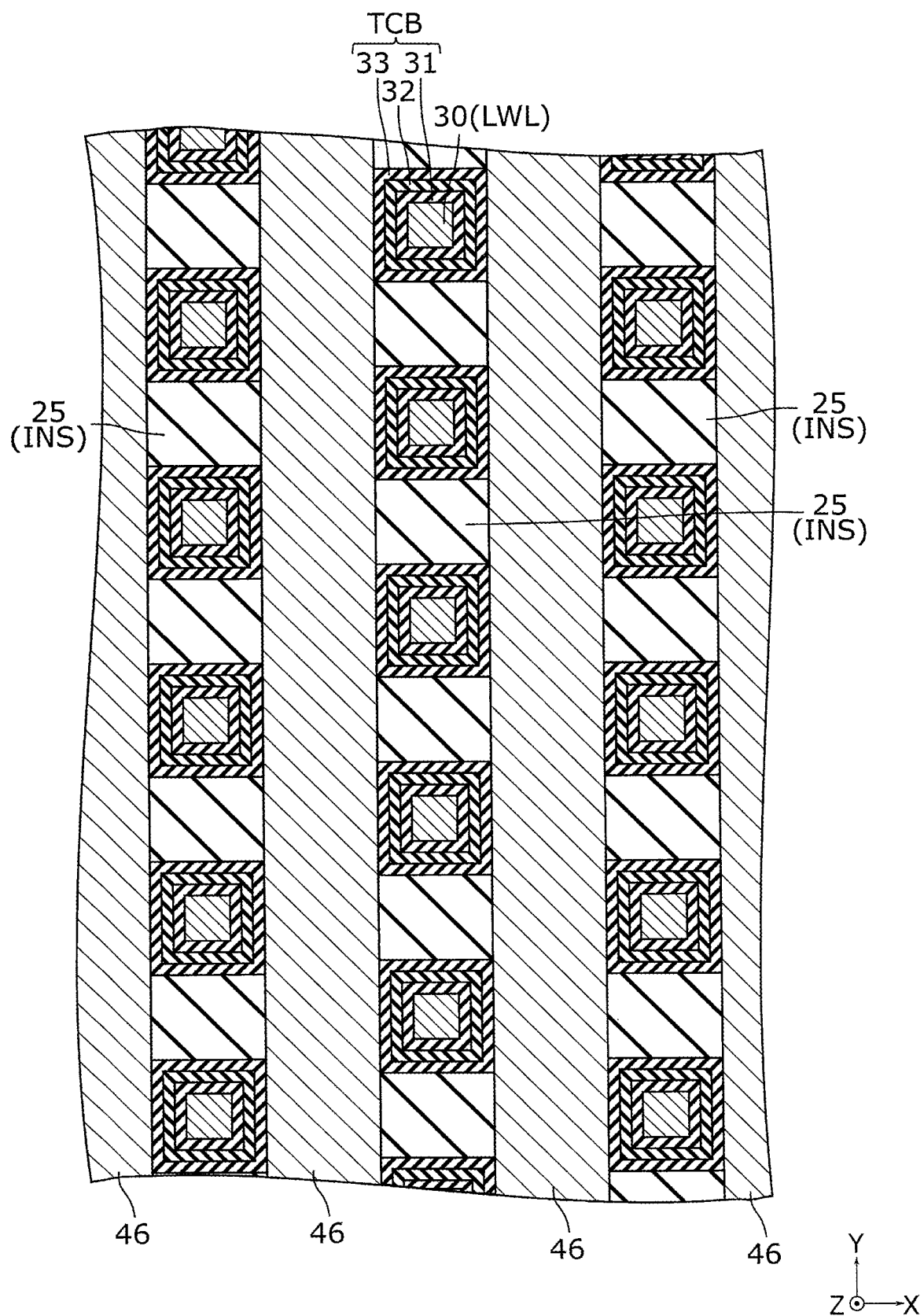
F I G. 26

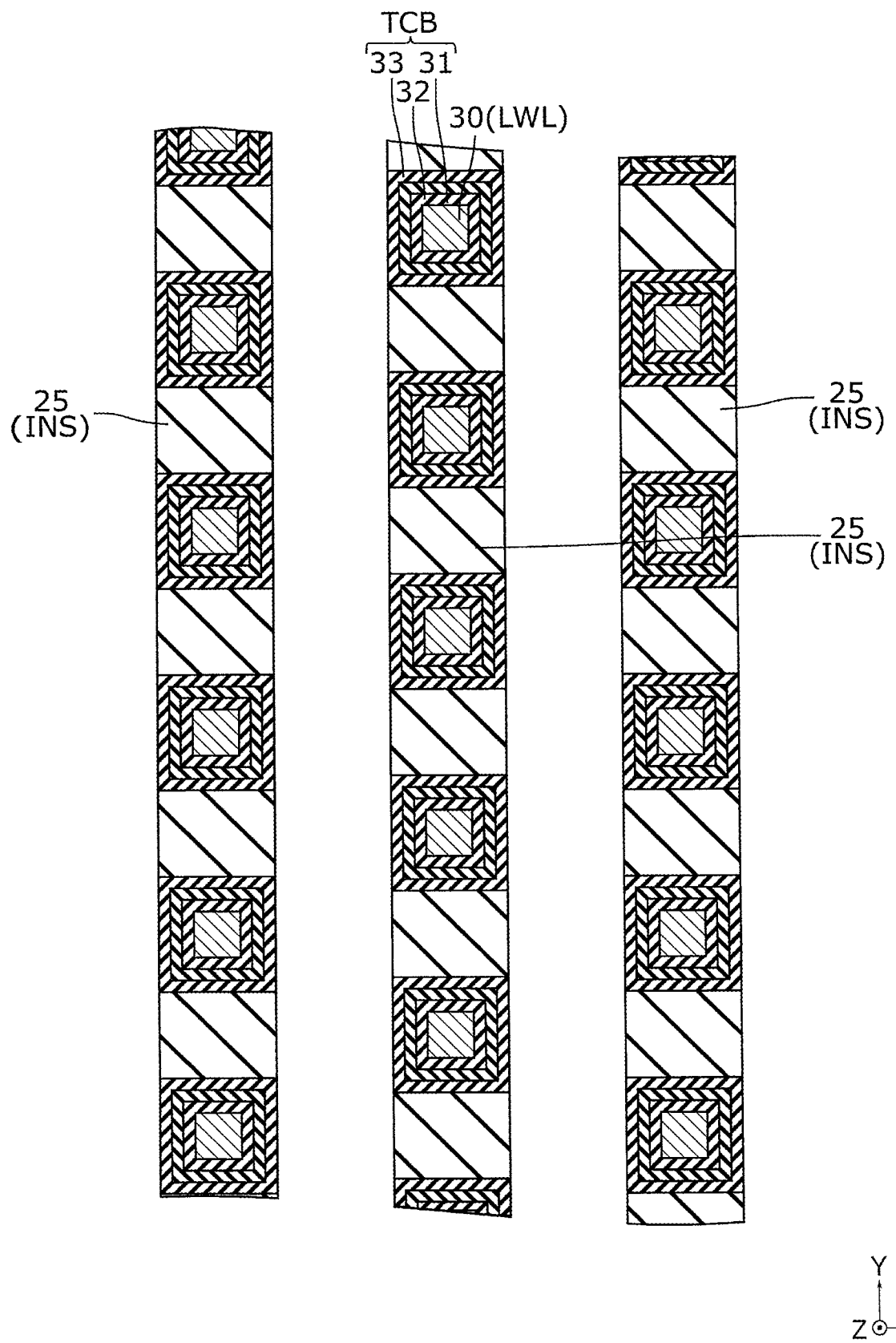
F I G. 28

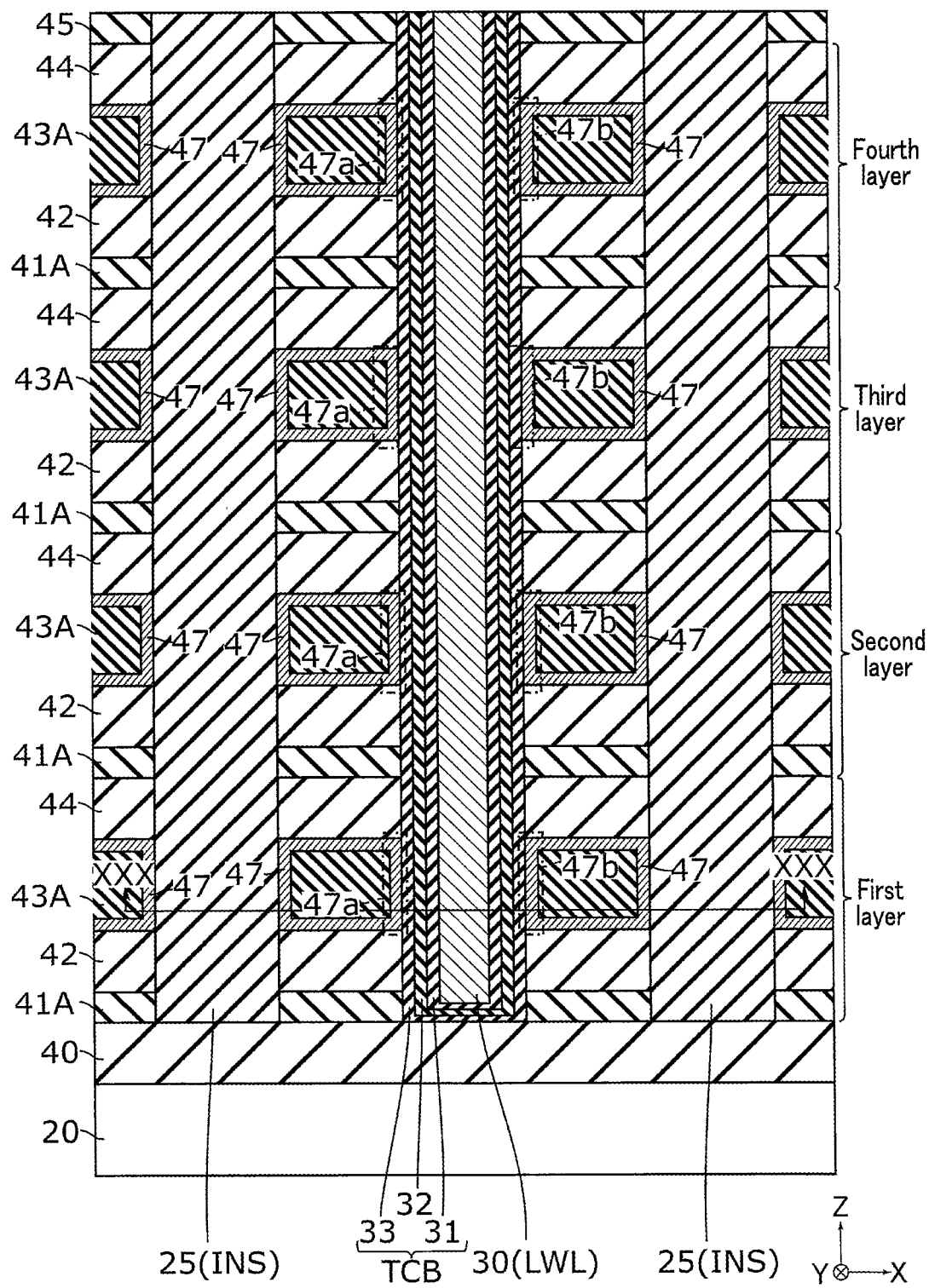
F I G. 29

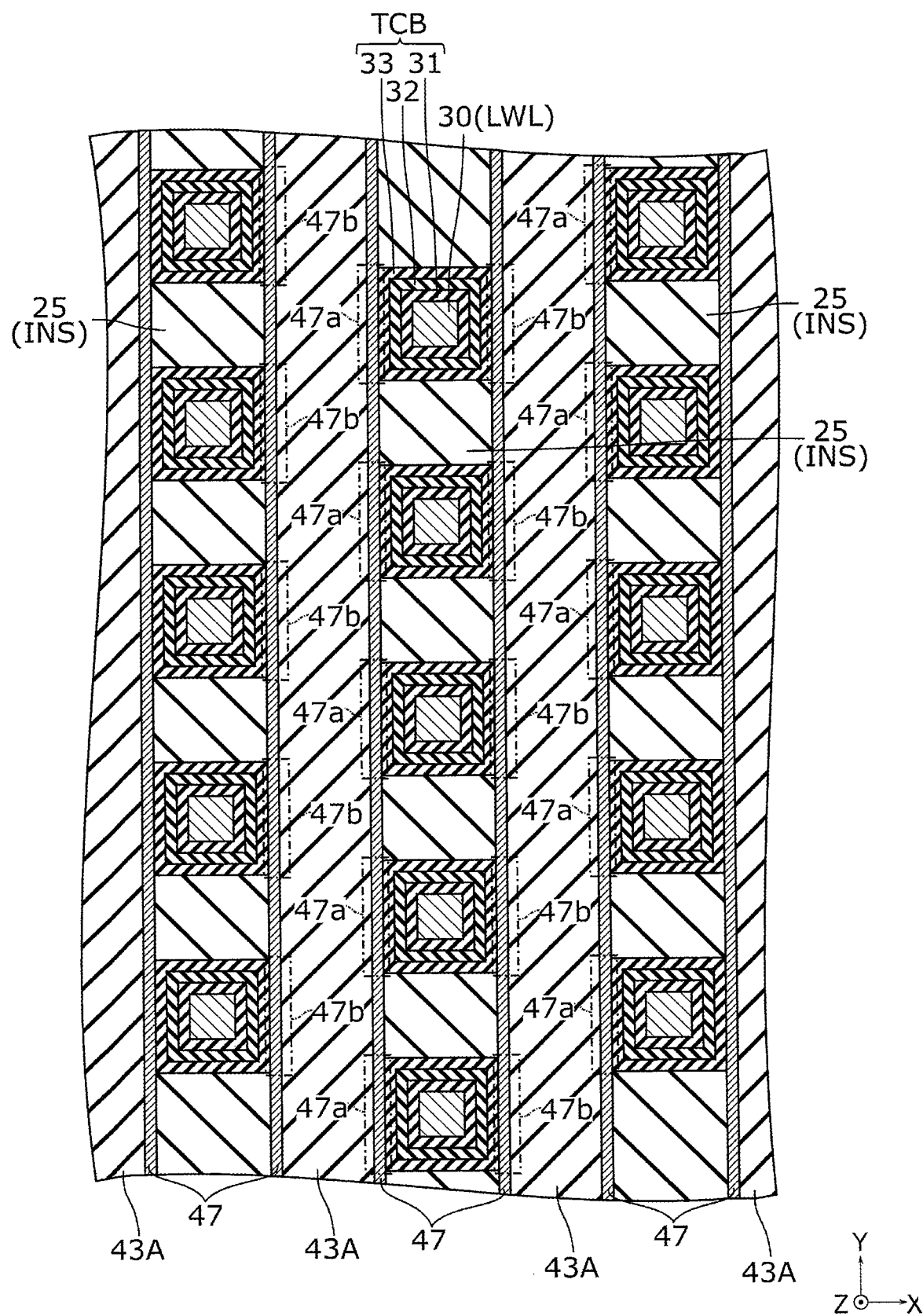
F I G. 30

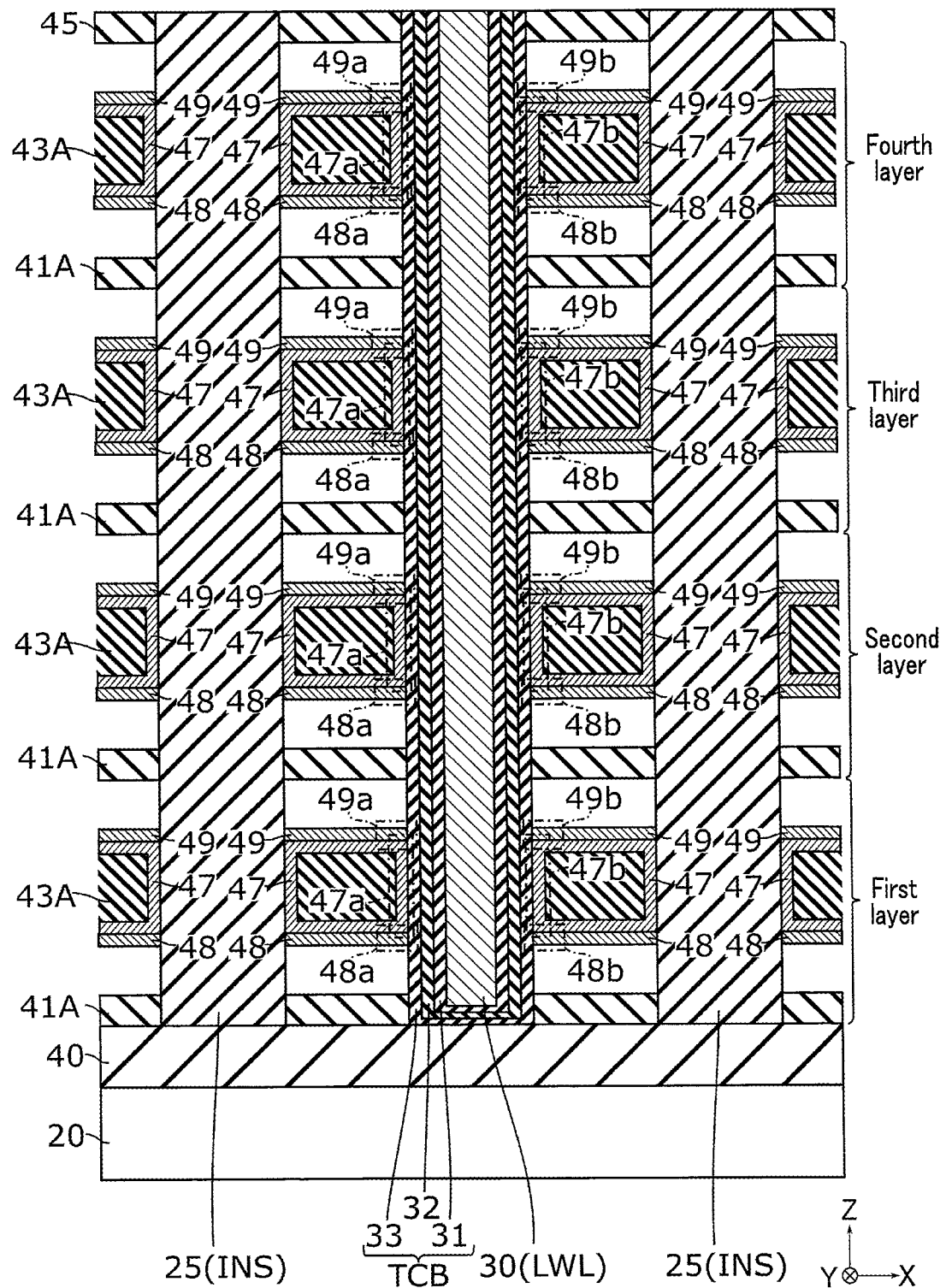
F I G. 32

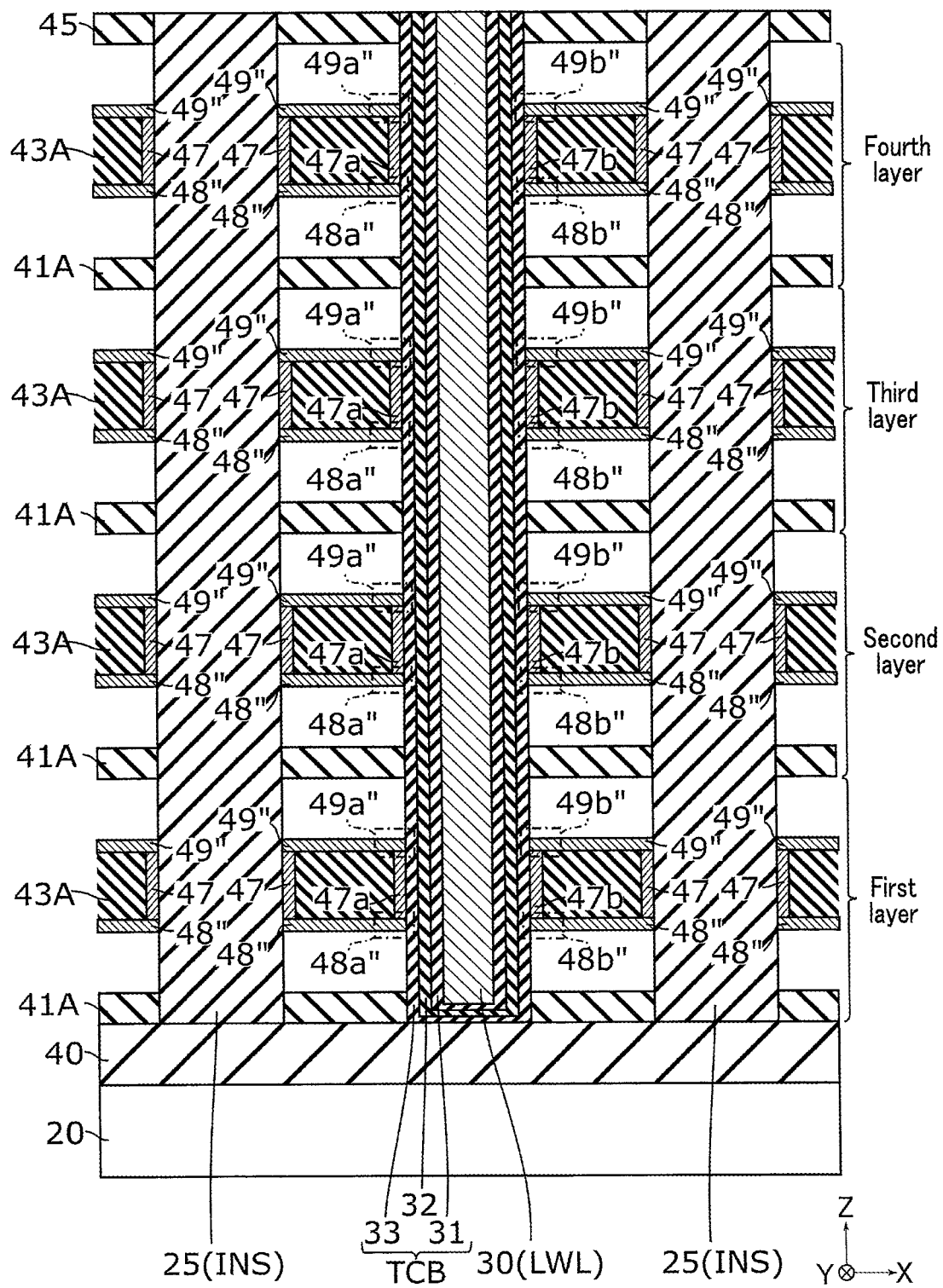
F I G. 35

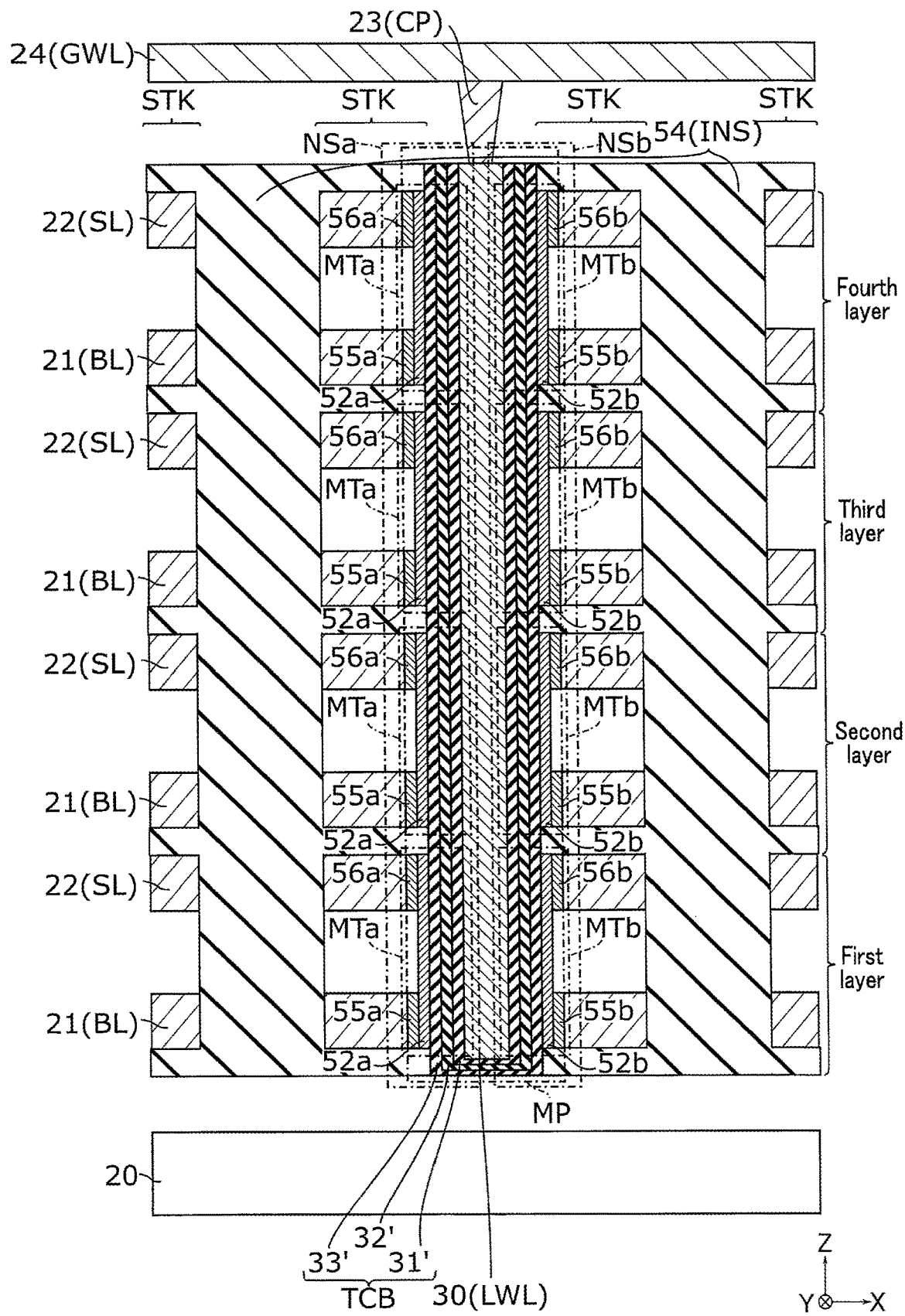
F I G. 36

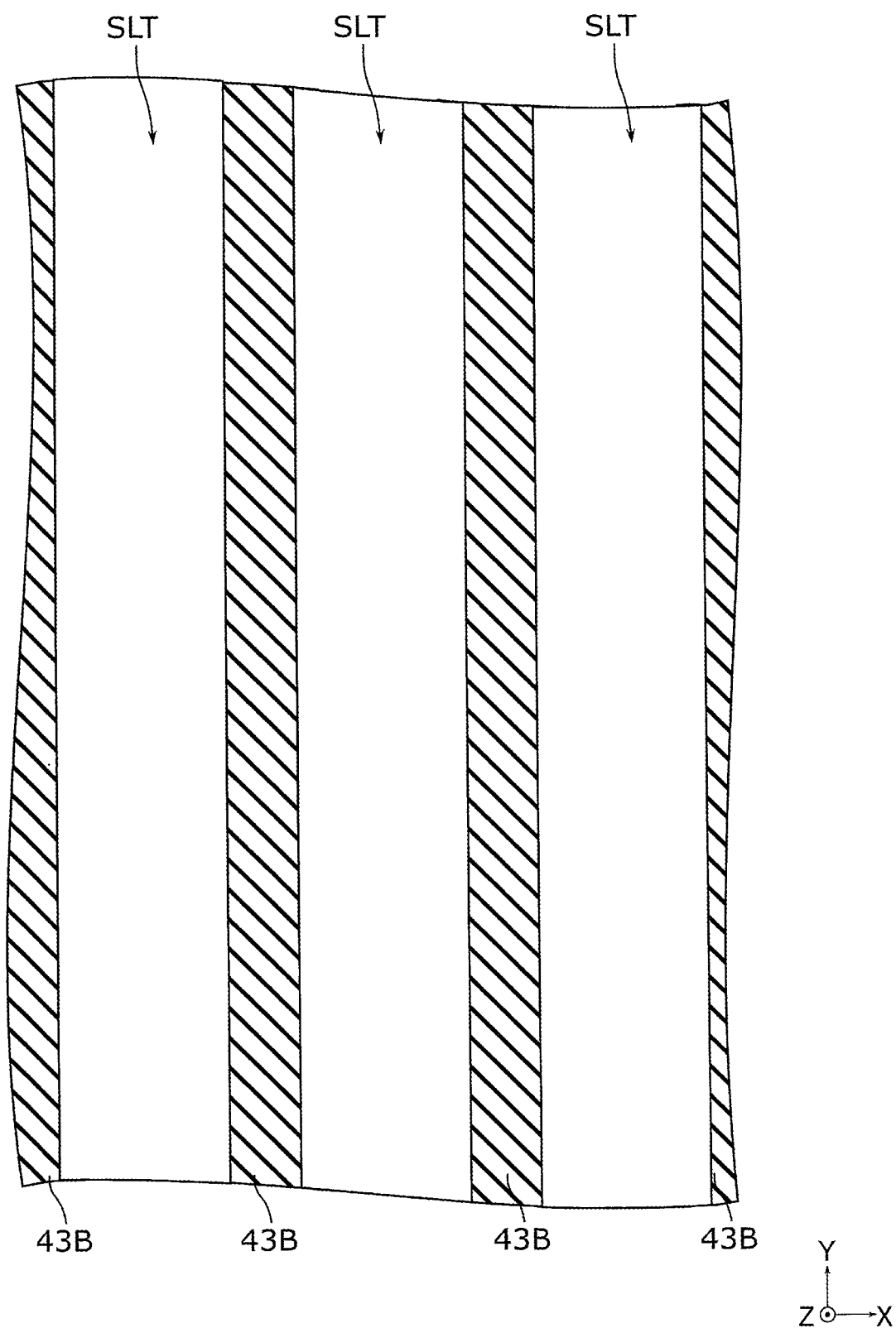
F I G. 39

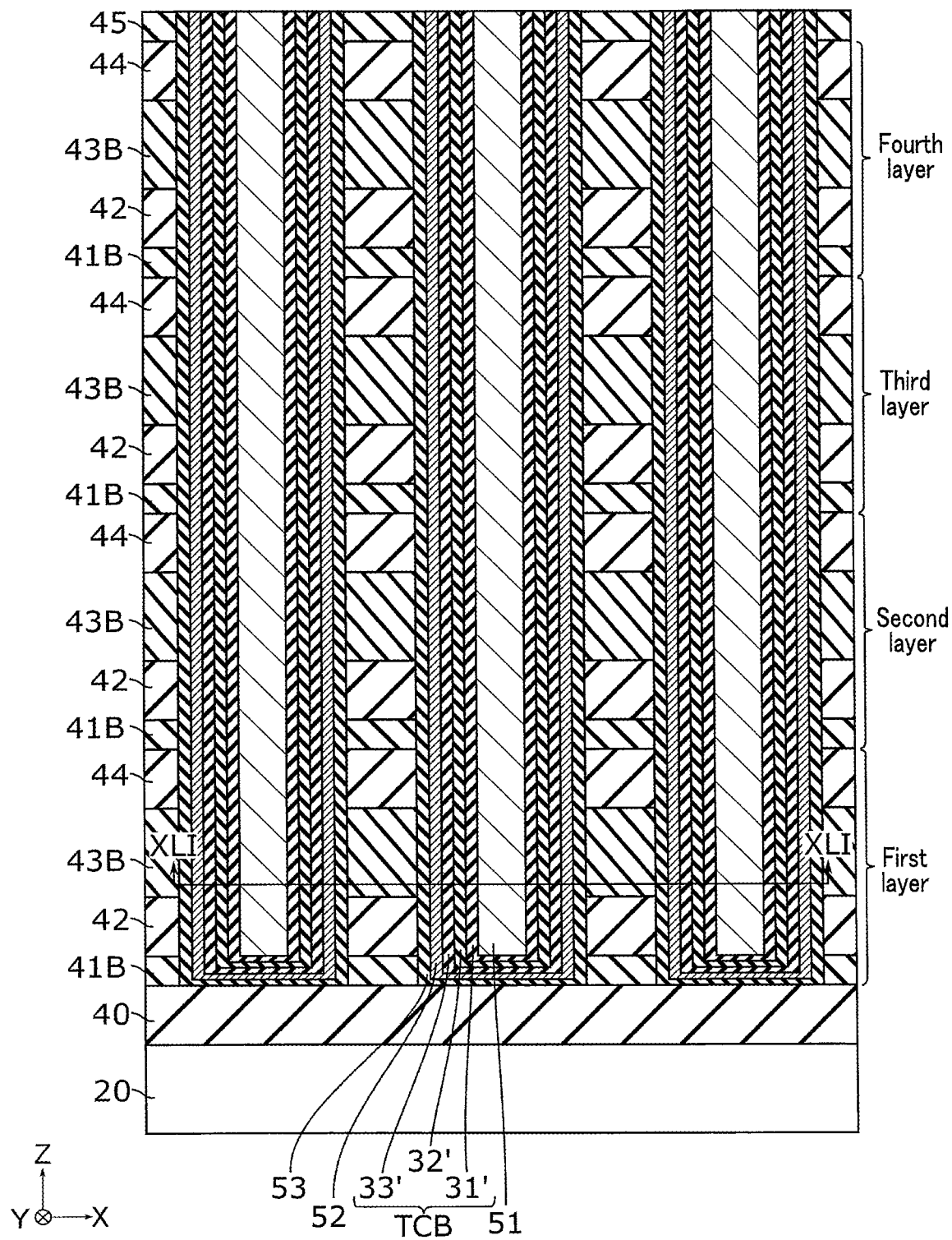
F I G. 40

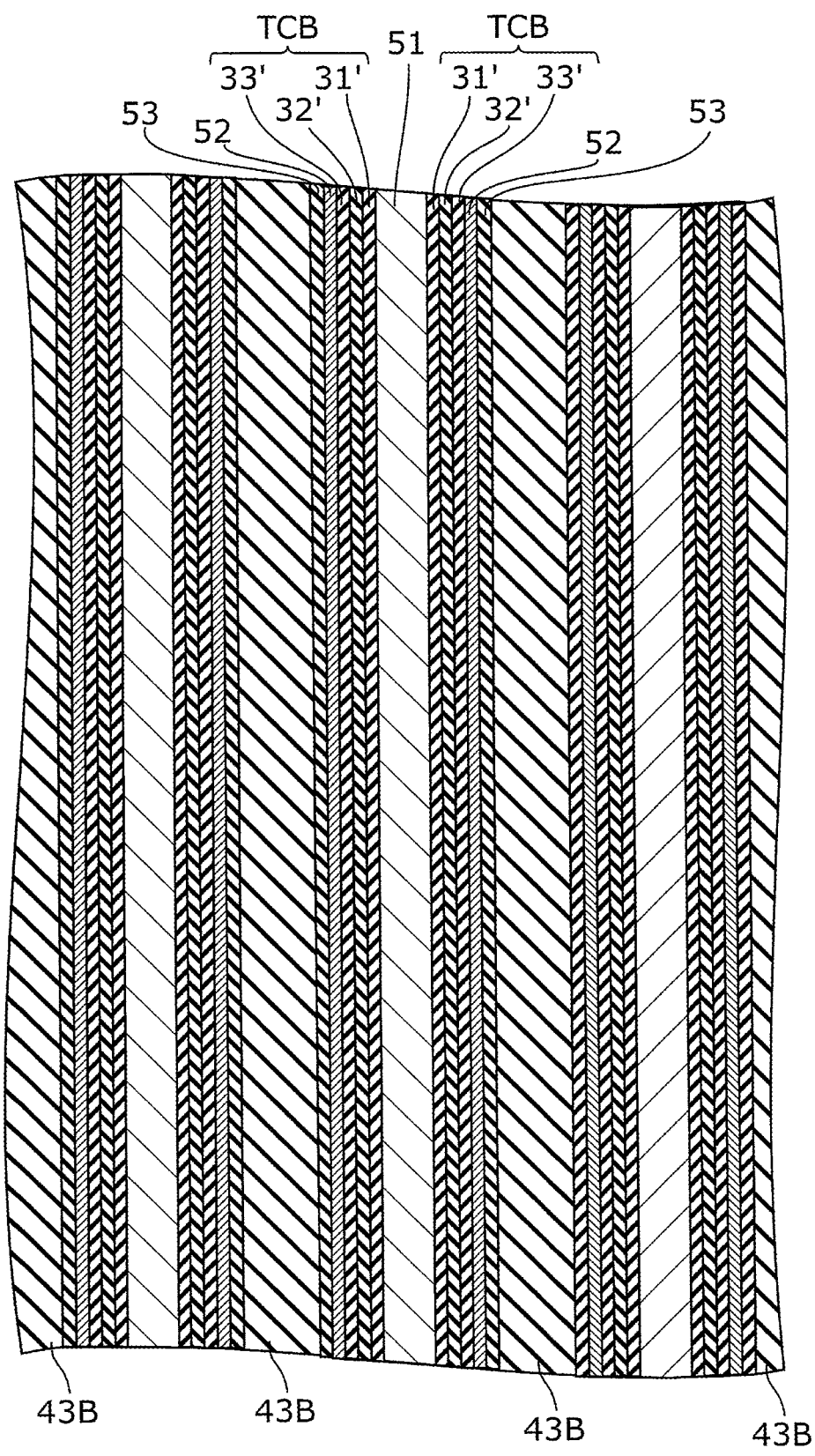
F I G. 41

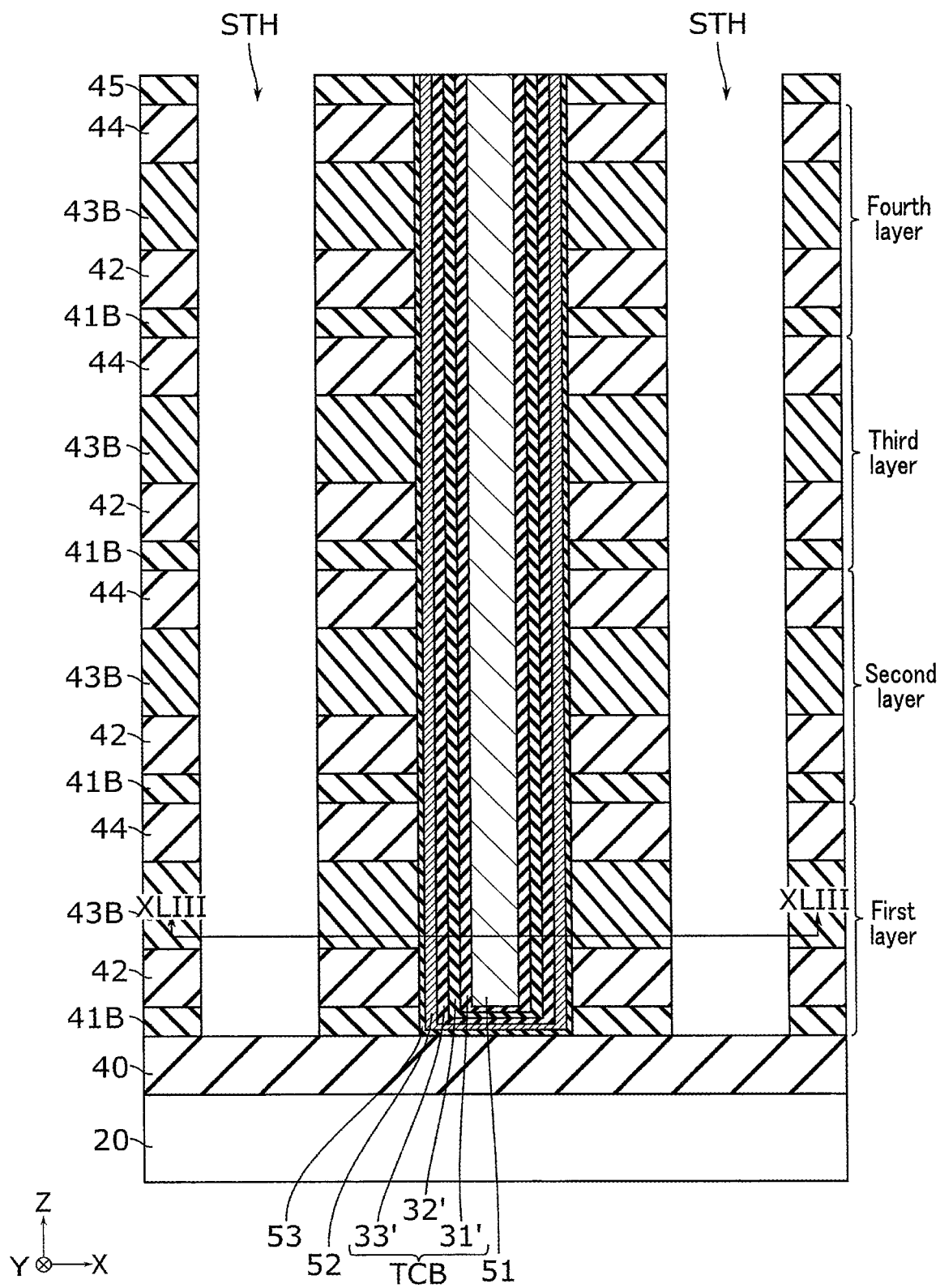
F I G. 42

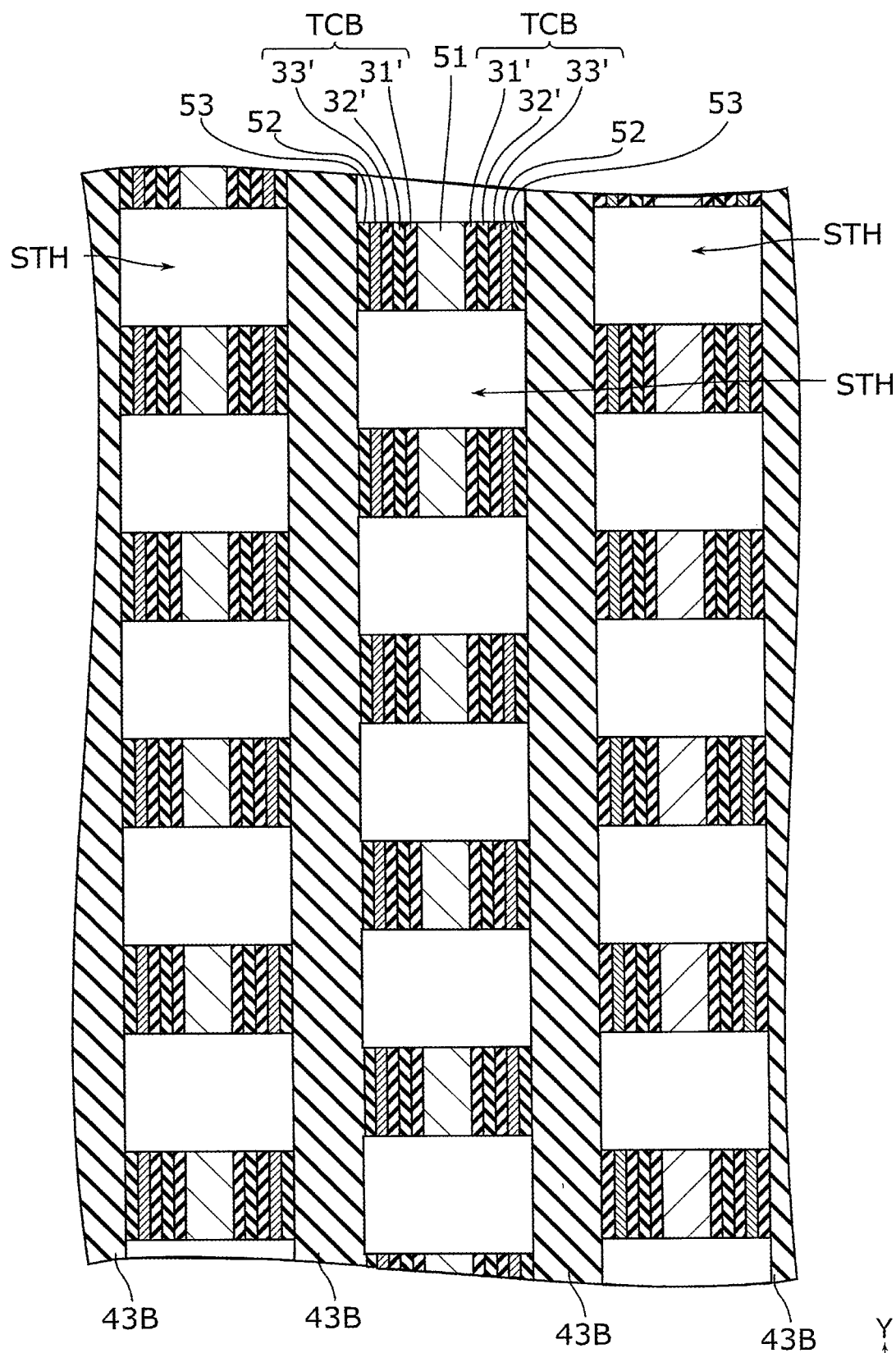
F I G. 43

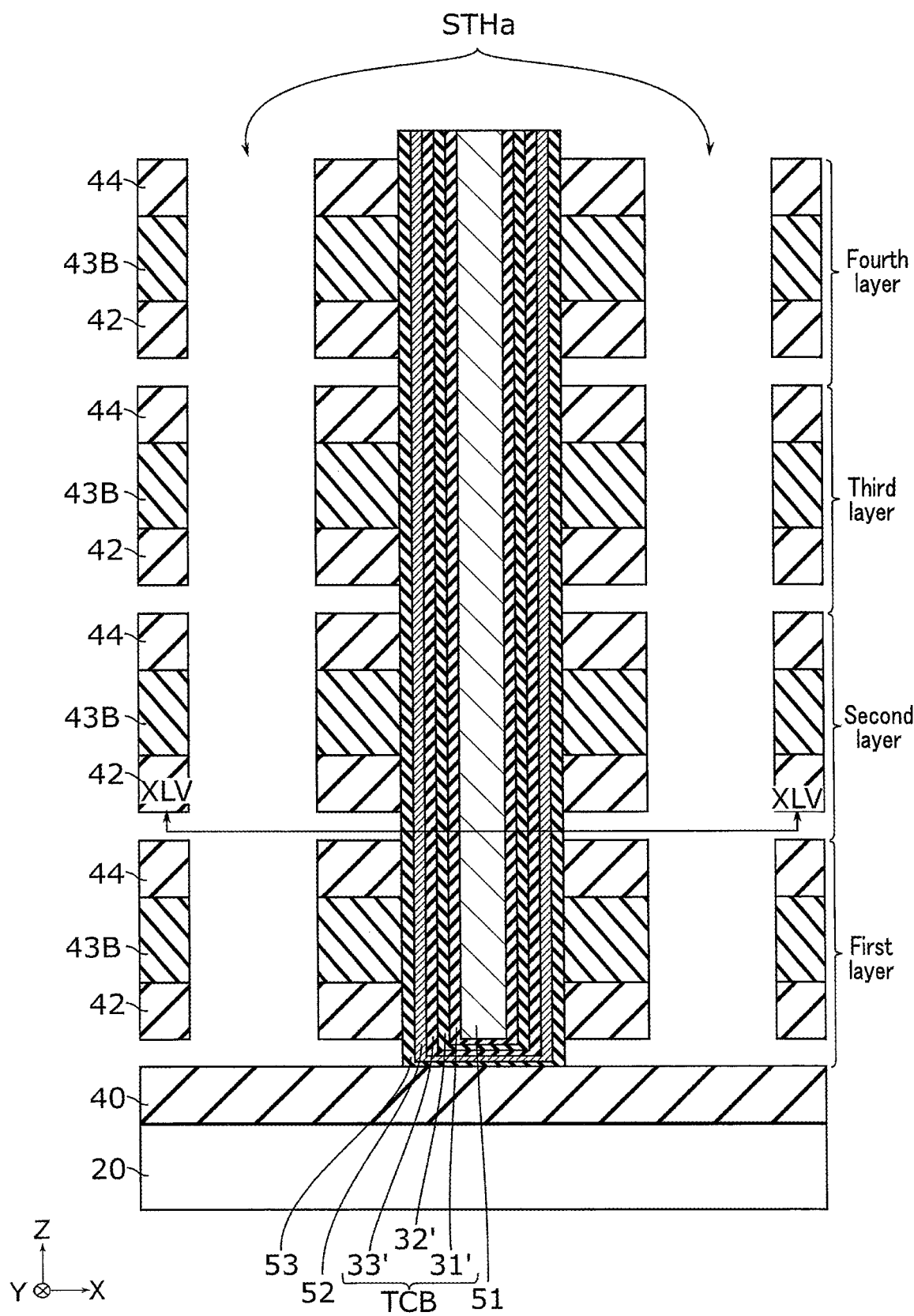
F I G. 44

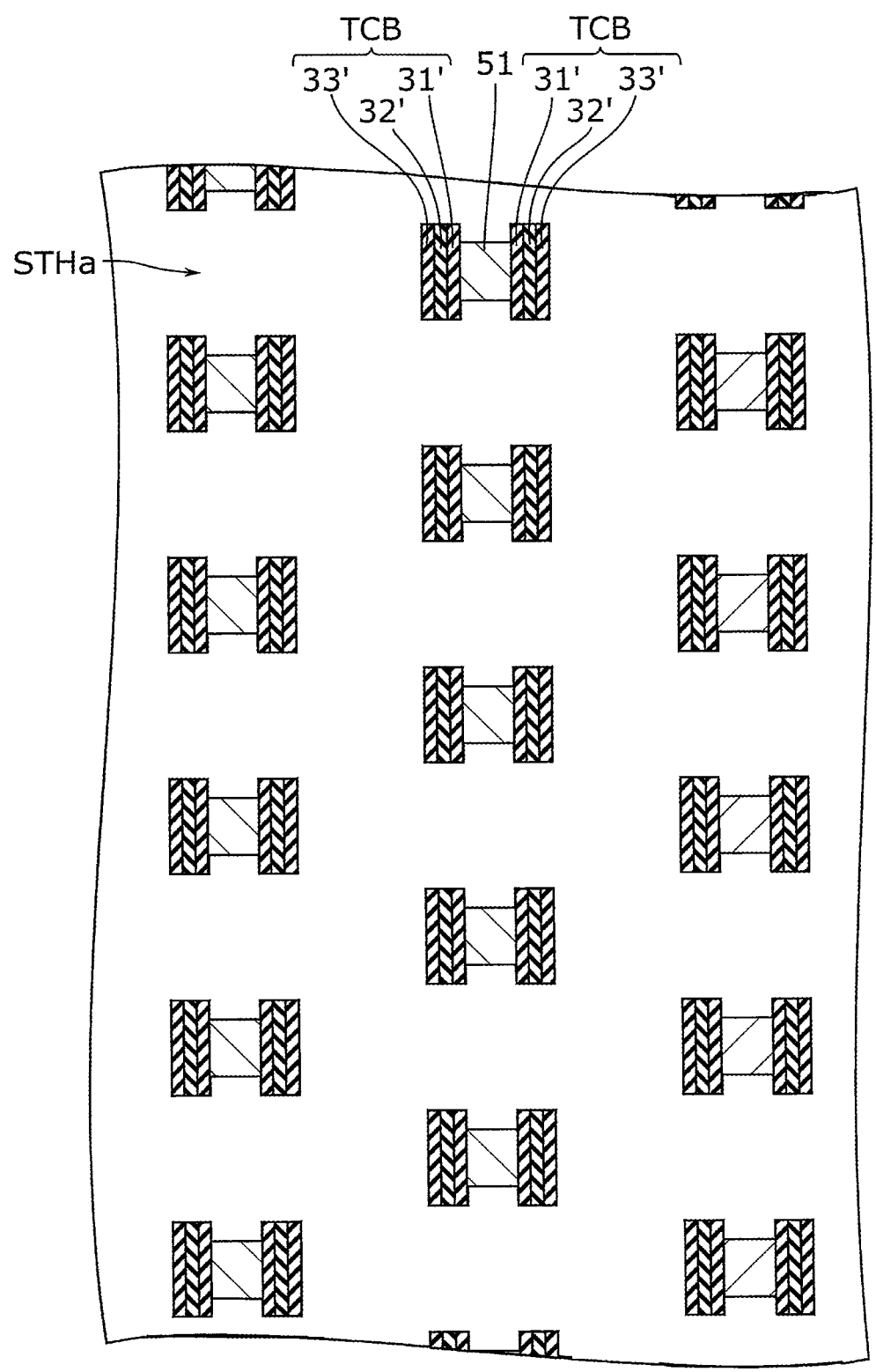
F I G. 47

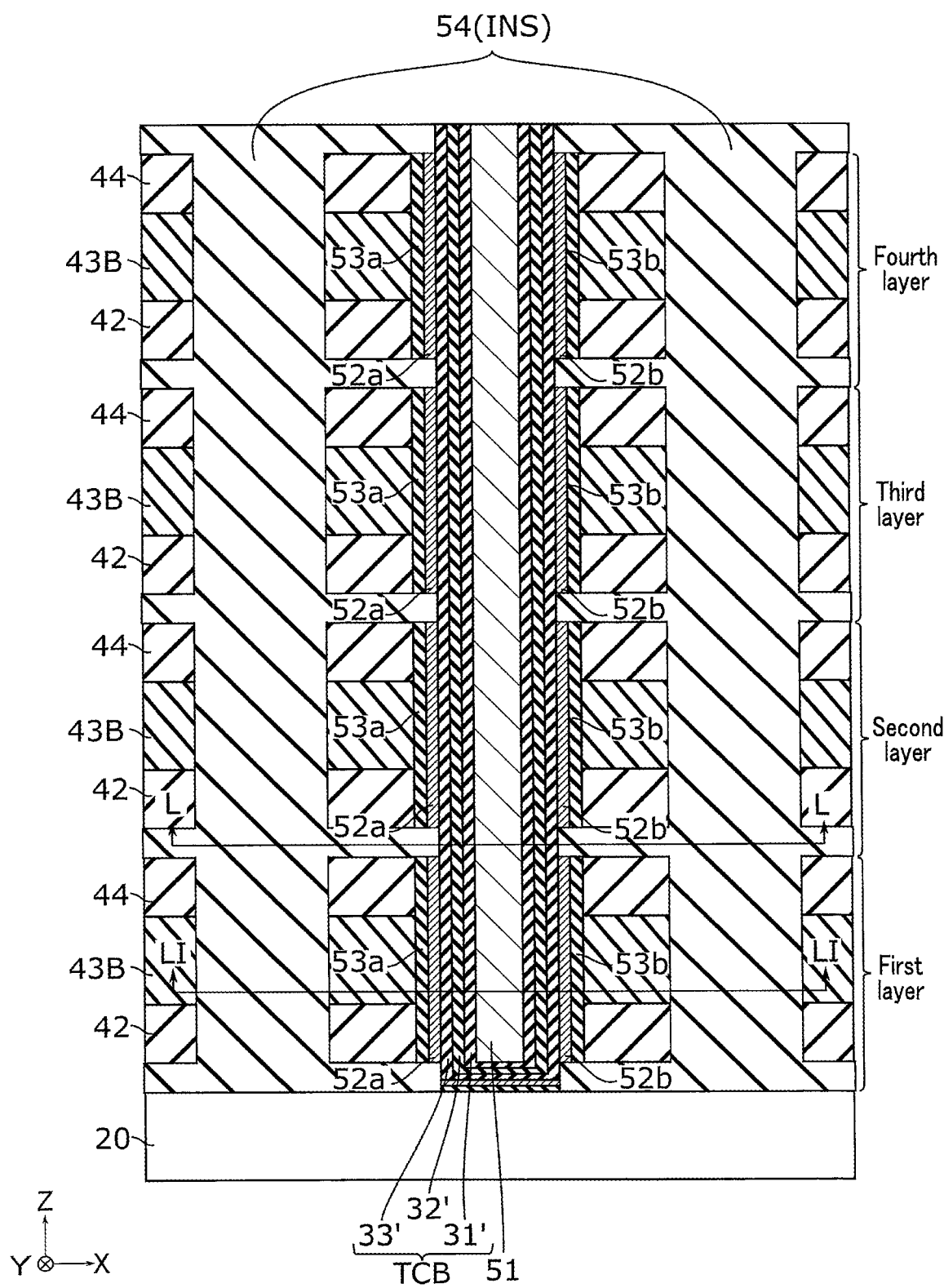
F I G. 49

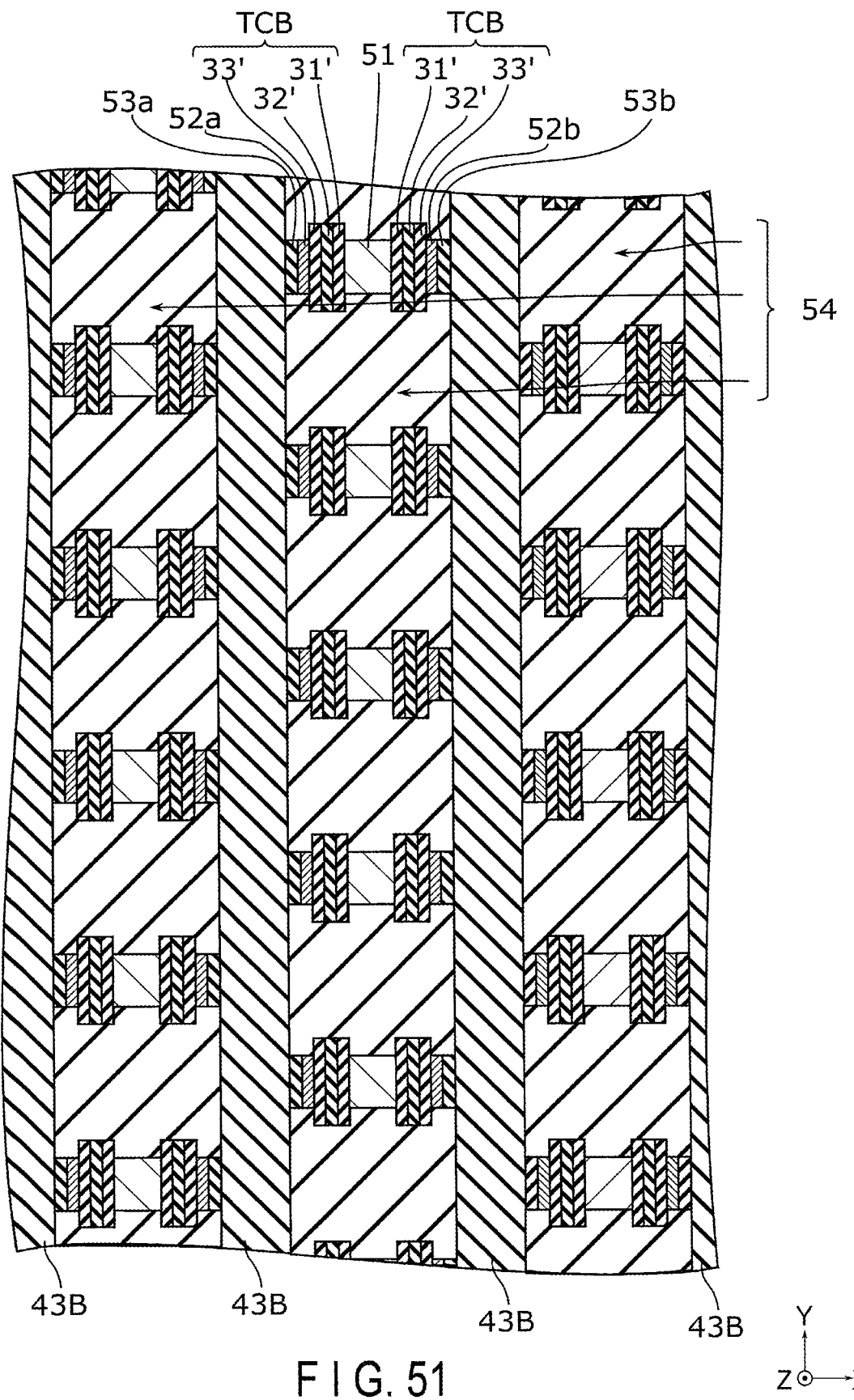
F I G. 51

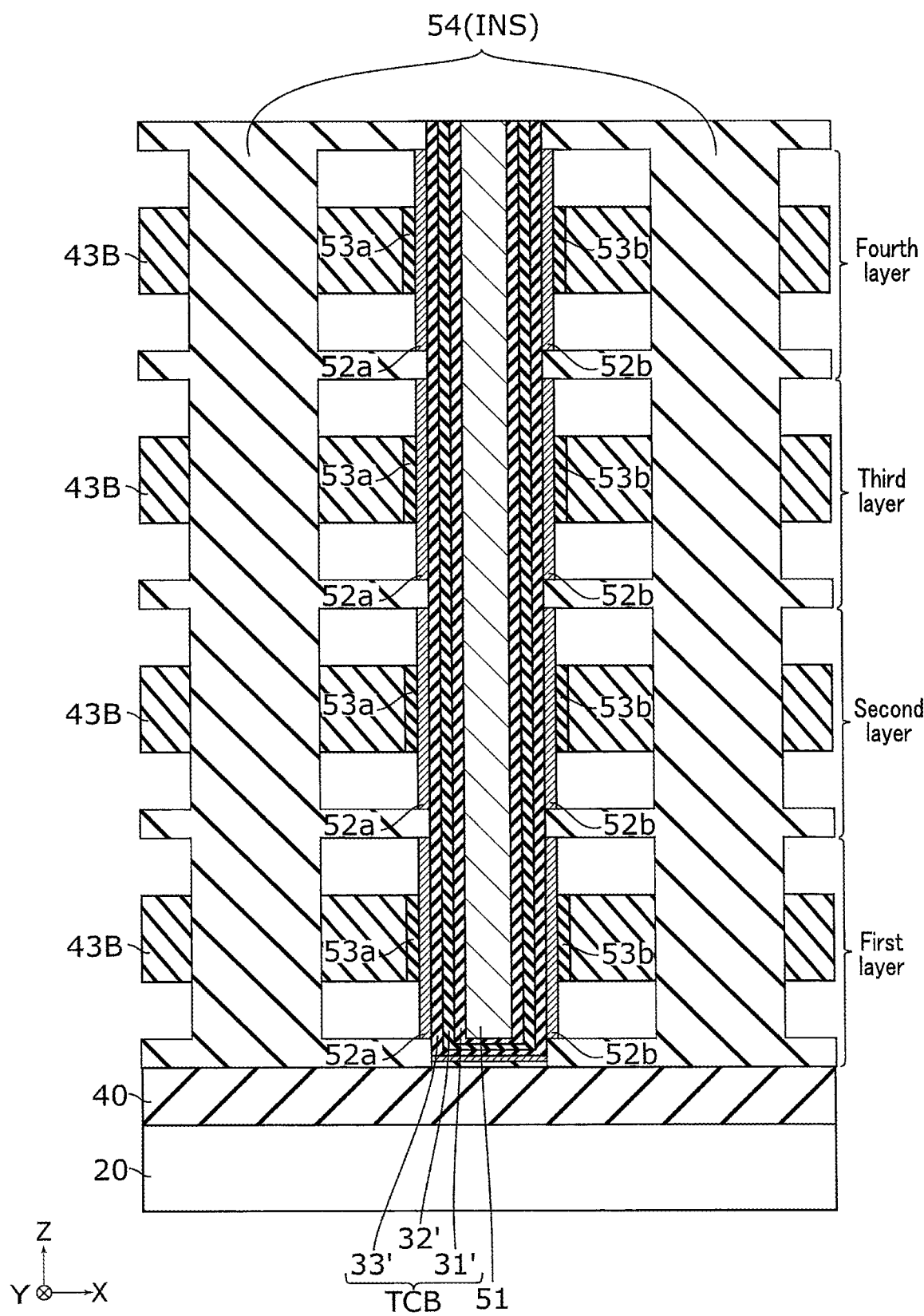
F I G. 52

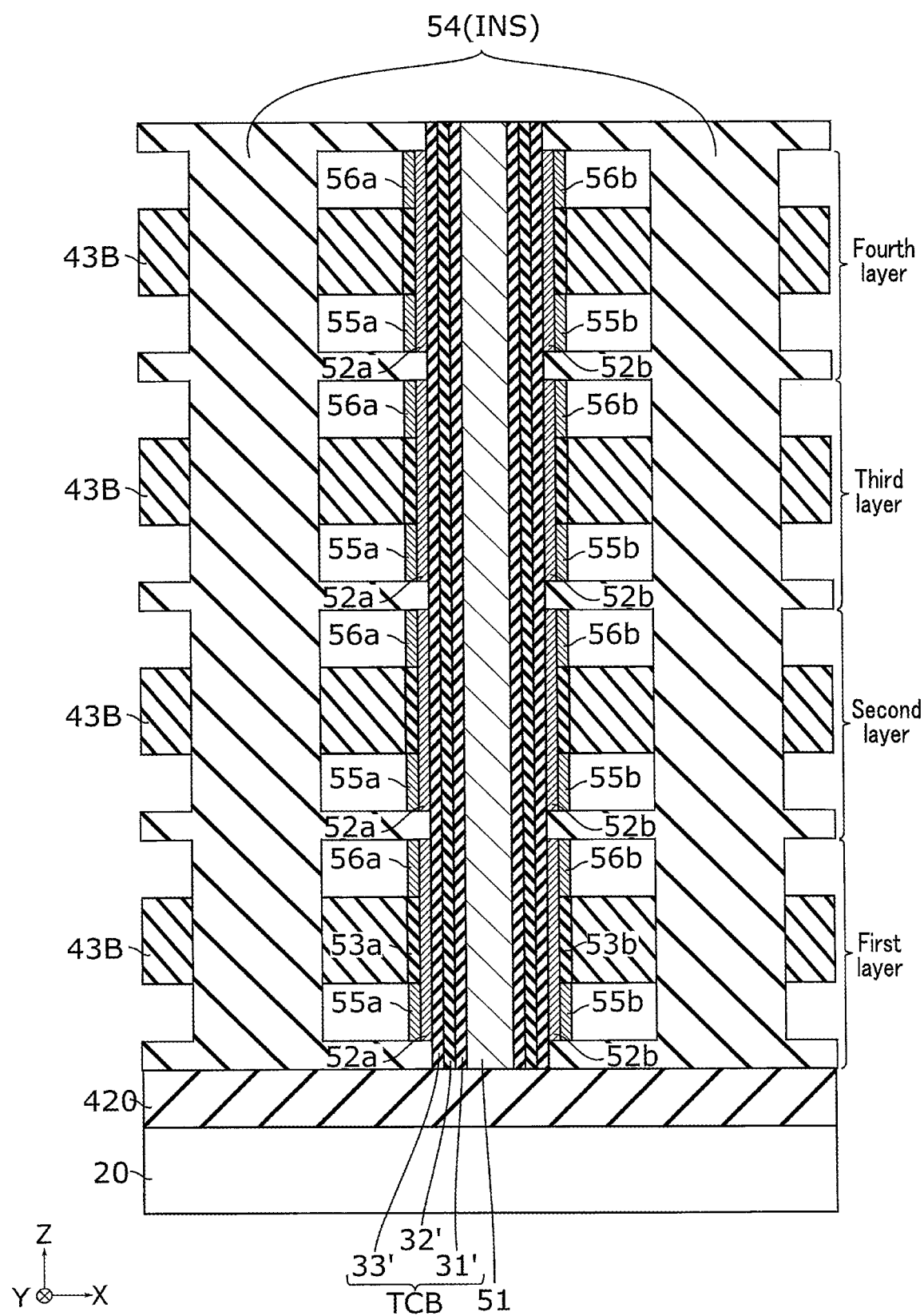
F I G. 53

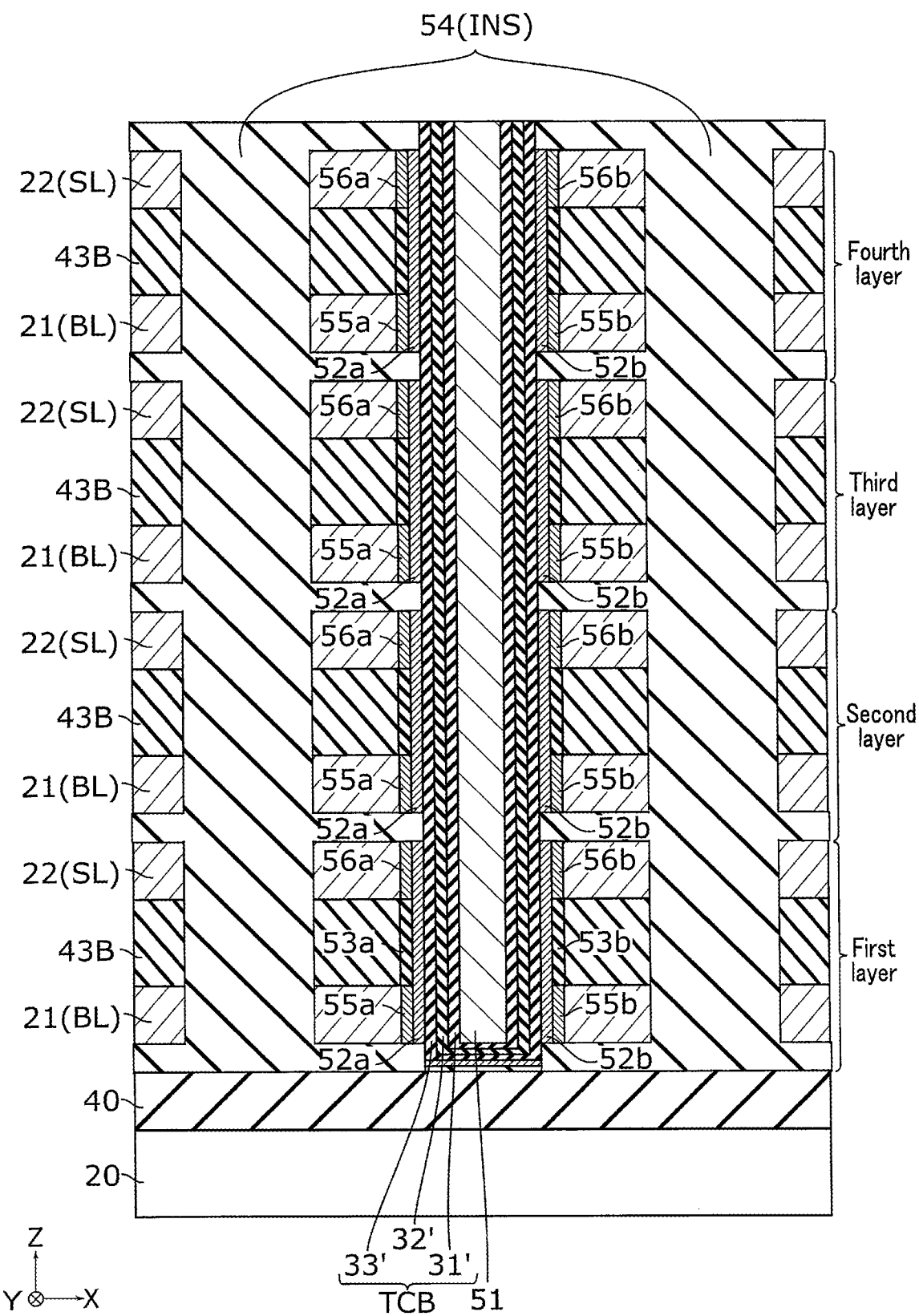
F I G. 54

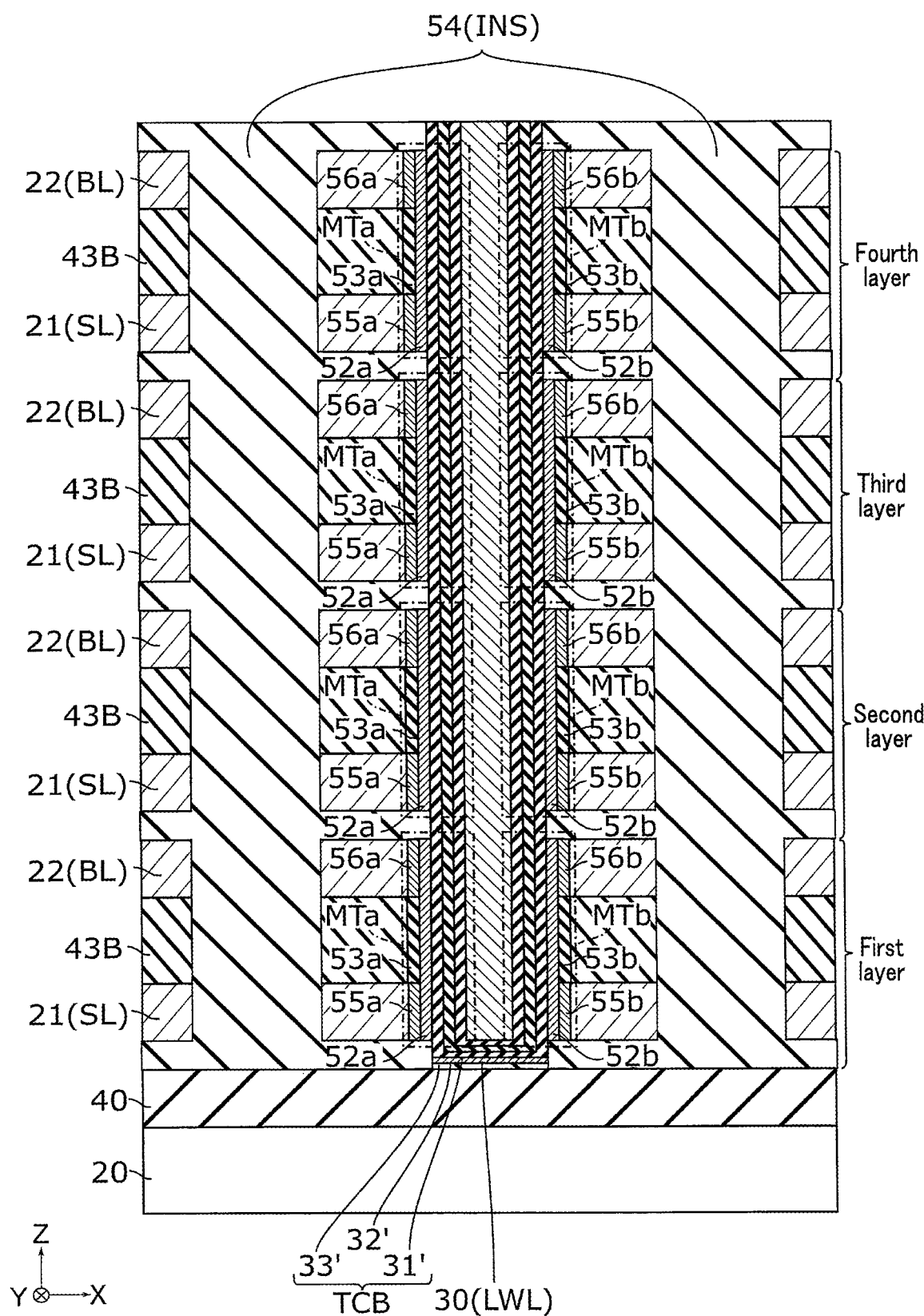
F I G. 55

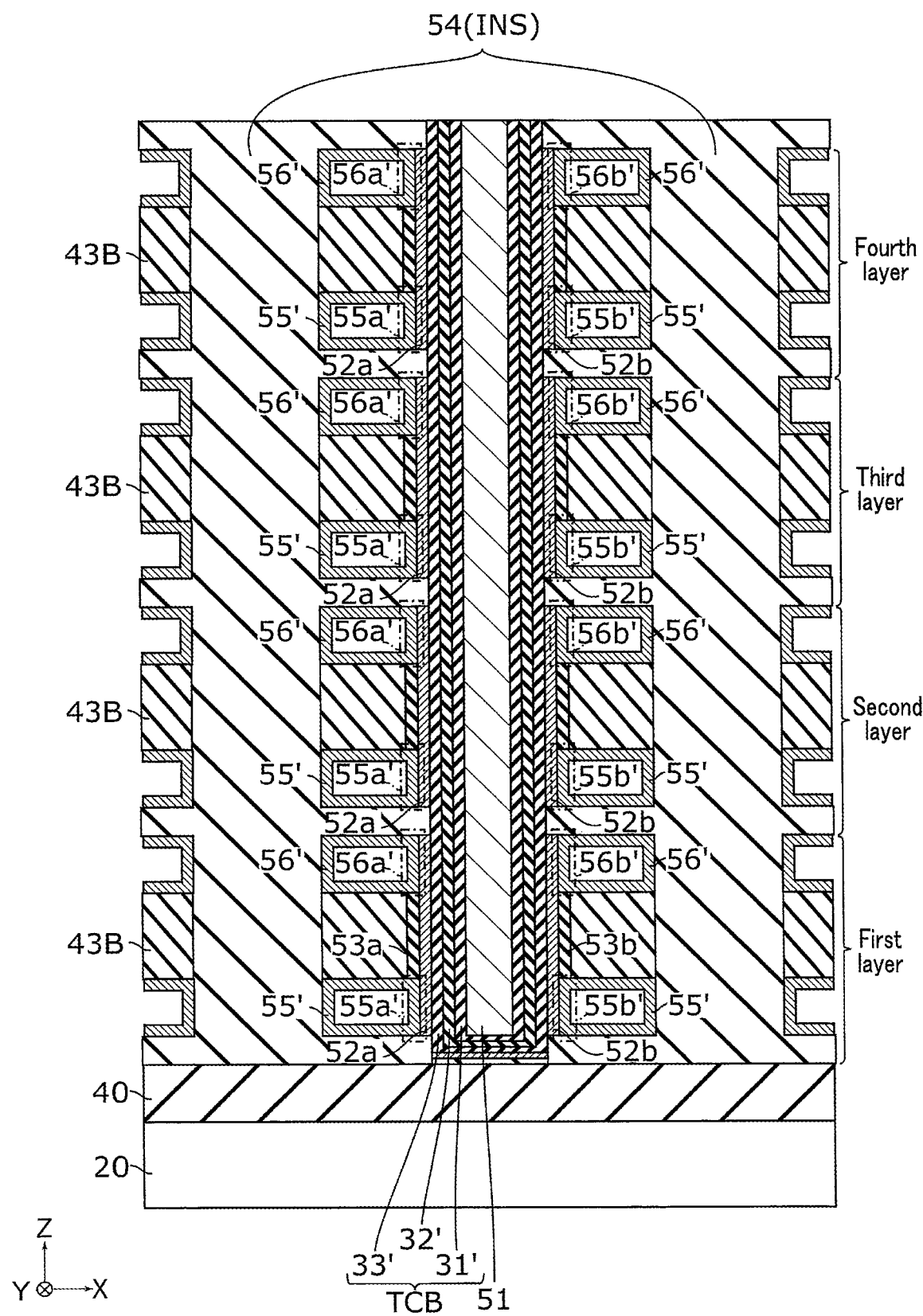
F I G. 56

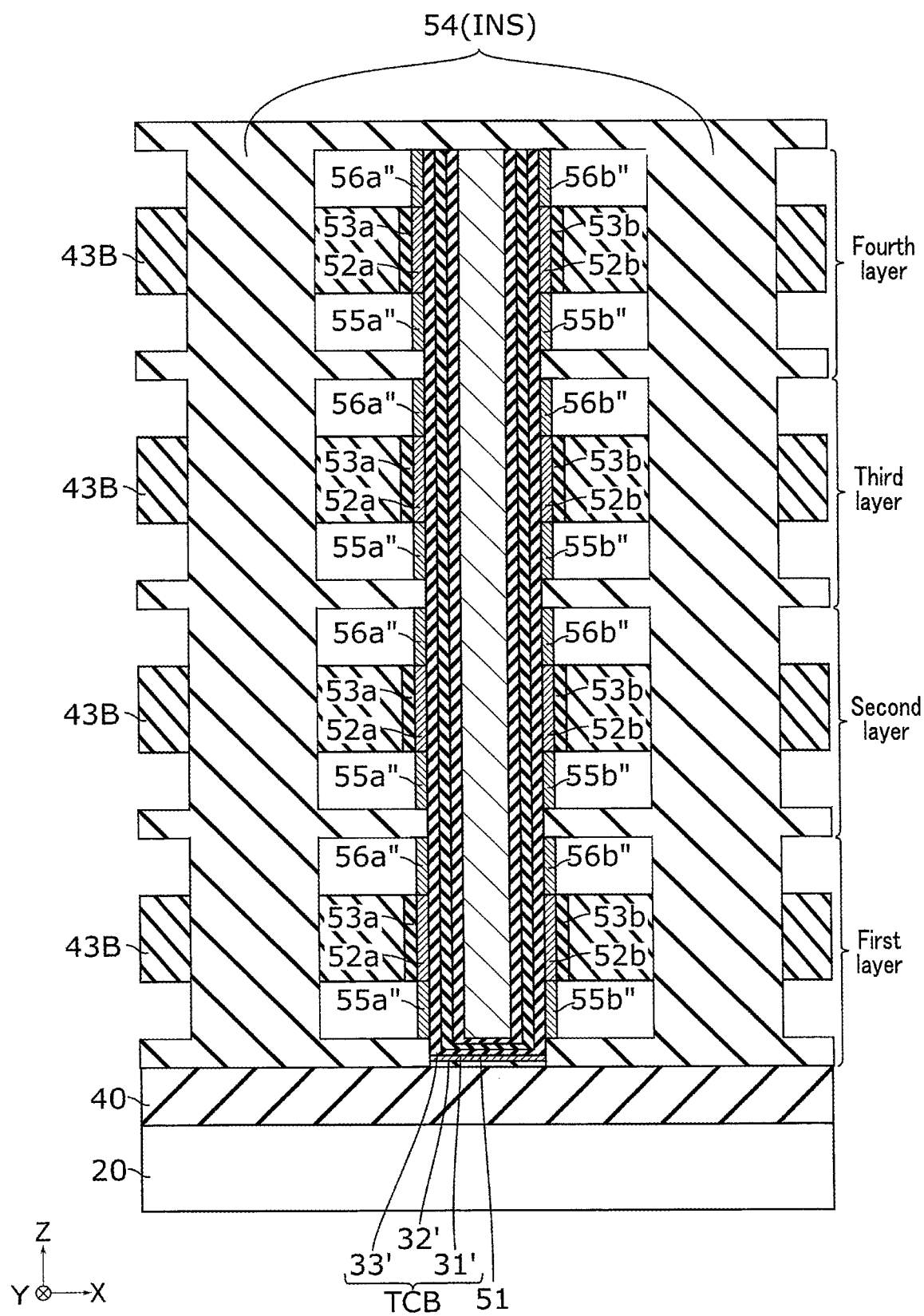
F I G. 57

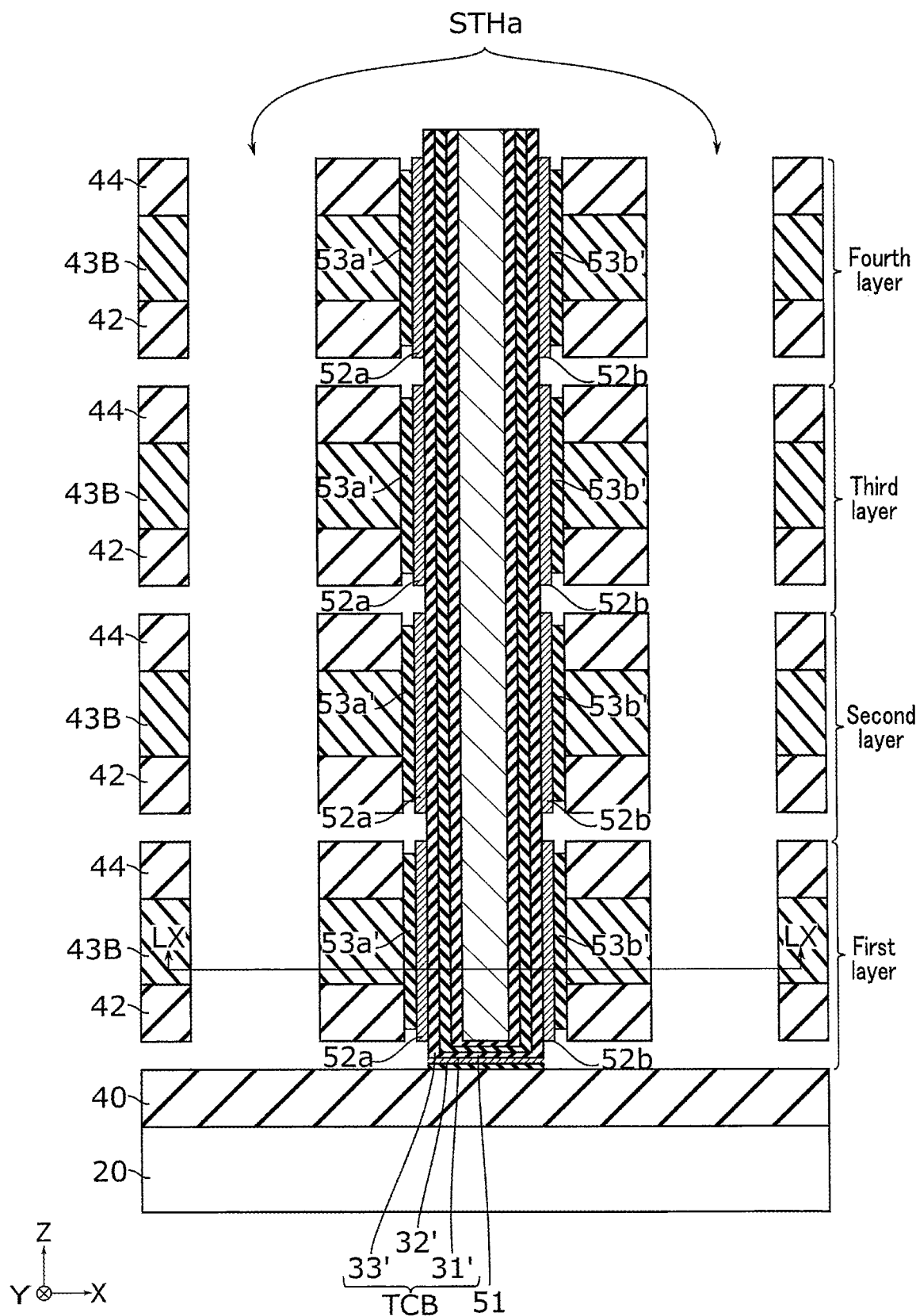
F I G. 59

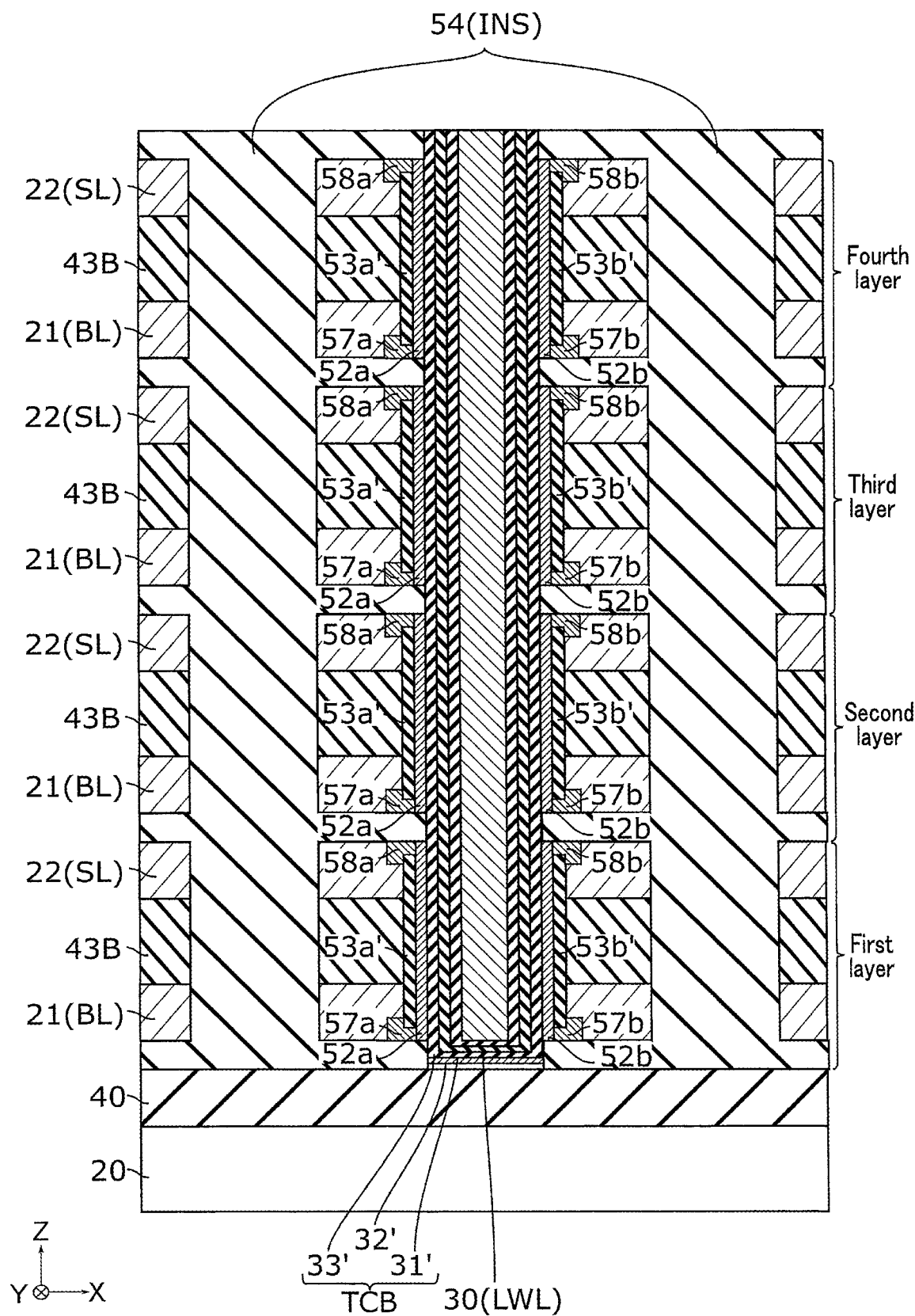
F I G. 65

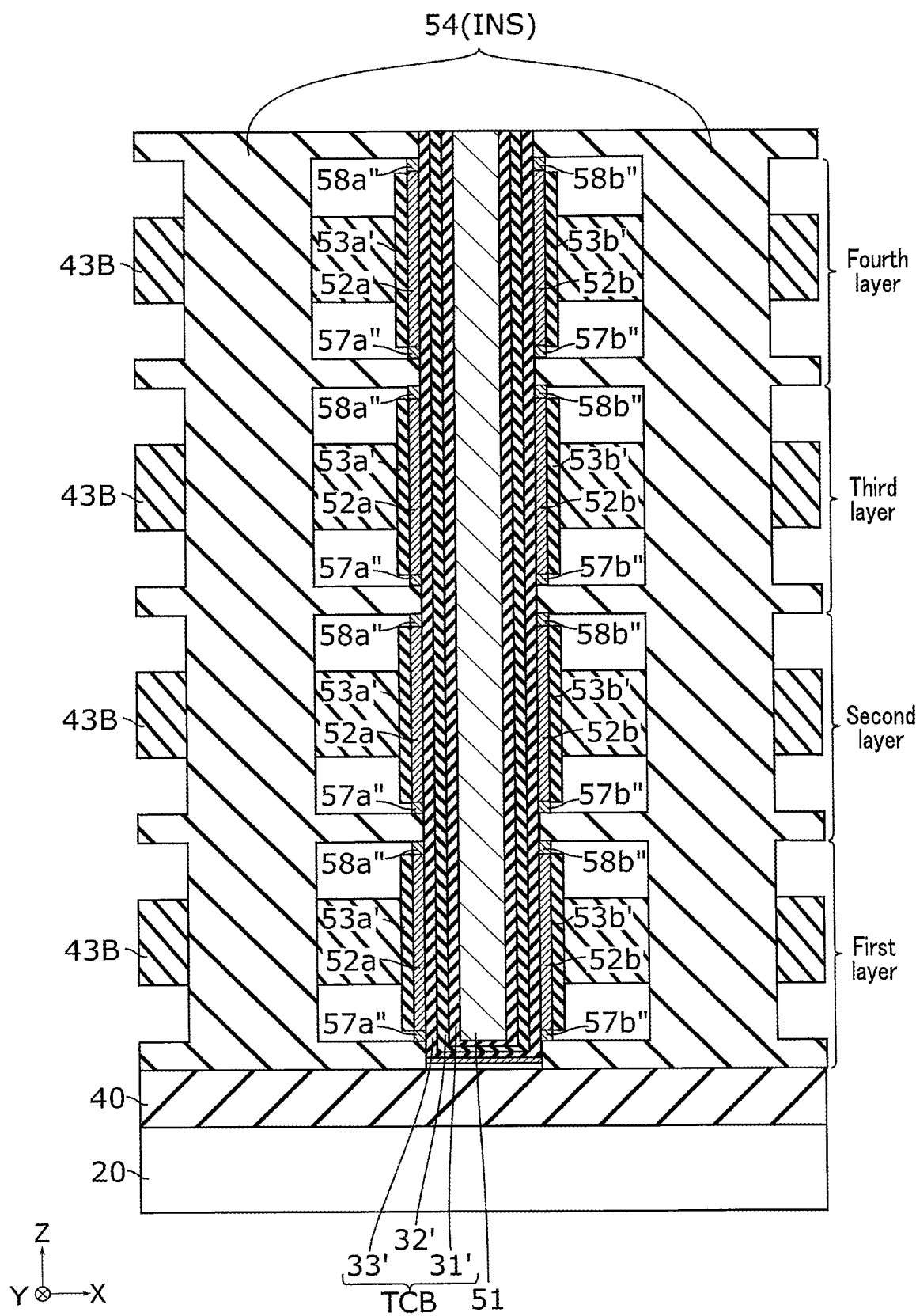
F I G. 67

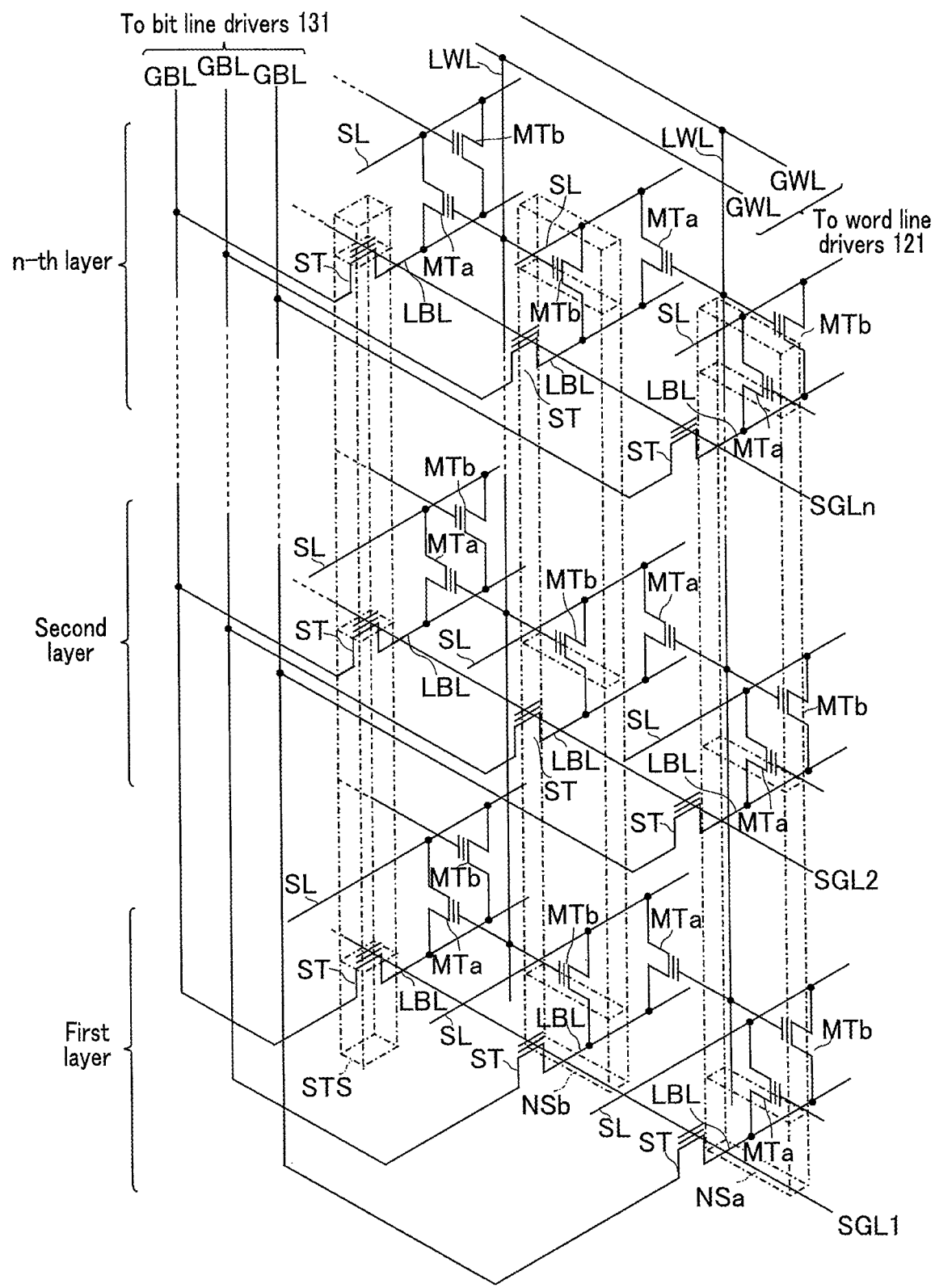
F I G. 68

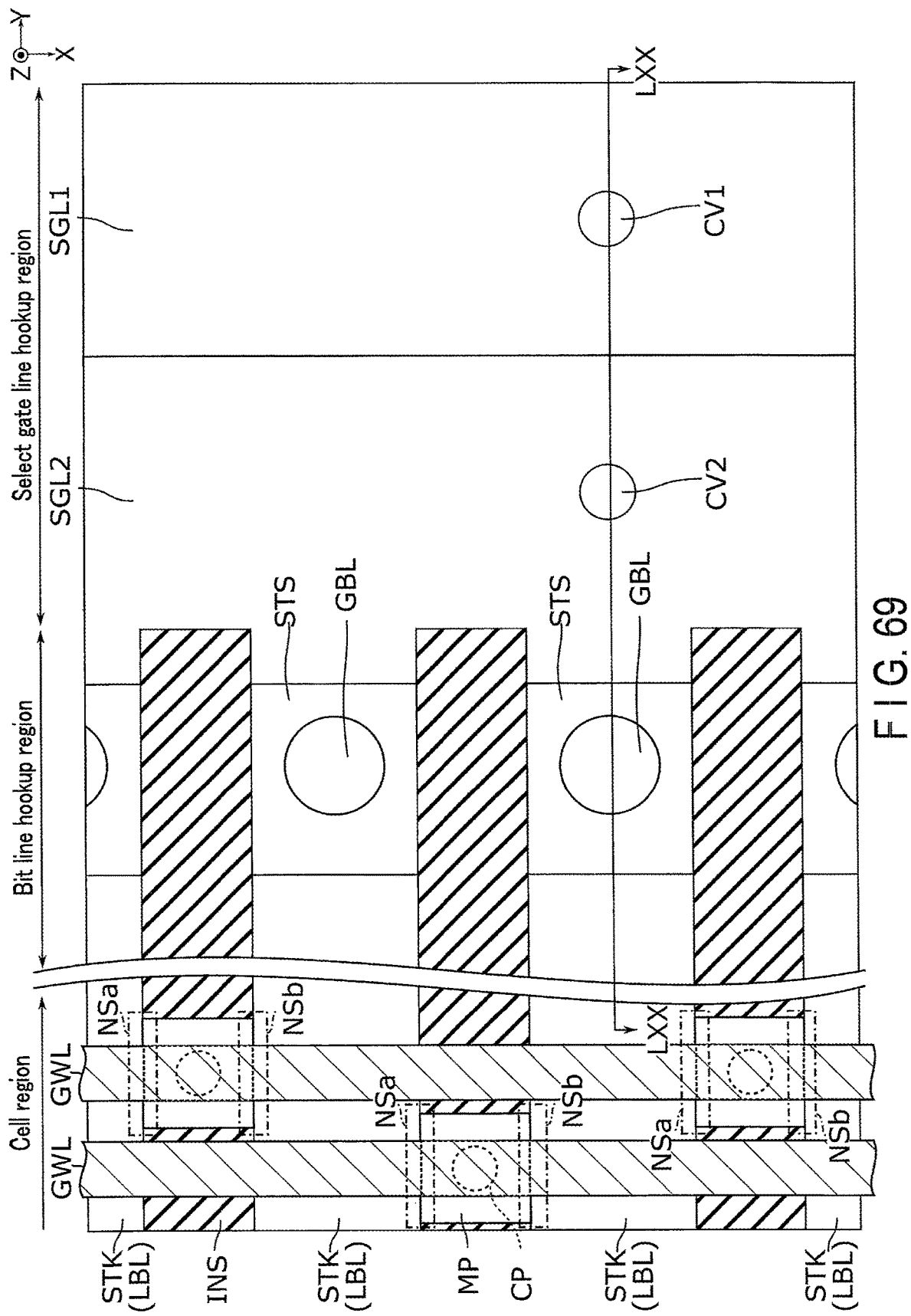
F I G. 69

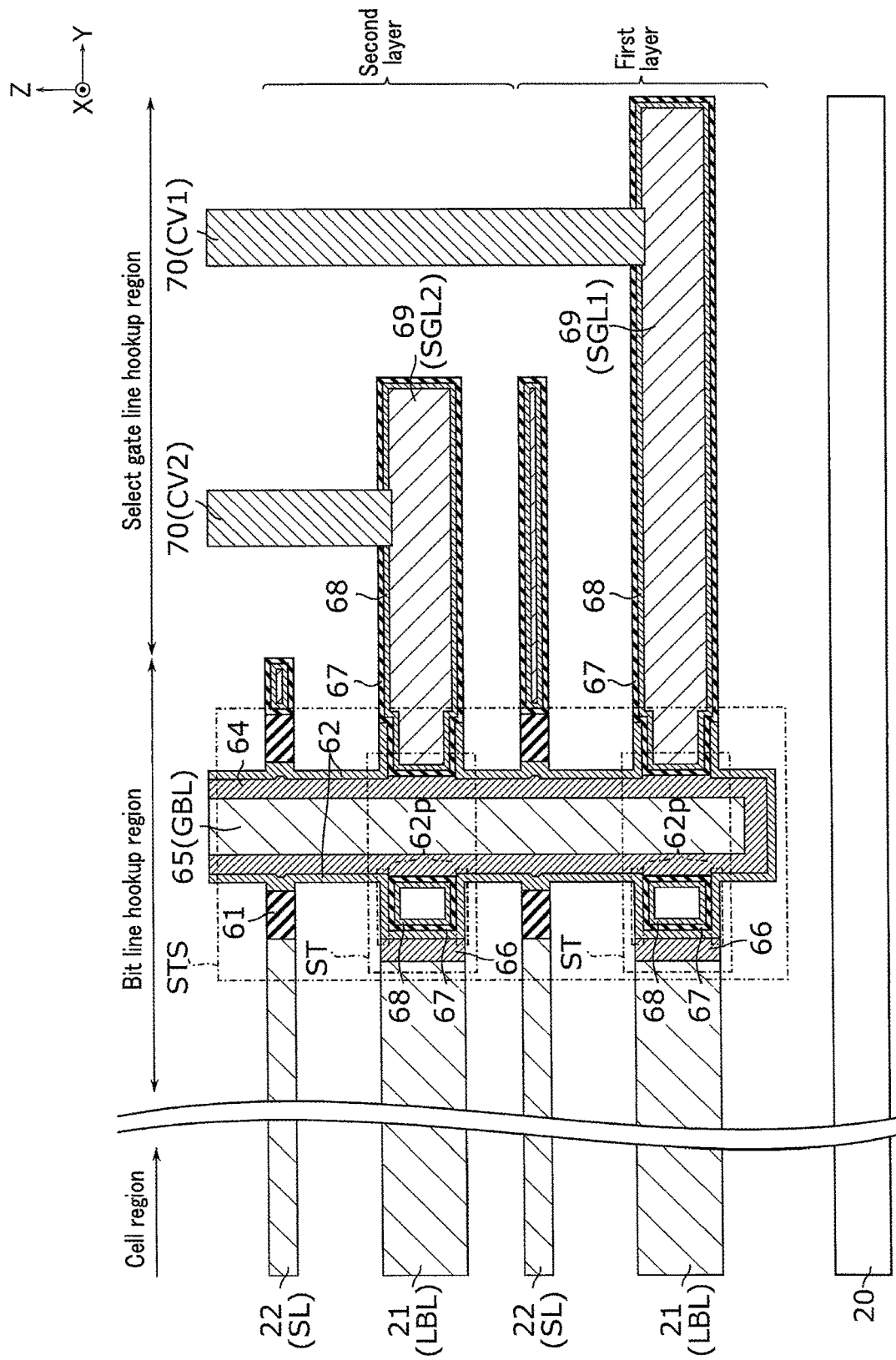
F I G. 70

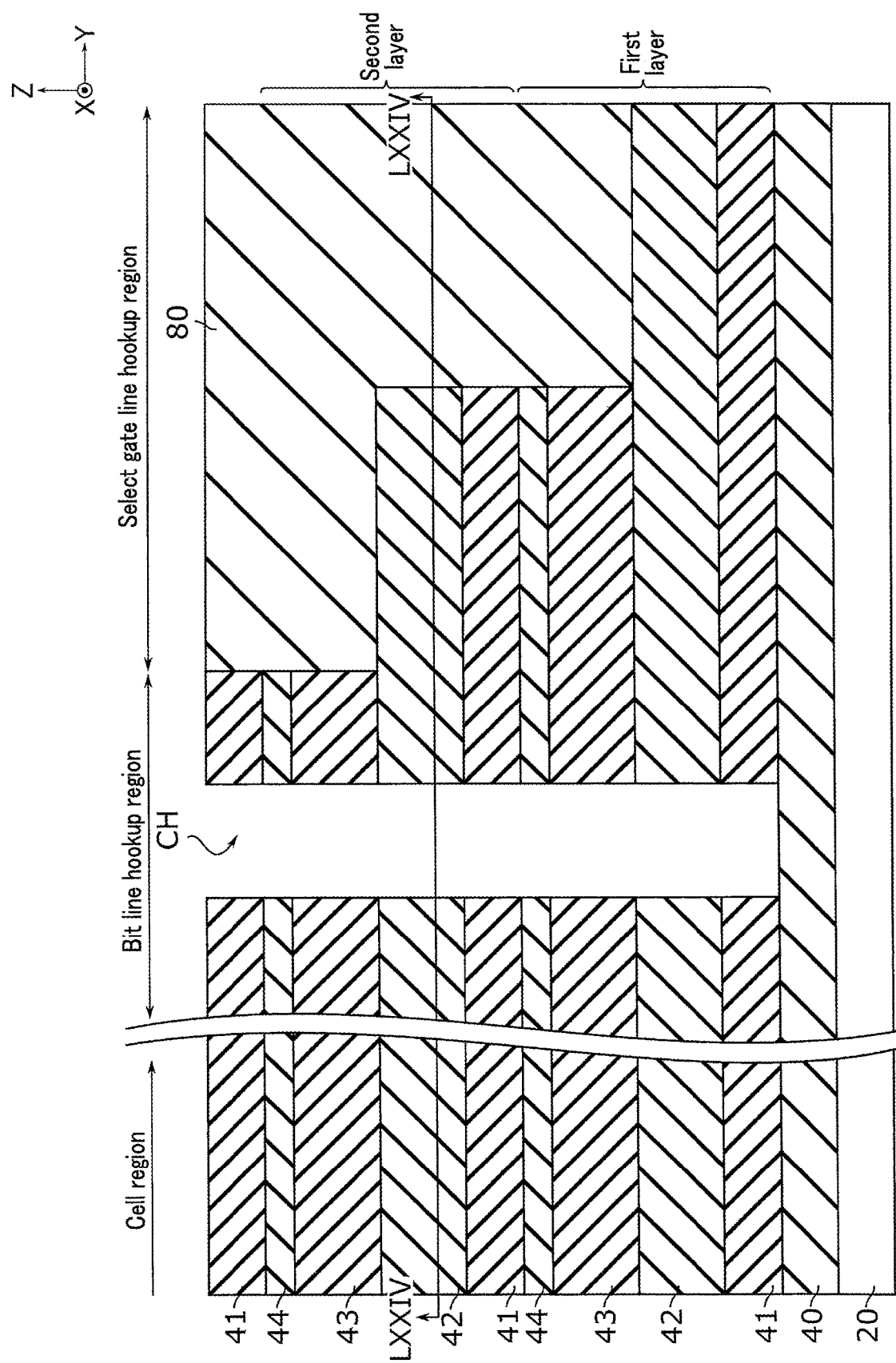
F I G. 73

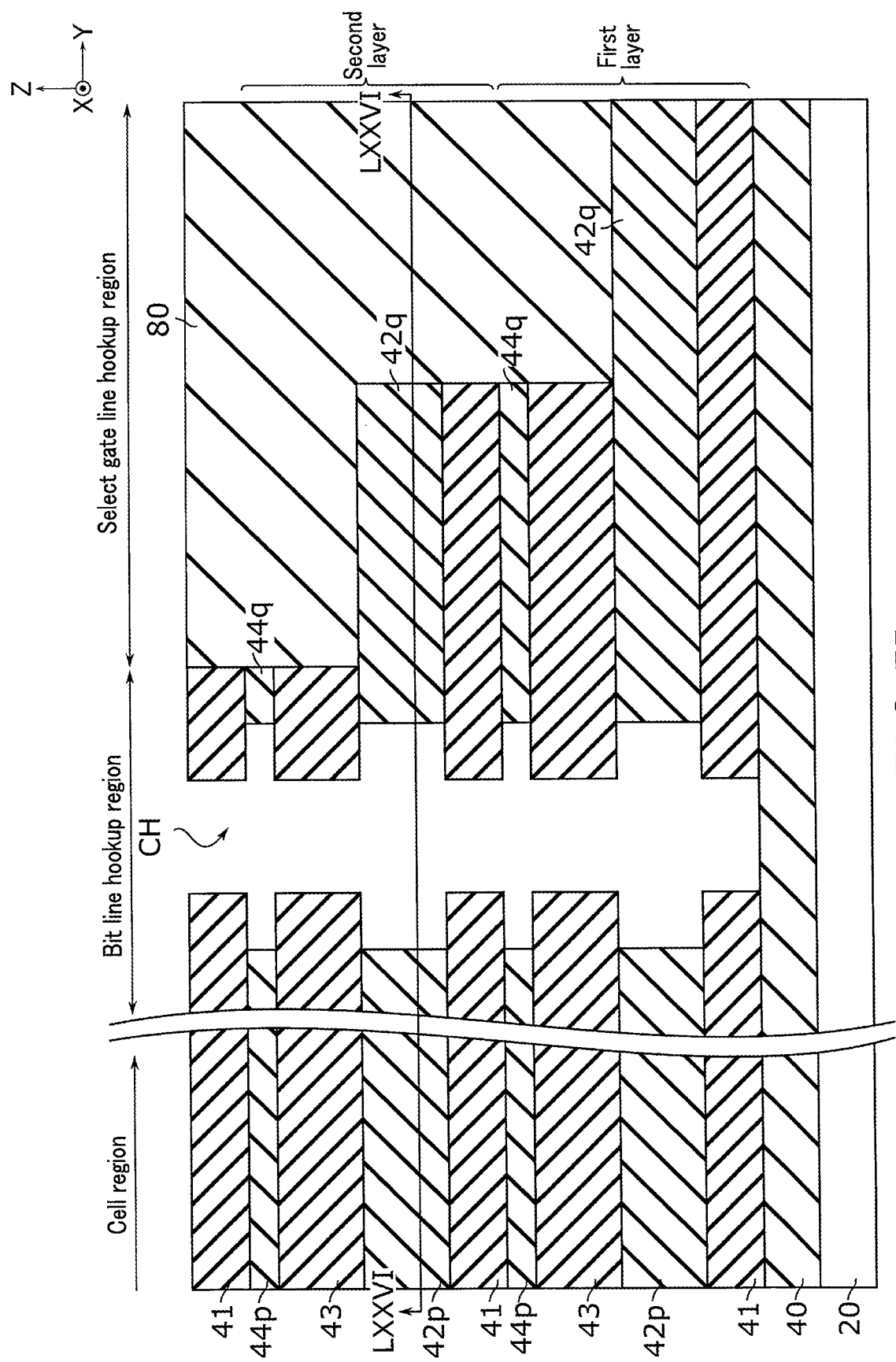
F I G. 75

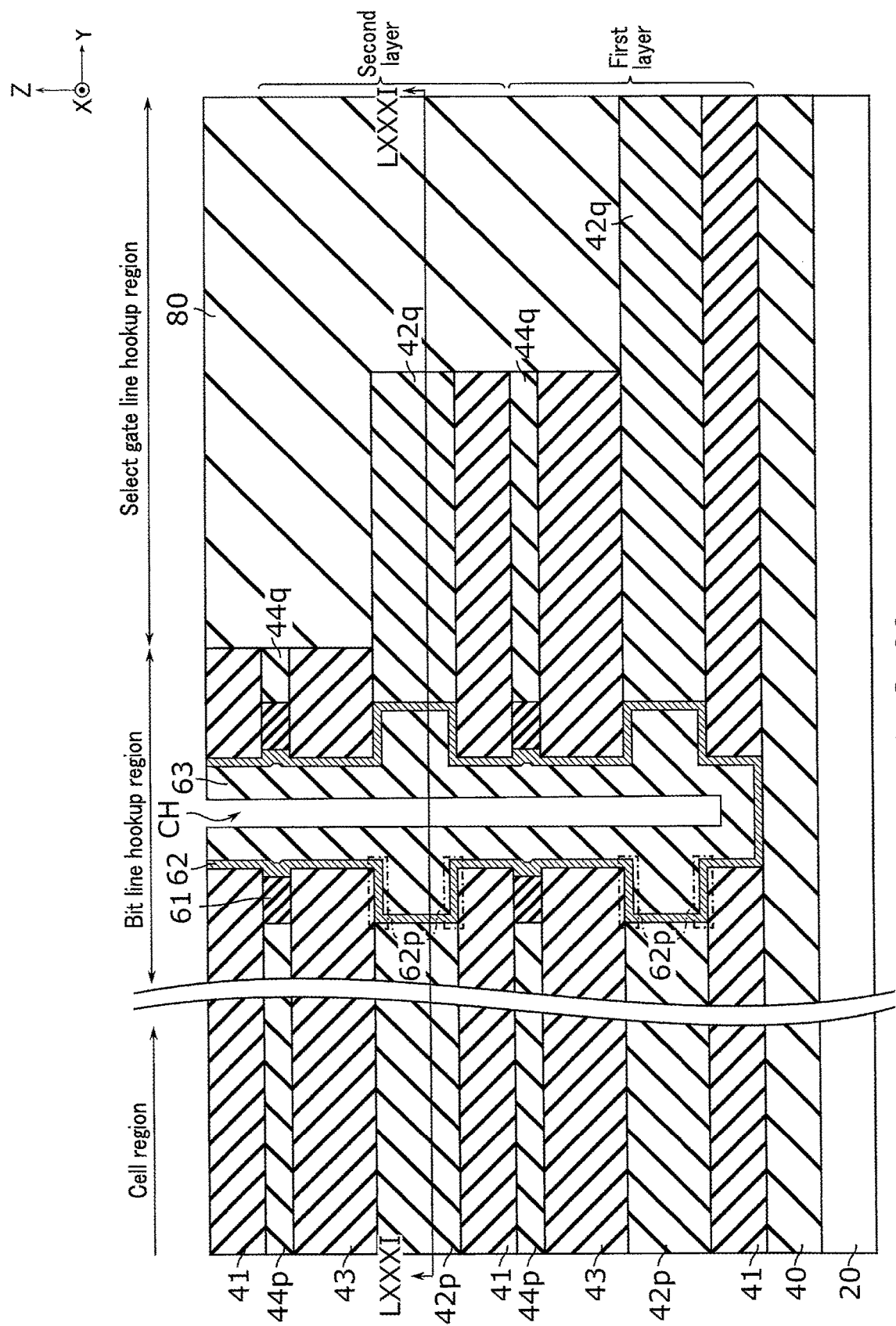
F I G. 80

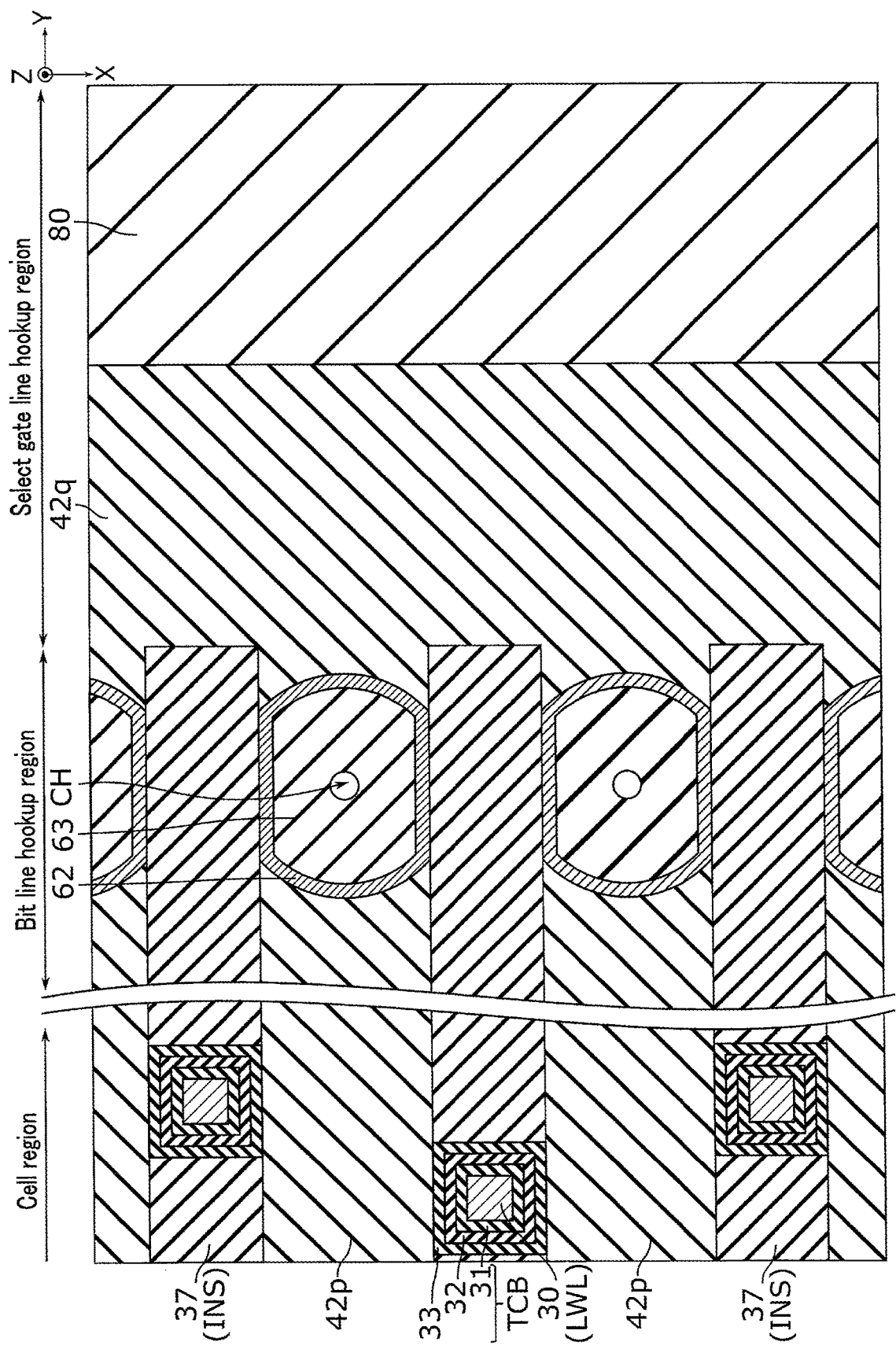
F I G. 81

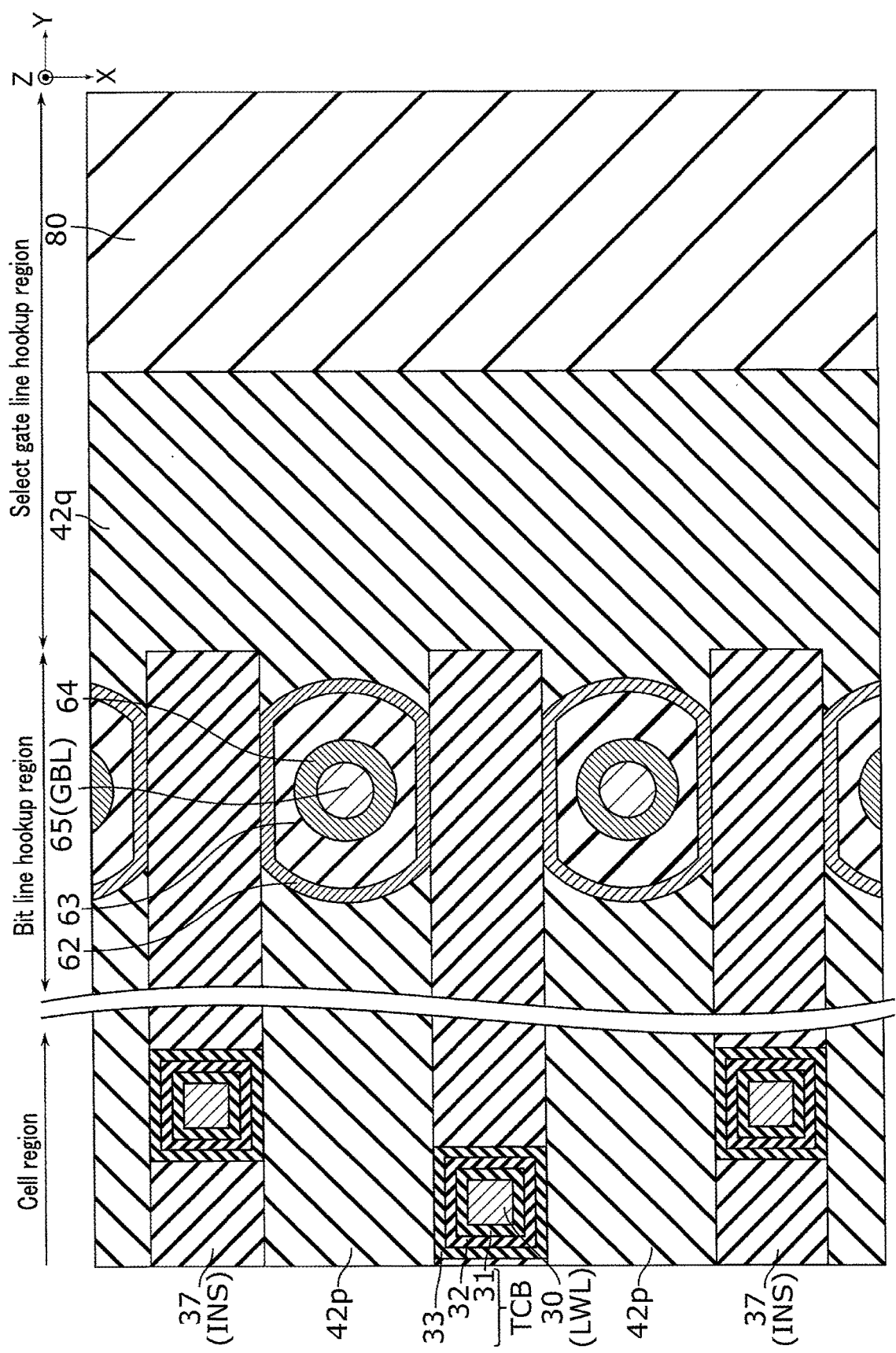
F I G. 85

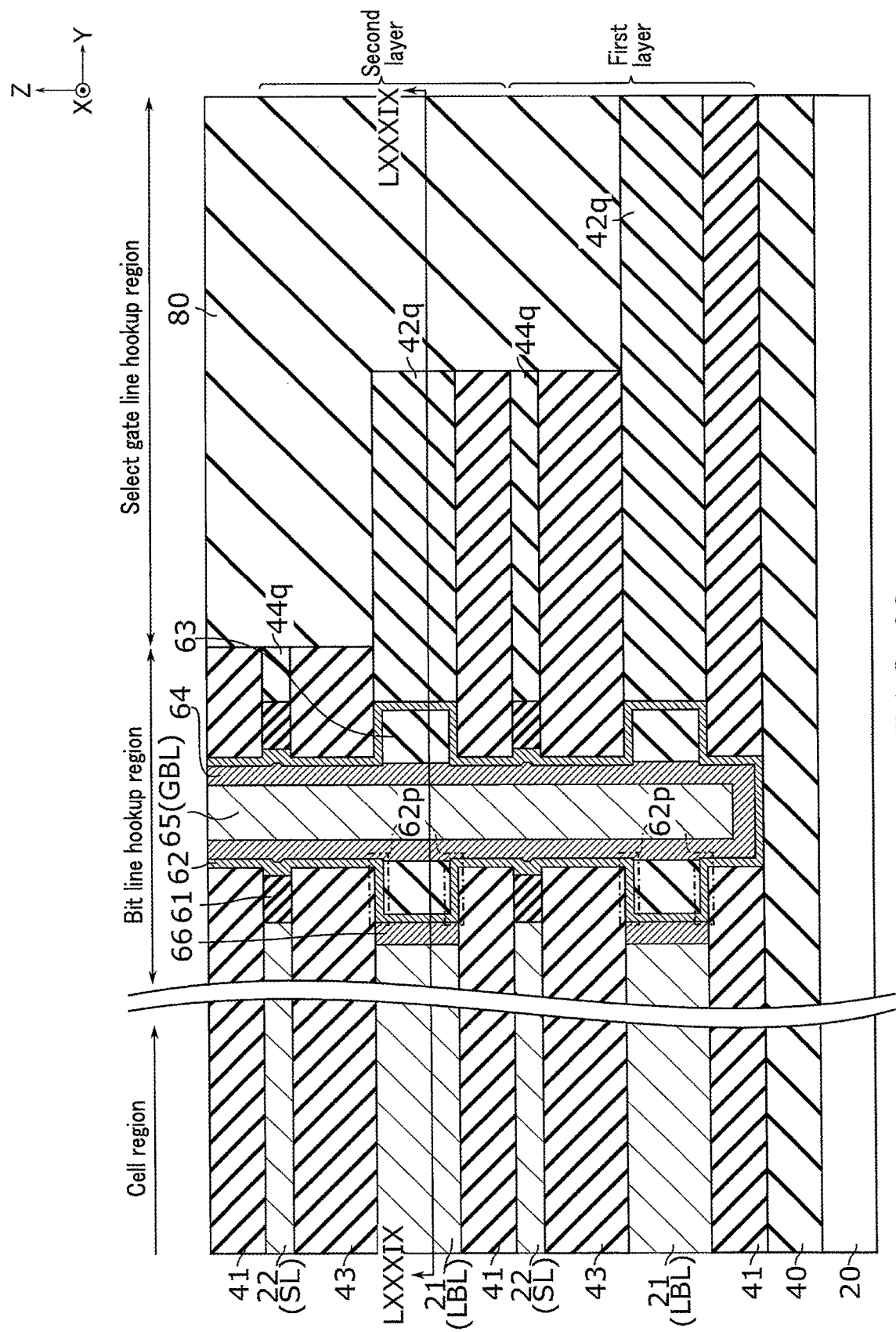
F I G. 88

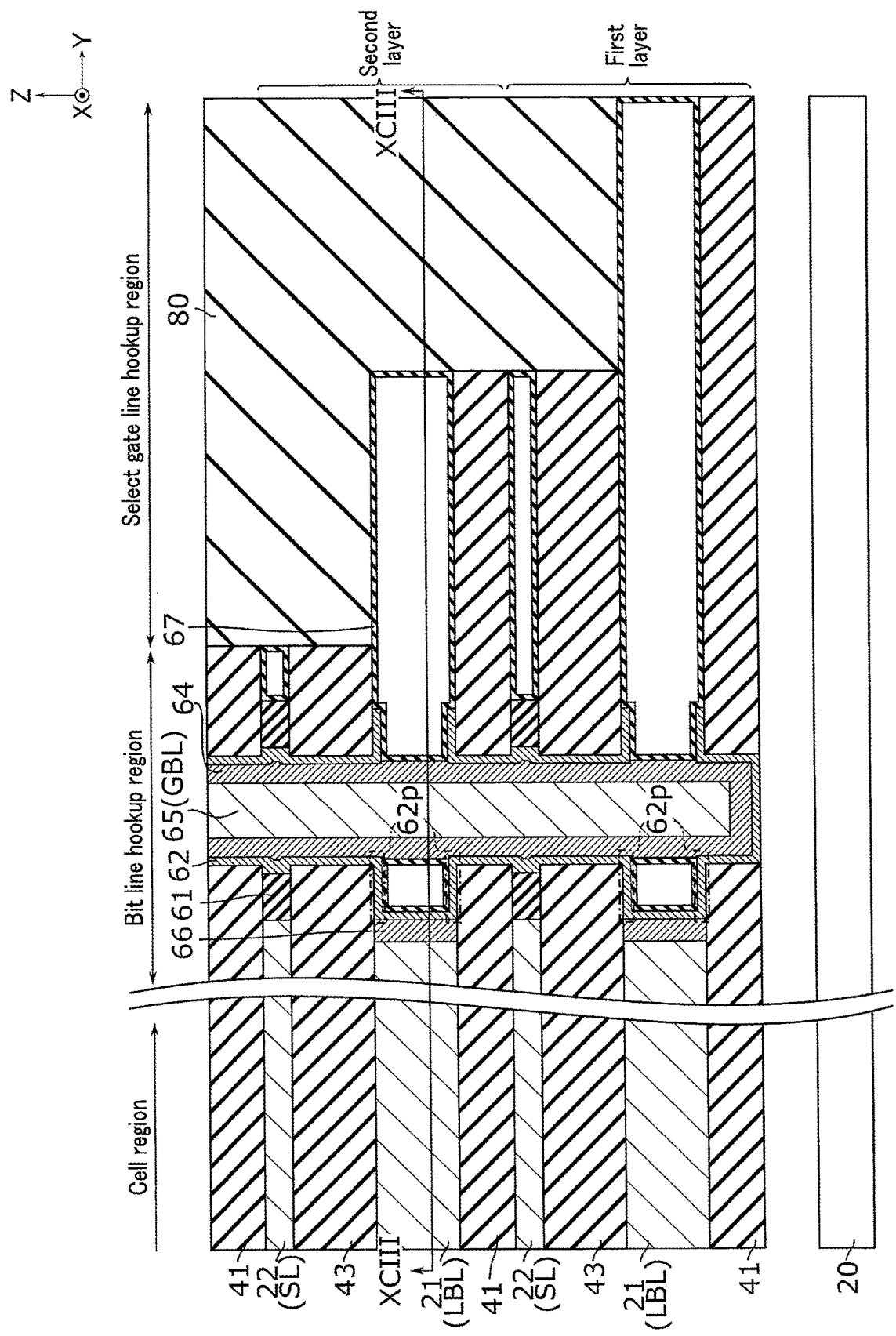
F I G. 92

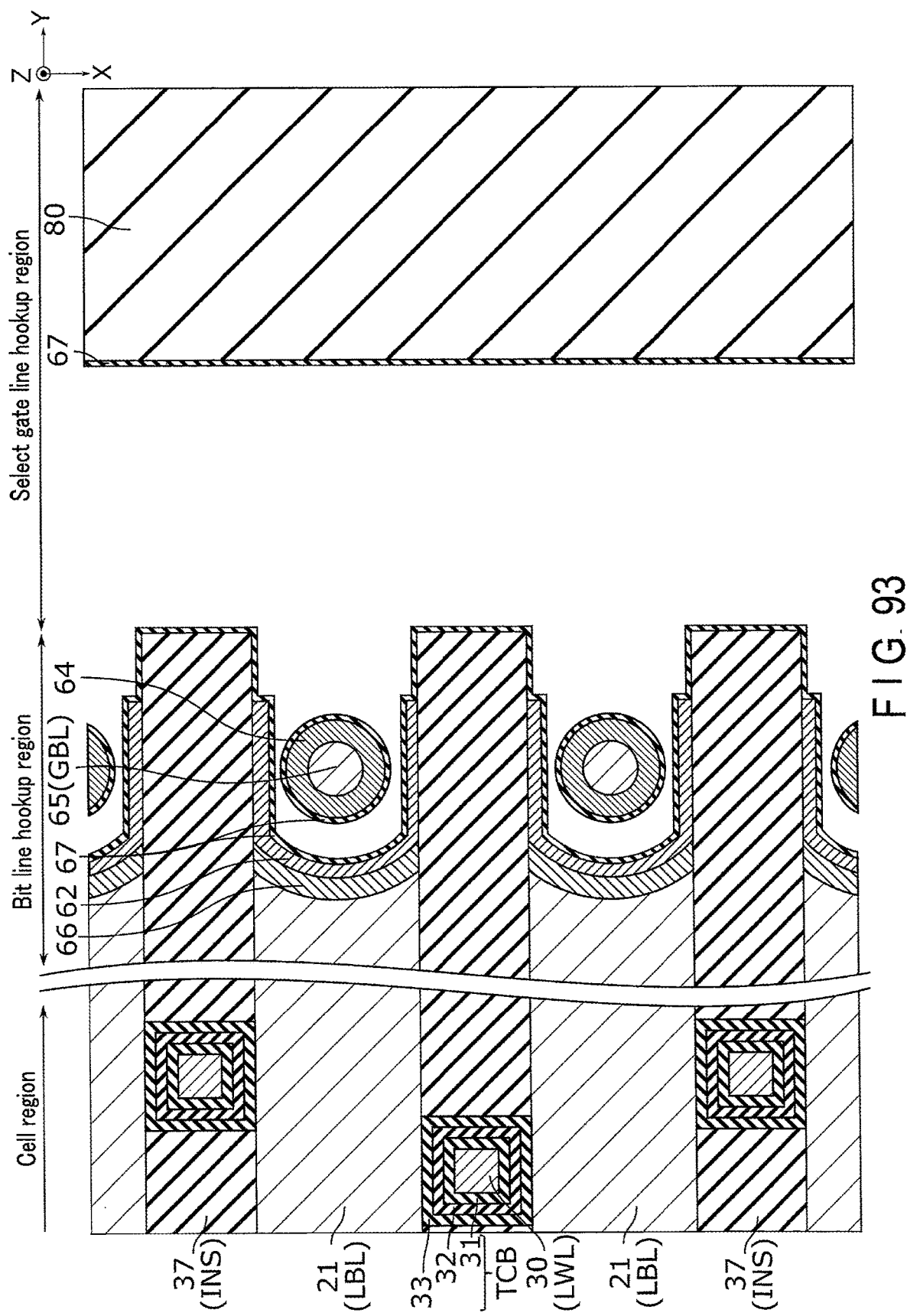
F I G. 93

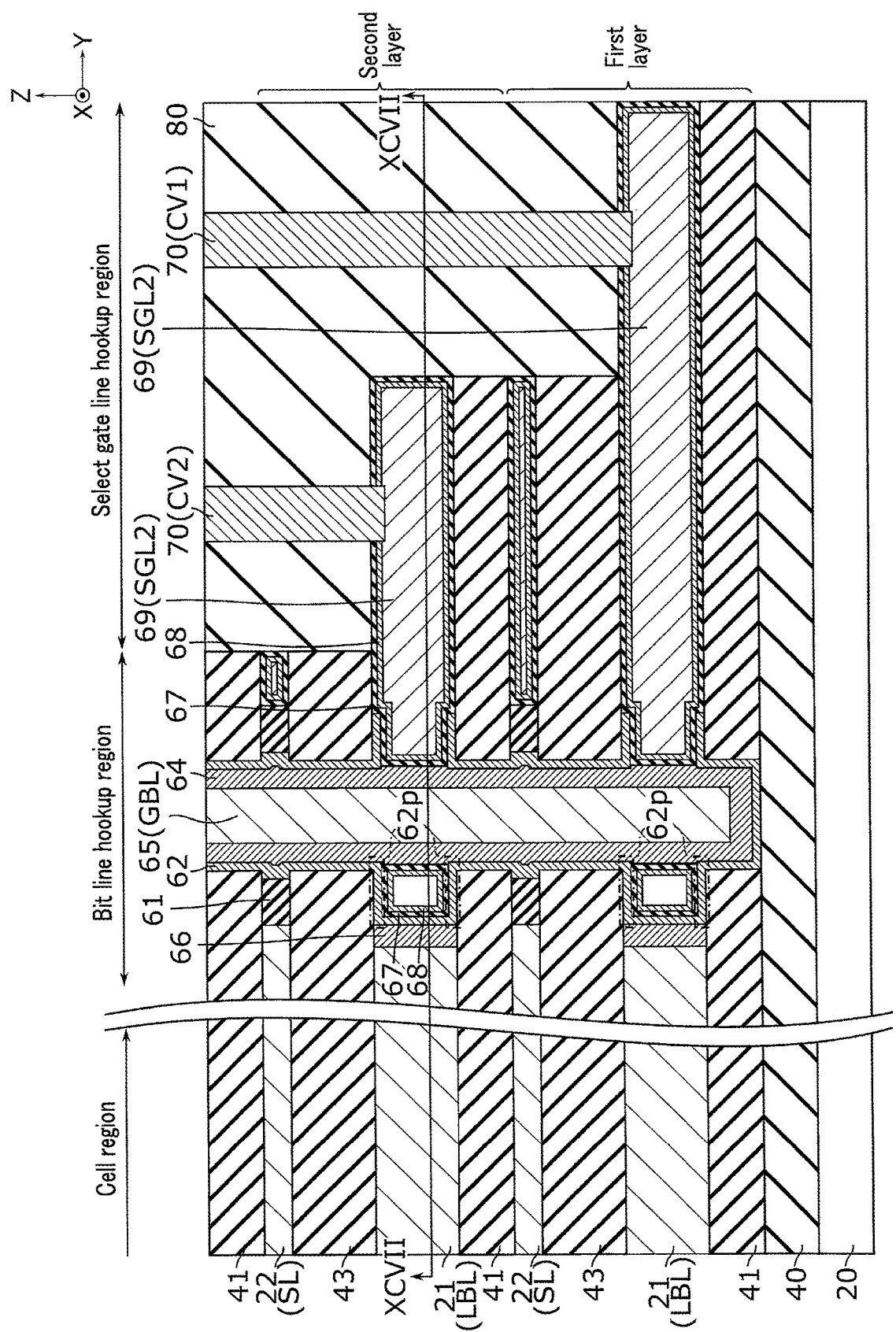
F I G. 96

MEMORY DEVICE

CROSS-REFERENCE TO RELATED APPLICATIONS

This application is a Continuation Application of PCT application No. PCT/JP2019/035567, filed Sep. 10, 2019, the entire contents of which are incorporated herein by reference.

FIELD

Embodiments described herein relate generally to a memory device.

BACKGROUND

Memory devices capable of non-volatile storage of data are known. For such memory devices, a three-dimensional memory structure is a subject of study for enhanced integration and increased capacity.

BRIEF DESCRIPTION OF THE DRAWINGS

FIG. 3 is a top plan view of the memory cell array of the memory device according to the first embodiment.

FIG. 4 is a sectional view of the memory cell array, taken along the line IV-IV indicated in FIG. 3.

FIG. 6 is a sectional view of the memory cell array as an illustration for explaining a process for producing the memory device according to the first embodiment.

FIG. 7 is a sectional view of the memory cell array, taken along the line VII-VII indicated in FIG. 6.

FIG. 9 is a sectional view of the memory cell array, taken along the line IX-IX indicated in FIG. 8.

FIG. 13 is a sectional view of the memory cell array, taken along the line XIII-XIII indicated in FIG. 12.

FIG. 14 is a sectional view of the memory cell array as an illustration for explaining a process for producing the memory device according to the first embodiment.

FIG. 23 is a sectional view of the memory cell array as an illustration for explaining a process for producing the memory device according to the second embodiment.

FIG. 25 is a sectional view of the memory cell array as an illustration for explaining a process for producing the memory device according to the second embodiment.

FIG. 26 is a sectional view of the memory cell array, taken along the line XXVI-XXVI indicated in FIG. 25.

FIG. 28 is a sectional view of the memory cell array, taken along the line XXVIII-XXVIII indicated in FIG. 27.

FIG. 29 is a sectional view of the memory cell array as an illustration for explaining a process for producing the memory device according to the second embodiment.

FIG. 30 is a sectional view of the memory cell array, taken along the line XXX-XXX indicated in FIG. 29.

FIG. 32 is a sectional view of the memory cell array as an illustration for explaining a process for producing the memory device according to the second embodiment.

FIG. 35 is a sectional view of a memory cell array as an illustration for explaining a process for producing a memory device according to a second modification of the second embodiment.

FIG. 36 is a sectional view showing a structure of a memory cell array of a memory device according to a third embodiment.

FIG. 39 is a sectional view of the memory cell array, taken along the line XXXIX-XXXIX indicated in FIG. 38.

FIG. 40 is a sectional view of the memory cell array as an illustration for explaining a process for producing the memory device according to the third embodiment.

FIG. 41 is a sectional view of the memory cell array, taken along the line XLI-XLI indicated in FIG. 40.

FIG. 42 is a sectional view of the memory cell array as an illustration for explaining a process for producing the memory device according to the third embodiment.

FIG. 43 is a sectional view of the memory cell array, taken along the line XLIII-XLIII indicated in FIG. 42.

FIG. 44 is a sectional view of the memory cell array as an illustration for explaining a process for producing the memory device according to the third embodiment.

FIG. 47 is a sectional view of the memory cell array, taken along the line XLVII-XLVII indicated in FIG. 46.

FIG. 49 is a sectional view of the memory cell array as an illustration for explaining a process for producing the memory device according to the third embodiment.

FIG. 51 is a sectional view of the memory cell array, taken along the line LI-LI indicated in FIG. 49.

FIG. 52 is a sectional view of the memory cell array as an illustration for explaining a process for producing the memory device according to the third embodiment.

FIG. 53 is a sectional view of the memory cell array as an illustration for explaining a process for producing the memory device according to the third embodiment.

FIG. 54 is a sectional view of the memory cell array as an illustration for explaining a process for producing the memory device according to the third embodiment.

FIG. 55 is a sectional view of the memory cell array as an illustration for explaining a process for producing the memory device according to the third embodiment.

FIG. 56 is a sectional view of a memory cell array as an illustration for explaining a process for producing a memory device according to a first modification of the third embodiment.

FIG. 57 is a sectional view of a memory cell array as an illustration for explaining a process for producing a memory device according to a second modification of the third embodiment.

FIG. 59 is a sectional view of the memory cell array as an illustration for explaining a process for producing the memory device according to the fourth embodiment.

FIG. 65 is a sectional view of the memory cell array as an illustration for explaining a process for producing the memory device according to the fourth embodiment.

FIG. 67 is a sectional view of a memory cell array as an illustration for explaining a process for producing a memory device according to a second modification of the fourth embodiment.

FIG. 68 is a circuit diagram showing a memory cell array of a memory device according to a fifth embodiment.

FIG. 69 is a top plan view of the memory cell array of the memory device according to the fifth embodiment.

FIG. 70 is a sectional view of the memory cell array, taken along the line LXX-LXX indicated in FIG. 69.

FIG. 73 is a sectional view of the memory cell array as an illustration for explaining a process for producing the memory device according to the fifth embodiment.

FIG. 75 is a sectional view of the memory cell array as an illustration for explaining a process for producing the memory device according to the fifth embodiment.

FIG. 80 is a sectional view of the memory cell array as an illustration for explaining a process for producing the memory device according to the fifth embodiment.

FIG. 81 is a sectional view of the memory cell array, taken along the line LXXXI-LXXXI indicated in FIG. 80.

FIG. 85 is a sectional view of the memory cell array, taken along the line LXXXV-LXXXV indicated in FIG. 84.

FIG. 88 is a sectional view of the memory cell array as an illustration for explaining a process for producing the memory device according to the fifth embodiment.

FIG. 92 is a sectional view of the memory cell array as an illustration for explaining a process for producing the memory device according to the fifth embodiment.

FIG. 93 is a sectional view of the memory cell array, taken along the line XCIII-XCIII indicated in FIG. 92.

FIG. 96 is a sectional view of the memory cell array as an illustration for explaining a process for producing the memory device according to the fifth embodiment.

DETAILED DESCRIPTION

In general, according to one embodiment, a memory device includes a first conductor and a charge storage film extending along a first direction crossing a surface of a substrate; a first semiconductor of a first conductive type; a second semiconductor and a third semiconductor each of a second conductive type; and a first stack comprising a second conductor, a first insulator, and a third conductor sequentially stacked along the first direction and each extending along a second direction in a first plane parallel to the surface of the substrate. The first conductor, the charge storage film, the first semiconductor, and the first stack are above the substrate and arranged in this order along a third direction crossing the second direction in the first plane. The second semiconductor is in contact with the first semiconductor and the second conductor, between the second conductor or the first insulator and the charge storage film. The third semiconductor is in contact with the first semiconductor and the third conductor, between the third conductor or the first insulator and the charge storage film.

The embodiments will now be described with reference to the drawings. Each embodiment will exemplify devices and methods for embodying the technical idea of the invention. The drawings are schematic or conceptual, and it is not a requisite that the dimensions, scales, etc., read from each drawing conform to actual products. The technical idea of the invention is not bound by particular component shapes, structures, arrangements, etc.

The description will use the same reference signs for the features or components having the same or substantially the same functions and/or configurations. Numerals may be added after reference sign-constituting characters in order to differentiate between elements that are denoted by a reference sign of the same characters and that have substantially the same configurations. When it is not required to differentiate between elements denoted by a reference sign of the same characters, the description will basically refer to each of such elements using only the reference sign of the same characters.

Also, the description may occasionally assume a size or a diameter of a layer, which may be taken as an average outer size or an average outer diameter of cross-sections of the layer that are parallel to the plane of lamination of the layer. When the description assumes a center of a cross-section of a layer, such a center may be taken as a gravity center of the cross-section.

1. First Embodiment

A memory device according to the first embodiment will be described.

1.1. Configuration

First, a description will be given of a configuration of the memory device according to the first embodiment.

1.1.1 Memory Device

Figure 1:
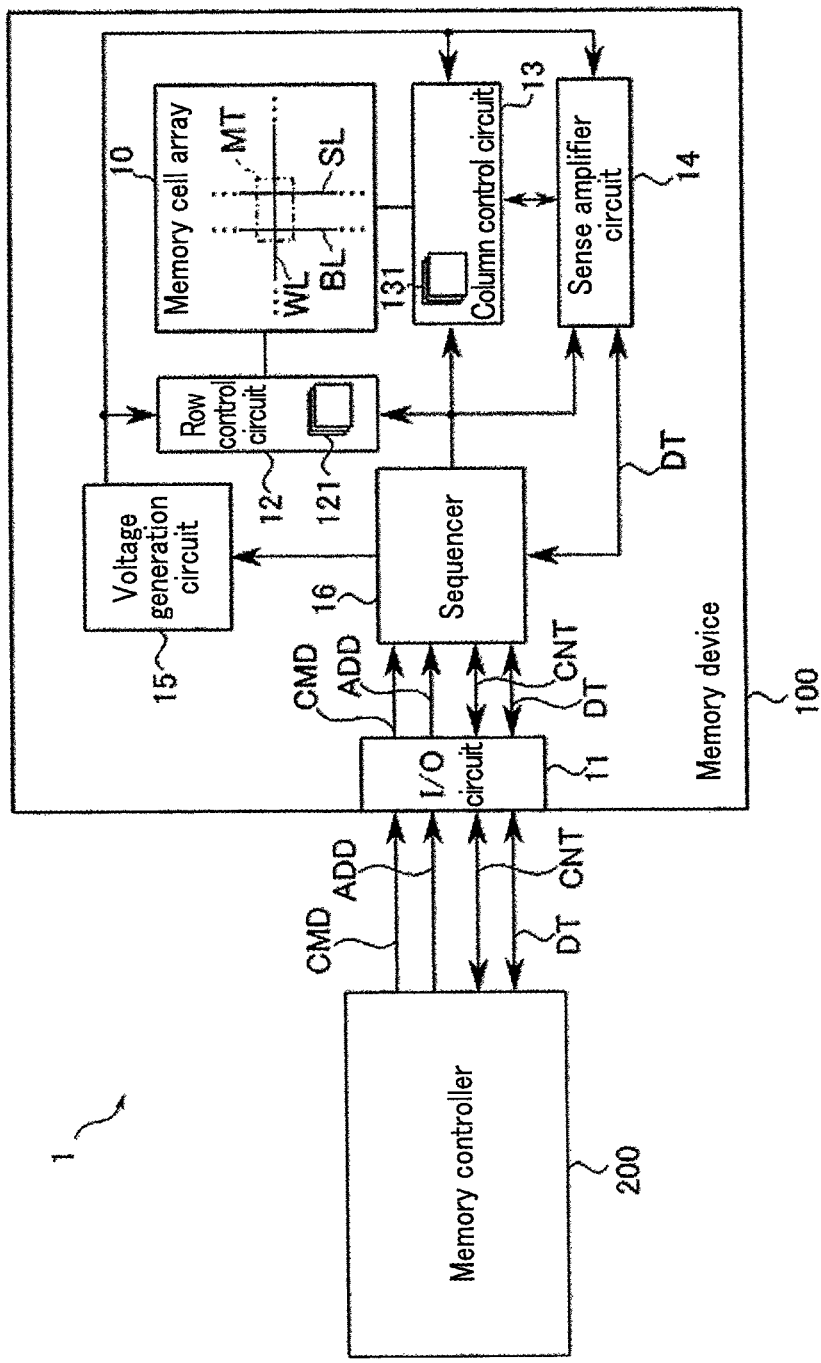
FIG. 1 is a block diagram showing a configuration of a memory system that embraces a memory device according to a first embodiment.

FIG. 1 is a block diagram for explaining a configuration of a memory system that embraces the memory device according to the first embodiment.

As shown in FIG. 1, a memory system 1 includes a memory device 100 as the memory device according to the embodiment, and a memory controller 200 adapted to control the memory device 100. The memory device 100 includes a NOR flash memory which is capable of storing data in a non-volatile manner. The memory system 1 is connected to, for example, a host device (not illustrated) such as a processor.

The memory controller 200 directs the memory device 100 for operations such as write, read, and erase of data. At the time of performing such operations, the memory controller 200 generates a command CMD corresponding to the respective operation and sends the command CMD to the memory device 100 together with an address ADD of a target of the operation. For example, in a write operation, the memory controller 200 sends a command CMD for the write operation, an address ADD of the write target, and also data DT to be written (write data DT), to the memory device 100. In a read operation, the memory controller 200 sends a command CMD for the read operation and an address ADD of the read target to the memory device 100, and receives from the memory device 100 data DT that has been read (read data DT) there. The memory controller 200 also communicates control signals CNT with the memory device 100.

The memory device 100 includes, for example, a memory cell array 10, an input/output circuit (I/O circuit) 11, a row control circuit 12, a column control circuit 13, a sense amplifier circuit 14, a voltage generation circuit 15, and a sequencer 16.

The memory cell array 10 includes multiple memory cell transistors MT each uniquely associated with a set of a row and a column. More specifically, the memory cell transistors MT in the same row are coupled to the same (global) word line WL, and the memory cell transistors MT in the same column are coupled to the same (global) bit line BL and source line SL which form a pair. The memory cell array 10 has a three-dimensional structure in which the multiple memory cell transistors MT are stacked in a direction perpendicular to the surface of a substrate.

The input/output circuit 11 receives a command CMD, an address ADD, data DT, and a control signal CNT from the memory controller 200, and transfers them to the sequencer 16. Also, the input/output circuit 11 receives data DT and a control signal NCT from the sequencer 16, and sends them to the memory controller 200.

The row control circuit 12 includes, for example, a row decoder (not illustrated), word line drivers 121, etc., and controls voltage application to the word lines WL based on the result of decoding the address ADD (row address). In an exemplary configuration, the word line drivers 121 are provided individually for the respective word lines WL.

The column control circuit 13 includes, for example, bit line drivers 131, source line drivers (not illustrated), a column decoder (not illustrated), etc., and controls voltage application to the bit lines BL and the source lines SL based on the result of decoding the address ADD (column address). In an exemplary configuration, the bit line drivers 131 and the source line drivers are provided individually for the respective bit lines BL and the respective source lines SL. The source line drivers may be omitted when a configuration is adopted where the intended operations are performed with the source lines SL placed in a floating state.

The sense amplifier circuit 14, in read operations, senses a threshold voltage of the memory cell transistor MT to read data from the memory cell transistor MT based on the result of this sensing. The sense amplifier circuit 14 is also adapted so that it can supply given voltages to the bit lines BL and the source lines SL in the course of, for example, a write operation and an erase operation.

The voltage generation circuit 15 generates voltages of various values according to operations to be performed, and feeds them to the row control circuit 12, the column control circuit 13, and the sense amplifier circuit 14.

The sequencer 16 performs total control over the operations of the memory device 100. In an exemplary configuration, the sequencer 16 includes a command decoder and a register circuit (both unillustrated), and controls each of the applicable circuits 11 to 15 based on the result of decoding a command CMD so that an operation according to the command CMD is performed. The sequencer 16 also controls, based on a control signal CNT, the operational timing for each of the circuits 11 to 15 and the timing to transfer the signals between the memory device 100 and the memory controller 200.

1.1.2 Circuit Configuration of Memory Cell Array

Figure 2:
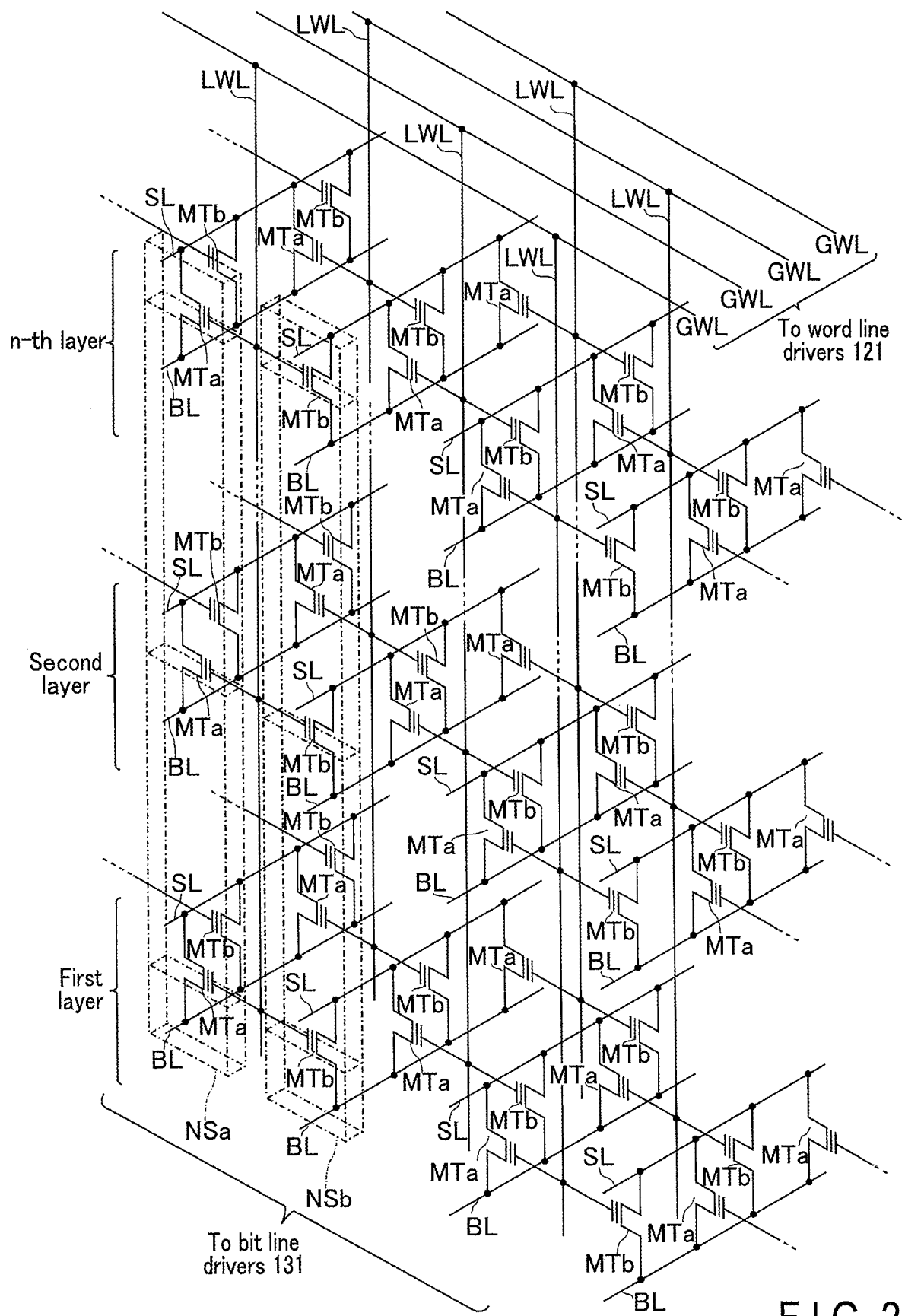
FIG. 2 is a circuit diagram showing a memory cell array of the memory device according to the first embodiment.

FIG. 2 is a circuit diagram, which is used as one example for explaining a configuration of the memory cell array of the memory device according to the first embodiment.

In the memory cell array 10 as shown in FIG. 2, multiple memory cell transistors MT are provided as well as multiple word lines WL (which may be called "global word lines GWL" below), multiple bit lines BL, and multiple source lines SL. The multiple global word lines GWL are each connected with multiple local word lines LWL. The multiple global word lines GWL each receive a voltage supply from the corresponding word line driver 121, and the multiple bit lines BL each receive a voltage supply from the corresponding bit line driver 131. One memory cell transistor MT is uniquely specified by a set that is constituted by a column-associated bit line BL and source line SL pair and a row-associated global word line GWL.

More specifically, multiple memory cell transistors MT associated with the same column are connected in parallel with each other between a given bit line BL and a given source line SL. These memory cell transistors MT associated with the same column are associated with different rows, respectively. In other words, the multiple memory cell transistors MT connected in parallel with each other between the pair of a bit line BL and a source line SL have their gates connected to different global word lines GWL via different local word lines LWL, respectively.

Each of the multiple global word lines GWL has common connections to the gates of the respective memory cell transistors MT associated with the same row. These memory cell transistors MT associated with the same row are associated with different columns, respectively. In other words, the multiple memory cell transistors MT having their respective gates connected to one common global word line GWL are each connected between the respective pair of a bit line BL and a source line SL that differ from the pairs of bit lines and source lines for the other memory cell transistors MT.

Note that, as mentioned above, the memory cell array 10 according to the embodiment has a three-dimensional stacking structure in which the memory cell transistors MT are provided in different layers along the direction crossing the surface of the substrate (Z direction). FIG. 2 shows an exemplary instance where n layers (n being a natural number) for the memory cell transistors MT are stacked in the Z direction as a partial circuit configuration of the memory cell array 10.

In this instance, one local word line LWL has common connections to, in each layer, the gates of two respective memory cell transistors MT among the multiple memory cell transistors MT associated with the same row, and thus, to the gates of 2n respective memory cell transistors MT in total among the multiple memory cell transistors MT associated with the same row. For the sake of explanation, the description herein refers to the two memory cell transistors MT having their gates connected to a common local word line LWL in the same layer as "MTa" and "MTb", on an as-needed basis for differentiation. According to the instance shown in FIG. 2, the multiple memory cell transistors MT connected between a given pair of a bit line BL and a source line SL are provided in such a manner that the memory cell transistors MTa and MTb are alternately arranged along the sequence of rows. Also, the description will refer to, among the 2n memory cell transistors MT having their gates connected to a common local word line LWL, the group of n memory cell transistors MTa as a "string NSa" and the group of n memory cell transistors MTb as a "string NSb".

The above configuration allows for the selection of a single memory cell transistor MT through the selection of one global word line GWL and one pair of a bit line BL and a source line SL.

1.1.3 Structure of Memory Cell Array

An exemplary structure of the memory cell array of the memory device according to the first embodiment will be described.

Note that, in the drawings which will be referred to below, the plane along the surface of a semiconductor substrate is assumed to be an X-Y plane, and the direction crossing the X-Y plane conforms to the Z direction. It is also assumed that the directions crossing each other in the X-Y plane conform to the X direction and the Y direction. The plan views use hatching as appropriate for better viewability. Hatching in the plan views is not necessarily related to materials or properties of the hatched subjects or components. The sectional views omit components such as insulators (interlayer insulating films), interconnects, contacts, etc., as appropriate for easier understanding.

FIG. 3 is a plan view for explaining a planar layout of the memory cell array of the memory device according to the first embodiment. FIG. 3 schematically shows, as one example, a region of the memory cell array 10 viewed from above, where the memory cell transistors MT are formed beneath (i.e., a cell region).

As shown in FIG. 3, the memory cell array 10 includes, for example, multiple stacks STK, multiple structures MP, multiple contacts CP, and multiple global word lines GWL.

The multiple stacks STK extend along the Y direction and are arranged along the X direction.

The multiple structures MP, each having a rectangular profile when viewed from above, are arranged along the Y direction between two stacks STK next to each other. The structure MP includes a local word line LWL (not illustrated)

and is electrically connected to the corresponding global word line GWL via the respective contact CP. The multiple global word lines GWL each extend along the X direction and have a common connection to the multiple local word lines LWL corresponding to the respective structures MP arranged along the X direction. The multiple structures MP, arranged between two stacks STK, are mutually separated from one another by intervening insulating structures INS. A region of contact between the structure MP and the stack STK is a portion functioning as a string NS. Note that the example shown in FIG. 3 assumes the contacting portion between one structure MP and its left-sided stack STK to be the string NSa, and the contacting portion between one structure MP and its right-sided stack STK to be the string NSb.

While FIG. 3 illustrates an exemplary staggered arrangement pattern for the structures MP, the arrangement of the structures MP is not limited to this, and may adopt a matrix pattern, etc.

FIG. 4 shows an exemplary sectional structure of the memory cell array 10 shown in FIG. 3, assuming that the array is cut along the line IV-IV. That is, FIG. 4 illustrates, in section, four stacks STK arranged along the X direction, two structures INS and one structure MP each provided between applicable ones of these stacks STK, and the contact CP and the global word line GWL connected to the local word line LWL in the structure MP. By way of example, FIG. 4 shows the memory cell array 10 of a case where four layers each as a structural portion for the memory cell transistors MT are stacked along the Z direction.

As shown in FIG. 4, the memory cell array 10 is provided above a semiconductor substrate 20 via an insulator (not illustrated). There are, for example, the row control circuit 12, the column control circuit 13, and the sense amplifier circuit 14 disposed within the insulator between the semiconductor substrate 20 and the memory cell array 10.

Concretely, in the memory cell array 10 shown in FIG. 4, the stack STK, the structure INS, the stack STK, the structure MP, the stack STK, the structure INS, and the stack STK are arranged in this order along the X direction. The multiple stacks STK arranged along the X direction have equivalent structures.

The stack STK includes a stacking structure constituted by conductors 21 and 22 alternately stacked with an intervening insulator (not illustrated) as many times as the number of memory cell transistors MT stacked in the Z direction (4 times in the example shown in FIG. 4). As discussed above, the multiple stacks STK arranged along the X direction are separated from each other by the structure INS or MP. As such, the multiple sets of conductors 21 and 22 arranged along the X direction in the same layer, as well as the multiple sets of conductors 21 and 22 arranged along the Z direction in different layers, can each be subjected to individual control for electrical potential, independent of other sets, and each correspond to one of the multiple bit line BL and source line SL pairs associated with different columns. The conductors 21 and 22 may contain, for example, a metal such as tungsten (W), molybdenum (Mo), or the like, and may be covered by a barrier metal such as titanium nitride (TiN), tungsten nitride (WN), or the like.

The structure MP extends along the Z direction from the height (level) comparable with the lower end of the stack STK to the height comparable with the upper end of the stack STK. Specifically, the structure MP includes a conductor 30 which serves as the local word line LWL, and a tunnel insulating film 33, a charge storage film 32, and a block insulating film 31 which together serve as a lamination film TCB.

The conductor 30 is provided at the substantial center of the structure MP and includes, for example, a portion of a rectangular prism shape that extends along the Z direction. The upper end of the conductor 30 reaches the upper end of the structure MP, and the lower end of the conductor 30 is below the upper surface of the lowermost conductor 21. The conductor 30 may contain, for example, a metal such as tungsten, molybdenum, or the like, and may be covered by a barrier metal such as titanium nitride, tungsten nitride, or the like.

The four side surfaces and lower surface of the conductor 30 are wholly covered by the block insulating film 31, the charge storage film 32, and the tunnel insulating film 33 disposed in this order. Accordingly, the lamination film TCB has four side surfaces extending along the Z direction. Also, the lamination film TCB for the multiple memory cell transistors MTa formed in different layers within one structure MP, and the lamination film TCB for the multiple memory cell transistors MTb formed similarly within the same structure MP are constituted by one continuous film. The tunnel insulating film 33 contains, for example, silicon oxide ($SiO_2$), and the charge storage film 32 contains, for example, silicon nitride (SiN). The block insulating film 31 includes a film of a high dielectric (high-k) substance such as silicon oxide, alumina, etc., or may be a lamination of such films.

The conductor 30, on its upper surface, is provided with a conductor 23 which serves as the contact CP. There is a conductor 24 serving as the global word line GWL on an upper surface of the conductor 23.

The structure INS includes an insulator 25. The insulator 25 contains, for example, silicon oxide and extends along the Z direction from the height comparable with the lower end of the stack STK to the height comparable with the upper end of the stack STK.

There are semiconductors 34 and 35 extending along the Y direction and arranged along the X direction with an intervening insulator (not illustrated), between the conductors 21 and 22 in each layer within the stack STK. The semiconductors 34 and 35 each contact the multiple structures MP which are arranged along the Y direction and the multiple structures INS which are arranged along the Y direction as well.

The semiconductors 34 and 35 include, for example, polysilicon containing a p-type impurity (dopant) such as boron (B). The semiconductor 34 has a portion 34a in contact with the left portion of the structure MP (according to the illustration), and this portion 34a functions as a channel of the memory cell transistor MTa. The semiconductor 35 has a portion 35b in contact with the right portion of the structure MP (according to the illustration), and this portion 35b functions as a channel of the memory cell transistor MTb. For the sake of explanation, the description will refer to one of the semiconductors 34 and 35 that is in contact with the left portion of the structure MP or the structure INS (according to the illustration) as the "semiconductor 34", and the one that is in contact with the right portion of the structure MP or the structure INS (according to the illustration) as the "semiconductor 35".

In each layer within the stack STK, a semiconductor 36 contacting the semiconductor 34 and the conductor 21, and a semiconductor 37 contacting the semiconductor 35 and the conductor 21 are provided between the structure MP or the structure INS and the conductor 21. Also, a semiconductor 38 contacting the semiconductor 34 and the conductor 22, and a semiconductor 39 contacting the semiconductor 35 and the conductor 22 are provided between the structure MP or the structure INS and the conductor 22. The semiconductors 36 to 39 extend along the Y direction and include, for example, polysilicon containing an n-type impurity such as phosphorus (P), arsenic (As), etc. The semiconductor 36 has a portion 36a in contact with the semiconductor 34a, and the semiconductor 38 has a portion 38a in contact with the semiconductor 34a. These portions 36a and 38a each function as a source or a drain of the memory cell transistor MTa. The semiconductor 37 has a portion 37b in contact with semiconductor 35b, and the semiconductor 39 has a portion 39b in contact with the semiconductor 35b. These portions 37b and 39b each function as a source or a drain of the memory cell transistor MTb.

According to such constitution, the semiconductors 34a, 36a, and 38a, the portion of the lamination film TCB that is proximate to the semiconductor 34a, and the conductors 21, 22, and 30 together form one memory cell transistor MTa. Also, the semiconductors 35b, 37b, and 39b, the portion of the lamination film TCB that is proximate to the semiconductor 35b, and the conductors 21, 22, and 30 together form one memory cell transistor MTb. Here, the memory cell transistors MTa and MTb, formed in the four respective layers for one structure MP as described above (in the example shown in FIG. 4, four memory cell transistors MTa and four memory cell transistors MTb), constitute one string NSa and one string NSb as the respective groups.

1.2 Method for Producing Memory Device

An example of a process for producing the memory cell array of the memory device according to the first embodiment will be described. FIGS. 5 to 16 each show an example of a sectional structure that includes a structural part corresponding to the memory cell array and that is formed in the course of the process for producing the memory device according to the first embodiment. Note that the sectional views which will be referred to for the production process include a cross-section vertical to the surface of the semiconductor substrate 20. Also, regions indicated in each sectional view for the production process step correspond to the regions indicated in FIGS. 3 and 4.

Figure 5:
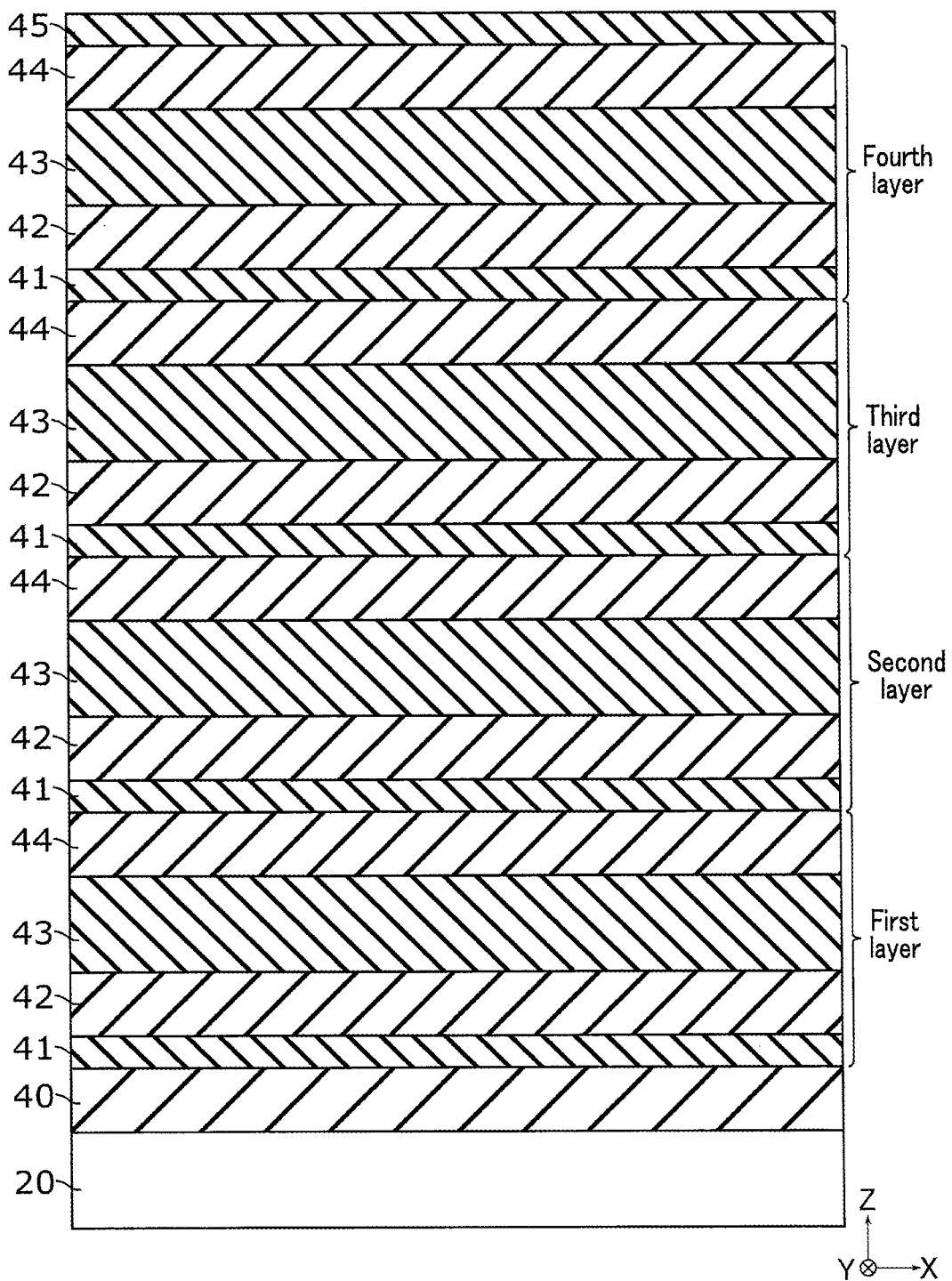
FIG. 5 is a sectional view of the memory cell array as an illustration for explaining a process for producing the memory device according to the first embodiment.

First, as shown in FIG. 5, a structure that will become the multiple stacks STK is formed.

More specifically, the process begins with forming an insulator 40 on the semiconductor substrate 20, and thereafter stacking on this insulator 40 an insulator 41, a sacrificial member 42, an insulator 43, and a sacrificial member 44 in this order. Stacking this set of the insulator 41, the sacrificial member 42, the insulator 43, and the sacrificial member 44 is repeated as many times as the number of layers (in this example, 4 times). The insulator 41 contains, for example, silicon oxide added with carbon (C), and the insulator 43 contains, for example, silicon oxide. With the carbon additive, the insulator 41 can have a smaller etching rate than the insulator 43 without a carbon additive, in the selective etching operations for oxides. The sacrificial members 42 and 44 contain, for example, silicon nitride. The insulator 41, the sacrificial member 42, the insulator 43, and the sacrificial member 44 may each have a thickness of, for example, 10 to 100 nanometers (nm). The film formation in this process step may use, for example, plasma chemical vapor deposition (PCVD).

Next, as shown in FIG. 6, each region intended for forming the structure MP or INS is removed from the structure that has been formed on the insulator 40, so as to form multiple slits SLT. More specifically, a lithography operation is performed first to form a mask with open regions each corresponding to the structure MP or INS. Anisotropic etching is performed using the formed mask so that the multiple slits SLT are formed. The lower end of each slit SLT reaches, for example, the insulator 40. The anisotropic etching in this process step may be, for example, reactive ion etching (RIE).

FIG. 7 is a sectional view of the memory cell array 10, taken along the line VII-VII indicated in FIG. 6. As shown in FIG. 7, the process step has formed a line-and-space shape in which the portion corresponding to the stack STK and including the insulator 43, and the slit SLT are alternately arranged along the X direction. Thus, the structure formed in the process step of FIG. 5 is divided into multiple separate portions along the X direction.

Figure 8:
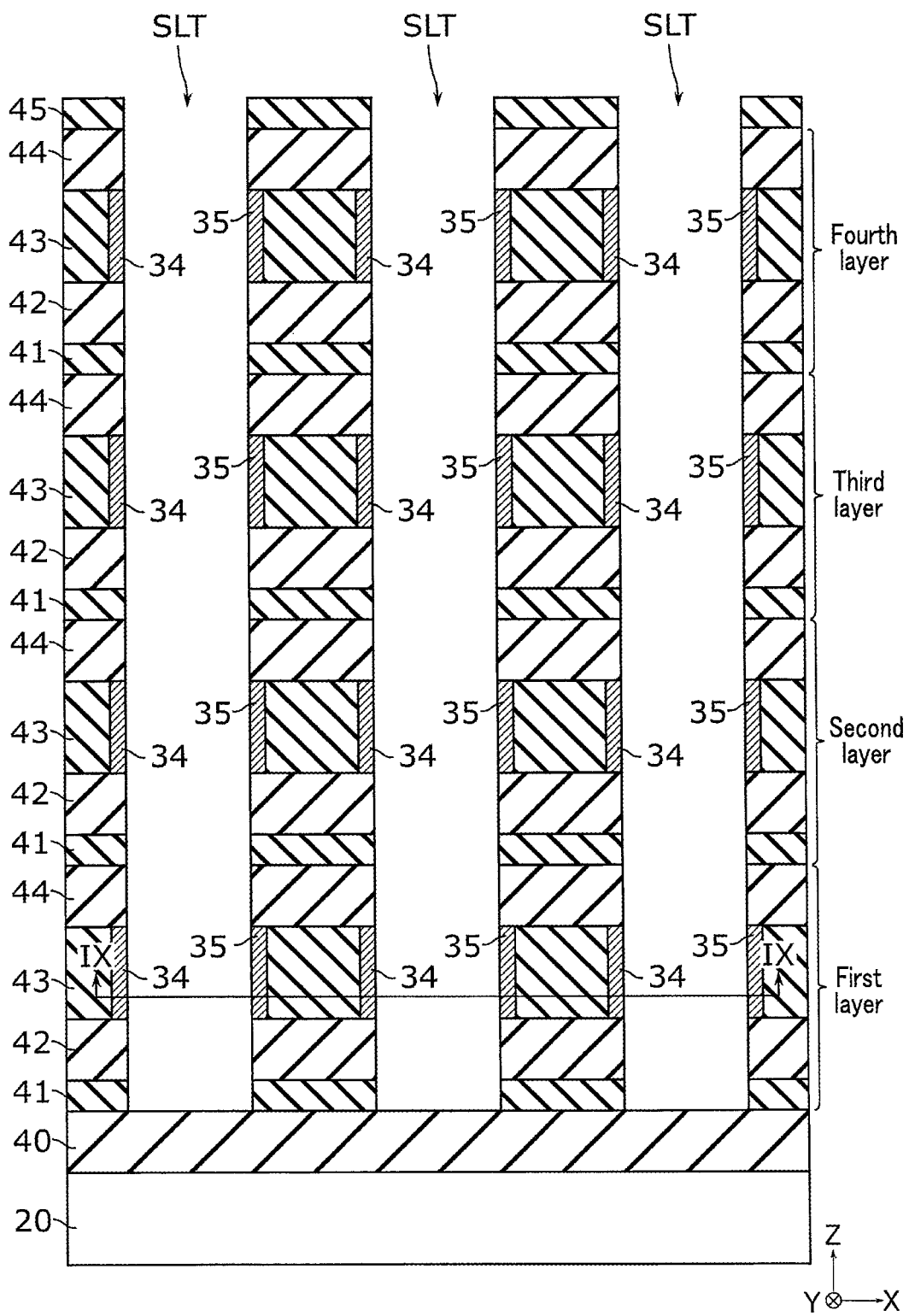
FIG. 8 is a sectional view of the memory cell array as an illustration for explaining a process for producing the memory device according to the first embodiment.

Next, as shown in FIG. 8, semiconductors 34 and 35 are formed for each layer in each slit SLT.

More specifically, portions of the insulator 43 that are exposed in the slit SLT are selectively removed by wet etching. Since the insulator 41 has a smaller etching rate than the insulator 43 as discussed above, the etching in this process step forms recesses at the heights of the insulators 43 in the slit SLT, such that in each recess, the upper surface of the sacrificial member 42 and the lower surface of the sacrificial member 44 are exposed along the X direction. The recesses each have a depth of, for example, about 10 nanometers (nm).

Subsequently, a semiconductor film (amorphous silicon or polysilicon) containing a p-type impurity is formed over the entire surface to fill the recesses. The film formation in this process step may use, for example, low-pressure (LP) CVD. This semiconductor film is then dry-etched in an anisotropic manner until the stacked members other than the insulator 43 are exposed in the slit SLT. The semiconductors 34 and 35 are thus formed in the recesses formed for each layer in the multiple slits SLT. Note that if the semiconductor film adopts amorphous silicon, the semiconductors 34 and 35 may be turned to polysilicon as their final form by a later heat treatment step.

FIG. 9 is a sectional view of the memory cell array 10, taken along the line IX-IX indicated in FIG. 8. As shown in FIG. 9, the process step has formed the semiconductors 34 and 35 extending along the Y direction in each slit SLT and covering the insulator 43.

Figure 10:
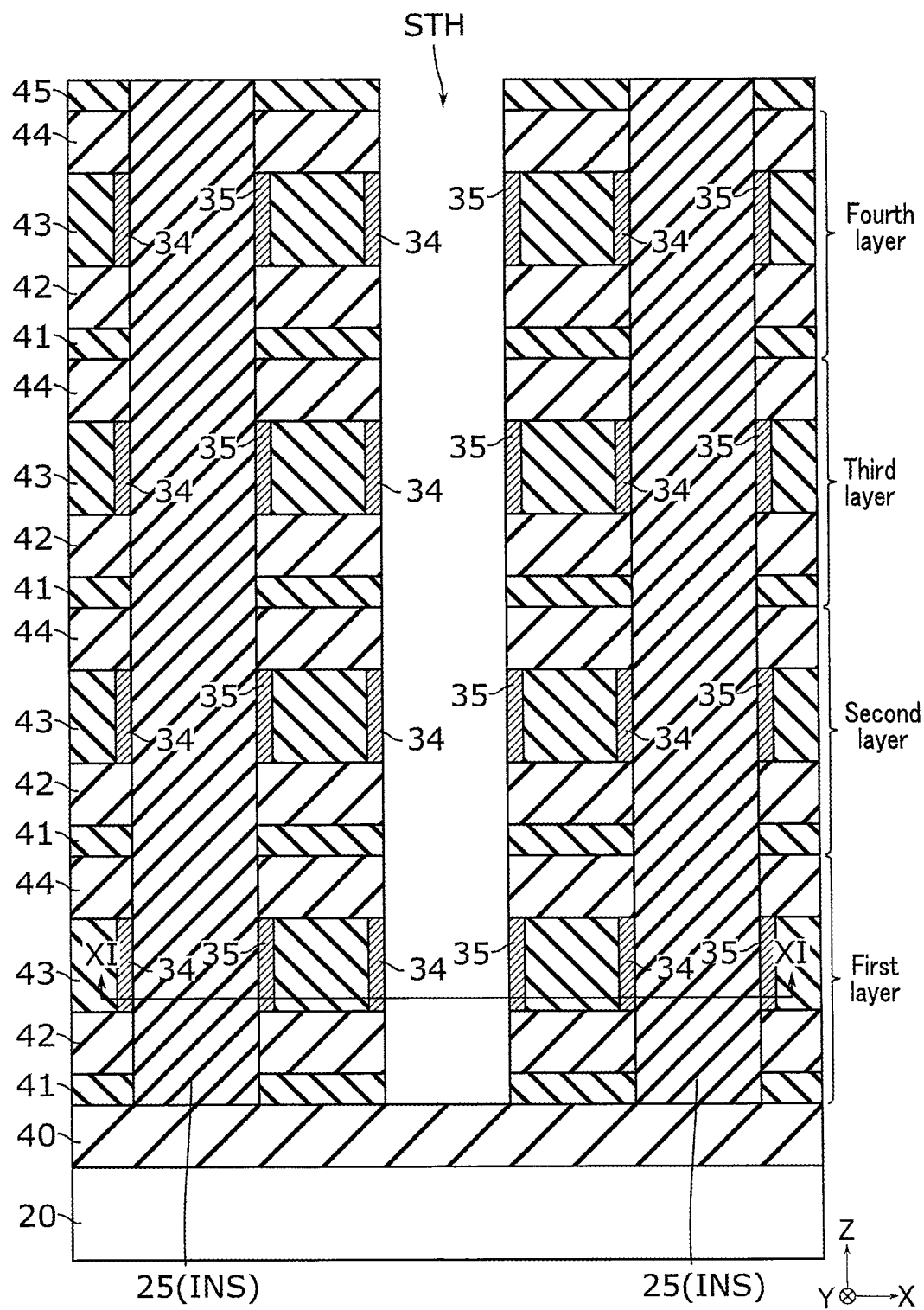
FIG. 10 is a sectional view of the memory cell array as an illustration for explaining a process for producing the memory device according to the first embodiment.

Next, as shown in FIG. 10, multiple structures INS are formed in the respective slits SLT. More specifically, an insulating film is provided over the entire surface to fill the multiple slits SLT. The film formation in this process step may use, for example, PCVD or LPCVD. Chemical mechanical polishing (CMP) is then performed for overall flatness, and an operation thereafter (for example, a combination of lithography and anisotropic etching) removes the portions corresponding to the regions for forming the structures MP from the insulating film. The insulators 25 corresponding to the structures INS are thus formed.

Figure 11:
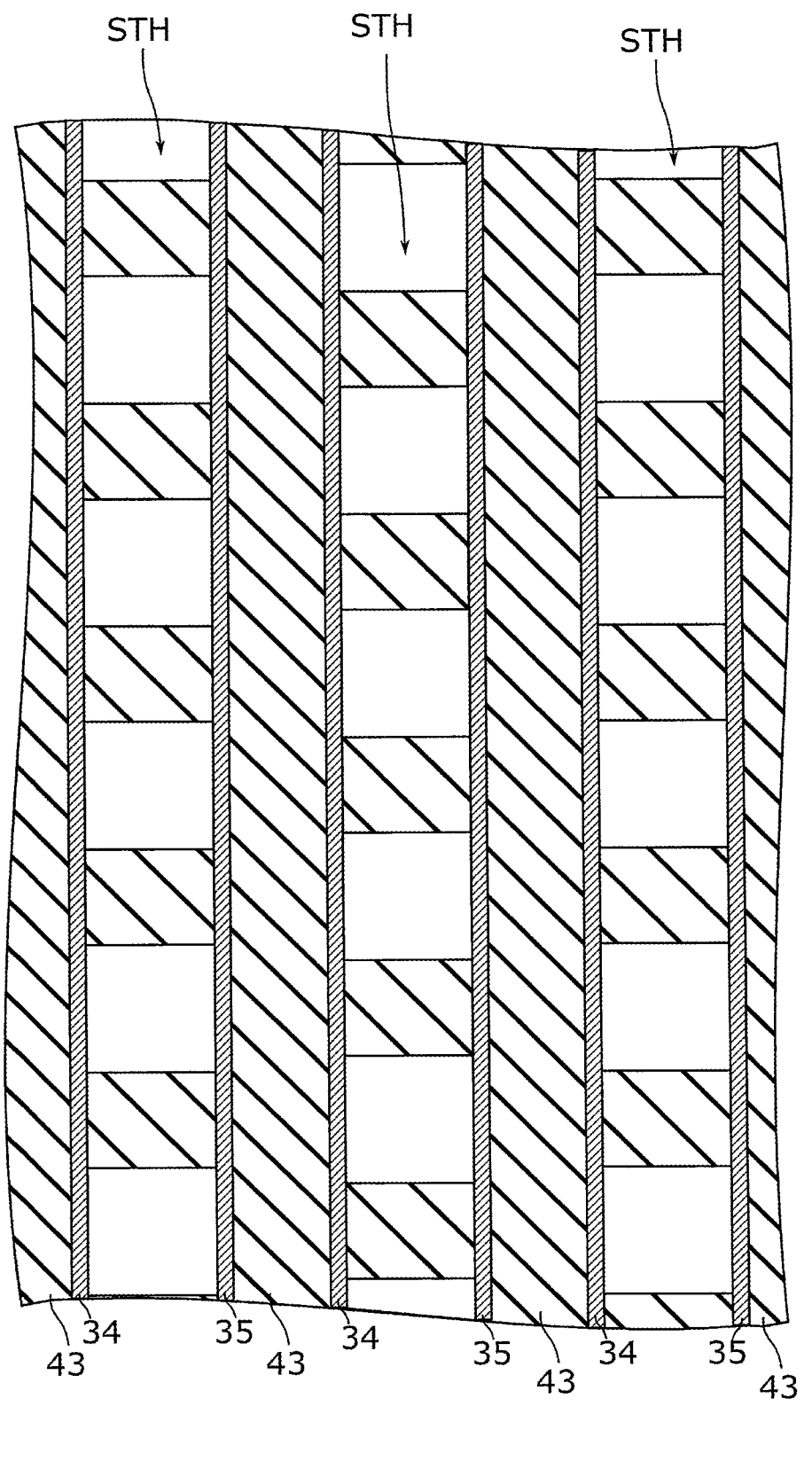
FIG. 11 is a sectional view of the memory cell array, taken along the line XI-XI indicated in FIG. 10.

FIG. 11 is a sectional view of the memory cell array 10, taken along the line XI-XI indicated in FIG. 10. As shown in FIG. 11, the process step has formed multiple holes STH along the Y direction and separated from one another by the applicable insulators 25, between the stack structures each including the insulator 43.

Figure 12:
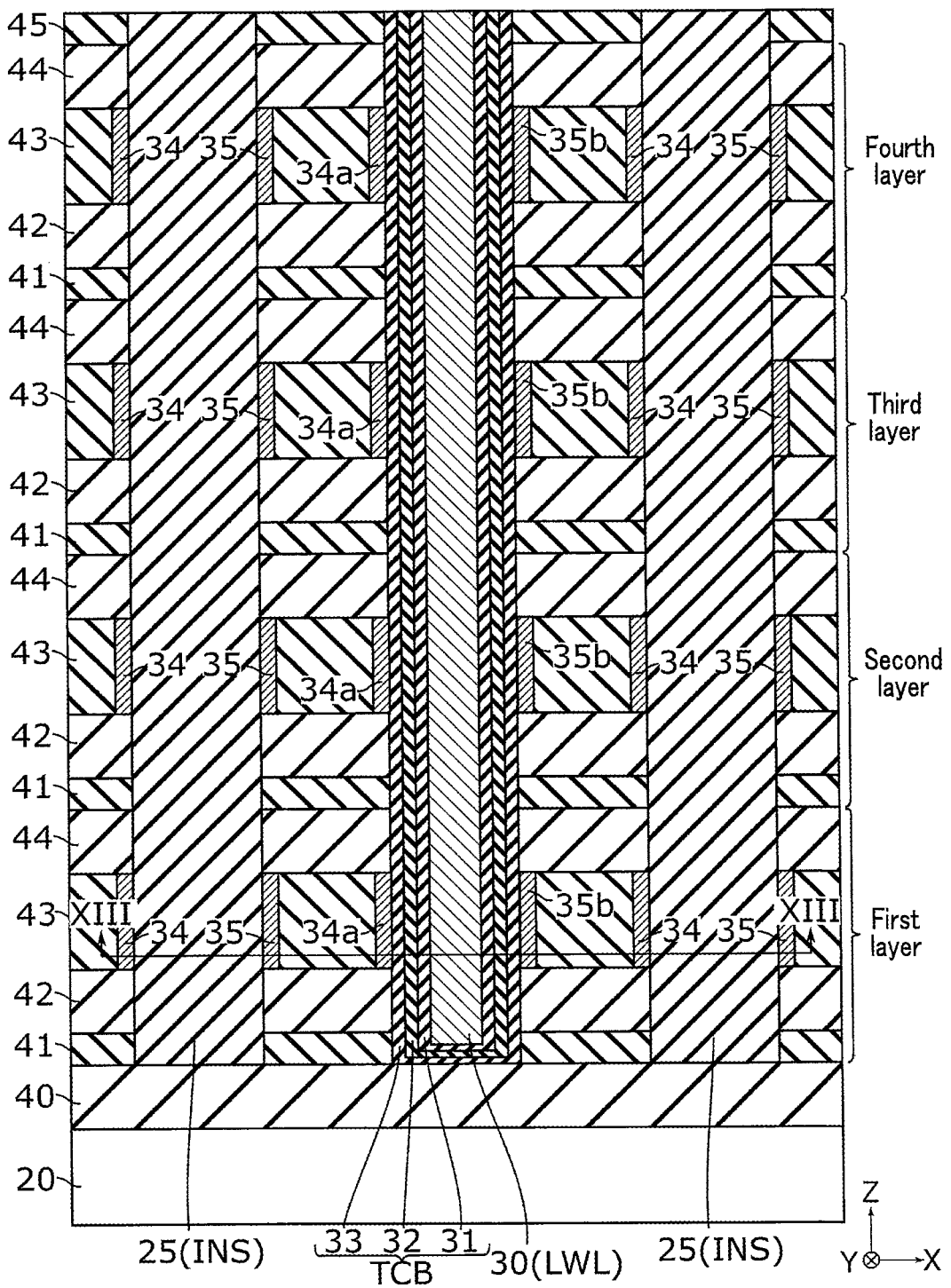
FIG. 12 is a sectional view of the memory cell array as an illustration for explaining a process for producing the memory device according to the first embodiment.

Next, as shown in FIG. 12, a structure MP is formed in each of the holes STH. More specifically, a tunnel insulating film 33, a charge storage film 32, and a block insulating film 31 are formed in this order in each hole STH. The film formation in this process step may use, for example, LPCVD, and the films 31 to 33 each have a thickness of about several nanometers (nm). A conductor 30 is subsequently formed in each hole STH. The film formation in this process step may use, for example, LPCVD or PCVD.

FIG. 13 is a sectional view of the memory cell array 10, taken along the line XIII-XIII indicated in FIG. 12. As shown in FIG. 13, the process step has formed one structure MP in each hole STH. One semiconductor 34 extending along the Y direction contacts each of the multiple structures MP arranged along the Y direction via the respective portion 34a, and one semiconductor 35 extending along the Y direction contacts each of the multiple structures MP arranged along the Y direction via the respective portion 35b.

Next, as can be seen from FIG. 14, one or more holes (not illustrated) penetrating through all the sacrificial members 42 and 44 stacked along the Z direction are formed to expose the sacrificial members 42 and 44. The sacrificial members 42 and 44 are then selectively removed by wet etching or dry etching via the holes. This exposes both ends of the semiconductors 34 and 35 in the Z direction.

Figure 15:
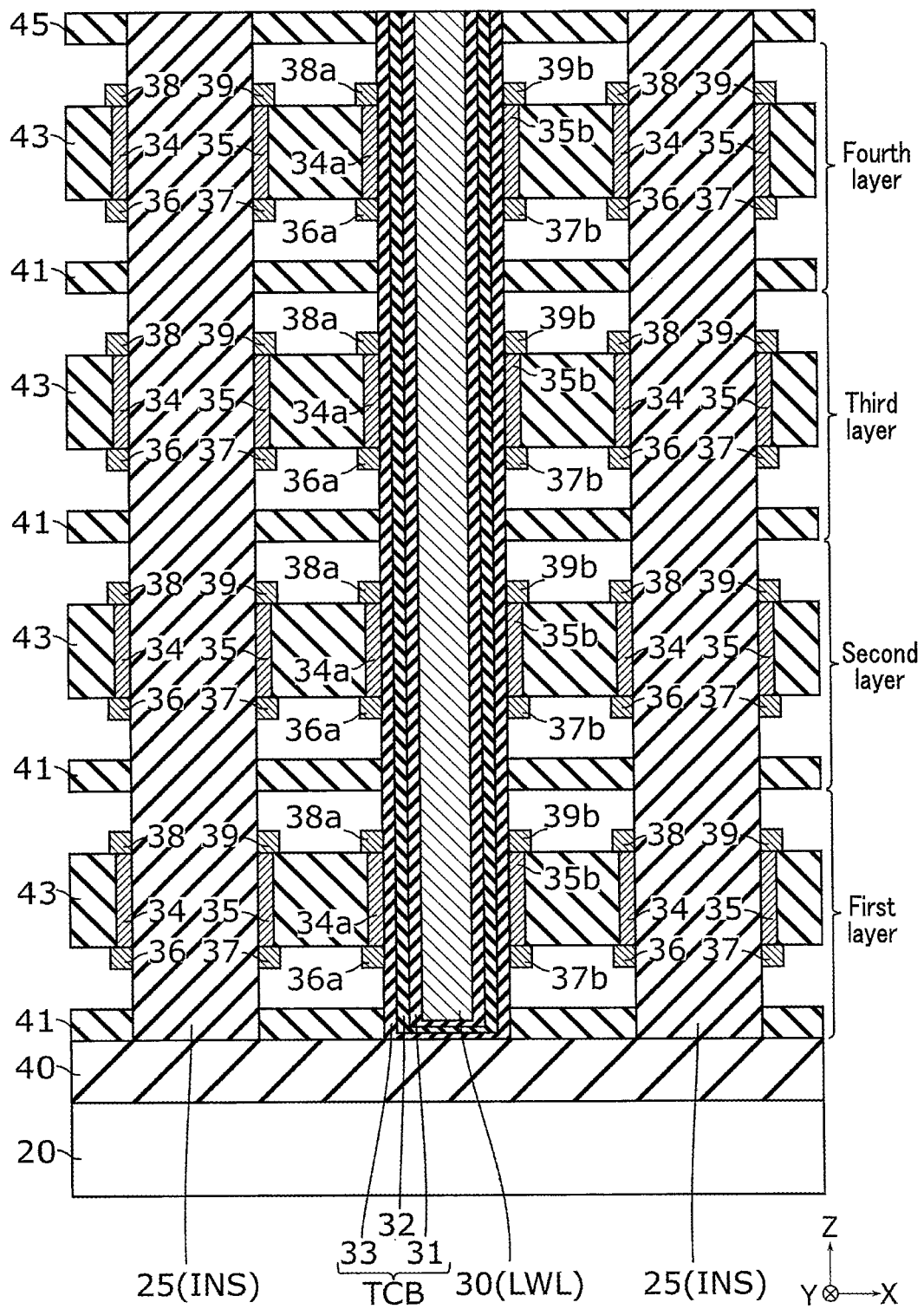
FIG. 15 is a sectional view of the memory cell array as an illustration for explaining a process for producing the memory device according to the first embodiment.

Next, as shown in FIG. 15, the exposed portions of the semiconductors 34 and 35 are subjected to selective growth of n-type impurity-containing polysilicon. This forms semiconductors 36 (36a) and 38 (38a) covering the respective lower and upper ends of the semiconductor 34 (34a) in the Z direction, and semiconductors 37 (37b) and 39 (39b) covering the respective lower and upper ends of the semiconductor 35 (35b) in the Z direction. The selective growth in this process step may use, for example, LPCVD.

The semiconductors 36 to 39 contain, for example, an n-type impurity at a high concentration of $1E20/cm^3$ or more, and each have a thickness of several nanometers to several tens of nanometers. Since the semiconductors 36 and 38 selectively grow on the semiconductor 34, and the semiconductors 37 and 39 selectively grow on the semiconductor 35 as described above, they can be formed so that the semiconductors 36 and 38 are separate from each other and the semiconductors 37 and 39 are separate from each other.

Figure 16:
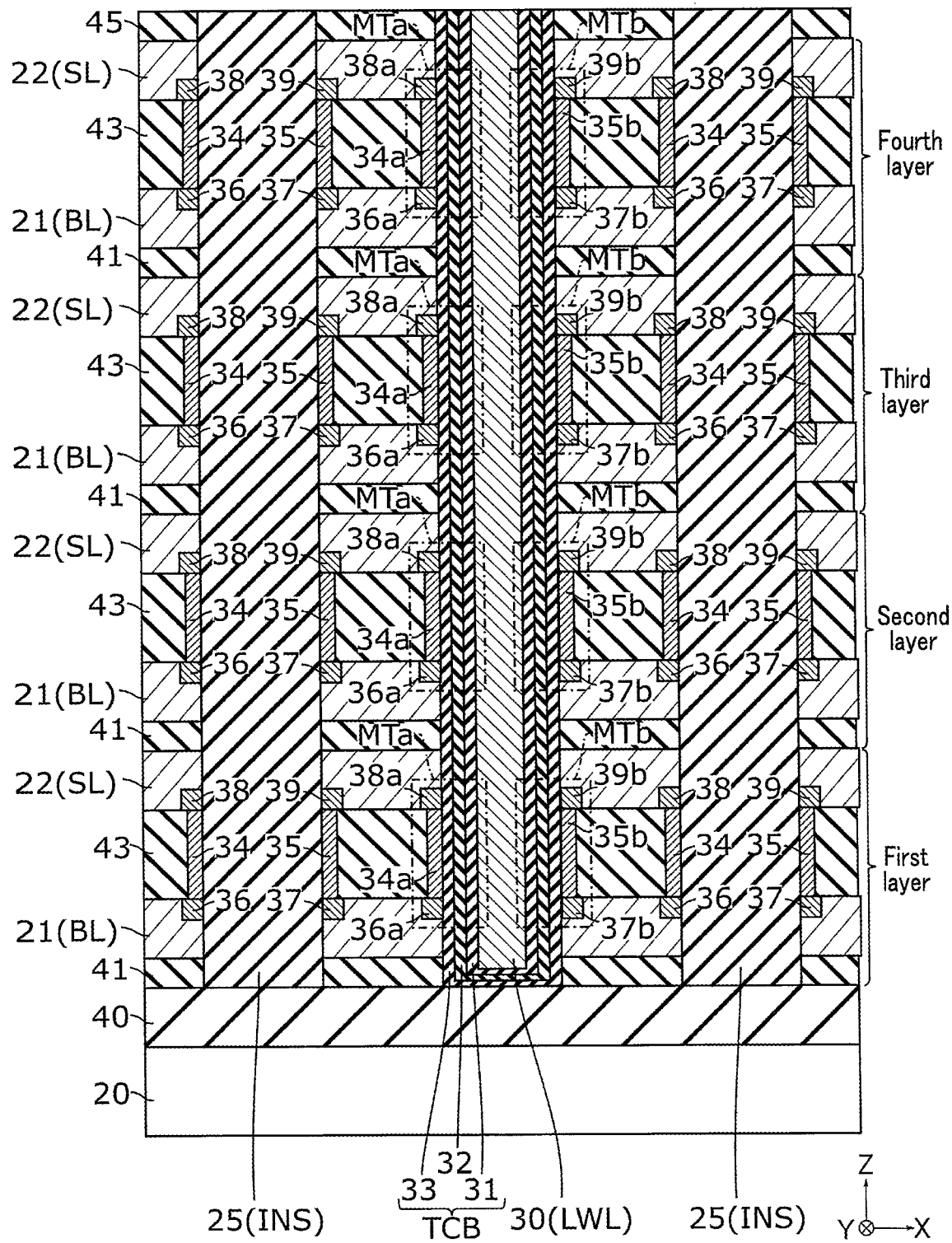
FIG. 16 is a sectional view of the memory cell array as an illustration for explaining a process for producing the memory device according to the first embodiment.

Next, as shown in FIG. 16, the conductors 21 are formed in the spaces created by the removal of the sacrificial members 42, and the conductors 22 are formed in the spaces created by the removal of the sacrificial members 44. The film formation in this process step may use, for example, LPCVD or PCVD.

By the process steps described above, the multiple, three-dimensionally stacked memory cell transistors MTa and MTb are formed. Thereafter, a step of forming conductors 23 and 24, a step of forming contacts to the conductors 21 and 22 and to various circuitry components formed in the insulator 40, a heat treatment step, etc. are performed so that the memory cell array 10 is formed.

Note that the production process described above is only an example. It is possible to adopt modifications such as inserting other processes between the process steps and changing the order of the steps as long as a problem does not occur.

1.3 Effects of Embodiment

According to the configuration of the first embodiment, effects including suppression of increase in size of the memory cell array can be obtained. These effects will be described.

For a stack STK to be formed, four members, i.e., the insulator 41, the sacrificial member 42 corresponding to the conductor 21, the insulator 43, and the sacrificial member 44 corresponding to the conductor 22, are stacked along the Z direction for each layer. The semiconductors 34 and 35 each functioning as a channel of a memory cell transistor MT are formed by removing portions of the insulator 43 along the X direction. The semiconductors 36 and 37, and also the semiconductors 38 and 39, each functioning as a source or a drain of a memory cell transistor MT are formed by the selective growth that is caused through the spaces created by the removal of the sacrificial members 42 and 44 and from the respective semiconductors 34 and 35 exposed in these spaces.

Accordingly, when the insulator 41, the sacrificial member 42, the insulator 43, and the sacrificial member 44 are stacked, it is not necessary to dispose film members corresponding to the semiconductors 36 and 37 between the sacrificial member 42 and the insulator 43, and it is not necessary to dispose film members corresponding to the semiconductors 38 and 39 between the sacrificial member 44 and the insulator 43, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

1.4 Modifications

The foregoing first embodiment tolerates various modifications. The description will basically concentrate on aspects of the configuration and the production process that differ from the first embodiment.

1.4.1 First Modification

The first embodiment has assumed the instances where the semiconductors 36 to 39 are formed by causing n-type impurity-containing semiconductor films to selectively grow on the semiconductors 34 and 35, but this is not a limitation. For example, each n-type impurity-containing semiconductor film may be formed as a continuous film on the inner walls that define the space after the removal of the sacrificial member 42 or 44.

Figure 17:
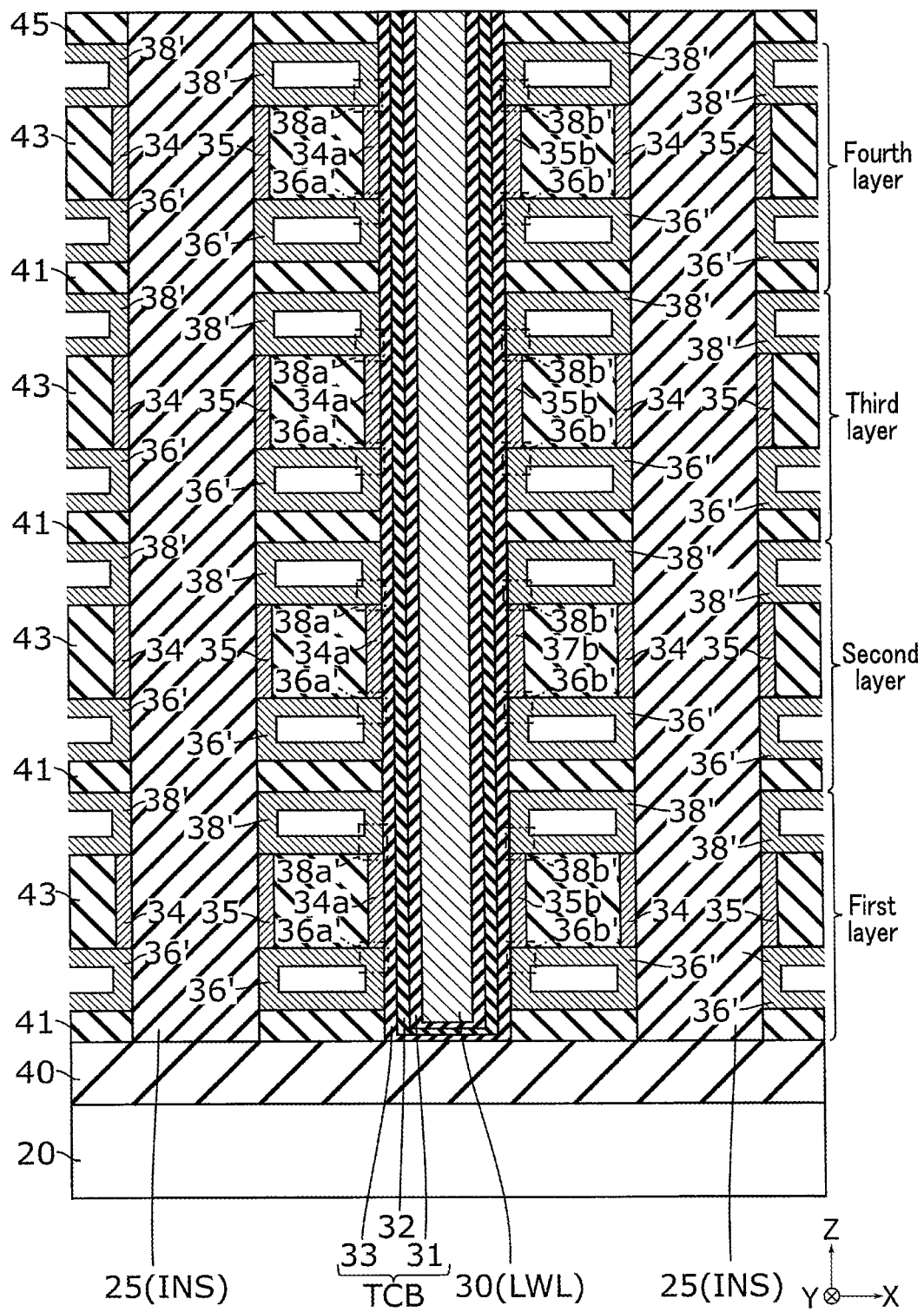
FIG. 17 is a sectional view of a memory cell array as an illustration for explaining a process for producing a memory device according to a first modification of the first embodiment.

FIG. 17 is one example of a sectional structure that includes a structural part corresponding to the memory cell array and that is formed in the course of the process for producing the memory device according to the first modification of the first embodiment. FIG. 17 corresponds to the first embodiment shown in FIG. 15.

As shown in FIG. 17, a semiconductor 36' is formed on the inner walls that define the space after the removal of the sacrificial member 42, and a semiconductor 38' is formed on the inner walls that define the space after the removal of the sacrificial member 44. The film formation in this process step may use, for example, LPCVD.

The semiconductors 36' and 38' contain, for example, amorphous silicon or polysilicon that contains an n-type impurity at a high concentration of $1E20/cm^3$ or more, and each have a thickness of several nanometers to several tens of nanometers. Since the semiconductors 36' and 38' are each formed as a continuous film on the inner walls that surround the space after the removal of the sacrificial member 42 or 44 as described above, the formed semiconductors 36' and 38' each have a tubular profile when viewed in the Y direction. The semiconductor 36' contacts the lower ends of the corresponding semiconductors 34 and 35, and the semiconductor 38' contacts the upper ends of the corresponding semiconductors 34 and 35. The semiconductors 36' and 38' contact the side surfaces of the corresponding conductors 21 and 22, respectively.

Accordingly, a portion 36a' of the semiconductor 36', which is in contact with the semiconductor 34a, and a portion 38a' of the semiconductor 38', which is in contact with the semiconductor 34a, each function as a source or a drain of the memory cell transistor MTa. A portion 36b' of the semiconductor 36', which is in contact with the semiconductor 35b, and a portion 38b' of the semiconductor 38', which is in contact with the semiconductor 35b, each function as a source or a drain of the memory cell transistor MTb.

According to the first modification of the first embodiment, the semiconductors 36' and 38' are formed on the inner walls surrounding the spaces created by the removal of the respective sacrificial members 42 and 44, and such film formation is uniformly done by, for example, LPCVD. Subsequently, the spaces inside the semiconductors 36' and 38' are filled with the conductors 21 and 22, respectively.

Therefore, as in the first embodiment, when the insulator 41, the sacrificial member 42, the insulator 43, and the sacrificial member 44 are stacked, it is not necessary to dispose film members corresponding to the semiconductor 36' between the sacrificial member 42 and the insulator 43, and it is not necessary to dispose film members corresponding to the semiconductor 38' between the sacrificial member 44 and the insulator 43, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

1.4.2 Second Modification

The foregoing first embodiment and its first modification have assumed the instances where n-type impurity-containing semiconductor films are formed in the spaces created by the removal of the sacrificial members 42 and 44, but this is not a limitation. For example, n-type impurity-containing semiconductor films may be formed by doping portions of the semiconductors 34 and 35 with n-type impurities.

Figure 18:
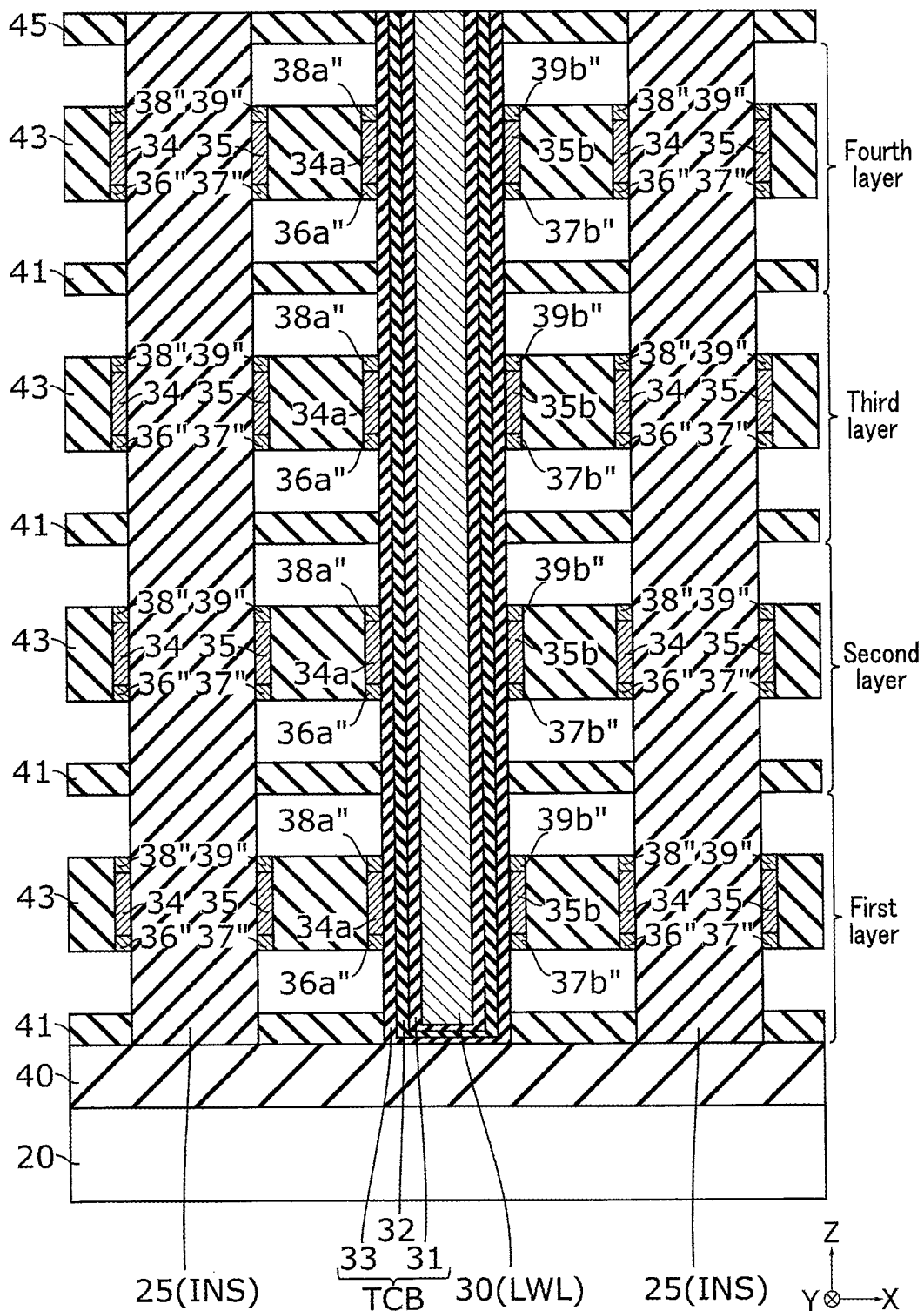
FIG. 18 is a sectional view of a memory cell array as an illustration for explaining a process for producing a memory device according to a second modification of the first embodiment.

FIG. 18 is one example of a sectional structure that includes a structural part corresponding to the memory cell array and that is formed in the course of the process for producing the memory device according to the second modification of the first embodiment. FIG. 18 corresponds to the first embodiment shown in FIG. 15.

In the example shown in FIG. 18, vapor-phase diffusion is conducted to cause n-type impurities to diffuse into the lower end regions of the semiconductors 34 and 35 which are exposed in the spaces created by the removal of the sacrificial member 42, and into the upper end regions of the semiconductors 34 and 35 which are exposed in the spaces created by the removal of the sacrificial member 44. The diffusion of the n-type impurities takes place in the range of, for example, several nanometers (nm) to 20 nanometers (nm) from the upper and lower ends of each of the semiconductors 34 and 35. Consequently, a lower portion 36a" of the semiconductor 34, which is in contact with the semiconductor 34a and the conductor 21, and an upper portion 38a" of the semiconductor 34, which is in contact with the semiconductor 34a and the conductor 22, are provided between the insulator 43 and the lamination film TCB. These portions 36a" and 38a" contain more n-type impurities than p-type impurities, and each function as a source or a drain of the memory cell transistor MTa. Similarly, a lower portion 37b" of the semiconductor 35, which is in contact with the semiconductor 35b and the conductor 21, and an upper portion 39b" of the semiconductor 35, which is in contact with the semiconductor 35b and the conductor 22, are provided between the insulator 43 and the lamination film TCB. These portions 37b" and 39b" contain more n-type impurities than p-type impurities, and each function as a source or a drain of the memory cell transistor MTb.

According to the second modification of the first embodiment, the semiconductors 36" and 37" are formed by the vapor-phase diffusion of n-type impurities into the semiconductors 34 and 35 exposed in the spaces after the removal of the sacrificial member 42, and the semiconductors 38" and 39" are formed by the vapor-phase diffusion of n-type impurities into the semiconductors 34 and 35 exposed in the spaces after the removal of the sacrificial member 44. Subsequently, the spaces after the removal of the sacrificial members 42 and 44 are filled with the conductors 21 and 22, respectively.

Therefore, as in the first embodiment, when the insulator 41, the sacrificial member 42, the insulator 43, and the sacrificial member 44 are stacked, it is not necessary to dispose film members corresponding to the semiconductors 36" and 37" between the sacrificial member 42 and the insulator 43, and it is not necessary to dispose film members corresponding to the semiconductors 38" and 39" between the sacrificial member 44 and the insulator 43, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

2. Second Embodiment

Next, a memory device according to the second embodiment will be described. The first embodiment has assumed the instances where the p-type impurity-containing semiconductors 34 and 35 are formed separately from each other between the two structures (MP or INS). The second embodiment differs from the first embodiment in that a p-type impurity-containing semiconductor provided between the two structures (MP or INS) is formed as a continuous film. The description will basically omit the configuration and production process substantially the same as those of the first embodiment, and concentrate on the configuration and production process that differ from those of the first embodiment.

2.1 Structure of Memory Cell Array

Figure 19:
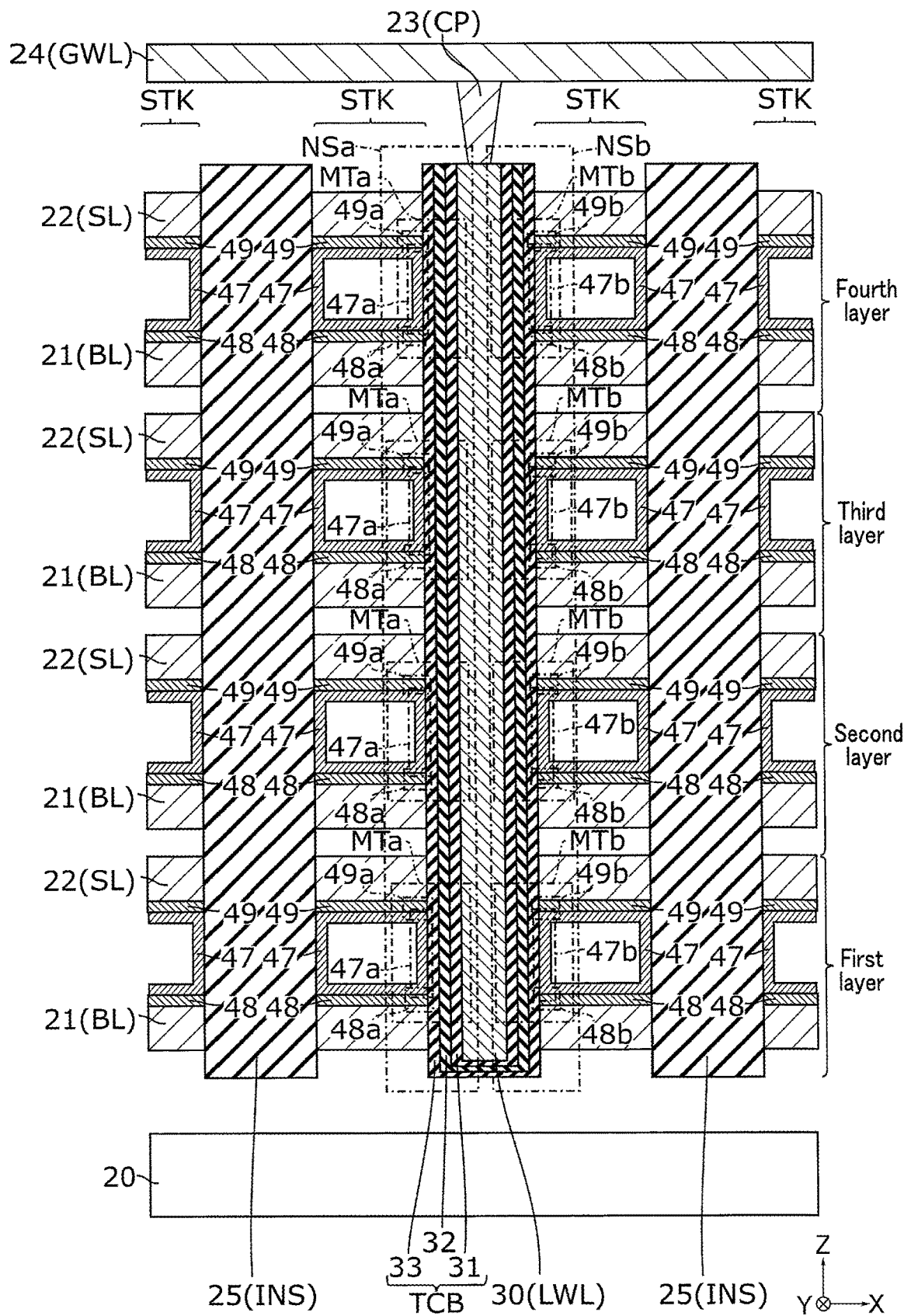
FIG. 19 is a sectional view of a memory cell array of a memory device according to a second embodiment.

FIG. 19 is a sectional view for explaining a structure of the memory cell array of the memory device according to the second embodiment, and corresponds to the first embodiment shown in FIG. 4.

As shown in FIG. 19, there are semiconductors 47 each extending along the Y direction and having a tubular profile surrounding an insulator (not illustrated) when viewed in the Y direction, between the conductors 21 and 22 in each layer within the stack STK. One semiconductor 47 contacts the structures MP and INS that sandwich the semiconductor 47 along the X direction.

The semiconductors 47 include, for example, polysilicon containing a p-type impurity. The semiconductor 47 has a portion 47a in contact with the left portion of the structure MP (according to the illustration), and this portion 47a functions as a channel of the memory cell transistor MTa. The semiconductor 47 has a portion 47b in contact with the right portion of the structure MP (according to the illustration), and this portion 47b functions as a channel of the memory cell transistor MTb.

In each layer within the stack STK, a semiconductor 48 is provided in contact with the lower portion of the semiconductor 47 (that is, the lower side of the tubular profile of the semiconductor 47 as viewed in the Y direction) and the conductor 21. Also, a semiconductor 49 is provided in contact with the upper portion of the semiconductor 47 (that is, the upper side of the tubular profile of the semiconductor 47 as viewed in the Y direction) and the conductor 22. The semiconductors 48 and 49 extend along the Y direction and include, for example, polysilicon containing an n-type impurity. The semiconductor 48 has a portion 48a in contact with the semiconductor 47a, and the semiconductor 49 has a portion 49a in contact with the semiconductor 47a. These portions 48a and 49a each function as a source or a drain of the memory cell transistor MTa. The semiconductor 48 has a portion 48b in contact with the semiconductor 47b, and the semiconductor 49 has a portion 49b in contact with the semiconductor 47b. These portions 48b and 49b each function as a source or a drain of the memory cell transistor MTb. According to such constitution, the semiconductors 47a, 48a, and 49a, the portion of the lamination film TCB that is proximate to the semiconductor 47a, and the conductors 21, 22, and 30 together form one memory cell transistor MTa. Also, the semiconductors 47b, 48b, and 49b, the portion of the lamination film TCB that is proximate to the semiconductor 47b, and the conductors 21, 22, and 30 together form one memory cell transistor MTb.

2.2 Method for Producing Memory Device

An example of a process for producing the memory cell array of the memory device according to the second embodiment will be described. FIGS. 20 to 33 each show an example of a sectional structure that includes a structural part corresponding to the memory cell array and that is formed in the course of the process for producing the memory device according to the second embodiment. Note that the sectional views which will be referred to for the production process include a cross-section vertical to the surface of the semiconductor substrate 20. Also, regions indicated in each sectional view for the production process step correspond to the regions indicated in FIG. 19.

Figure 20:
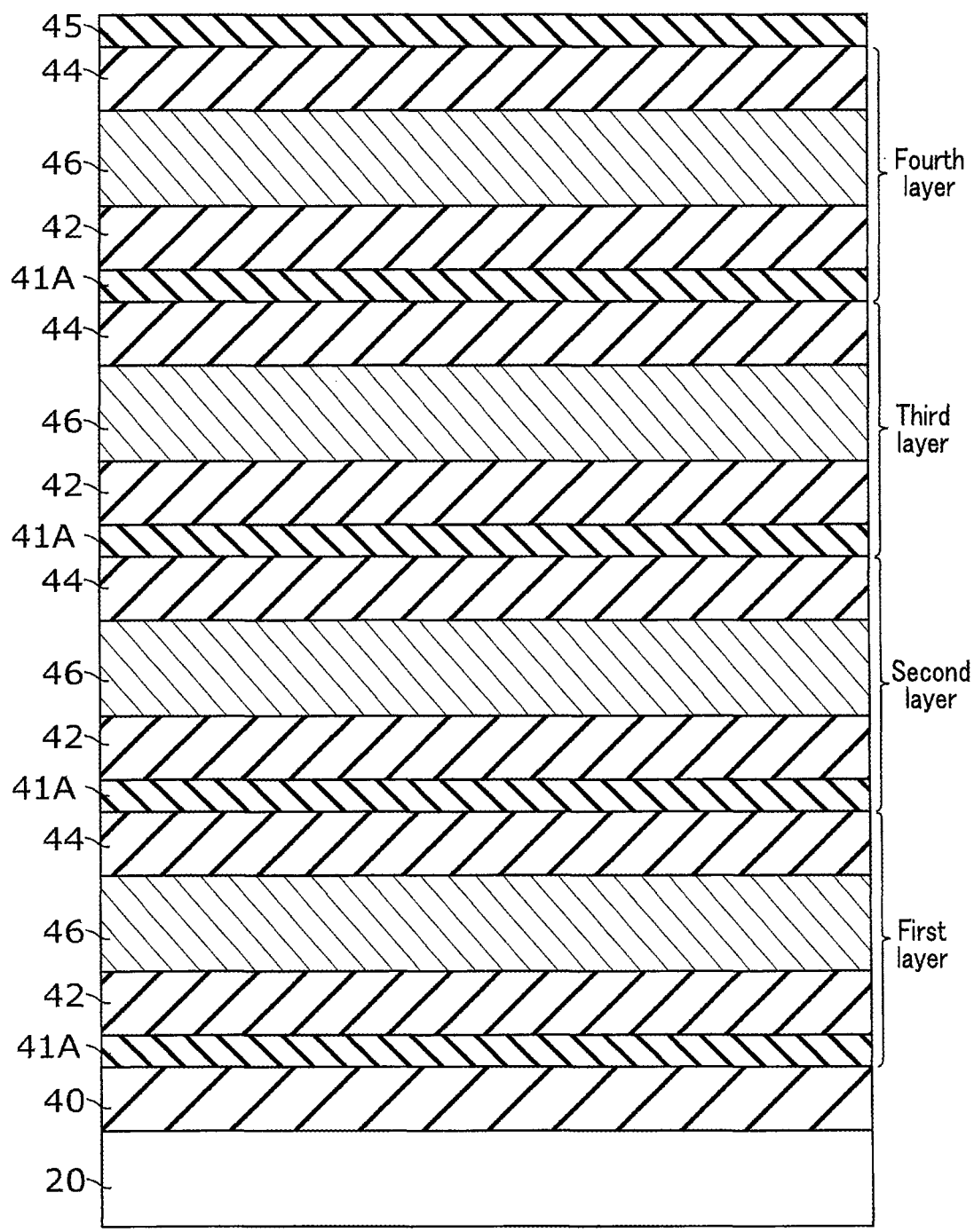
FIG. 20 is a sectional view of the memory cell array as an illustration for explaining a process for producing the memory device according to the second embodiment.

First, as shown in FIG. 20, a structure that will become the multiple stacks STK is formed.

More specifically, the process begins with forming an insulator 40 on the semiconductor substrate 20, and thereafter stacking on this insulator 40 an insulator 41A, a sacrificial member 42, a sacrificial member 46, and a sacrificial member 44 in this order. Stacking this set of the insulator 41A, the sacrificial member 42, the sacrificial member 46, and the sacrificial member 44 is repeated as many times as the number of layers (in this exemplary production process, 4 times). The insulator 41A contains, for example, silicon oxide, and the sacrificial member 46 contains, for example, polysilicon. The insulator 41A, the sacrificial member 42, the sacrificial member 46, and the sacrificial member 44 may each have a thickness of, for example, 10 to 100 nanometers (nm). The film formation in this process step may use, for example, PCVD.

Figure 21:
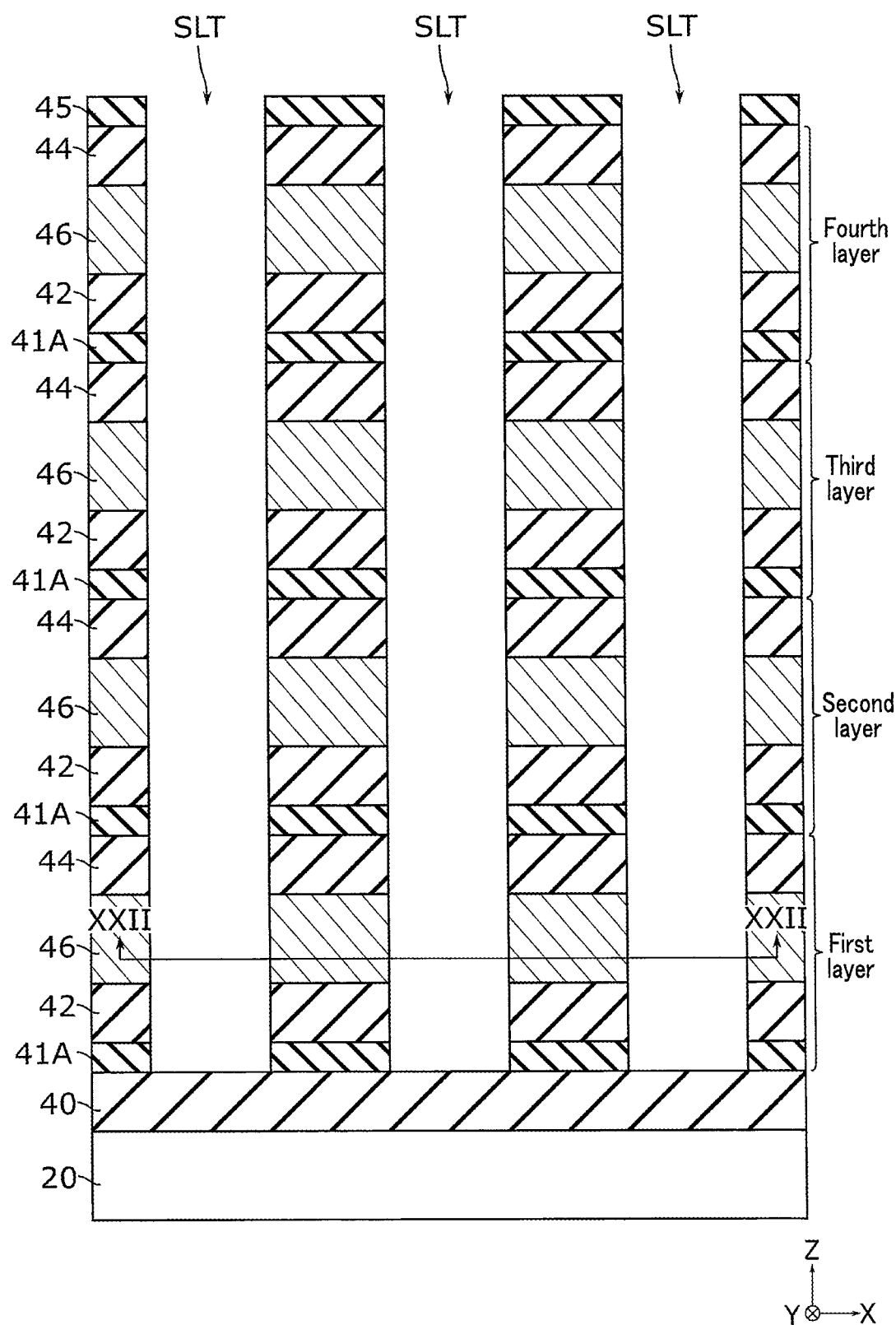
FIG. 21 is a sectional view of the memory cell array as an illustration for explaining a process for producing the memory device according to the second embodiment.

Next, as shown in FIG. 21, lithography and anisotropic etching are conducted to remove each region intended for forming the structure MP or INS from the structure that has been formed on the insulator 40, so that multiple slits SLT are formed.

Figure 22:
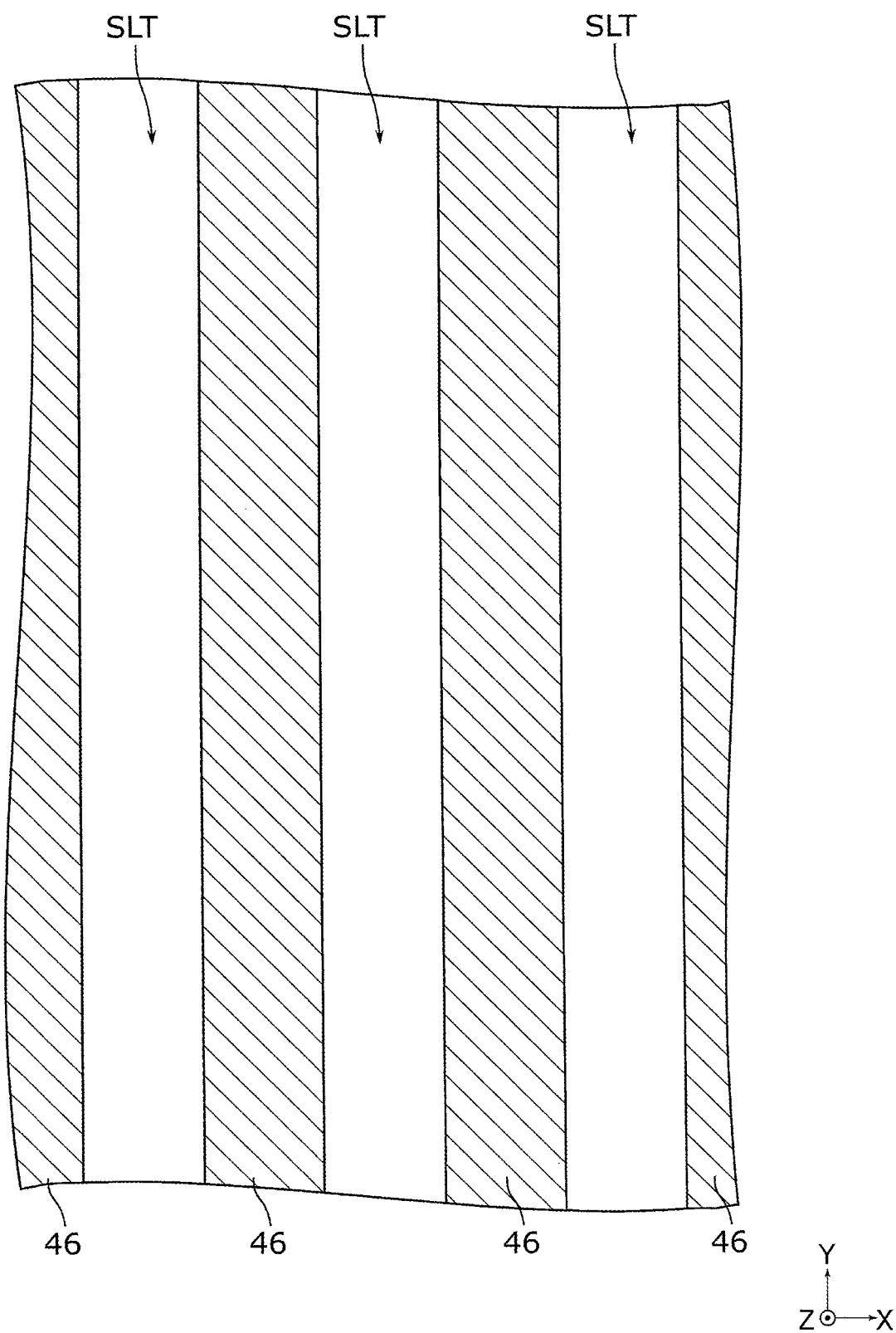
FIG. 22 is a sectional view of the memory cell array, taken along the line XXII-XXII indicated in FIG. 21.

FIG. 22 is a sectional view of the memory cell array 10, taken along the line XXII-XXII indicated in FIG. 21. As shown in FIG. 22, this process step has formed a line-and-space shape in which the portion corresponding to the stack STK and including the sacrificial member 46, and the slit SLT are alternately arranged along the X direction. Thus, the structure formed in the process step of FIG. 20 is divided into multiple separate portions along the X direction.

Next, as shown in FIG. 23, multiple structures INS are formed in the respective slits SLT. More specifically, an insulating film is provided over the entire surface to fill the multiple slits SLT. The film formation in this process step may use, for example, PCVD or LPCVD. Subsequently, CMP is performed for overall flatness, and an operation thereafter (for example, a combination of lithography and anisotropic etching) removes the portions corresponding to the regions for forming the structures MP from the insulating film. The insulators 25 corresponding to the structures INS are thus formed.

Figure 24:
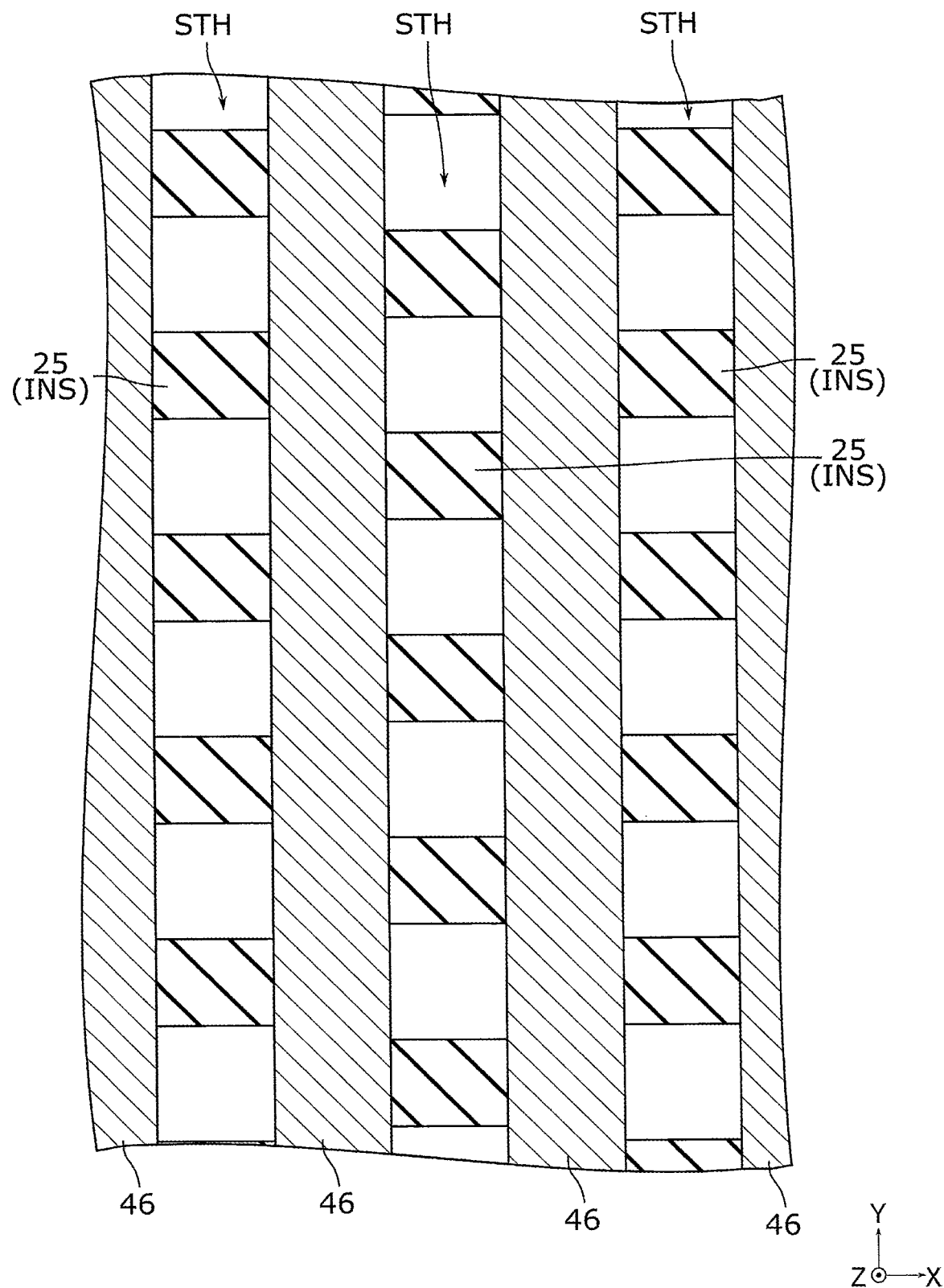
FIG. 24 is a sectional view of the memory cell array, taken along the line XXIV-XXIV indicated in FIG. 23.

FIG. 24 is a sectional view of the memory cell array 10, taken along the line XXIV-XXIV indicated in FIG. 23. As shown in FIG. 24, the process step has formed multiple holes STH along the Y direction and separated from one another by the applicable insulators 25, between two stack structures each including the sacrificial member 46.

Next, as shown in FIG. 25, a structure MP is formed in each of the holes STH. More specifically, a tunnel insulating film 33, a charge storage film 32, and a block insulating film 31 are formed in this order in each hole STH. The film formation in this process step may use, for example, LPCVD, and the films 31 to 33 each have a thickness of about several nanometers (nm). A conductor 30 is subsequently formed in each hole STH. The film formation in this process step may use, for example, LPCVD or PCVD. FIG. 26 is a sectional view of the memory cell array 10, taken along the line XXVI-XXVI indicated in FIG. 25. As shown in FIG. 26, the process step has formed one structure MP in each hole STH. One sacrificial member 46 extending along the Y direction contacts, on both of its sides in the X direction, each of the multiple structures MP arranged along the Y direction.

Figure 27:
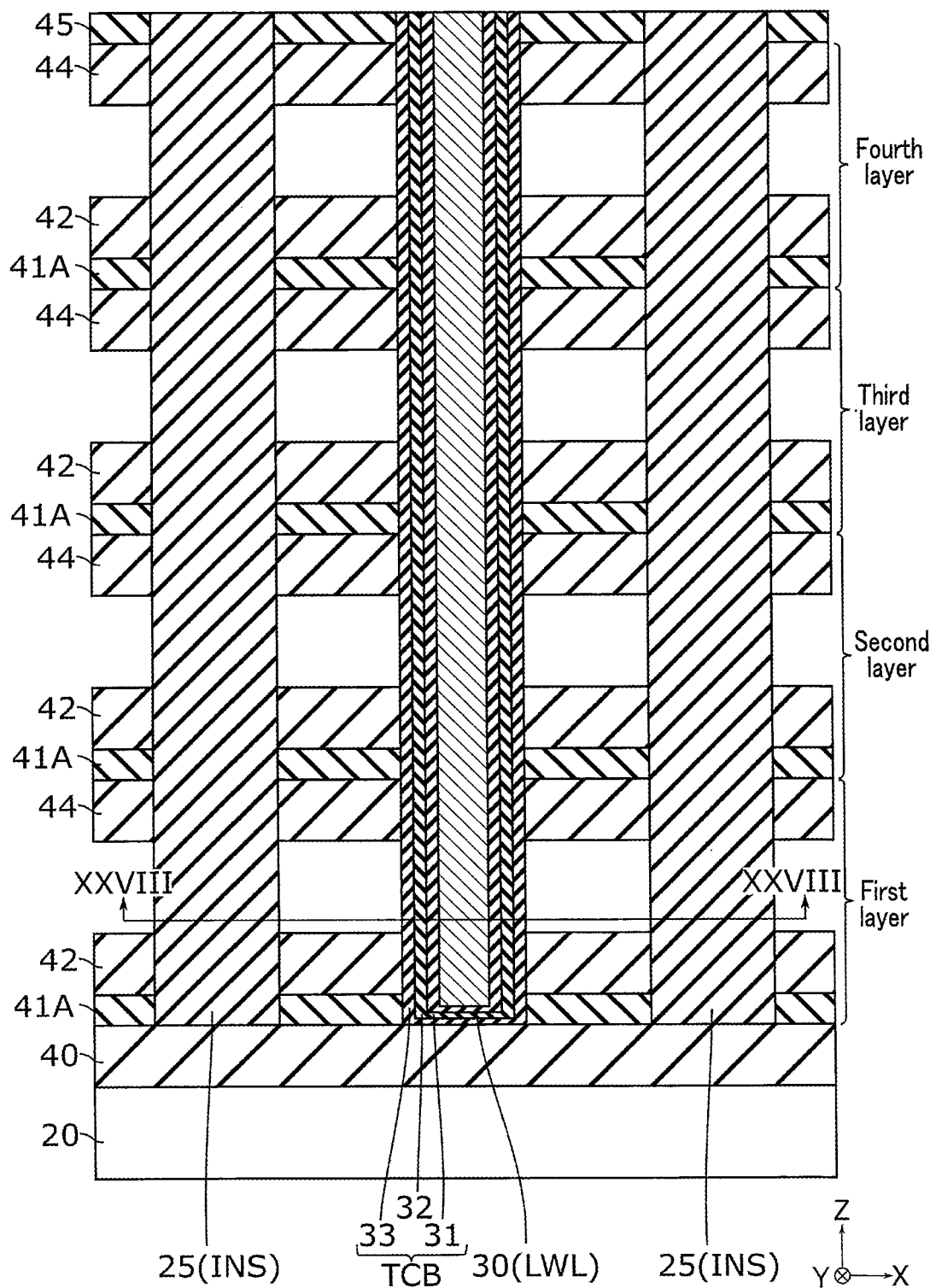
FIG. 27 is a sectional view of the memory cell array as an illustration for explaining a process for producing the memory device according to the second embodiment.

Next, as can be seen from FIG. 27, one or more holes (not illustrated) penetrating through all the sacrificial members 46 stacked along the Z direction are formed to expose the sacrificial members 46. The sacrificial members 46 are then selectively removed by wet etching or dry etching via the holes. This exposes each upper surface of the sacrificial members 42, each lower surface of the sacrificial members 44, and each portion of the structures MP and INS that is located between the applicable sacrificial members 42 and 44.

FIG. 28 is a sectional view of the memory cell array 10, taken along the line XXVIII-XXVIII indicated in FIG. 27. As shown in FIG. 28, the process step has exposed the left portion and the right portion (according to the illustration) of each of the multiple structures MP.

Next, as shown in FIG. 29, the p-type impurity-containing semiconductor 47 is formed on the inner walls surrounding the respective space created by the removal of the sacrificial member 46, such that the semiconductor 47 has a tubular profile. Each semiconductor 47 contains, for example, polysilicon or amorphous silicon. If the semiconductors 47 adopt amorphous silicon, the semiconductors 47 may be turned to polysilicon as their final form by a later heat treatment step. The film formation in this process step may use, for example, LPCVD or PCVD. Subsequently, an insulator 43A is formed on the inner walls of the respective semiconductor 47 to fill the space created by the removal of the sacrificial member 46. Each insulator 43A contains, for example, silicon oxide.

FIG. 30 is a sectional view of the memory cell array 10, taken along the line XXX-XXX indicated in FIG. 29. As shown in FIG. 30, the process step has formed the semiconductors 47 such that the multiple structures MP arranged along the Y direction each have a left portion (according to the illustration) contacting the respective one of the portions 47a of one semiconductor 47 extending along the Y direction on their left side (according to the illustration). Also, the multiple structures MP arranged along the Y direction each have a right portion (according to the illustration) contacting the respective one of the portions 47b of one semiconductor 47 extending along the Y direction on their right side (according to the illustration).

Figure 31:
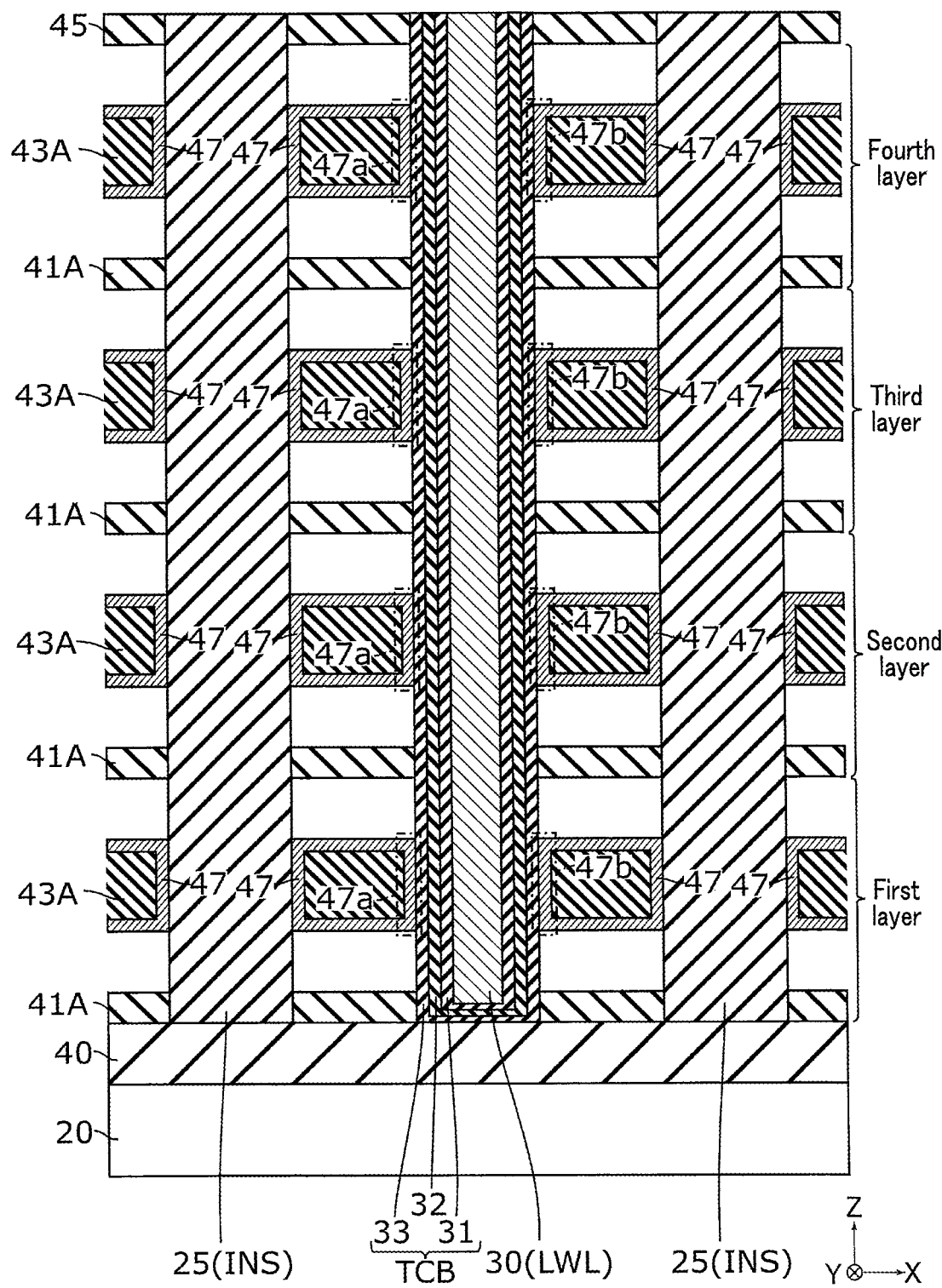
FIG. 31 is a sectional view of the memory cell array as an illustration for explaining a process for producing the memory device according to the second embodiment.

Next, as can be seen from FIG. 31, one or more holes (not illustrated) penetrating through all the sacrificial members 42 and 44 stacked along the Z direction are formed to expose the sacrificial members 42 and 44. The sacrificial members 42 and 44 are then selectively removed by wet etching or dry etching via the holes. This exposes the lower and upper surfaces of the semiconductors 47.

Next, as shown in FIG. 32, the exposed portions of the semiconductors 47 are subjected to selective growth of n-type impurity-containing polysilicon. This forms semiconductors 48 (48a and 48b) and semiconductors 49 (49a and 49b) to cover the respective lower and upper surfaces of the semiconductors 47 (47a and 47b). The selective growth in this process step may use, for example, LPCVD.

Figure 33:
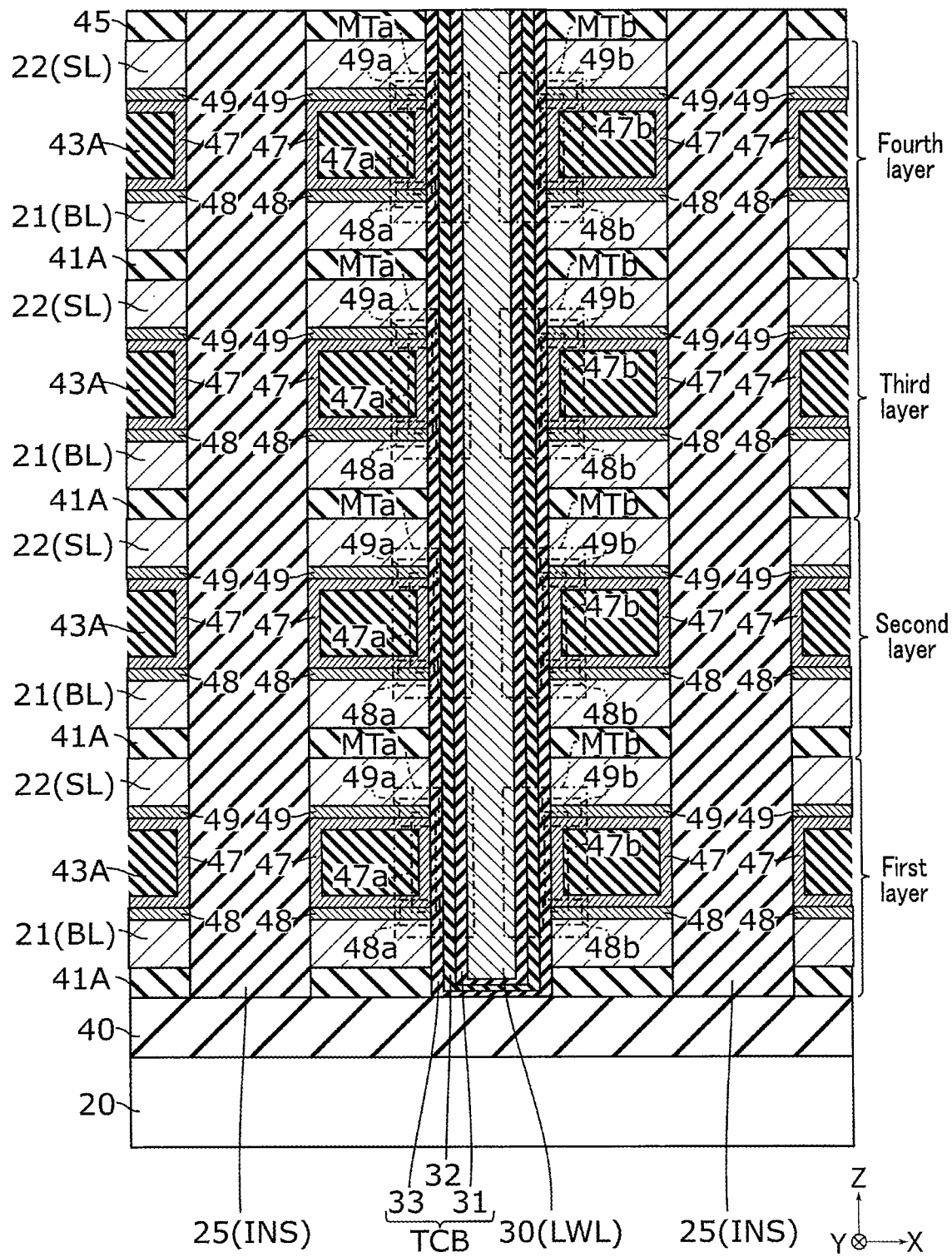
FIG. 33 is a sectional view of the memory cell array as an illustration for explaining a process for producing the memory device according to the second embodiment.

Next, as shown in FIG. 33, the conductors 21 are formed in the spaces created by the removal of the sacrificial members 42, and the conductors 22 are formed in the spaces created by the removal of the sacrificial members 44. The film formation in this process step may use, for example, LPCVD or PCVD.

By the process steps described above, the multiple, three-dimensionally stacked memory cell transistors MTa and MTb are formed. Thereafter, a step of forming conductors 23 and 24, a step of forming contacts to the conductors 21 and 22 and to various circuitry components formed in the insulator 40, a heat treatment step, etc. are performed so that the memory cell array 10 is formed.

Note that the production process described above is only an example. It is possible to adopt modifications such as inserting other processes between the process steps and changing the order of the steps as long as a problem does not occur.

2.3 Effects of Embodiment

For a stack STK to be formed according to the second embodiment, four members, i.e., the insulator 41A, the sacrificial member 42, the sacrificial member 46, and the sacrificial member 44, are stacked along the Z direction for each layer. The semiconductor 47 functioning as a channel of a memory cell transistor MT is formed on the inner walls surrounding the respective space created by the removal of the sacrificial member 46. Subsequently, the spaces inside the semiconductors 47 are filled with the insulators 43A. The semiconductors 48 and 49, each functioning as a source or a drain of a memory cell transistor MT, are formed by the selective growth that is caused through the spaces created by the removal of the sacrificial members 42 and 44 and from the semiconductors 47 exposed in these spaces.

Accordingly, when the insulator 41A, the sacrificial member 42, the sacrificial member 46, and the sacrificial member 44 are stacked, it is not necessary to dispose a film member corresponding to the semiconductor 48 between the sacrificial member 42 and the sacrificial member 46, and it is not necessary to dispose a film member corresponding to the semiconductor 49 between the sacrificial member 44 and the sacrificial member 46, either. This allows the number of different-material members stacked for each layer to be reduced from 6 to 4, and the increase in load of the production process steps can be suppressed as in the first embodiment. Together, as in the first embodiment, more layers can be provided in the memory cell array with a reduced processing-conversion difference for the production process steps, and therefore, increase in size of the memory cell array can be suppressed.

Additionally, the semiconductors 47 are formed after the structures MP are formed. Accordingly, the embodiment can reduce the risk of the semiconductors 47 being damaged by the etching step for forming the holes STH.

2.4 Modifications

The foregoing second embodiment tolerates various modifications. The description will basically concentrate on aspects of the configuration and the production process that differ from the second embodiment.

2.4.1 First Modification

The second embodiment has assumed the instances where the semiconductors 48 and 49 are formed by causing n-type impurity-containing semiconductor films to selectively grow on the semiconductors 47, but this is not a limitation. For example, each n-type impurity-containing semiconductor film may be formed as a continuous film on the inner walls that define the space after the removal of the sacrificial member 42 or 44.

Figure 34:
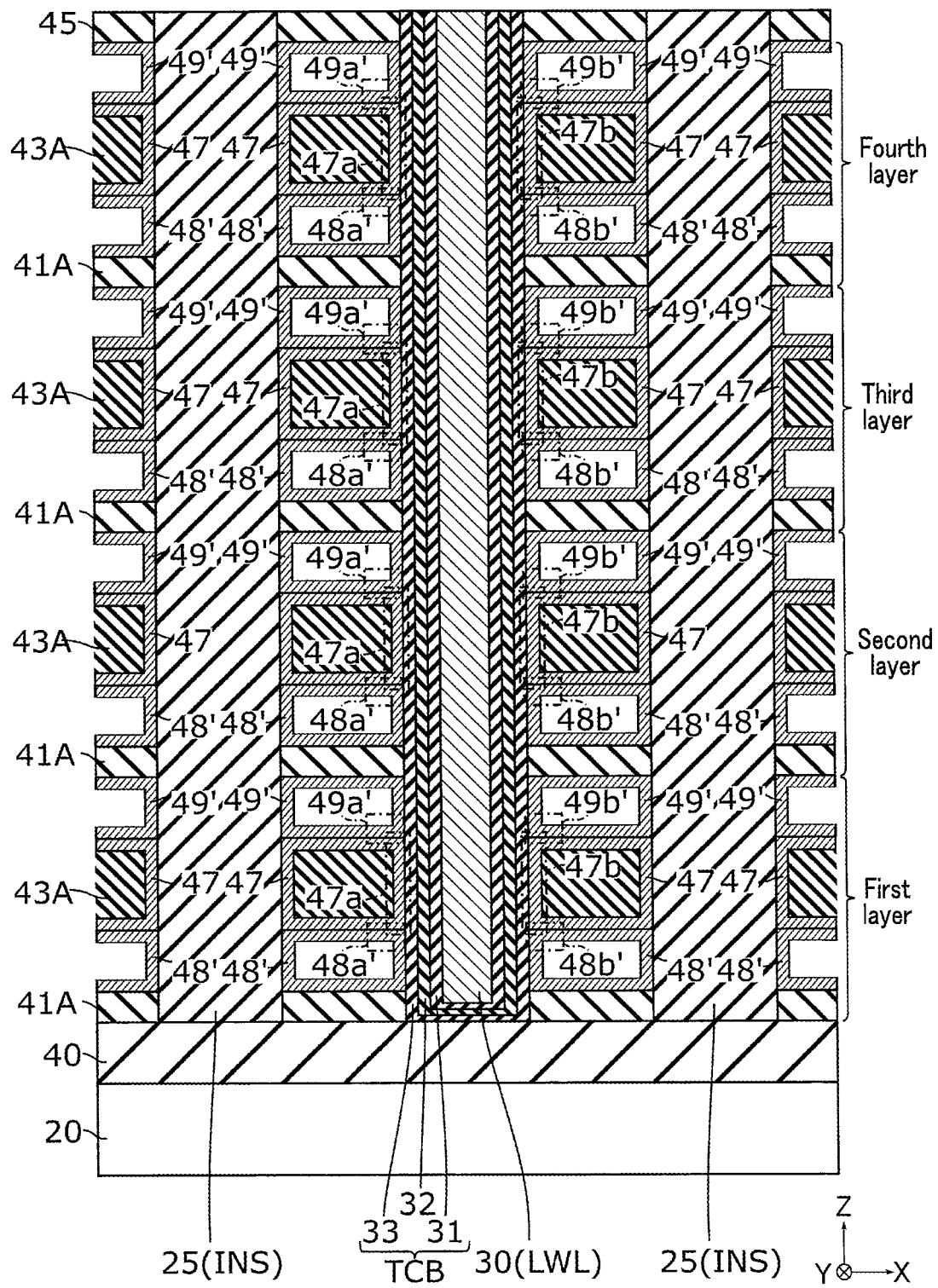
FIG. 34 is a sectional view of a memory cell array as an illustration for explaining a process for producing a memory device according to a first modification of the second embodiment.

FIG. 34 is one example of a sectional structure that includes a structural part corresponding to the memory cell array and that is formed in the course of the process for producing the memory device according to the first modification of the second embodiment. FIG. 34 corresponds to the second embodiment shown in FIG. 32.

As shown in FIG. 34, a semiconductor 48' is formed on the inner walls that define the space after the removal of the sacrificial member 42, and a semiconductor 49' is formed on the inner walls that define the space after the removal of the sacrificial member 44. The film formation in this process step may use, for example, LPCVD.

The semiconductors 48' and 49' contain, for example, amorphous silicon or polysilicon that contains an n-type impurity at a high concentration of $1E20/cm^3$ or more, and each have a thickness of several nanometers to several tens of nanometers. Since the semiconductors 48' and 49' are each formed as a continuous film on the inner walls that surround the space after the removal of the sacrificial member 42 or 44 as described above, the formed semiconductors 48' and 49' each have a tubular profile when viewed in the Y direction. The semiconductor 48' contacts the lower surface of the corresponding semiconductors 47, and the semiconductor 49' contacts the upper surface of the corresponding semiconductors 47.

Accordingly, a portion 48a' of the semiconductor 48', which is in contact with the semiconductor 47a, and a portion 49a' of the semiconductor 49', which is in contact with the semiconductor 47a, each function as a source or a drain of the memory cell transistor MTa. A portion 48b' of the semiconductor 48', which is in contact with the semiconductor 47b, and a portion 49b' of the semiconductor 49', which is in contact with the semiconductor 47b, each function as a source or a drain of the memory cell transistor MTb.

According to the first modification of the second embodiment, the semiconductors 48' and 49' are formed on the inner walls surrounding the spaces created by the removal of the respective sacrificial members 42 and 44, and such film formation is uniformly done by, for example, LPCVD. Subsequently, the spaces inside the semiconductors 48' and 49' are filled with the conductors 21 and 22, respectively.

Therefore, as in the second embodiment, when the insulator 41A, the sacrificial member 42, the sacrificial member 46, and the sacrificial member 44 are stacked, it is not necessary to dispose a film member corresponding to the semiconductor 48' between the sacrificial member 42 and the sacrificial member 46, and it is not necessary to dispose a film member corresponding to the semiconductor 49' between the sacrificial member 44 and the sacrificial member 46, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

2.4.2 Second Modification

The foregoing second embodiment and its first modification have assumed the instances where n-type impurity-containing semiconductor films are formed in the spaces created by the removal of the sacrificial members 42 and 44, but this is not a limitation. For example, n-type impurity-containing semiconductor films may be formed by doping portions of the semiconductors 47 with n-type impurities.

FIG. 35 is one example of a sectional structure that includes a structural part corresponding to the memory cell array and that is formed in the course of the process for producing the memory device according to the second modification of the second embodiment. FIG. 35 corresponds to the second embodiment shown in FIG. 32.

In the example shown in FIG. 35, vapor-phase diffusion is conducted to cause n-type impurities to diffuse into the lower surface regions of the semiconductors 47 which are exposed in the spaces created by the removal of the sacrificial member 42, and into the upper surface regions of the semiconductors 47 which are exposed in the spaces created by the removal of the sacrificial member 44. The diffusion of the n-type impurities takes place in the range of, for example, several nanometers (nm) to 20 nanometers (nm) from the upper and lower surfaces of each semiconductor 47. Consequently, a lower portion 48a" and an upper portion 49a" of the semiconductor 47a contain more n-type impurities than p-type impurities, and each function as a source or a drain of the memory cell transistor MTa. Similarly, a lower portion 48b" and an upper portion 49b" of the semiconductor 47b contain more n-type impurities than p-type impurities, and each function as a source or a drain of the memory cell transistor MTb.

According to the second modification of the second embodiment, the semiconductors 48" are formed by the vapor-phase diffusion of n-type impurities into the semiconductors 47 exposed in the spaces after the removal of the sacrificial member 42, and the semiconductors 49" are formed by the vapor-phase diffusion of n-type impurities into the semiconductors 47 exposed in the spaces after the removal of the sacrificial member 44. Subsequently, the spaces after the removal of the sacrificial members 42 and 44 are filled with the conductors 21 and 22, respectively.

Therefore, as in the second embodiment, when the insulator 41A, the sacrificial member 42, the sacrificial member 46, and the sacrificial member 44 are stacked, it is not necessary to dispose a film member corresponding to the semiconductor 48" between the sacrificial member 42 and the sacrificial member 46, and it is not necessary to dispose a film member corresponding to the semiconductor 49" between the sacrificial member 44 and the sacrificial member 46, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

3. Third Embodiment

Next, a memory device according to the third embodiment will be described. The first embodiment and the second embodiment have assumed the instances where the channels of memory cell transistors MT are each formed to have a height corresponding to the length between the upper end of the applicable bit line BL and the lower end of the applicable source line SL along the Z direction. The third embodiment differs from the first embodiment and the second embodiment in that the channels of memory cell transistors MT are each formed to bridge between the lower end of the bit line BL and the upper end of the source line SL along the Z direction (in other words, have a length along the Z direction longer than the length between the upper end of the bit line BL and the lower end of the source line SL). The description will basically omit the configuration and production process substantially the same as those of the first embodiment, and concentrate on the configuration and production process that differ from those of the first embodiment.

3.1 Structure of Memory Cell Array

FIG. 36 is a sectional view for explaining a structure of the memory cell array of the memory device according to the third embodiment, and corresponds to the first embodiment shown in FIG. 4.

As shown in FIG. 36, each structure MP includes: a conductor 30; a set of a tunnel insulating film 33', a charge storage film 32', and a block insulating film 31' serving as a lamination film TCB; and semiconductors 52a, 52b, 55a, 55b, 56a, and 56b. The semiconductors 52a and 52b function as channels of the memory cell transistors MTa and MTb, respectively. The semiconductors 55a and 56a each function as a source or a drain of the memory cell transistor MTa, and the semiconductors 55b and 56b each function as a source or a drain of the memory cell transistor MTb. Note that, in the structure MP, the conductor 30 is of a similar structure to the first embodiment.

Among the four side surfaces and the lower surface of the conductor 30, two opposing side surfaces (in the example shown in FIG. 36, the two surfaces along the Y-Z plane) and the lower surface are wholly covered by the block insulating film 31', the charge storage film 32', and the tunnel insulating film 33' disposed in this order. Accordingly, the lamination film TCB has two side surfaces along the Y-Z plane. Also, the lamination film TCB for the multiple memory cell transistors MTa formed in different layers within one structure MP, and the lamination film TCB for the multiple memory cell transistors MTb formed similarly within the same structure MP are constituted by one continuous film. The tunnel insulating film 33', the charge storage film 32', and the block insulating film 31' may contain the same materials as the tunnel insulating film 33, the charge storage film 32, and the block insulating film 31 of the first embodiment, respectively.

The lamination film TCB has, for each layer, portions corresponding to the height from the lower end of the conductor 21 to the upper end of the conductor 22. The lamination film TCB has two side surfaces for these portions, where the semiconductor 52a is provided on one side surface (in the example shown in FIG. 36, the left surface)

and the semiconductor 52b is provided on the other side surface (in the example shown in FIG. 36, the right surface).

For each layer, the semiconductor 55a is provided on the side surface of the semiconductor 52a for a portion corresponding to the height from the lower end to the upper end of the conductor 21, and the semiconductor 56a is provided on the side surface of the semiconductor 52a for a portion corresponding to the height from the lower end to the upper end of the conductor 22. Also, for each layer, the semiconductor 55b is provided on the side surface of the semiconductor 52b for a portion corresponding to the height from the lower end to the upper end of the conductor 21, and the semiconductor 56b is provided on the side surface of the semiconductor 52b for a portion corresponding to the height from the lower end to the upper end of the conductor 22.

The structure INS includes an insulator 54. The insulator 54 contains, for example, silicon oxide and has a portion extending along the Z direction from the position (height) comparable with the lower end of the stack STK to the position comparable with the upper end of the stack STK. The insulator 54 also has portions extending along the XY plane in film regions within each stack STK, including a film region below the lowermost conductor 21, film regions between the applicable conductors 21 and 22, and a film region above the uppermost conductor 22.

According to such constitution, the semiconductors 52a, 55a, and 56a, the portion of the lamination film TCB that is proximate to the semiconductor 52a, and the conductors 21, 22, and 30 together form one memory cell transistor MTa. Also, the semiconductors 52b, 55b, and 56b, the portion of the lamination film TCB that is proximate to the semiconductor 52b, and the conductors 21, 22, and 30 together form one memory cell transistor MTb.

3.2 Method for Producing Memory Device

An example of a process for producing the memory cell array of the memory device according to the third embodiment will be described. FIGS. 37 to 55 each show an example of a sectional structure that includes a structural part corresponding to the memory cell array and that is formed in the course of the process for producing the memory device according to the third embodiment. Note that the sectional views which will be referred to for the production process include a cross-section vertical to the surface of the semiconductor substrate 20. Also, regions indicated in each sectional view for the production process step correspond to the regions indicated in FIG. 36.

Figure 37:
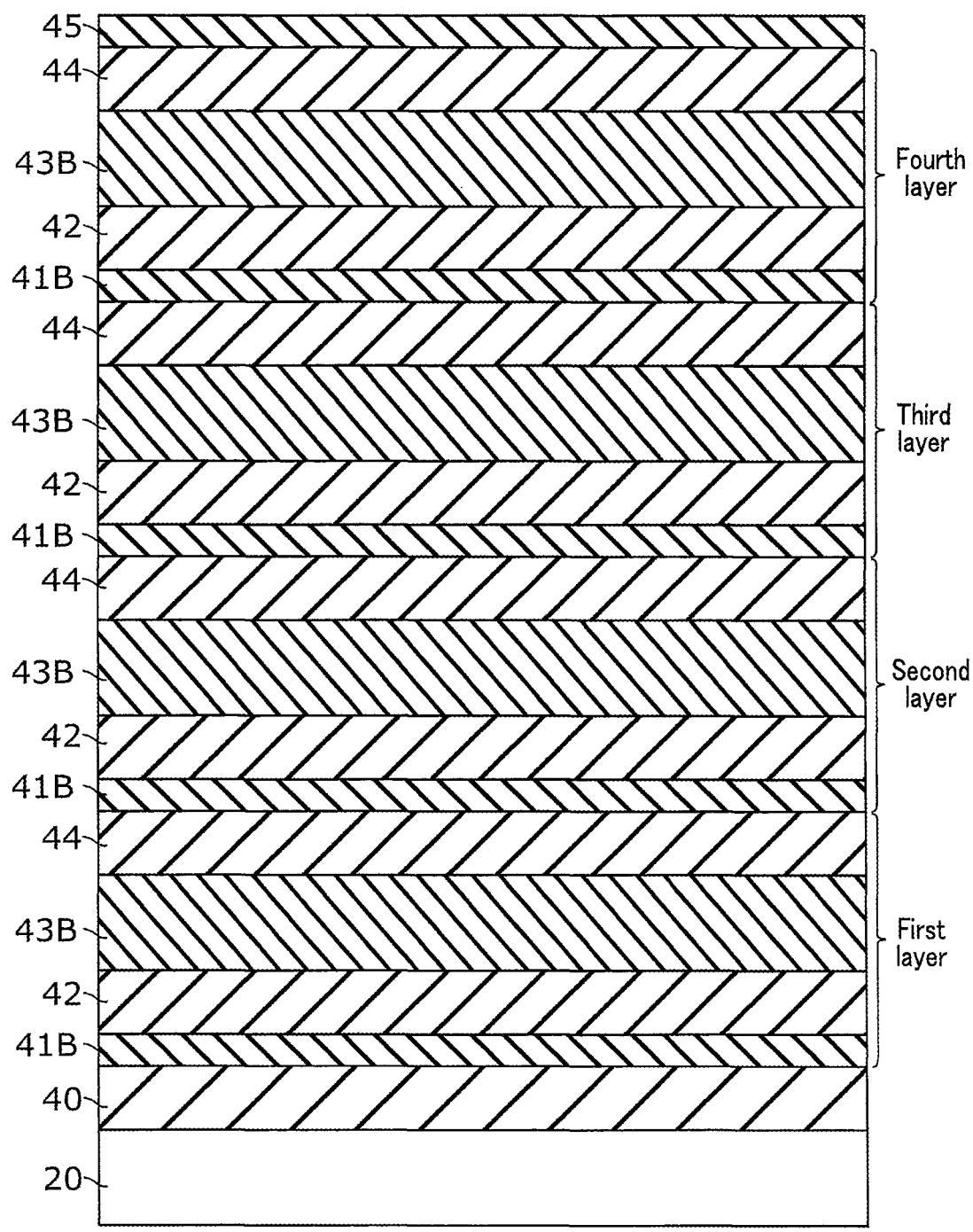
FIG. 37 is a sectional view of the memory cell array as an illustration for explaining a process for producing the memory device according to the third embodiment.

First, as shown in FIG. 37, a structure that will become the multiple stacks STK is formed.

More specifically, the process begins with forming an insulator 40 on the semiconductor substrate 20, and thereafter stacking on this insulator 40 an insulator 41B, a sacrificial member 42, an insulator 43B, and a sacrificial member 44 in this order. Stacking this set of the insulator 41B, the sacrificial member 42, the insulator 43B, and the sacrificial member 44 is repeated as many times as the number of layers (in this exemplary production process, 4 times). The insulator 41B contains, for example, silicon oxide added with boron, phosphorus, or both boron and phosphorus, and the insulator 43B contains, for example, silicon oxide. With the boron additive or the phosphorus additive, or both, the insulator 41B can have a greater etching rate than the insulator 43B without such an additive, at the selective etching operations for oxides. The insulator 41B, the sacrificial member 42, the insulator 43B, and the sacrificial member 44 may each have a thickness of, for example, 10 to 100 nanometers (nm). The film formation in this process step may use, for example, PCVD.

Figure 38:
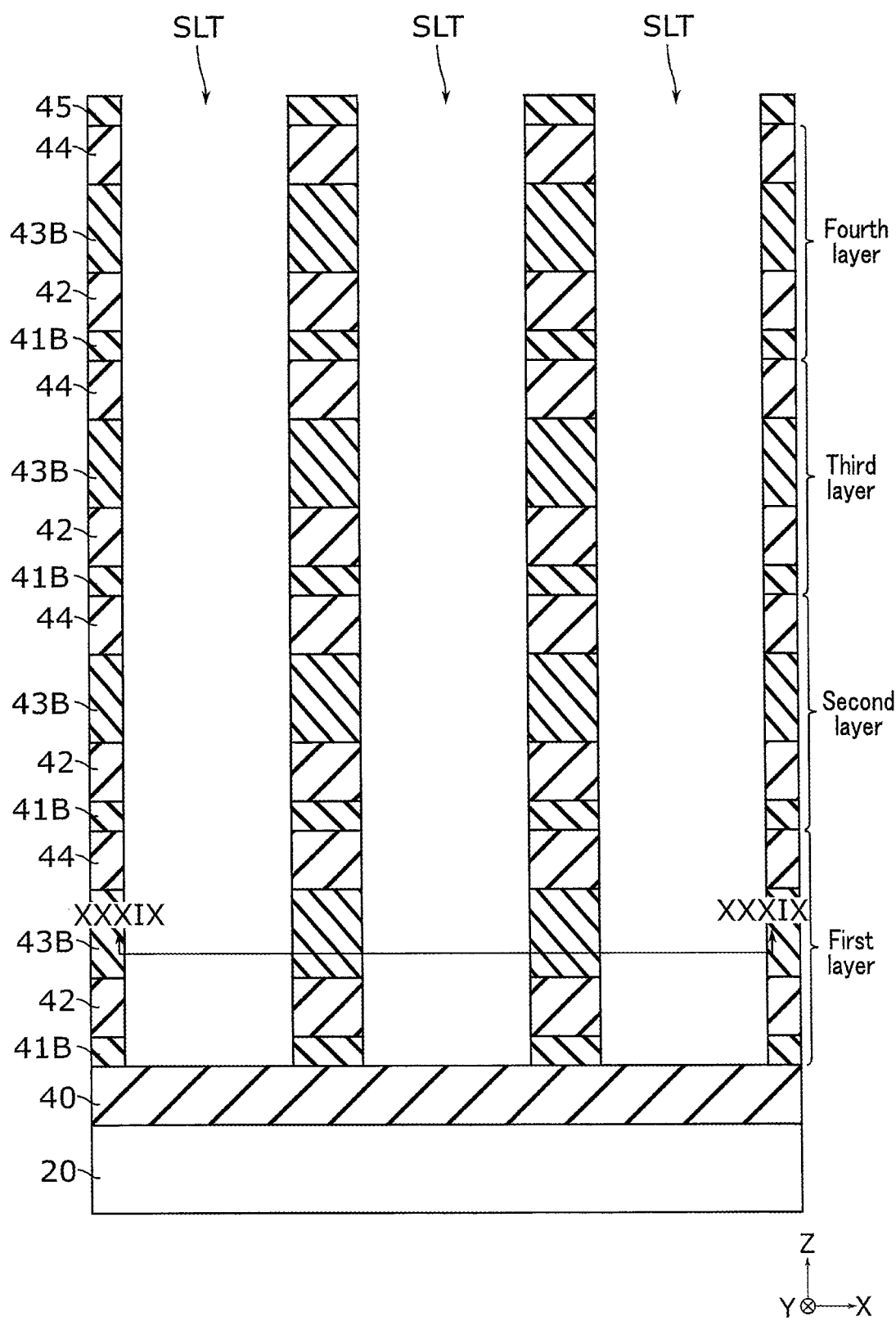
FIG. 38 is a sectional view of the memory cell array as an illustration for explaining a process for producing the memory device according to the third embodiment.

Next, as shown in FIG. 38, lithography and anisotropic etching are conducted to remove each region intended for forming the structure MP or INS from the structure that has been formed on the insulator 40, so that multiple slits SLT are formed.

FIG. 39 is a sectional view of the memory cell array 10, taken along the line XXXIX-XXXIX indicated in FIG. 38. As shown in FIG. 39, the process step has formed a line-and-space shape in which the portion corresponding to the stack STK and including the insulator 43B, and the slit SLT are alternately arranged along the X direction. Thus, the structure formed in the process step of FIG. 37 is divided into multiple separate portions along the X direction.

Next, as shown in FIG. 40, a structure that can constitute the structure MP is formed in each slit SLT. More specifically, an insulator 53, a semiconductor 52, a tunnel insulating film 33', a charge storage film 32', a block insulating film 31', and a sacrificial member 51 are formed in this order over the entire surface to fill the multiple slits SLT. Subsequently, CMP is performed for overall flatness and the surfaces of the stacks STK are exposed, so that the material portions filling the respective slits SLT are separate from each other. Each insulator 53 contains, for example, silicon oxide. Each semiconductor 52 contains, for example, polysilicon or amorphous silicon containing a p-type impurity. If the semiconductors 52 adopt amorphous silicon, the semiconductors 52 may be turned to polysilicon as their final form by a later heat treatment step. The sacrificial member 51 contains, for example, polysilicon. The film formation in this process step may use, for example, PCVD or LPCVD.

FIG. 41 is a sectional view of the memory cell array 10, taken along the line XLI-XLI indicated in FIG. 40. As shown in FIG. 41, the process step has filled each slit SLT with the insulator 53, the semiconductor 52, the tunnel insulating film 33', the charge storage film 32', the block insulating film 31', and the sacrificial member 51, which each extend along the Y direction.

Next, as shown in FIG. 42, lithography and anisotropic etching are conducted so that, among the material portions filling the respective slits SLT, the portions that will become the structures MP are maintained while the remaining portions are removed. Accordingly, multiple holes STH are created at the positions where the material portions have been removed, and the insulators 41B are exposed.

FIG. 43 is a sectional view of the memory cell array 10, taken along the line XLIII-XLIII indicated in FIG. 42. As shown in FIG. 43, the process step has turned the state where each slit SLT is filled with the material portion, into the state where the material portions as the later structures MP are retained in an arrangement along the Y direction with the intervening holes STH. In each of the portions that will become the structure MP, a set of the lamination film TCB, the semiconductor 52, and the insulator 53 has two side surfaces sandwiching the sacrificial member 51 along the X direction, but does not have side surfaces sandwiching the sacrificial member 51 along the Y direction.

Next, as shown in FIG. 44, the insulators 41B are selectively removed by wet etching via the holes STH. Since each insulator 41B has a greater etching rate than the insulators 43B (and the insulator 53) as discussed above, the etching in this process step can remove the insulators 41B until the associated portions of the insulator 53 are exposed, without substantively damaging the insulators 43B.

Figure 45:
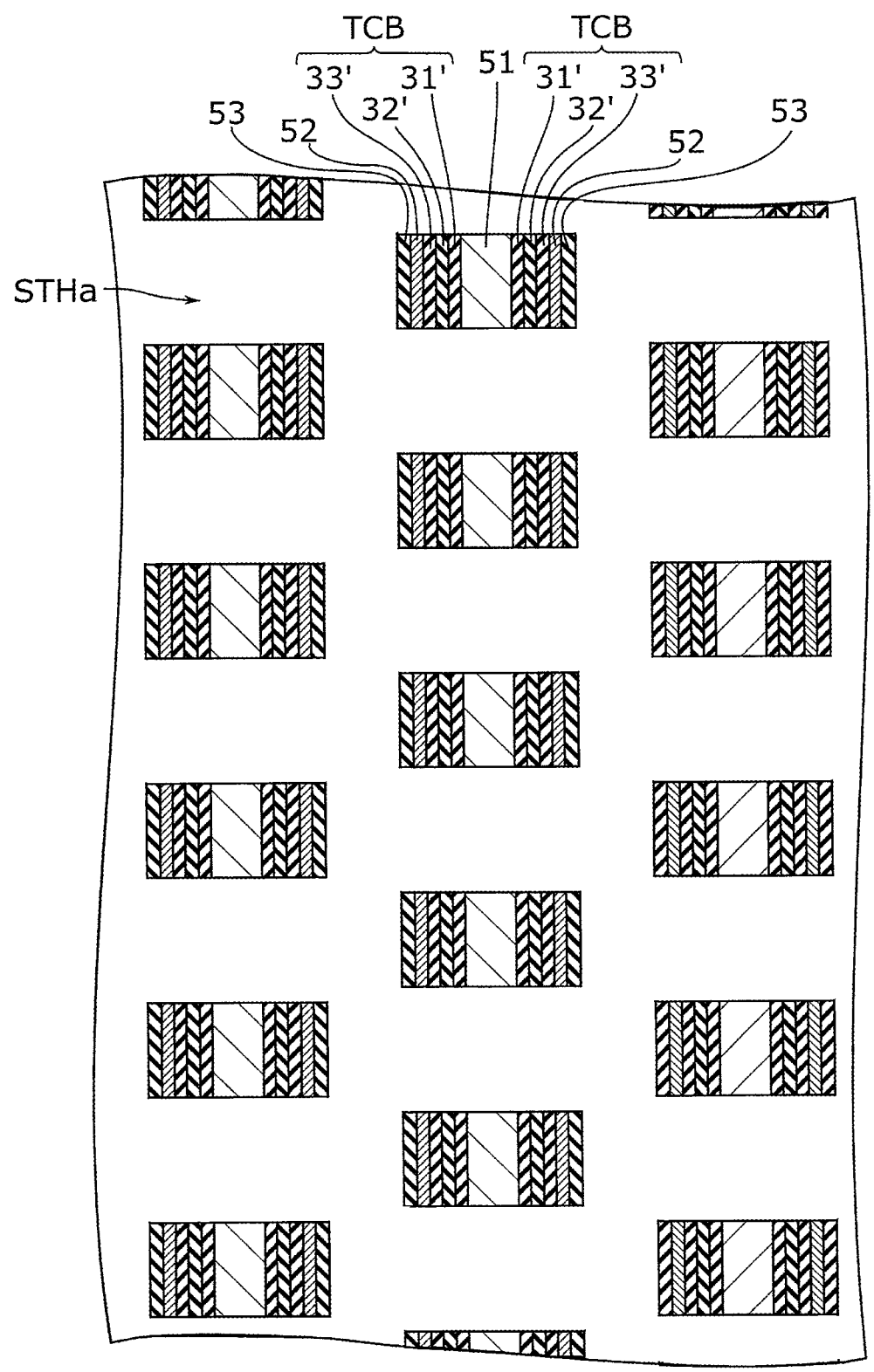
FIG. 45 is a sectional view of the memory cell array, taken along the line XLV-XLV indicated in FIG. 44.

FIG. 45 is a sectional view of the memory cell array 10, taken along the line XLV-XLV indicated in FIG. 44. As shown in FIG. 45, the process step has connected together the multiple holes STH via the spaces created by the removal of the insulators 41B, so that one hole STHa results.

Figure 46:
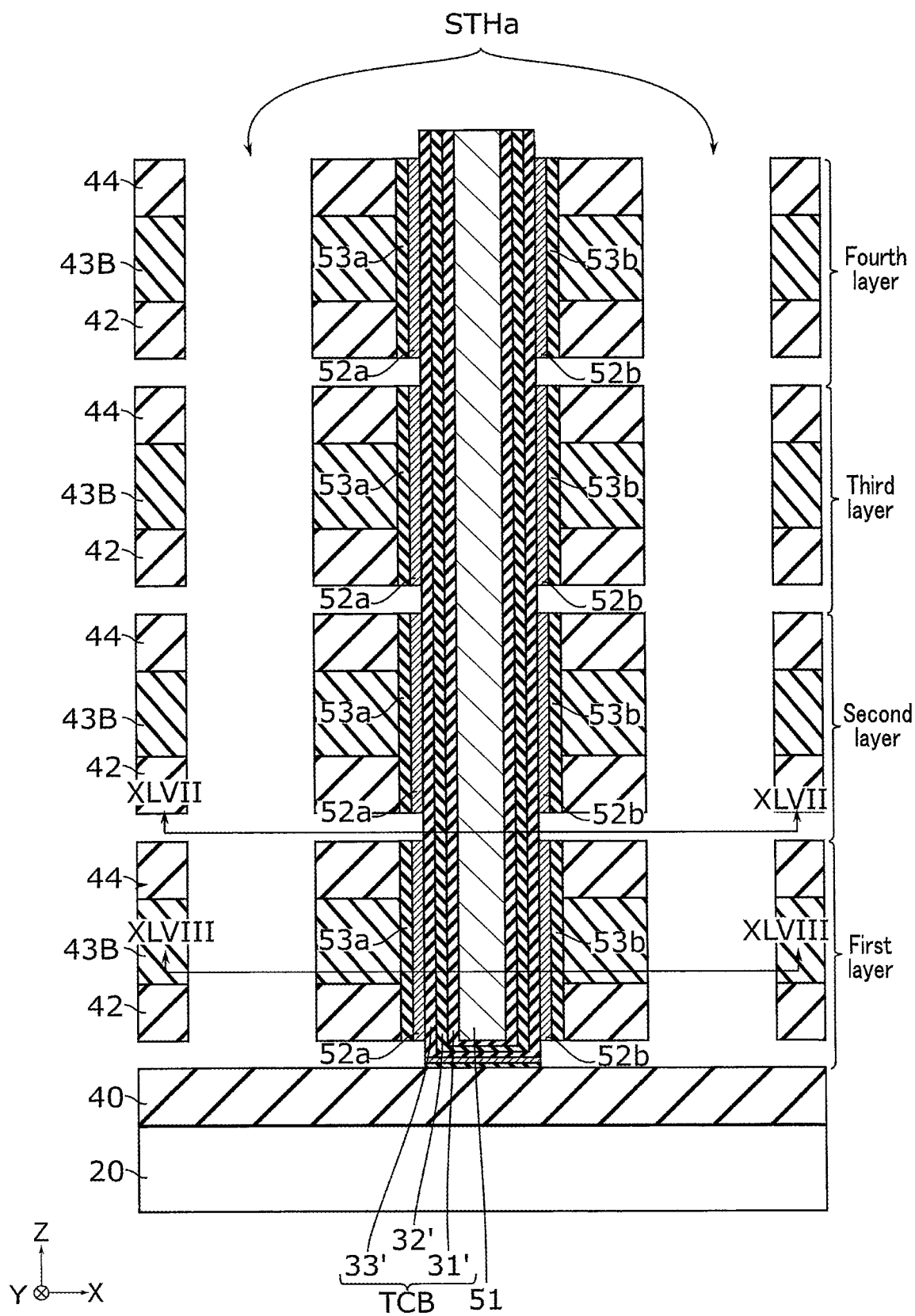
FIG. 46 is a sectional view of the memory cell array as an illustration for explaining a process for producing the memory device according to the third embodiment.

Next, as shown in FIG. 46, the portions of the insulator 53 are selectively removed by wet etching or dry etching via the hole STHa until the associated portions of the semiconductor 52 are exposed (that is, for as much as the thickness of the insulator 53). Accordingly, the insulator 53 is, for each layer, divided into two parts that sandwich the lamination film TCB and the sacrificial member 51. Such two parts of the insulator 53 are portions 53a and 53b of one layer, respectively. That is, the portions 53a and 53b for each layer extend along the Z direction from the lower end of the sacrificial member 42 to the upper end of the sacrificial member 44.

Subsequently, the portions of the semiconductor 52 are selectively removed by further wet etching or dry etching via the hole STHa until the tunnel insulating film 33' is exposed (that is, for as much as the thickness of the semiconductor 52). Accordingly, the semiconductor 52 is, for each layer, divided into two parts that sandwich the lamination film TCB and the sacrificial member 51. Such two parts of the semiconductor 52 are portions 52a and 52b of one layer, respectively. That is, the portions 52a and 52b for each layer extend along the Z direction from the lower end of the sacrificial member 42 to the upper end of the sacrificial member 44.

Figure 48:
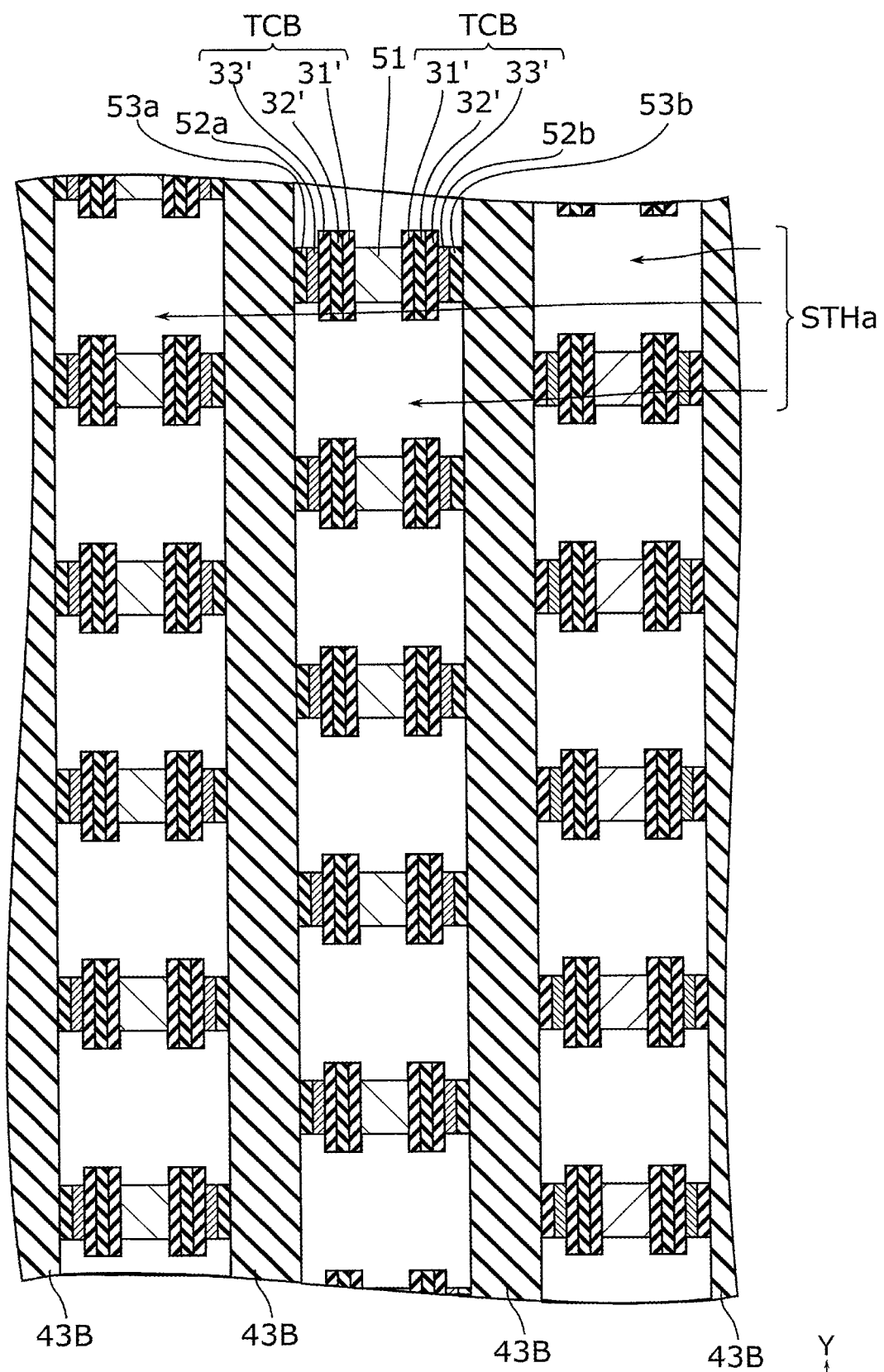
FIG. 48 is a sectional view of the memory cell array, taken along the line XLVIII-XLVIII indicated in FIG. 46.

FIGS. 47 and 48 are sectional views of the memory cell array 10, taken along the line XLVII-XLVII and the line XLVIII-XLVIII indicated in FIG. 46, respectively. As shown in FIG. 47, the process step has completely removed the portions of the semiconductor 52 and the insulator 53 that are at the same height as the respective associated insulators 41B. On the other hand, as shown in FIG. 48, the process step has partially removed the portions of the semiconductor 52 and the insulator 53 (as well as the sacrificial member 51), which are at the same height as the respective associated insulators 43B, along the Y direction and from the part exposed along the X-Z plane. That is, the semiconductors 52a and 52b are each shorter in the Y direction than the lamination film TCB.

Next, as shown in FIG. 49, a structure INS is formed in the hole STHa. More specifically, an insulating film is provided over the entire surface to fill the hole STHa. The film formation in this process step may use, for example, PCVD or LPCVD. Subsequently, CMP is performed for overall flatness so that the insulator 54 corresponding to the structure INS is formed.

Figure 50:
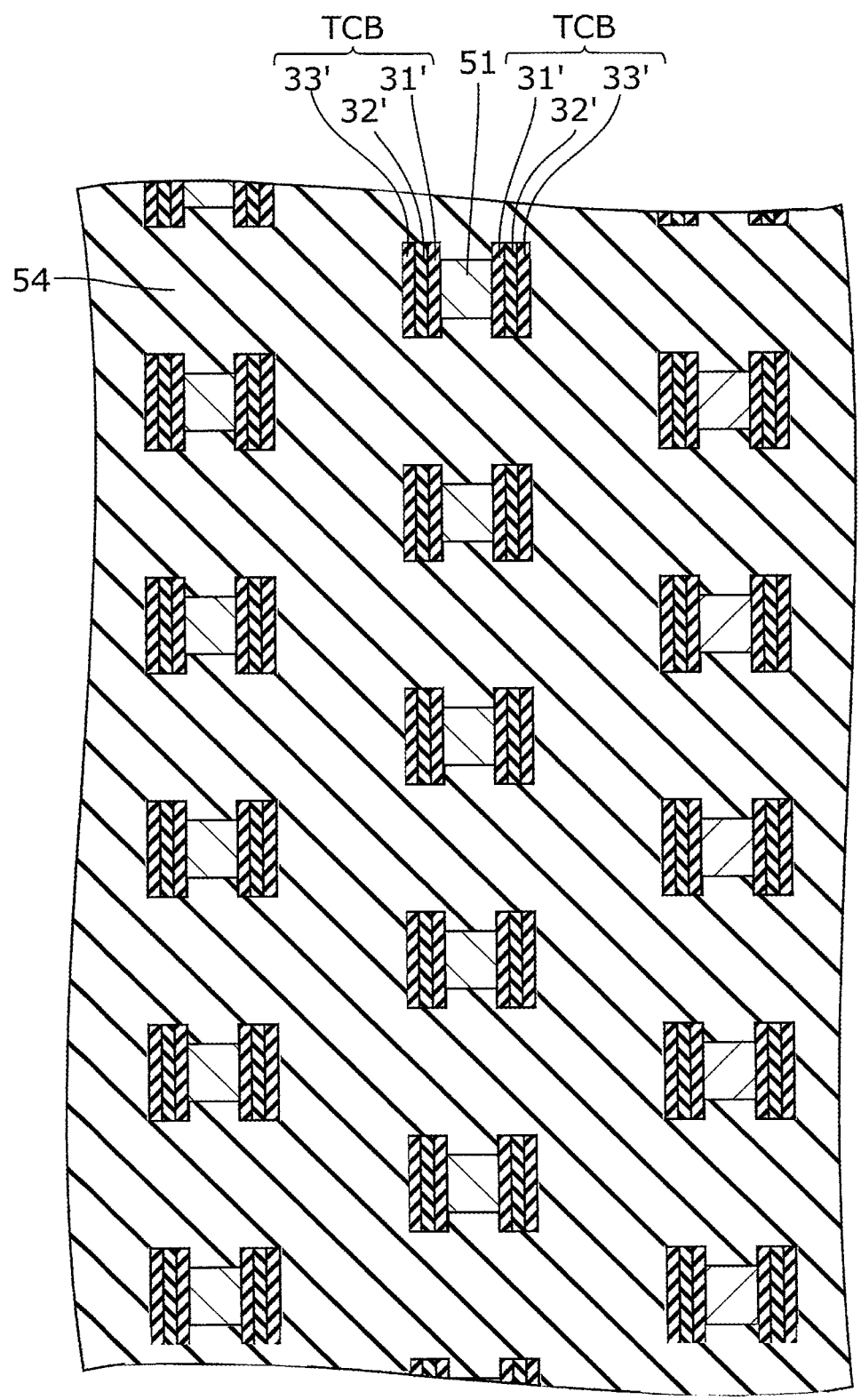
FIG. 50 is a sectional view of the memory cell array, taken along the line L-L indicated in FIG. 49.

FIGS. 50 and 51 are sectional views of the memory cell array 10, taken along the line L-L and the line LI-LI indicated in FIG. 49, respectively. As shown in FIGS. 50 and 51, the process step has filled all the spaces between the structures MP and between the sacrificial members 42 and 44, with the insulator 54.

Next, as can be seen from FIG. 52, one or more holes (not illustrated) penetrating through all the sacrificial members 42 and 44 stacked along the Z direction are formed to expose the sacrificial members 42 and 44. The sacrificial members 42 and 44 are then selectively removed by wet etching or dry etching via the holes. This exposes the side surfaces of each of the semiconductors 52a and 52b, for a portion from the lower end to the upper end of the sacrificial member 42 and a portion from the lower end to the upper end of the sacrificial member 44.

Next, as shown in FIG. 53, the exposed portions of the semiconductors 52a and 52b are subjected to selective growth of n-type impurity-containing polysilicon. Accordingly, a semiconductor 55a is formed to cover, among the exposed portions of each semiconductor 52a, the portion (side surface) exposed in the space after the removal of the sacrificial member 42, and a semiconductor 56a is formed to cover the portion (side surface) exposed in the space after the removal of the sacrificial member 44. Also, a semiconductor 55b is formed to cover, among the exposed portions of each semiconductor 52b, the portion (side surface) exposed in the space after the removal of the sacrificial member 42, and a semiconductor 56b is formed to cover the portion (side surface) exposed in the space after the removal of the sacrificial member 44. The selective growth in this process step may use, for example, LPCVD.

Next, as shown in FIG. 54, the conductors 21 are formed in the spaces created by the removal of the sacrificial members 42, and the conductors 22 are formed in the spaces created by the removal of the sacrificial members 44. The film formation in this process step may use, for example, LPCVD or PCVD.

Accordingly, between one conductor 21 and the lamination film TCB, the semiconductor 55a contacts the side surface of each of the semiconductor 52a and the conductor 21 along the Y direction, and the semiconductor 55b contacts the side surface of each of the semiconductor 52b and the conductor 21 along the Y direction. Between one conductor 22 and the lamination film TCB, the semiconductor 56a contacts the side surface of each of the semiconductor 52a and the conductor 22 along the Y direction, and the semiconductor 56b contacts the side surface of each of the semiconductor 52b and the conductor 22 along the Y direction. Also, the upper surface of each semiconductor 55 is higher than or flush with the upper surface of the associated conductor 21, and the lower surface of each semiconductor 56 is lower than or flush with the lower surface of the associated conductor 22.

Next, as shown in FIG. 55, the sacrificial member 51 is removed by wet etching, and the space after the removal of the sacrificial member 51 is filled with a conductor 30. The film formation in this process step may use, for example, LPCVD or PCVD.

By the process steps described above, the multiple, three-dimensionally stacked memory cell transistors MTa and MTb are formed. Thereafter, a step of forming conductors 23 and 24, a step of forming contacts to the conductors 21 and 22 and to various circuitry components formed in the insulator 40, a heat treatment step, etc. are performed so that the memory cell array 10 is formed.

Note that the production process described above is only an example. It is possible to adopt modifications such as inserting other processes between the process steps and changing the order of the steps as long as a problem does not occur.

3.3 Effects of Embodiment

For a stack STK to be formed according to the third embodiment, four members, i.e., the insulator 41B, the sacrificial member 42, the insulator 43B, and the sacrificial member 44, are stacked along the Z direction for each layer. The semiconductor 52 functioning as a channel of a memory cell transistor MT, and the insulator 53 covering the side surface of the semiconductor 52 are formed on the side surface of the lamination film TCB as a part of the structure MP. Portions of the semiconductor 52 and the insulator 53, at the height where the associated insulator 41B was present, are removed via the space created by the removal of this insulator 41B. The semiconductor 52 is thus divided to correspond to the respective layers. Subsequently, portions of the semiconductor 52, at the respective heights where the associated sacrificial members 42 and 44 were present, are exposed to the spaces created by the removal of these sacrificial members 42 and 44, upon removal of the associated portions of the insulator 53. The semiconductors 55 and 56, each functioning as a source or a drain of a memory cell transistor MT, are formed by the selective growth caused from the portions of the semiconductor 52 exposed in the spaces created by the removal of the sacrificial members 42 and 44, respectively.

Accordingly, when the insulator 41B, the sacrificial member 42, the insulator 43B, and the sacrificial member 44 are stacked, it is not necessary to dispose a film member corresponding to the semiconductor 55 between the sacrificial member 42 and the insulator 43B, and it is not necessary to dispose a film member corresponding to the semiconductor 56 between the sacrificial member 44 and the insulator 43B, either. This allows the number of different-material members stacked for each layer to be reduced from 6 to 4, and the increase in load of the production process steps can be suppressed as in the first and second embodiments. Together, as in the first and second embodiments, more layers can be provided in the memory cell array with a reduced processing-conversion difference for the production process steps, and therefore, increase in size of the memory cell array can be suppressed.

Also, the semiconductor 52 is formed by the step of filling the slit SLT, and as such, the area for film formation is relatively reduced. This facilitates the film formation with a uniform thickness.

Moreover, the surface of the semiconductor 52 along the Y-Z plane is not exposed during the later step of forming the hole STH. Accordingly, as in the second embodiment, the embodiment can reduce the risk of the semiconductors 52 being damaged during the step after the formation of the semiconductor 52.

3.4 Modifications

The foregoing third embodiment tolerates various modifications. The description will basically concentrate on aspects of the configuration and the production process that differ from the third embodiment.

3.4.1 First Modification

The third embodiment has assumed the instances where the semiconductors 55a and 55b, and the semiconductors 56a and 56b are formed by causing n-type impurity-containing semiconductor films to selectively grow on the semiconductors 52a and 52b, but this is not a limitation. For example, each n-type impurity-containing semiconductor film may be formed as a continuous film on the inner walls that define the space after the removal of the sacrificial member 42 or 44.

FIG. 56 is one example of a sectional structure that includes a structural part corresponding to the memory cell array and that is formed in the course of the process for producing the memory device according to the first modification of the third embodiment. FIG. 56 corresponds to the third embodiment shown in FIG. 53.

As shown in FIG. 56, a semiconductor 55' is formed on the inner walls that define the space after the removal of the sacrificial member 42, and a semiconductor 56' is formed on the inner walls that define the space after the removal of the sacrificial member 44. The film formation in this process step may use, for example, LPCVD.

The semiconductors 55' and 56' contain, for example, amorphous silicon or polysilicon that contains an n-type impurity at a high concentration of $1E20/cm^3$ or more, and each have a thickness of several nanometers to several tens of nanometers. Since the semiconductors 55' and 56' are each formed as a continuous film on the inner walls that surround the space after the removal of the sacrificial member 42 or 44 as described above, the formed semiconductors 55' and 56' each have a tubular profile when viewed in the Y direction. Also, the semiconductor 55' contacts the lower side surface of the semiconductor 52a or 52b, and the semiconductor 56' contacts the upper side surface of the semiconductor 52a or 52b. Also, the region of contact between the semiconductor 52a or 52b and the semiconductor 55' has an upper end higher than the upper surface of the conductor 21 when formed, and the region of contact between the semiconductor 52a or 52b and the semiconductor 56' has a lower end lower than the lower surface of the conductor 22 when formed.

Accordingly, a portion 55a' of the semiconductor 55', which is in contact with the semiconductor 52a, and a portion 56a' of the semiconductor 56', which is in contact with the semiconductor 52a, each function as a source or a drain of the memory cell transistor MTa. A portion 55b' of the semiconductor 55', which is in contact with the semiconductor 52b, and a portion 56b' of the semiconductor 56', which is in contact with the semiconductor 52b, each function as a source or a drain of the memory cell transistor MTb.

According to the first modification of the third embodiment, the semiconductors 55' and 56' are formed on the inner walls surrounding the spaces created by the removal of the respective sacrificial members 42 and 44, and such film formation is uniformly done by, for example, LPCVD. Subsequently, the spaces inside the semiconductors 55' and 56' are filled with the conductors 21 and 22, respectively.

Therefore, as in the third embodiment, when the insulator 41B, the sacrificial member 42, the insulator 43B, and the sacrificial member 44 are stacked, it is not necessary to dispose a film member corresponding to the semiconductor 55' between the sacrificial member 42 and the insulator 43B, and it is not necessary to dispose a film member corresponding to the semiconductor 56' between the sacrificial member 44 and the insulator 43B, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

3.4.2 Second Modification

The foregoing third embodiment and its first modification have assumed the instances where n-type impurity-containing semiconductor films are formed in the spaces created by the removal of the sacrificial members 42 and 44, but this is not a limitation. For example, n-type impurity-containing semiconductor films may be formed by doping portions of the semiconductors 52a and 52b with n-type impurities.

FIG. 57 is one example of a sectional structure that includes a structural part corresponding to the memory cell array and that is formed in the course of the process for producing the memory device according to the second modification of the third embodiment. FIG. 57 corresponds to the third embodiment shown in FIG. 53.

In the example shown in FIG. 57, vapor-phase diffusion is conducted to cause n-type impurities to diffuse into the lower side surface regions of the semiconductors 52a and 52b which are exposed in the spaces created by the removal of the sacrificial member 42, and into the upper side surface regions of the semiconductors 52a and 52b which are exposed in the spaces created by the removal of the sacrificial member 44. The diffusion of the n-type impurities takes place in the range of, for example, several nanometers (nm) to 20 nanometers (nm) from each of the upper and lower side surfaces of the semiconductor 52a.

Consequently, a lower portion 55a" and an upper portion 56a" of the semiconductor 52a contain more n-type impurities than p-type impurities, and each function as a source or a drain of the memory cell transistor MTa. Similarly, a lower portion 55b" and an upper portion 56b" of the semiconductor 52b contain more n-type impurities than p-type impurities, and each function as a source or a drain of the memory cell transistor MTb.

Note that the resultant boundary between each semiconductor 52 and its lower portion 55" may be at the height higher than or comparable with the lower surface of the associated insulator 43B, and the resultant boundary between each semiconductor 52 and its upper portion 56" may be at the height lower than or comparable with the upper surface of the associated insulator 43B.

According to the second modification of the third embodiment, the semiconductors 55" are formed by the vapor-phase diffusion of n-type impurities into the semiconductors 52 exposed in the spaces after the removal of the sacrificial member 42, and the semiconductors 56" are formed by the vapor-phase diffusion of n-type impurities into the semiconductors 52 exposed in the spaces after the removal of the sacrificial member 44. Subsequently, the spaces after the removal of the sacrificial members 42 and 44 are filled with the conductors 21 and 22, respectively.

Therefore, as in the third embodiment, when the insulator 41B, the sacrificial member 42, the insulator 43B, and the sacrificial member 44 are stacked, it is not necessary to dispose a film member corresponding to the semiconductor 55" between the sacrificial member 42 and the insulator 43B, and it is not necessary to dispose a film member corresponding to the semiconductor 56" between the sacrificial member 44 and the insulator 43B, either. This allows the number of different-material members stacked for each layer to be reduced from 6 to 4, and the increase in load of the production process steps can be suppressed. Together, more layers can be provided in the memory cell array with a reduced processing-conversion difference for the production process steps, and therefore, increase in size of the memory cell array can be suppressed.

4. Fourth Embodiment

Next, a memory device according to the fourth embodiment will be described. The third embodiment has assumed the instances where the entire side surfaces of the conductors 21 and 22 contact the source or the drain of a memory cell transistor MT. The fourth embodiment differs from the third embodiment in that the lower side surfaces of the conductors 21 and 22 contact the source or the drain of a memory cell transistor MT. The description will basically omit the configuration and production process substantially the same as those of the third embodiment, and concentrate on the configuration and production process that differ from those of the third embodiment.

4.1 Structure of Memory Cell Array

Figure 58:
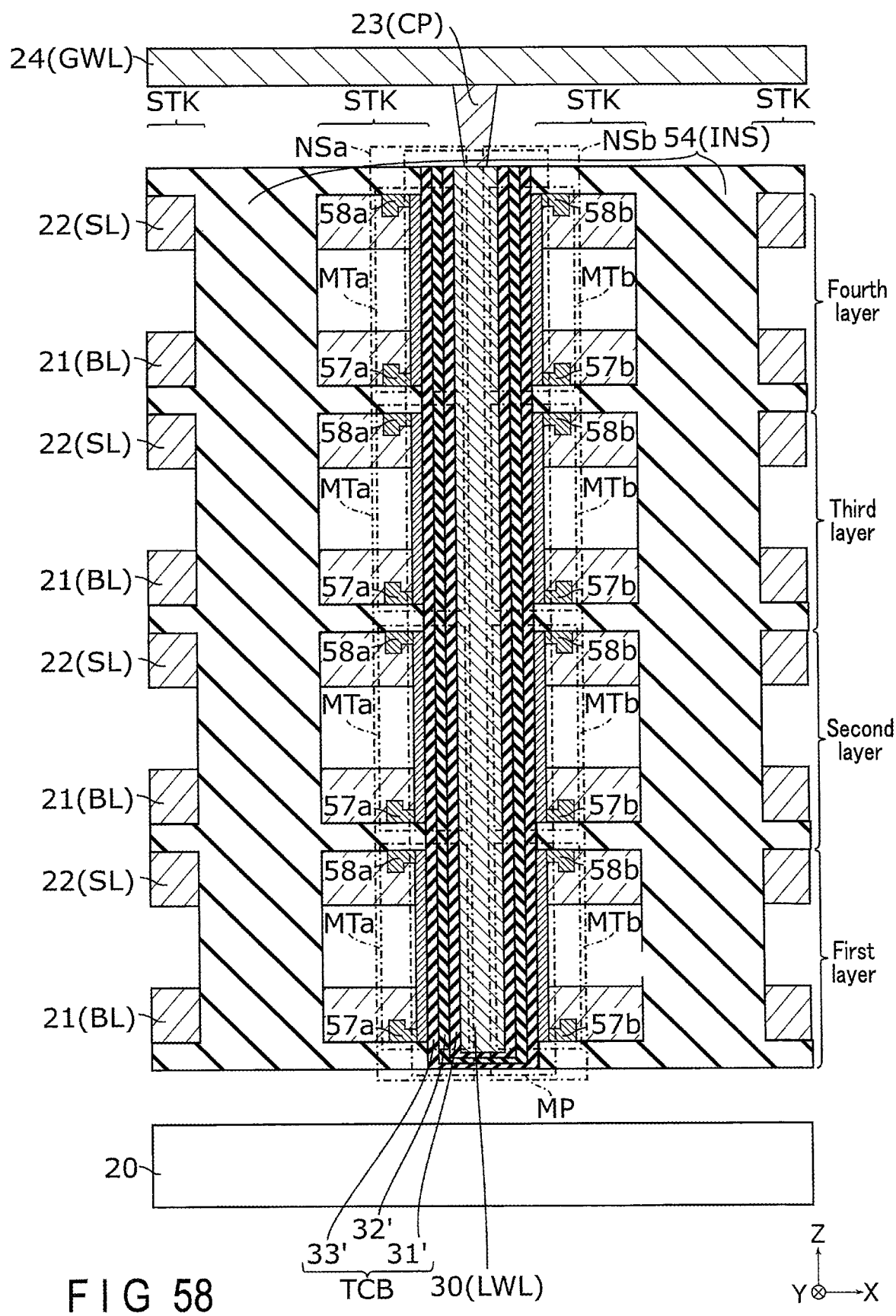
FIG. 58 is a sectional view of a memory cell array of a memory device according to a fourth embodiment.

FIG. 58 is a sectional view for explaining a structure of the memory cell array of the memory device according to the fourth embodiment, and corresponds to the third embodiment shown in FIG. 36.

As shown in FIG. 58, for each layer, a semiconductor 57a is provided on the side surface of the semiconductor 52a for a portion proximate to the lower end of the conductor 21, and a semiconductor 58a is provided on the side surface of the semiconductor 52a for a portion proximate to the upper end of the conductor 22. The semiconductors 57a and 58a each have a portion adjacent to the semiconductor 52a and a portion distant from the semiconductor 52a in the X direction, and the latter portion is longer in the Z direction than the former portion.

Also, for each layer, a semiconductor 57b is provided on the side surface of the semiconductor 52b for a portion proximate to the lower end of the conductor 21, and a semiconductor 58b is provided on the side surface of the semiconductor 52b for a portion proximate to the upper end of the conductor 22. The semiconductors 57b and 58b each have a portion adjacent to the semiconductor 52b and a portion distant from the semiconductor 52b in the X direction, and the latter portion is longer in the Z direction than the former portion.

The region of contact between the semiconductor 57a and the semiconductor 52a, and the region of contact between the semiconductor 57b and the semiconductor 52b each have an upper end lower than the upper end of the conductor 21. The region of contact between the semiconductor 58a and the semiconductor 52a, and the region of contact between the semiconductor 58b and the semiconductor 52b each have a lower end higher than the lower end of the conductor 22.

According to such constitution, the semiconductors 52a, 57a, and 58a, the portion of the lamination film TCB that is proximate to the semiconductor 52a, and the conductors 21, 22, and 30 together form one memory cell transistor MTa. Also, the semiconductors 52b, 57b, and 58b, the portion of the lamination film TCB that is proximate to the semiconductor 52b, and the conductors 21, 22, and 30 together form one memory cell transistor MTb.

4.2 Method for Producing Memory Device

An example of a process for producing the memory cell array of the memory device according to the fourth embodiment will be described. FIGS. 59 to 65 each show an example of a sectional structure that includes a structural part corresponding to the memory cell array and that is formed in the course of the process for producing the memory device according to the fourth embodiment. Note that the sectional views which will be referred to for the production process include a cross-section vertical to the surface of the semiconductor substrate 20. Also, regions indicated in each sectional view for the production process step correspond to the regions indicated in FIG. 58.

First, the process steps similar to the steps described with reference to FIGS. 37 to 46 for the third embodiment are performed so that the hole STHa is formed and the insulator 53 and the semiconductor 52 are divided to correspond to the respective layers.

Next, as shown in FIG. 59, portions of the insulator 53 are further selectively removed by wet etching or dry etching via the hole STHa. Accordingly, the insulators 53a and 53b, having been etched along the Z direction, are turned into the insulators 53a' and 53b' shorter in the Z direction than the associated semiconductor 52. That is, in each layer, the insulators 53a' and 53b' each have a lower end higher than the lower end of the sacrificial member 42, and an upper end lower than the upper end of the sacrificial member 44.

Figure 60:
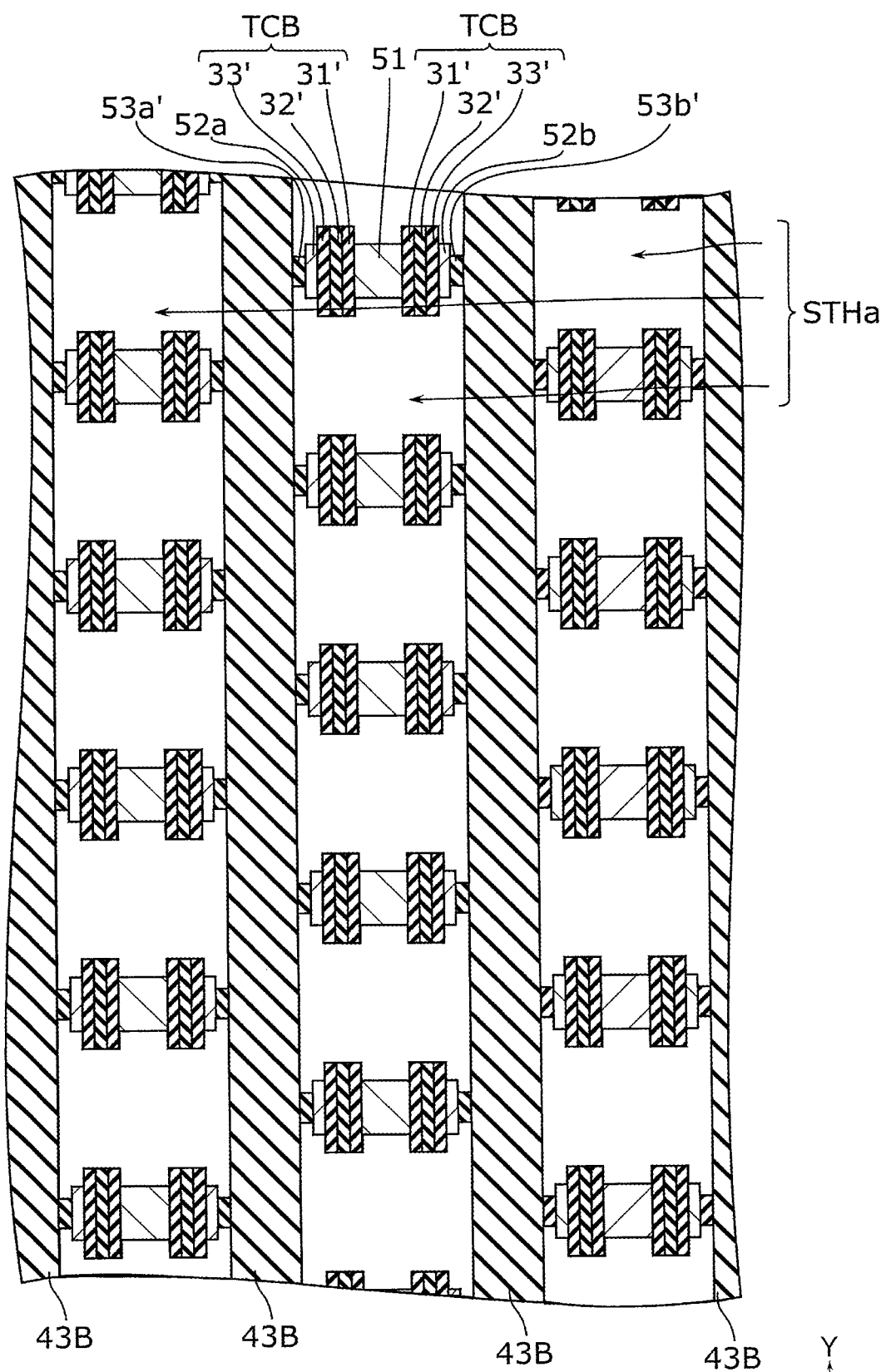
FIG. 60 is a sectional view of the memory cell array, taken along the line LX-LX indicated in FIG. 59.

FIG. 60 is a sectional view of the memory cell array 10, taken along the line LX-LX indicated in FIG. 59. As shown in FIG. 60, the process step has partially removed the portions of the semiconductor 52 and the insulator 53 (as well as the sacrificial member 51), which are at the same height as the respective associated insulators 43B, along the Y direction and from the part exposed along the X-Z plane, so that the insulator 53 becomes shorter in the Y direction than the semiconductor 52.

Figure 61:
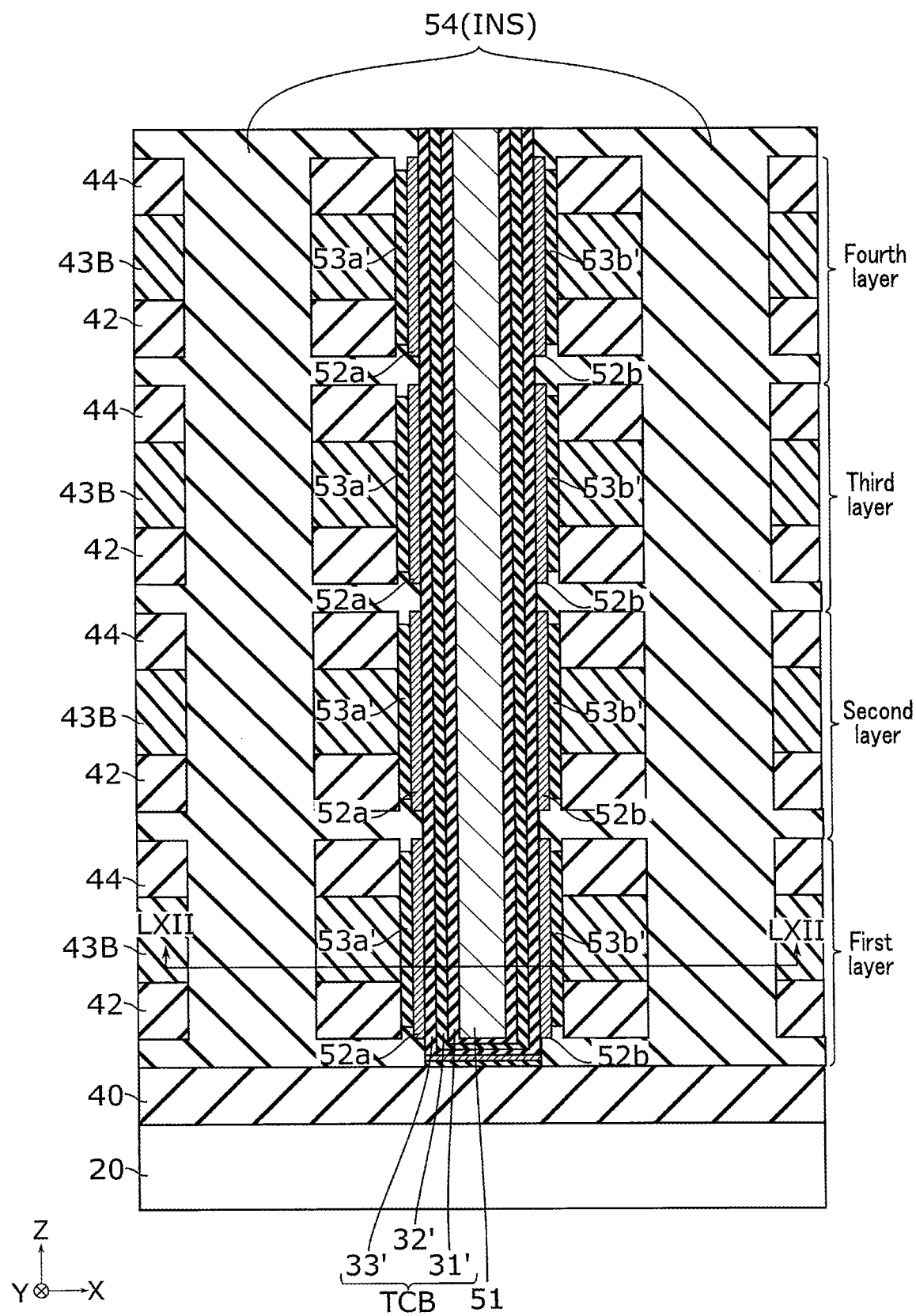
FIG. 61 is a sectional view of the memory cell array as an illustration for explaining a process for producing the memory device according to the fourth embodiment.

Next, as shown in FIG. 61, a structure INS is formed in the hole STHa. More specifically, an insulating film is provided over the entire surface to fill the hole STHa. The film formation in this process step may use, for example, PCVD or LPCVD. Subsequently, CMP is performed for overall flatness so that the insulator 54 corresponding to the structure INS is formed. Note that the insulator 54 here is preferably a silicon oxide having a lower density than the insulators 53a' and 53b'. The insulator 54 can accordingly have a greater etching rate than the insulators 53a' and 53b' at the selective etching operations for oxides.

Figure 62:
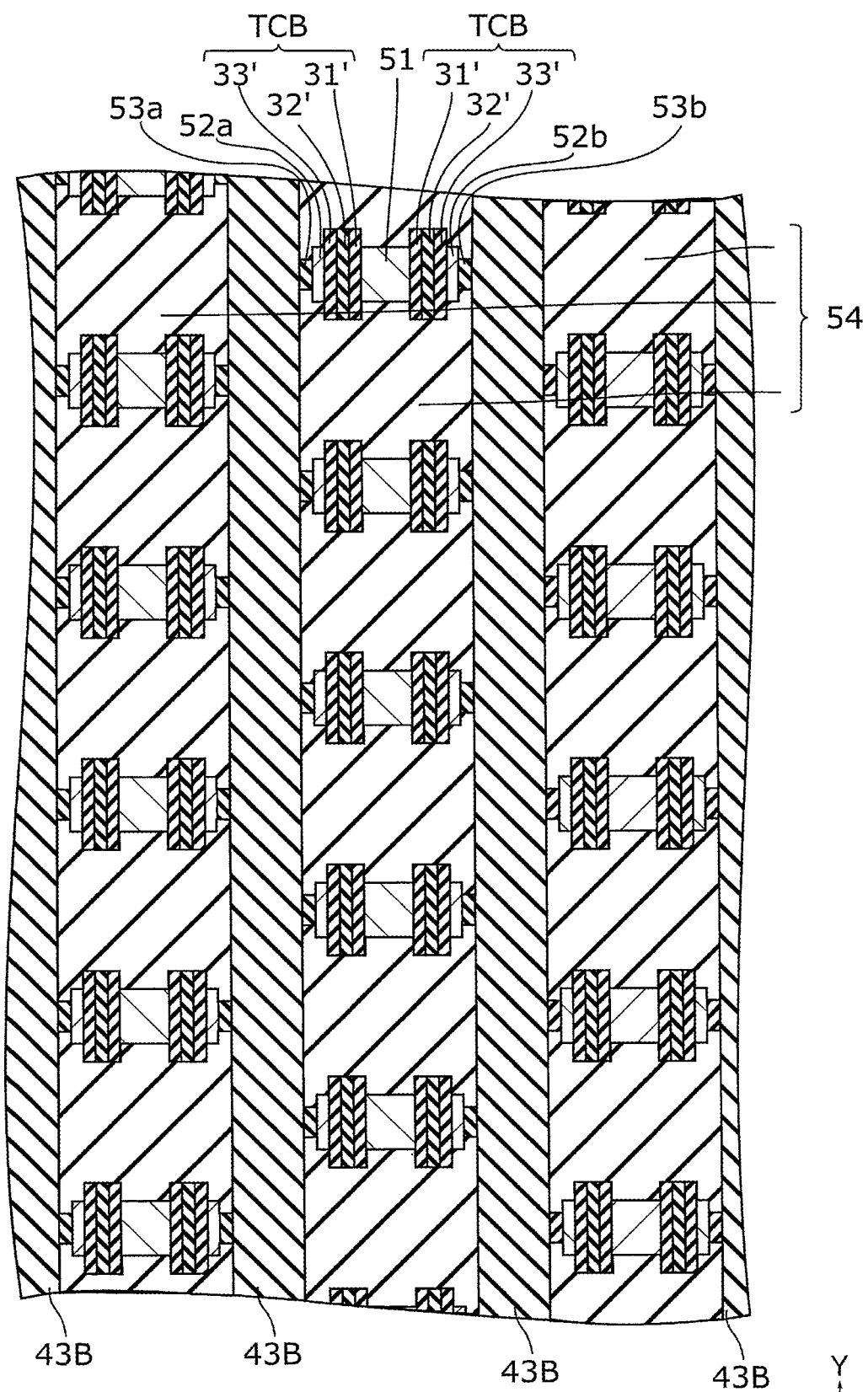
FIG. 62 is a sectional view of the memory cell array, taken along the line LXII-LXII indicated in FIG. 61.

FIG. 62 is a sectional view of the memory cell array 10, taken along the line LXII-LXII indicated in FIG. 61. As shown in FIGS. 62, the process step has filled all the spaces between the structures MP and between the sacrificial members 42 and 44, with the insulator 54.

Figure 63:
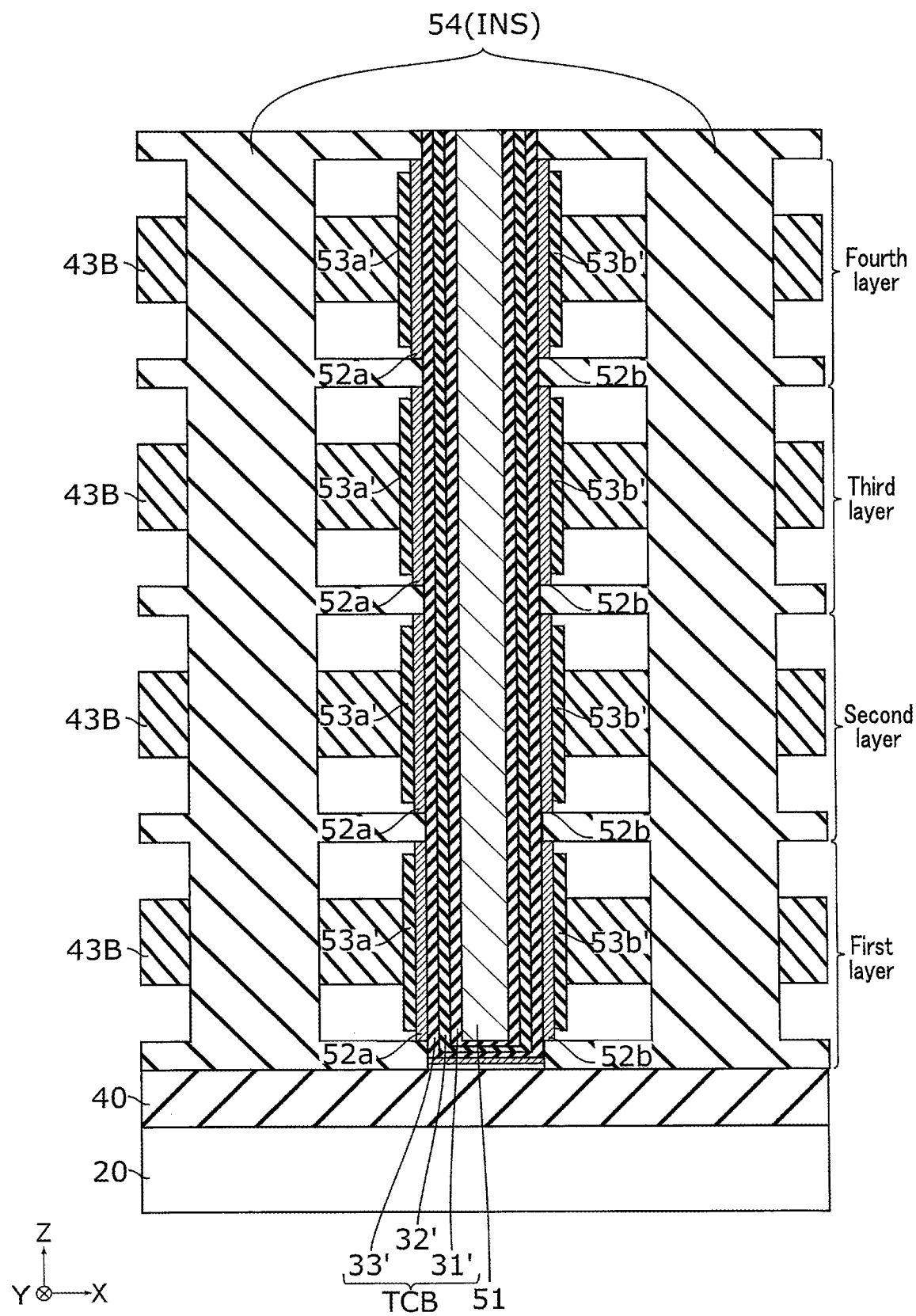
FIG. 63 is a sectional view of the memory cell array as an illustration for explaining a process for producing the memory device according to the fourth embodiment.

Next, as can be seen from FIG. 63, one or more holes (not illustrated) penetrating through all the sacrificial members 42 and 44 stacked along the Z direction are formed to expose the sacrificial members 42 and 44. The sacrificial members 42 and 44 are then selectively removed by wet etching or dry etching via the holes. This exposes the insulator 54 and the insulator 53a' or 53b', arranged along the Z direction.

Subsequently, further wet etching or dry etching is performed to selectively remove portions of the insulator 54. As described above, the insulator 54 has been formed at a lower density than the insulator 53a' or 53b' so that it has a greater etching rate. Accordingly, when the insulator 54 is removed in the X direction until the semiconductors 52a and 52b are exposed, the insulator 53a' can be retained on the semiconductor 52a and the insulator 53b' can be retained on the semiconductor 52b.

Figure 64:
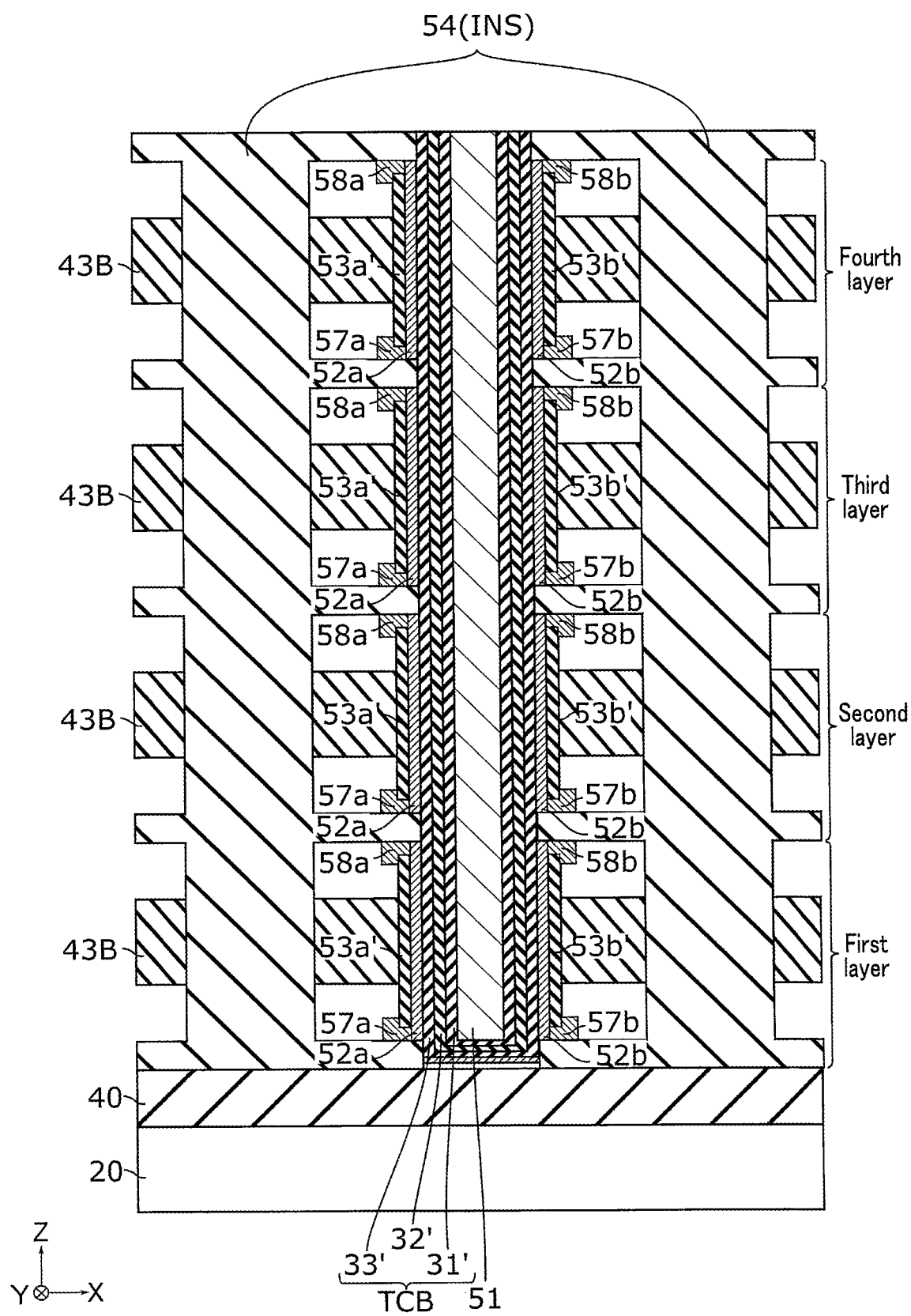
FIG. 64 is a sectional view of the memory cell array as an illustration for explaining a process for producing the memory device according to the fourth embodiment.

Next, as shown in FIG. 64, the exposed portions of the semiconductors 52a and 52b are subjected to selective growth of n-type impurity-containing polysilicon. This forms a semiconductor 57a covering the lower exposed portion of the semiconductor 52a that constitutes one Z-direction excess-length portion thereof as compared to the insulator 53a', and also covering the lower region of the insulator 53a'. Also, a semiconductor 58a is formed, covering the upper exposed portion of the semiconductor 52a that constitutes another Z-direction excess-length portion as compared to the insulator 53a', and also covering the upper region of the insulator 53a'. Meanwhile, a semiconductor 57b is formed, covering the lower exposed portion of the semiconductor 52b that constitutes one Z-direction excess-length portion thereof as compared to the insulator 53b', and also covering the lower region of the insulator 53b'. Also, a semiconductor 58b is formed, covering the upper exposed portion of the semiconductor 52b that constitutes another Z-direction excess-length portion as compared to the insulator 53b', and also covering the upper region of the insulator 53b'. The selective growth in this process step may use, for example, LPCVD.

Next, as shown in FIG. 65, the conductors 21 are formed in the spaces created by the removal of the sacrificial members 42, and the conductors 22 are formed in the spaces created by the removal of the sacrificial members 44. The film formation in this process step may use, for example, LPCVD or PCVD. Subsequently, the sacrificial member 51 is removed by wet etching, and the space after the removal of the sacrificial member 51 is filled with a conductor 30. The film formation in this process step may use, for example, LPCVD or PCVD.

By the process steps described above, the multiple, three-dimensionally stacked memory cell transistors MTa and MTb are formed. Thereafter, a step of forming conductors 23 and 24, a step of forming contacts to the conductors 21 and 22 and to various circuitry components formed in the insulator 40, a heat treatment step, etc. are performed so that the memory cell array 10 is formed.

Note that the production process described above is only an example. It is possible to adopt modifications such as inserting other processes between the process steps and changing the order of the steps as long as a problem does not occur.

4.3 Effects of Embodiment

According to the fourth embodiment, portions of the semiconductor 52 and the insulator 53, at the height where the associated insulator 41B was present, are removed via the space created by the removal of this insulator 41B. The semiconductor 52 is thus divided to correspond to the respective layers. Also, the insulator 53 are further partially removed along the Z direction via the same space, and the portion subjected to this further removal is substituted by the insulator 54. Thereafter, the portions substituted by the insulator 54 are selectively removed via the respective spaces created by the removal of the sacrificial members 42 and 44, so that the associated portions of the semiconductor 52 are exposed in the spaces. The semiconductors 57 and 58, each functioning as a source or a drain of a memory cell transistor MT, are formed by the selective growth caused from the portions of the semiconductor 52 exposed in the spaces created by the removal of the sacrificial members 42 and 44, respectively.

Thus, this allows the number of different-material members stacked for each layer to be reduced from 6 to 4, and the increase in load of the production process steps can be suppressed as in the third embodiment. Together, as in the third embodiment, more layers can be provided in the memory cell array with a reduced processing-conversion difference for the production process steps, and therefore, increase in size of the memory cell array can be suppressed.

Moreover, since the length of the channels can be increased, the embodiment realizes improved properties of the memory cell transistors MT.

4.4 Modifications

The foregoing fourth embodiment tolerates various modifications. The description will basically concentrate on aspects of the configuration and the production process that differ from the fourth embodiment.

4.4.1 First Modification

The foregoing fourth embodiment has assumed the instances where the semiconductors 57a and 57b, and the semiconductors 58a and 58b are formed by causing n-type impurity-containing semiconductor films to selectively grow on the semiconductors 52a and 52b, but this is not a limitation. For example, each n-type impurity-containing semiconductor film may be formed as a continuous film on the inner walls that define the space after the removal of the sacrificial member 42 or 44.

Figure 66:
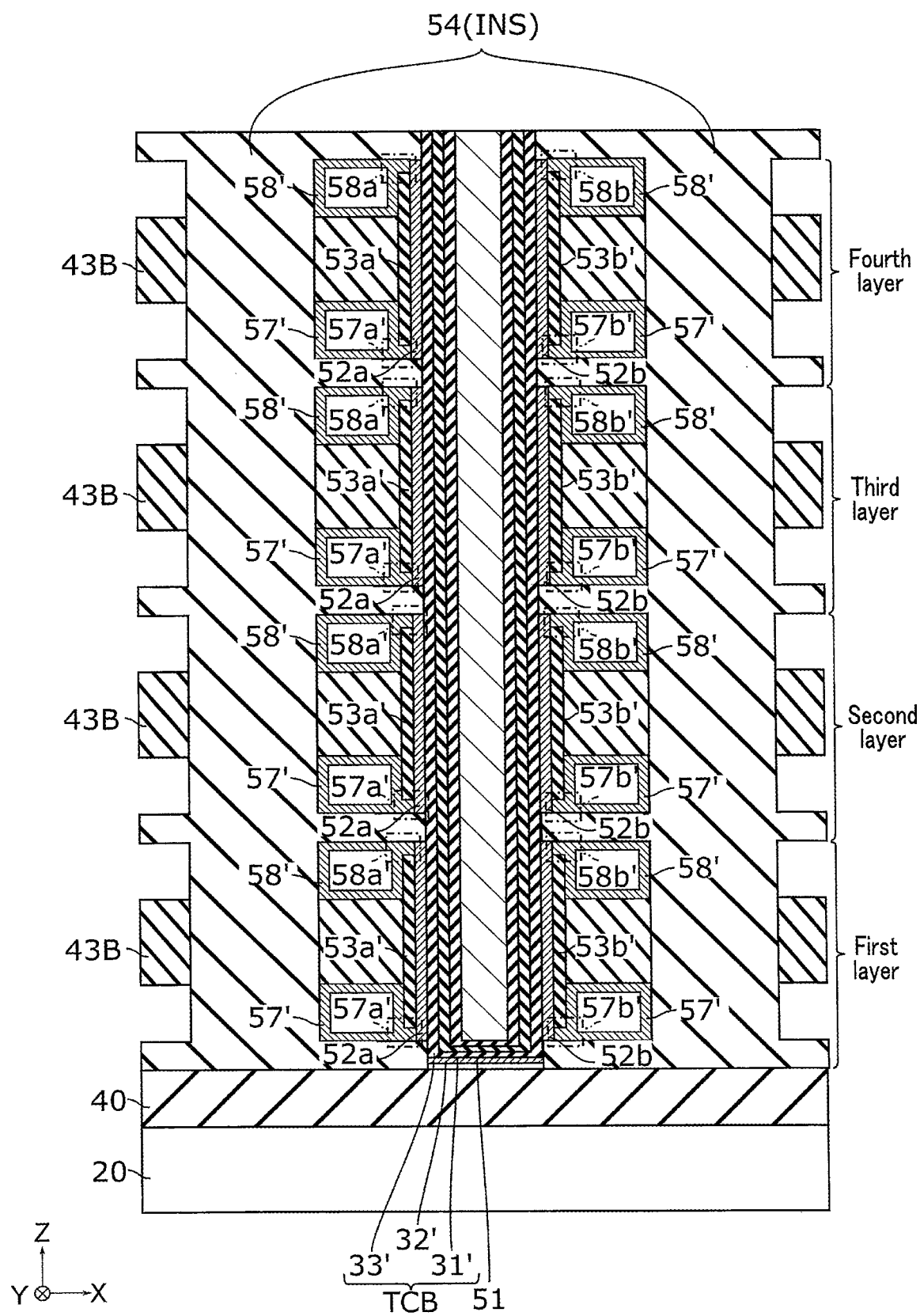
FIG. 66 is a sectional view of a memory cell array as an illustration for explaining a process for producing a memory device according to a first modification of the fourth embodiment.

FIG. 66 is one example of a sectional structure that includes a structural part corresponding to the memory cell array and that is formed in the course of the process for producing the memory device according to the first modification of the fourth embodiment. FIG. 66 corresponds to the fourth embodiment shown in FIG. 64.

As shown in FIG. 66, a semiconductor 57' is formed on the inner walls that define the space after the removal of the sacrificial member 42, and a semiconductor 58' is formed on the inner walls that define the space after the removal of the sacrificial member 44. The film formation in this process step may use, for example, LPCVD.

The semiconductors 57' and 58' contain, for example, amorphous silicon or polysilicon that contains an n-type impurity at a high concentration of 1E20/cm³ or more, and each have a thickness of several nanometers to several tens of nanometers. Since the semiconductors 57' and 58' are each formed as a continuous film on the inner walls that surround the space after the removal of the sacrificial member 42 or 44 as described above, the formed semiconductors 57' and 58' each have a tubular profile when viewed in the Y direction. Also, the semiconductor 57' contacts the lower side surface of the semiconductor 52a or 52b, and the semiconductor 58' contacts the upper side surface of the semiconductor 52a or 52b.

Here, the region of contact between the semiconductor 57' and the semiconductor 52 has an upper end lower than the upper surface of the conductor 21 when formed, and the region of contact between the semiconductor 58' and the semiconductor 52 has a lower end higher than the lower surface of the conductor 22 when formed.

Accordingly, a portion 57a' of the semiconductor 57', which is in contact with the semiconductor 52a, and a portion 58a' of the semiconductor 58', which is in contact with the semiconductor 52a, each function as a source or a drain of the memory cell transistor MTa. A portion 57b' of the semiconductor 57', which is in contact with the semiconductor 52b, and a portion 58b' of the semiconductor 58', which is in contact with the semiconductor 52b, each function as a source or a drain of the memory cell transistor MTb.

According to the first modification of the fourth embodiment, the semiconductors 57' and 58' are formed on the inner walls surrounding the spaces created by the removal of the respective sacrificial members 42 and 44, and such film formation is uniformly done by, for example, LPCVD. Subsequently, the spaces inside the semiconductors 57' and 58' are filled with the conductors 21 and 22, respectively.

Thus, this allows the number of different-material members stacked for each layer to be reduced from 6 to 4, and the increase in load of the production process steps can be suppressed as in the fourth embodiment. Together, as in the fourth embodiment, more layers can be provided in the memory cell array with a reduced processing-conversion difference for the production process steps, and therefore, increase in size of the memory cell array can be suppressed.

4.4.2 Second Modification

The foregoing fourth embodiment and its first modification have assumed the instances where n-type impurity-containing semiconductor films are formed in the spaces created by the removal of the sacrificial members 42 and 44, but this is not a limitation. For example, n-type impurity-containing semiconductor films may be formed by doping portions of the semiconductors 52a and 52b with n-type impurities.

FIG. 67 is one example of a sectional structure that includes a structural part corresponding to the memory cell array and that is formed in the course of the process for producing the memory device according to the second modification of the fourth embodiment. FIG. 67 corresponds to the fourth embodiment shown in FIG. 64.

In the example shown in FIG. 67, vapor-phase diffusion is conducted to cause n-type impurities to diffuse into the lower side surface regions of the semiconductors 52a and 52b which are exposed in the spaces created by the removal of the sacrificial member 42, and into the upper side surface regions of the semiconductors 52a and 52b which are exposed in the spaces created by the removal of the sacrificial member 44. The diffusion of the n-type impurities takes place in the range of, for example, several nanometers (nm) to 20 nanometers (nm) from each of the upper and lower side surfaces of the semiconductor 52a.

Consequently, a lower portion 57a'' and an upper portion 58a'' of the semiconductor 52a contain more n-type impurities than p-type impurities, and each function as a source or a drain of the memory cell transistor MTa. Similarly, a lower portion 57b'' and an upper portion 58b'' of the semiconductor 52b contain more n-type impurities than p-type impurities, and each function as a source or a drain of the memory cell transistor MTb.

According to the second modification of the fourth embodiment, the semiconductors 57'' are formed by the vapor-phase diffusion of n-type impurities into the semiconductors 52 exposed in the spaces after the removal of the sacrificial member 42, and the semiconductors 58'' are formed by the vapor-phase diffusion of n-type impurities into the semiconductors 52 exposed in the spaces after the removal of the sacrificial member 44. Subsequently, the spaces after the removal of the sacrificial members 42 and 44 are filled with the conductors 21 and 22, respectively.

This allows the number of different-material members stacked for each layer to be reduced from 6 to 4, and the increase in load of the production process steps can be suppressed as in the fourth embodiment. Together, as in the fourth embodiment, increase in size of the memory cell array can be suppressed.

5. Fifth Embodiment

Next, a memory device according to the fifth embodiment will be described. The first to fourth embodiments have assumed the instances where each of the multiple bit lines BL has a first end connected to the corresponding memory cell transistor MT and a second end connected to the corresponding bit line driver 131. The description will be given, as the fifth embodiment, of a detailed bit line configuration between the bit line drivers 131 and the memory cell transistors MT. The description will basically omit the configuration and production process substantially the same as those of the first embodiment, and concentrate on the configuration and production process that differ from those of the first embodiment.

5.1 Circuit Configuration of Memory Cell Array

FIG. 68 is one example of a circuit diagram for explaining a structure of the memory cell array of the memory device according to the fifth embodiment, and corresponds to the first embodiment shown in FIG. 2.

As shown in FIG. 68, multiple bit lines include multiple global bit lines GBL, and multiple local bit lines LBL connected to the respective global bit lines GBL. The local bit lines LBL shown in FIG. 68 correspond to the bit lines BL which have been illustrated for the first to fourth embodiments. That is, multiple memory cell transistors MT associated with the same column are connected in parallel with each other between a given local bit line LBL and a given source line SL among the multiple pairs of the local bit lines LBL and the source lines SL.

The multiple local bit lines LBL are each connected to a first end of a corresponding select transistor ST. Multiple select transistors ST in one layer have their gates connected to one common select gate line SGL. In other words, gates of multiple select transistors ST in the k-th layer have common connections to the same select gate line SGLk ($1 \leq k \leq n$). Multiple select transistors ST connected to the respective memory cell transistors MTa (or MTb) in one string NSa (or NSb) have their second ends connected to one common global bit line GBL.

In the disclosure herein, a term "string STS" will be used to refer to a unit constituted by multiple select transistors ST having common connections to the same global bit line GBL, for the sake of explanation.

The above configuration allows for the selection of a single local bit line LBL through the selection of a set of one global bit line GBL and one select gate line SGL.

5.2 Structure of Memory Cell Array

An exemplary structure of the memory cell array of the memory device according to the fifth embodiment will be described.

FIG. 69 is a plan view for explaining a planar layout of the memory cell array of the memory device according to the fifth embodiment. FIG. 69 schematically shows, as one example, a cell region in the memory cell array 10 and hookup regions for pulling out various interconnects to be higher than the memory cell array 10, which are viewed from above. The cell region here is of a similar structure to the first embodiment shown in FIG. 3, so the substantial description thereof will be basically omitted.

Note that, for the sake of explanation, the description will assume the instances where there are two memory cell transistors MT stacked along the Z direction (that is, where two layers, i.e., a first layer and a second layer, are provided).

As shown in FIG. 69, the hookup regions include a bit line hookup region for pulling out the global bit lines GBL to be higher than the memory cell array 10, and a select gate line hookup region for pulling out the select gate lines SGL to be higher than the memory cell array 10. The cell region, the bit line hookup region, and the select gate line hookup region are sequentially arranged along the Y direction in this order.

The bit line hookup region is provided with multiple strings STS arranged along the X direction. The multiple strings STS are each disposed between two consecutive structures INS while contacting these two structures INS, so that the strings STS are separate from one another. The multiple strings STS arranged along the X direction each have a first end in the Y direction that contacts the corresponding stack STK extending along the Y direction from the side of the cell region. This stack STK includes a stack of multiple local bit lines LBL. Also, the multiple strings STS arranged along the X direction have respective second ends in the Y direction that have common connections to multiple select gate lines SGL (SGL1 and SGL2) provided for the respective layers and extending along the Y direction in the select gate line hookup region. Further, each of the multiple strings STS is connected to the global bit line GBL extending therethrough along the Z direction.

With the above constitution, the global bit lines GBL are pulled out in the bit line hookup region so that they are higher than the memory cell array 10.

In the select gate line hookup region, the select gate lines SGL corresponding to the respective layers together form a staircase profile along the Y direction in order for them to be pulled out higher than the memory cell array 10. In other words, the Y-direction extension of the select gate line SGL for the lower layer (e.g., select gate line SGL1) is, starting from the region of contact with the strings STS, longer than that of the select gate line SGL for the upper layer (e.g., select gate line SGL2). The select gate line SGL for the lower layer is connected with a contact CV which extends along the Z direction where the select gate line SGL for the upper layer is absent. As such, contacts CV1 and CV2 in this example are disposed such that the former is more distant from the string STS in the Y direction than the latter.

With the above constitution, the select gate lines SGL are pulled out in the select gate line hookup region so that they are higher than the memory cell array 10.

FIG. 70 shows an exemplary sectional structure of the memory cell array 10 shown in FIG. 69, assuming that the array is cut along the line LXX-LXX. Thus, FIG. 70 is mainly composed of the cross-sections of the bit line hookup region and the select gate line hookup region.

As shown in FIG. 70, the structural part to form the string STS in the bit line hookup region includes a conductor 65, insulators 61 and 67, and semiconductors 62, 64, 66, and 68. This structural part is connected to each of the multiple conductors 21 in the corresponding stack STK on the cell region side, and to multiple conductors 69 corresponding to the respective conductors 21 in the select gate line hookup region.

The conductor 21 in each layer is formed below the associated conductor 22 and thicker in the Z direction than the conductor 22.

The multiple conductors 69 are disposed at the same height as the respective, corresponding conductors 21. The conductors 69 may contain, for example, a metal such as tungsten, molybdenum, or the like, and may be covered by a barrier metal such as titanium nitride, tungsten nitride, or the like.

The conductor 65 is provided at the center portion of the structural part forming the string STS and includes, for example, a portion of a cylindrical shape that extends along the Z direction. The conductor 65 has a lower end that is lower than the lower surface of the conductor 21 in the lowermost layer (the first layer), and an upper end that is higher than the upper surface of the conductor 22 in the uppermost layer. The conductor 65 may contain, for example, a metal such as tungsten, molybdenum, or the like, and may be covered by a barrier metal such as titanium nitride, tungsten nitride, or the like.

The semiconductor 64 surrounds the side surface and the lower surface of the conductor 65 and is electrically connected to the conductor 65. The semiconductor 64 contains, for example, polysilicon containing an n-type impurity, and functions as a first end (a source or a drain) of each of the multiple select transistors ST in the string STS.

The semiconductor 66 is provided for each layer and disposed between the conductor 21 in the corresponding layer and the semiconductor 64, so as to be electrically connected to the conductor 21. The semiconductor 66 contains, for example, polysilicon containing an n-type impurity, and functions as a source or a drain of the select transistor ST in the corresponding layer.

The semiconductor 62 contains, for example, polysilicon containing a p-type impurity. The semiconductor 62 has first portions provided at the same heights as the respective members of the stack STK except the conductors 21, and second portions provided at the same heights as the conductors 21 of the respective layers. The first and second portions of the semiconductor 62 are formed as a continuous film.

The first portions of the semiconductor 62 surround the side surface and the lower surface of the semiconductor 64. The second portions of the semiconductor 62 each have portions 62p provided between the semiconductors 66 and 64 and physically connecting together the semiconductor 66 and the semiconductor 64. The portions 62p function as a channel of the select transistor ST in the corresponding layer. Note that there is no second portion of the semiconductor 62 between the conductor 69 and the semiconductor 64 in the corresponding layer (that is, the semiconductor 62 has openings such that the semiconductor 62 does not interrupt between each conductor 69 and the semiconductor 64).

The insulator 67 is provided for each layer and covers the surfaces of the semiconductor 64 and the second portion of the semiconductor 62 at the same height as the conductor 21 in the corresponding layer. The insulator 67 contains, for example, silicon oxide and its portion provided along the portions 62$p$ of the semiconductor 62 functions as a gate insulating film for the select transistor ST in the corresponding layer.

The semiconductor 68 is provided for each layer and disposed between the insulator 67 and the conductor 69 in the corresponding layer, so as to cover the entire surface of each of the insulator 67 and the conductor 69. The semiconductor 68 contains, for example, polysilicon containing an n-type impurity. The portion of the semiconductor 68, provided along the respective portion 62$p$ of the semiconductor 62 via the insulator 67, functions as a source or a drain of the select transistor ST in the corresponding layer.

As such, the insulator 67 is provided between [the semiconductor 68 and the conductor 69] and [the semiconductors 62, 64, and 66, and the conductors 21 and 65].

The insulator 61 is provided for each layer and disposed on the side surface of the first portion of the semiconductor 62 at the same height as the conductor 22 in the corresponding layer. Each insulator 61 contains, for example, silicon oxide and electrically separates the associated conductor 22 and the semiconductor 64 from each other.

The conductor 70 is provided for each layer and extends along the Z direction from the upper portion of the conductor 69 of the corresponding layer. The conductor 70 thus serves as a contact CV for pulling out the respective select gate line SGL to be higher than the memory cell array 10.

As in the above constitution, the multiple select transistors ST corresponding to the respective layers are formed within one string STS.

5.3 Method for Producing Memory Device

An example of a process for producing the memory cell array of the memory device according to the fifth embodiment will be described. FIGS. 71 to 97 each show an example of a sectional structure that includes a structural part corresponding particularly to the hookup regions for the memory cell array and that is formed in the course of the process for producing the memory device according to the fifth embodiment. Note that the sectional views which will be referred to for the production process include a cross-section vertical to the surface of the semiconductor substrate 20. Also, regions indicated in each sectional view for the production process step correspond to the regions indicated in FIG. 70.

First, a structure similar to that shown in FIG. 5 for the first embodiment, i.e., a structure that has been described as becoming the multiple stacks STK, is formed. Here, the sacrificial member 42 is formed with a thickness in the 2 direction greater than that of the sacrificial member 44.

Subsequently, process steps similar to those explained with reference to FIGS. 6 to 13 for the first embodiment are performed.

Figure 71:
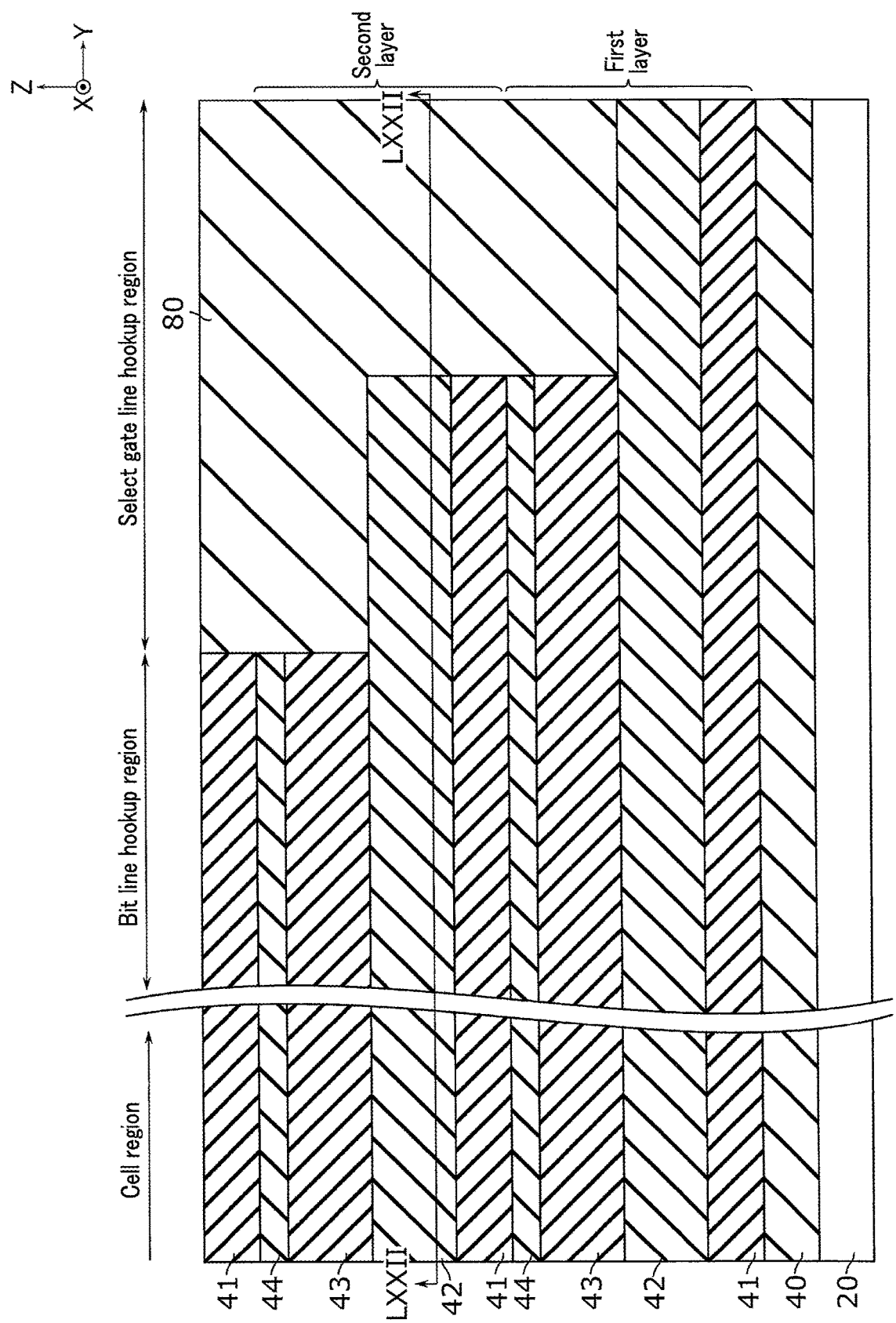
FIG. 71 is a sectional view of the memory cell array as an illustration for explaining a process for producing the memory device according to the fifth embodiment.

As shown in FIG. 71, in the select gate line hookup region, the insulator 43 and the sacrificial member 44 in the first layer and the insulator 41 and the sacrificial member 42 in the second layer are each formed to be shorter in the Y direction than the insulator 41 and the sacrificial member 42 in the first layer. Also, the insulator 43 and the sacrificial member 44 in the second layer and the uppermost insulator 41 are each formed to be shorter in the Y direction than the insulator 43 and the sacrificial member 44 in the first layer and the insulator 41 and the sacrificial member 42 in the second layer. Accordingly, a staircase-profile portion is formed in the select gate line hookup region. Note that the space above the staircase-profile portion is, for example, subjected to formation of an interlayer insulating film 80.

Figure 72:
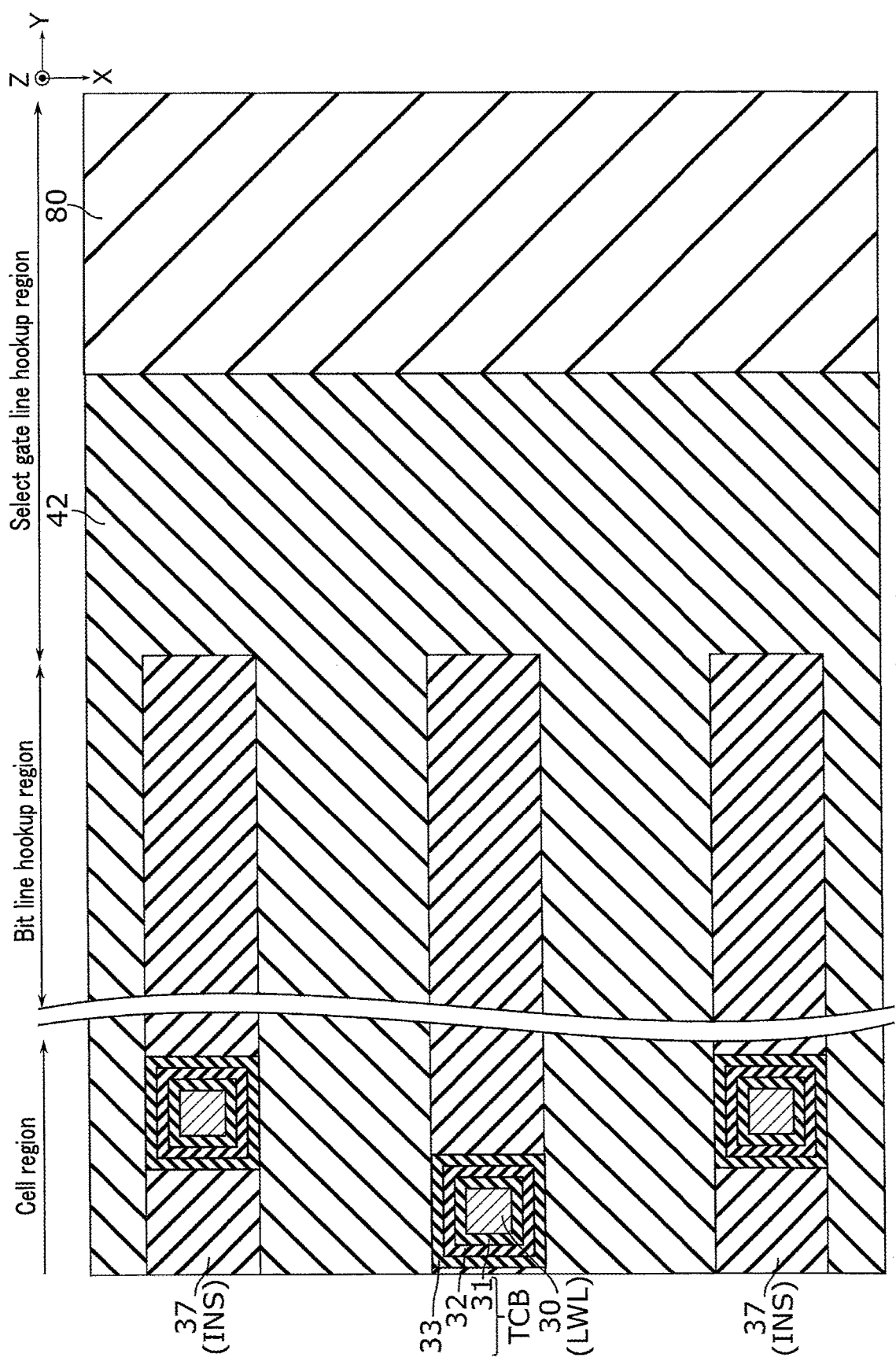
FIG. 72 is a sectional view of the memory cell array, taken along the line LXXII-LXXII indicated in FIG. 71.

FIG. 72 is a sectional view of the memory cell array 10, taken along the line LXXII-LXXII indicated in FIG. 71. As shown in FIG. 72, the process steps have formed multiple structures MP in the cell region. The process steps have also formed multiple semiconductors 34 and 35 (not shown) in the cell region. Note that, as can be understood from the foregoing description, the structures INS extend along the Y direction up to the boundary between the bit line hookup region and the select gate line hookup region.

Next, as shown in FIG. 73, a step of, for example, lithography and anisotropic etching is conducted to remove each region intended for forming the string STS from the stacked structure shown in FIG. 71, so that holes CH are formed. Each hole CH penetrates through the lowermost insulator 41 and reaches the upper surface of the insulator 40. The anisotropic etching in this process step may be, for example, RIE.

Figure 74:
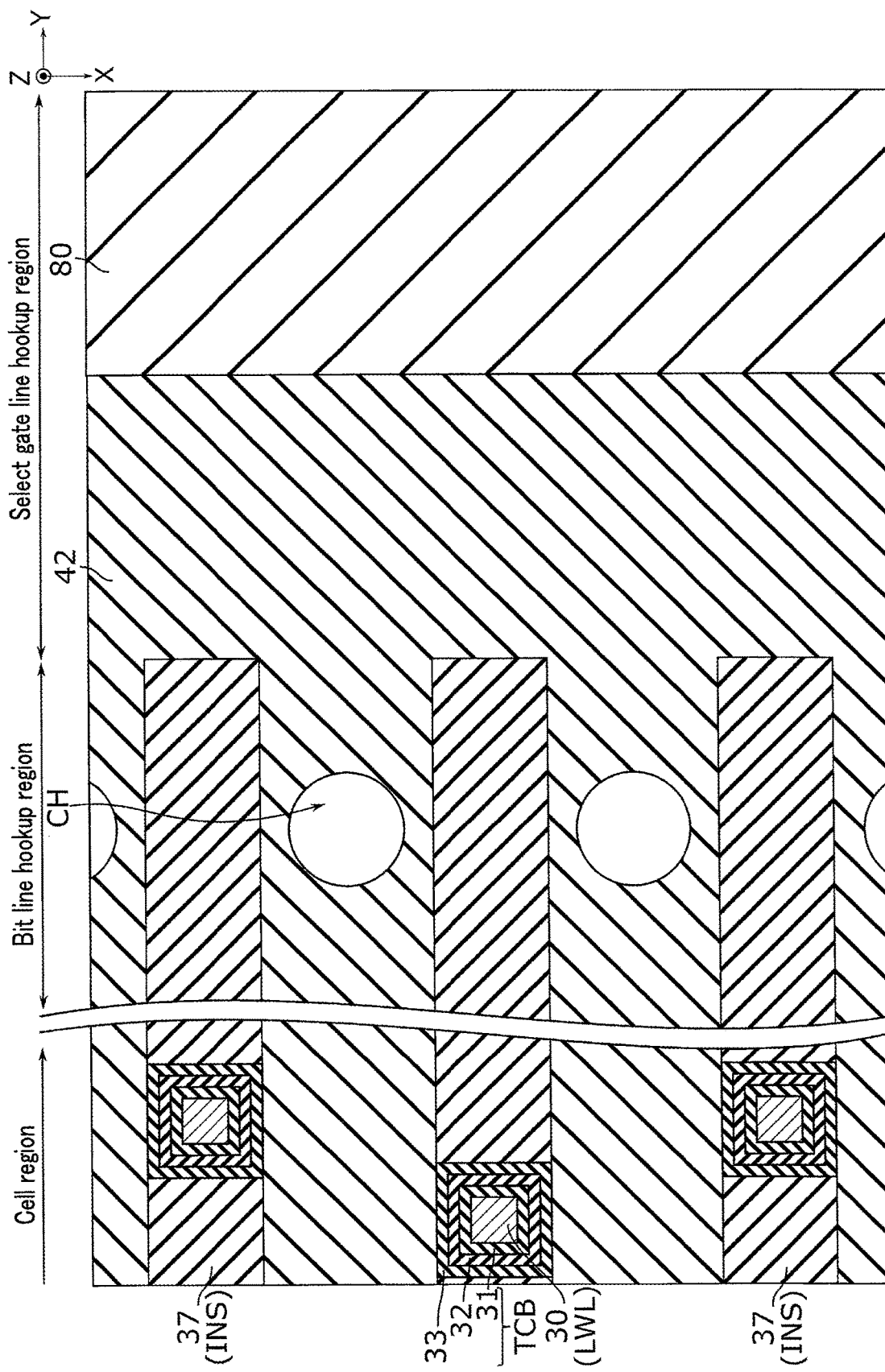
FIG. 74 is a sectional view of the memory cell array, taken along the line LXXIV-LXXIV indicated in FIG. 73.

FIG. 74 is a sectional view of the memory cell array 10, taken along the line LXXIV-LXXIV indicated in FIG. 73. As shown in FIG. 74, the process step has formed multiple holes CH each having, for example, a circular opening. One hole CH is provided at every interval between multiple structures INS arranged along the X direction.

Next, as shown in FIG. 75, portions of the sacrificial members 42 and 44, exposed via each hole CH formed as shown in FIG. 73, are selectively removed by, for example, wet etching or dry etching. This forms, within the hole CH, recesses that expose the upper and lower surfaces of the insulators 41 and 43 at the heights corresponding to the sacrificial members 42 and 44.

Figure 76:
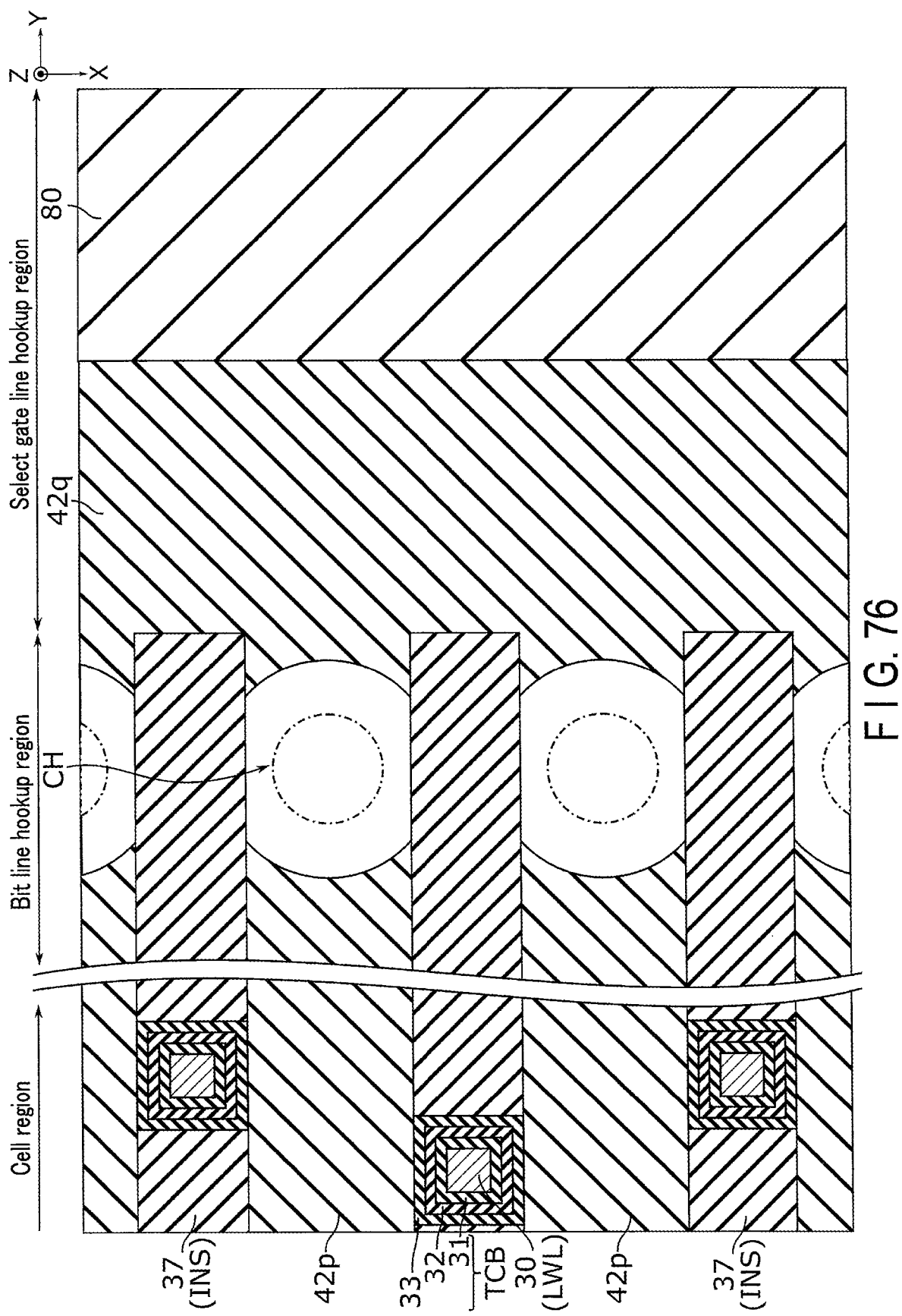
FIG. 76 is a sectional view of the memory cell array, taken along the line LXXVI-LXXVI indicated in FIG. 75.

FIG. 76 is a sectional view of the memory cell array 10, taken along the line LXXVI-LXXVI indicated in FIG. 75. In this figure, as well as the remaining figures, a circle indicated by dashed-dotted lines within the hole CH represents the diameter of the opening in the insulator 41 or 43. As shown in FIG. 76, the recesses formed by this process step each have a diameter larger than the width between two consecutive structures INS arranged along the X direction. As such, the recesses formed in the respective holes CH by the process step separate the sacrificial members 42 and 44 into the portions 42$p$ and 44$p$ on the side of the cell region and the portions 42$q$ and 44$g$ on the side of the select gate line hookup region, with respect to the holes CH.

Figure 77:
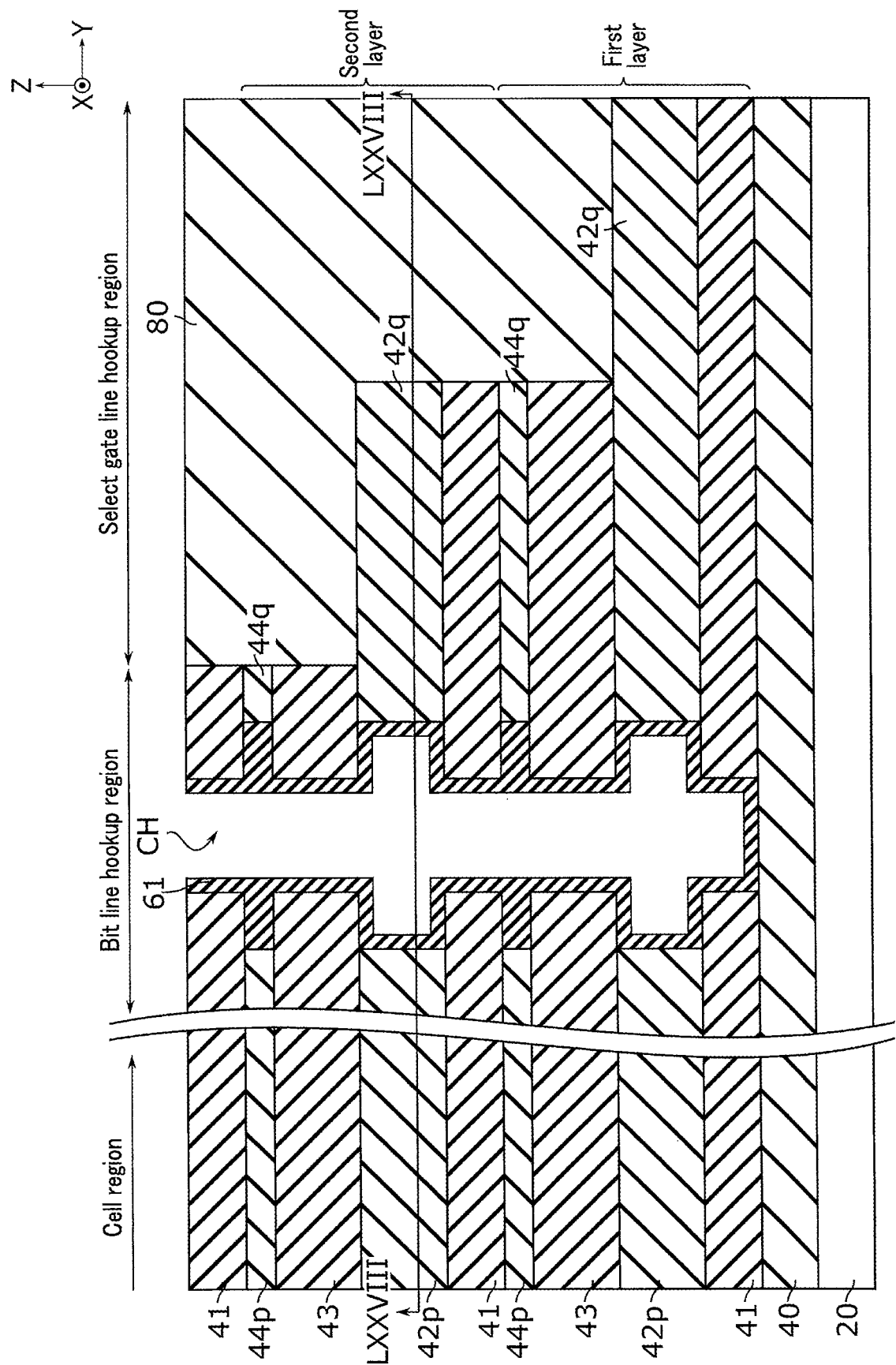
FIG. 77 is a sectional view of the memory cell array as an illustration for explaining a process for producing the memory device according to the fifth embodiment.

Next, as shown in FIG. 77, an insulator 61 is formed in each hole CH having the recesses. This makes the insulator 61 fill the recesses at the heights corresponding to the sacrificial members 44$p$ and 44$q$. On the other hand, since the sacrificial members 42$p$ and 42$q$ are thicker in the Z direction than the sacrificial members 44$p$ and 44$q$ as explained above, the recesses at the heights corresponding to the sacrificial members 42$p$ and 42$q$ each have an opening size in the Z direction larger than that of the recesses at the heights corresponding to the sacrificial members 44$p$ and 44$q$. Accordingly, the insulator 61 formed in the recesses at the heights corresponding to the sacrificial members 42$p$ and 42$q$ does not fill these recesses.

Figure 78:
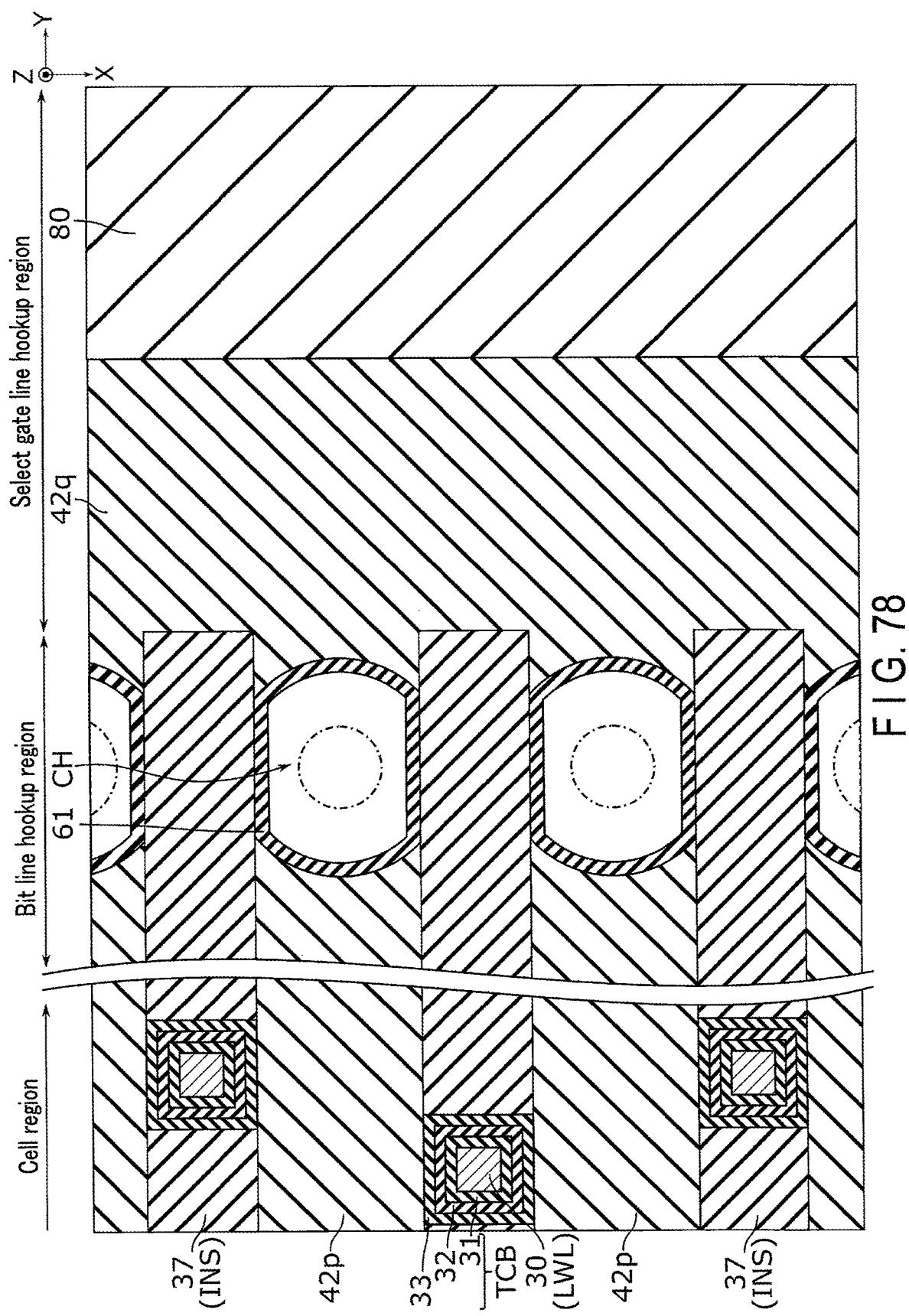
FIG. 78 is a sectional view of the memory cell array, taken along the line LXXVIII-LXXVIII indicated in FIG. 77.

FIG. 78 is a sectional view of the memory cell array 10, taken along the line LXXVIII-LXXVIII indicated in FIG. 77. As shown in FIG. 78, the insulator 61 does not fill each recess at the height corresponding to the associated sacrificial members 42p and 42q, even for the relatively shallow portions (that is, X-direction portions of the recess).

Figure 79:
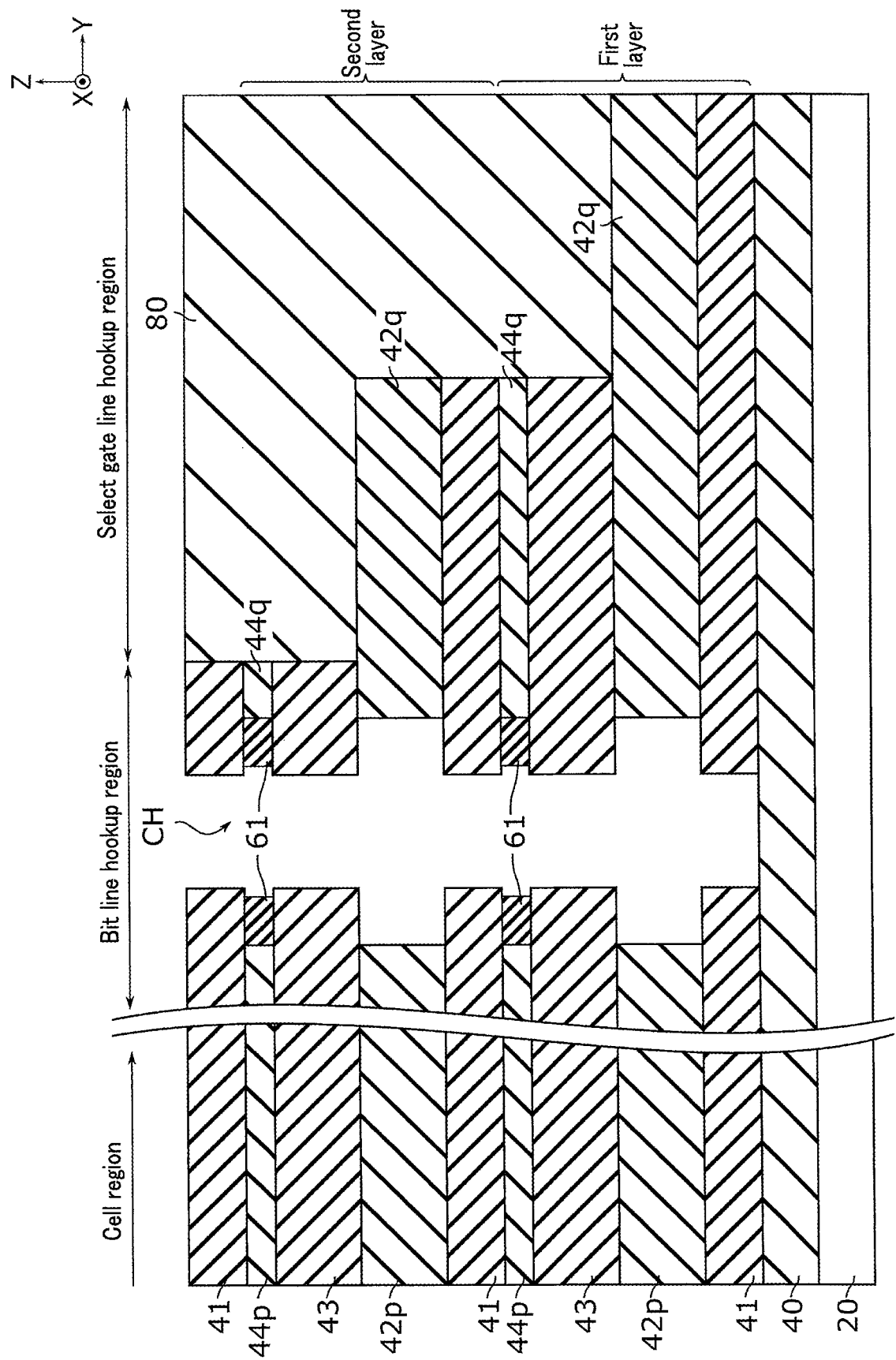
FIG. 79 is a sectional view of the memory cell array as an illustration for explaining a process for producing the memory device according to the fifth embodiment.

Next, as shown in FIG. 79, portions of the insulator 61 formed in each hole CH are removed by, for example, wet etching or dry etching. More specifically, the insulator 61 is subjected to isotropic etching to the extent that its portions formed on the insulators 41 and 43 are removed. As explained above, the insulator 61 does not fill the recesses at the heights corresponding to the sacrificial members 42p and 42q, and the portions of the insulator 61 formed on the sacrificial members 42p and 42q each have a thickness comparable with the thickness of the portions formed on the insulators 41 and 43. Accordingly, the portions of the insulator 61 formed on the sacrificial members 42p and 42q are likewise removed. On the other hand, since the insulator 61 has filled the recesses at the heights corresponding to the sacrificial members 44p and 44q, portions of the insulator 61 formed on the sacrificial members 44p and 44q are not removed but remain there.

Next, as shown in FIG. 80, a semiconductor 62 and a sacrificial member 63 are formed in this order within each hole CH. Similar to the insulator 61 formed as shown in FIG. 77, the semiconductor 62 is formed in such a manner that it does not fill the recesses at the heights corresponding to the sacrificial members 42p and 42q. The sacrificial member 63, however, is formed on the semiconductor 62 in such a manner as to fill these recesses. The sacrificial member 63 contains, for example, silicon nitride. The film formation in this process step may use, for example, LPCVD.

Note that portions 62p of the semiconductor 62 in each layer, including a portion extending along the Y direction over the upper surface of the insulator 41 to reach the sacrificial member 42p and a portion extending along the Y direction over the lower surface of the insulator 43 to reach the sacrificial member 42p, will, in the final form, function as a channel of the select transistor ST.

FIG. 81 is a sectional view of the memory cell array 10, taken along the line LXXXI-LXXXI indicated in FIG. 80. In the example shown in FIG. 81, each hole CH has substantially the same diameter at any of the heights of the insulators 41 and 43 and also the sacrificial members 42p, 42q, 44p, and 44q.

Figure 82:
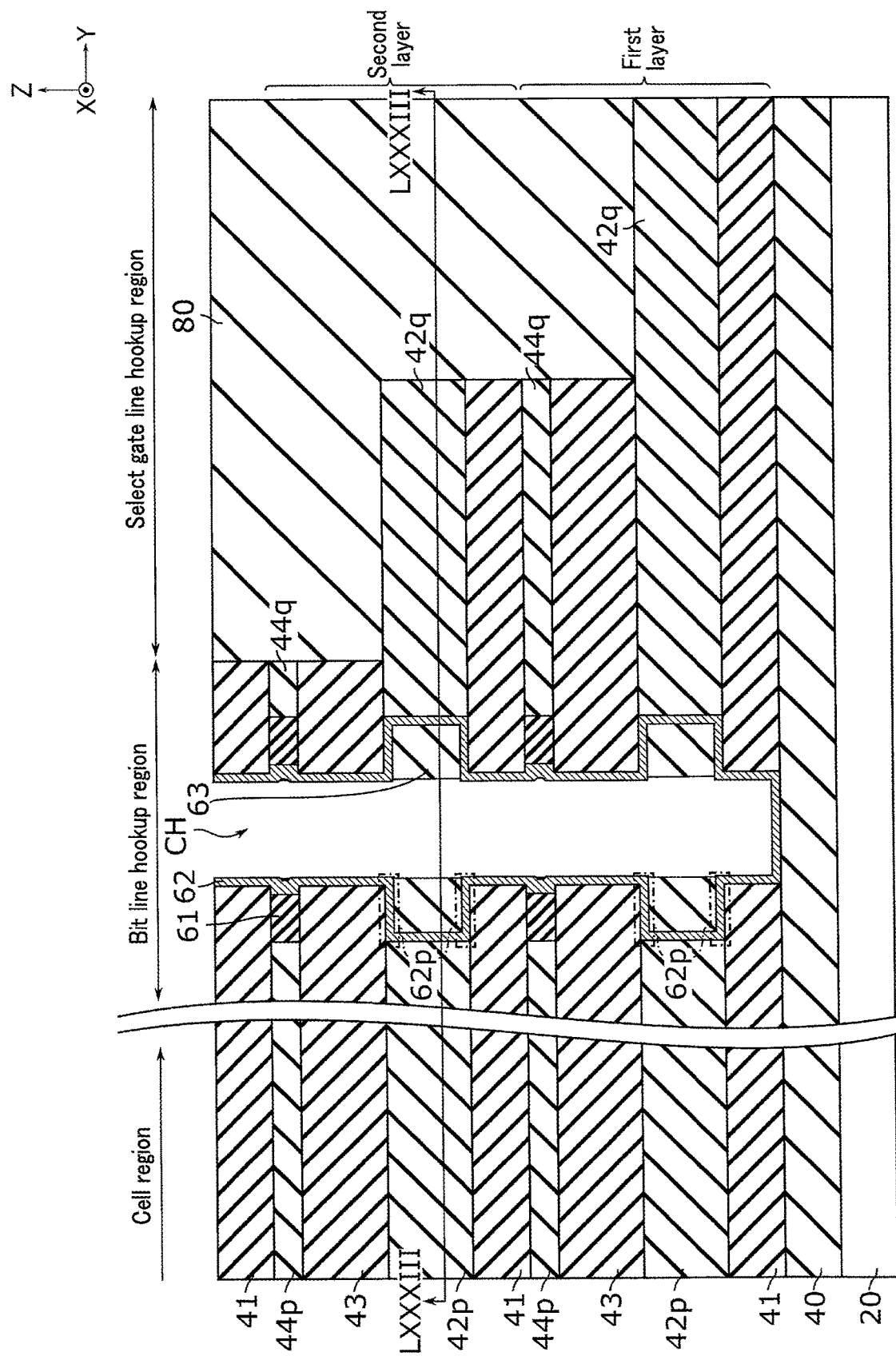
FIG. 82 is a sectional view of the memory cell array as an illustration for explaining a process for producing the memory device according to the fifth embodiment.

Next, as shown in FIG. 82, a portion of the sacrificial member 63 in each hole CH is subjected to an etch-back step. This process step exposes the semiconductor 62 except for the portions at the heights corresponding to the sacrificial members 42p and 42q. The recesses at the heights corresponding to the sacrificial members 42p and 42q are still filled with the semiconductor 62 and the sacrificial member 63.

Figure 83:
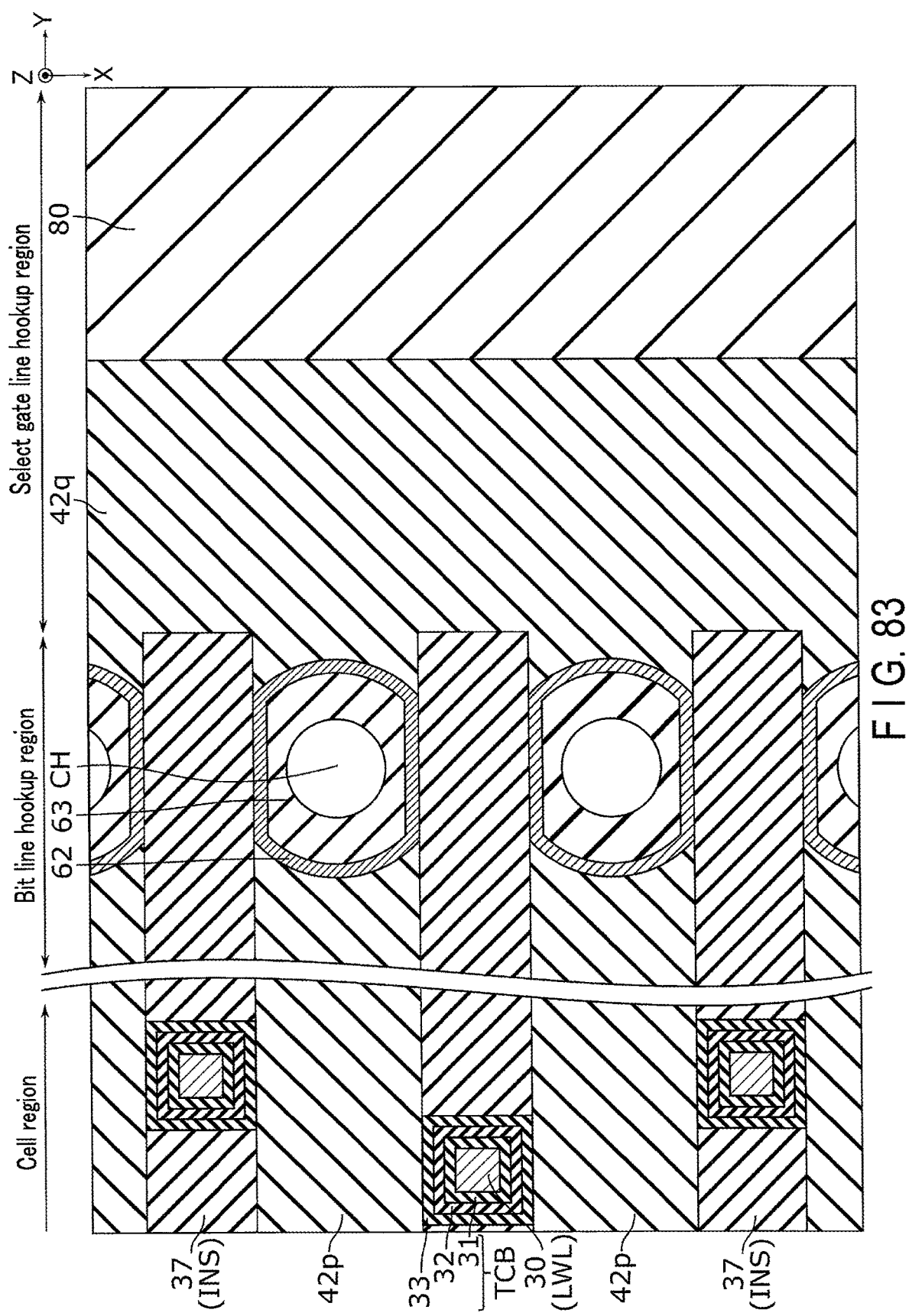
FIG. 83 is a sectional view of the memory cell array, taken along the line LXXXIII-LXXXIII indicated in FIG. 82.

FIG. 83 is a sectional view of the memory cell array 10, taken along the line LXXXIII-LXXXIII indicated in FIG. 82. In the example shown in FIG. 83, each hole CH has substantially the same diameter at any of the heights of the insulators 41 and 43 and also the sacrificial members 42p, 42q, 44p, and 44q, as in the case shown in FIG. 81.

Figure 84:
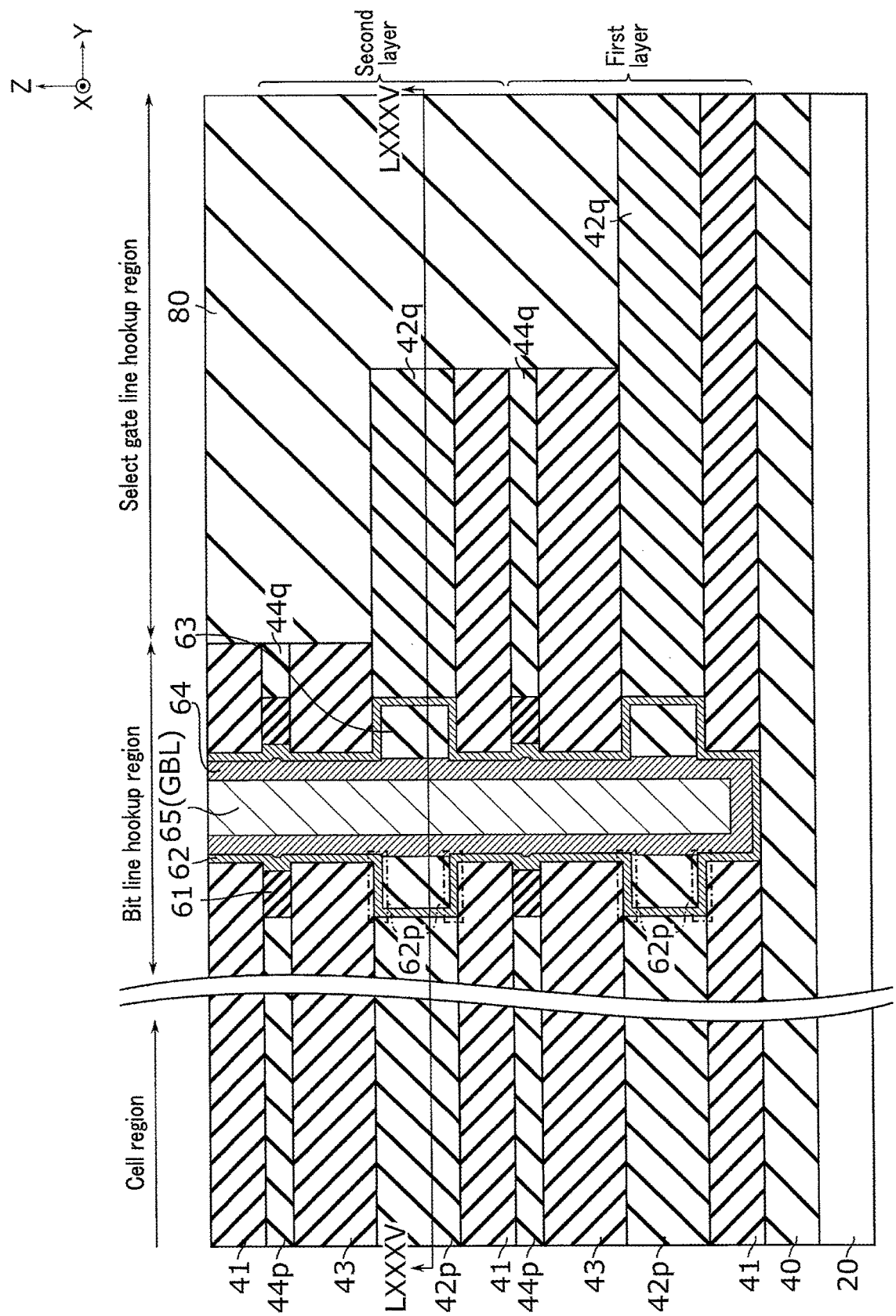
FIG. 84 is a sectional view of the memory cell array as an illustration for explaining a process for producing the memory device according to the fifth embodiment.

Next, as shown in FIG. 84, a semiconductor 64 and a conductors 65 are formed in this order within each hole CH, and the hole CH is thus filled. The film formation in this process step may use, for example, LPCVD or PCVD. Note that the portion of the semiconductor 64 in each layer, which is in contact with the respective portion 62p of the semiconductor 62, will, in the final form, function as a source or a drain of the select transistor ST.

FIG. 85 is a sectional view of the memory cell array 10, taken along the line LXXXV-LXXXV indicated in FIG. 84.

As understood from FIG. 85, the semiconductor 64 includes, on its side surface, the part covered by the sacrificial member 63 in addition to the part where the portions 62p of the semiconductor 62 are formed.

Figure 86:
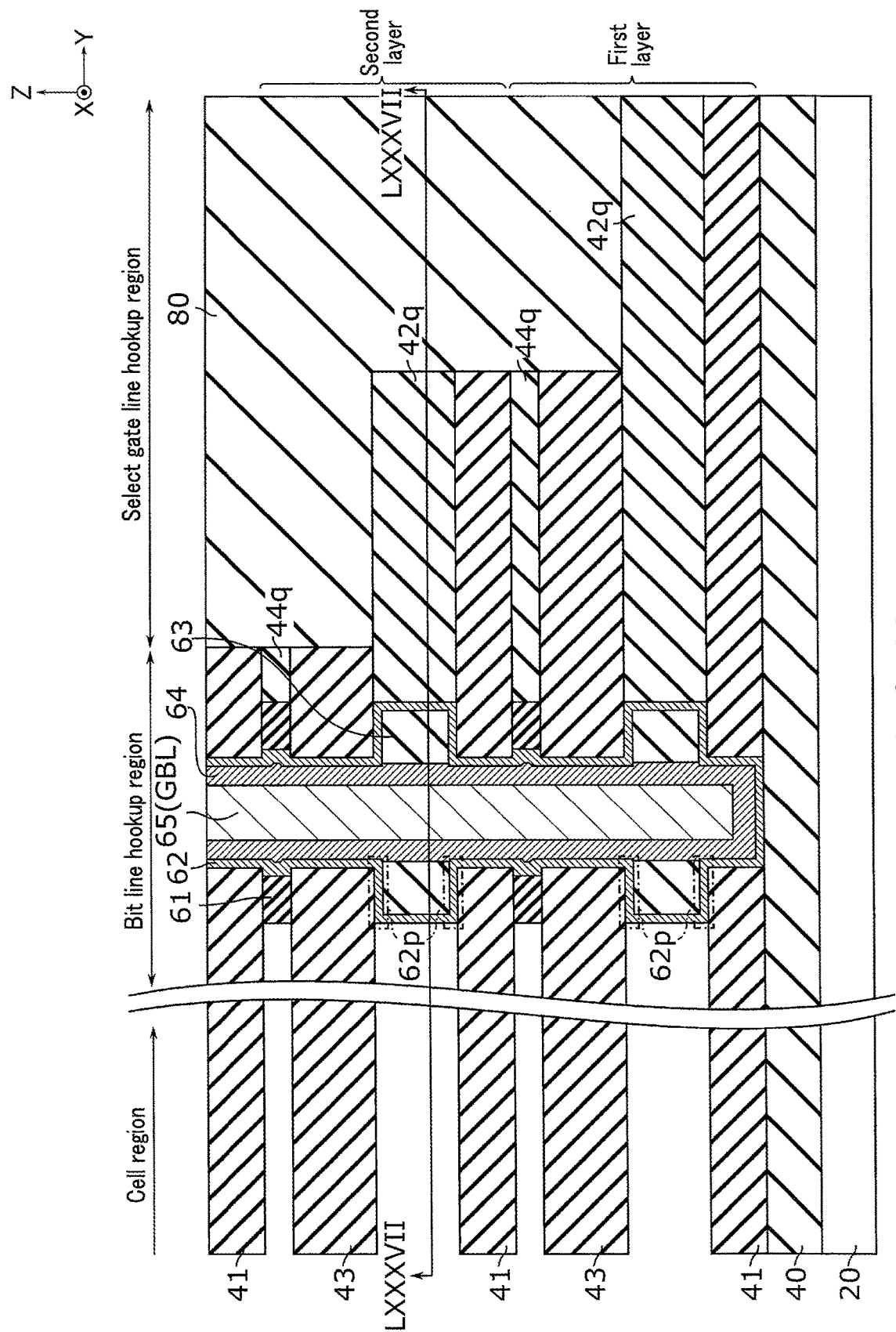
FIG. 86 is a sectional view of the memory cell array as an illustration for explaining a process for producing the memory device according to the fifth embodiment.
Figure 87:
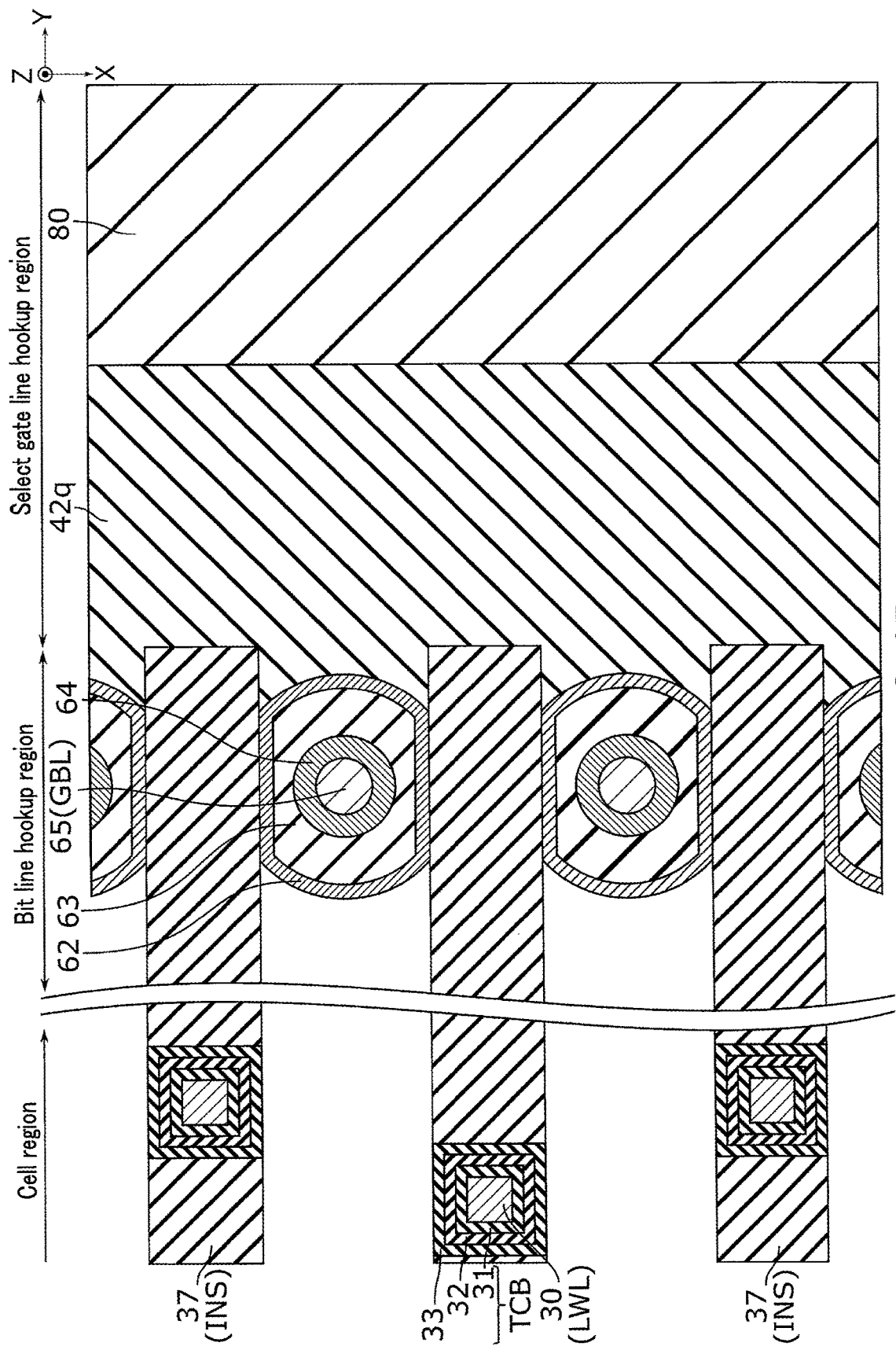
FIG. 87 is a sectional view of the memory cell array, taken along the line LXXXVII-LXXXVII indicated in FIG. 86.

Next, as shown in FIG. 86, and also in FIG. 87 which is a sectional view of the memory cell array 10 taken along the line LXXXVII-LXXVII indicated in FIG. 86, the process step as in the first embodiment shown in FIG. 14 is performed. This removes the sacrificial members 42p and 44p from the cell region and the bit line hookup region, so that the surface of the semiconductor 62 on the side of the cell region is exposed in the space created by the removal of the respective sacrificial member 42p, and the surface of the insulator 61 on the side of the cell region is exposed in the space created by the removal of the respective sacrificial member 44p. Note that the sacrificial members 42q and 44q are each separate from the sacrificial members 42p and 44p as described above, the sacrificial members 42q and 44q remain unremoved by this process step.

Subsequently, the process step as in the first embodiment shown in FIG. 15 is performed. This forms a semiconductor 66 on the semiconductor 62 exposed in the space created by the removal of the respective sacrificial member 42p in the bit line hookup region, while the semiconductors 36 to 39 are formed on the semiconductors 34 and 35 exposed in the spaces created by the removal of the sacrificial members 42p and 44p in the cell region.

Figure 89:
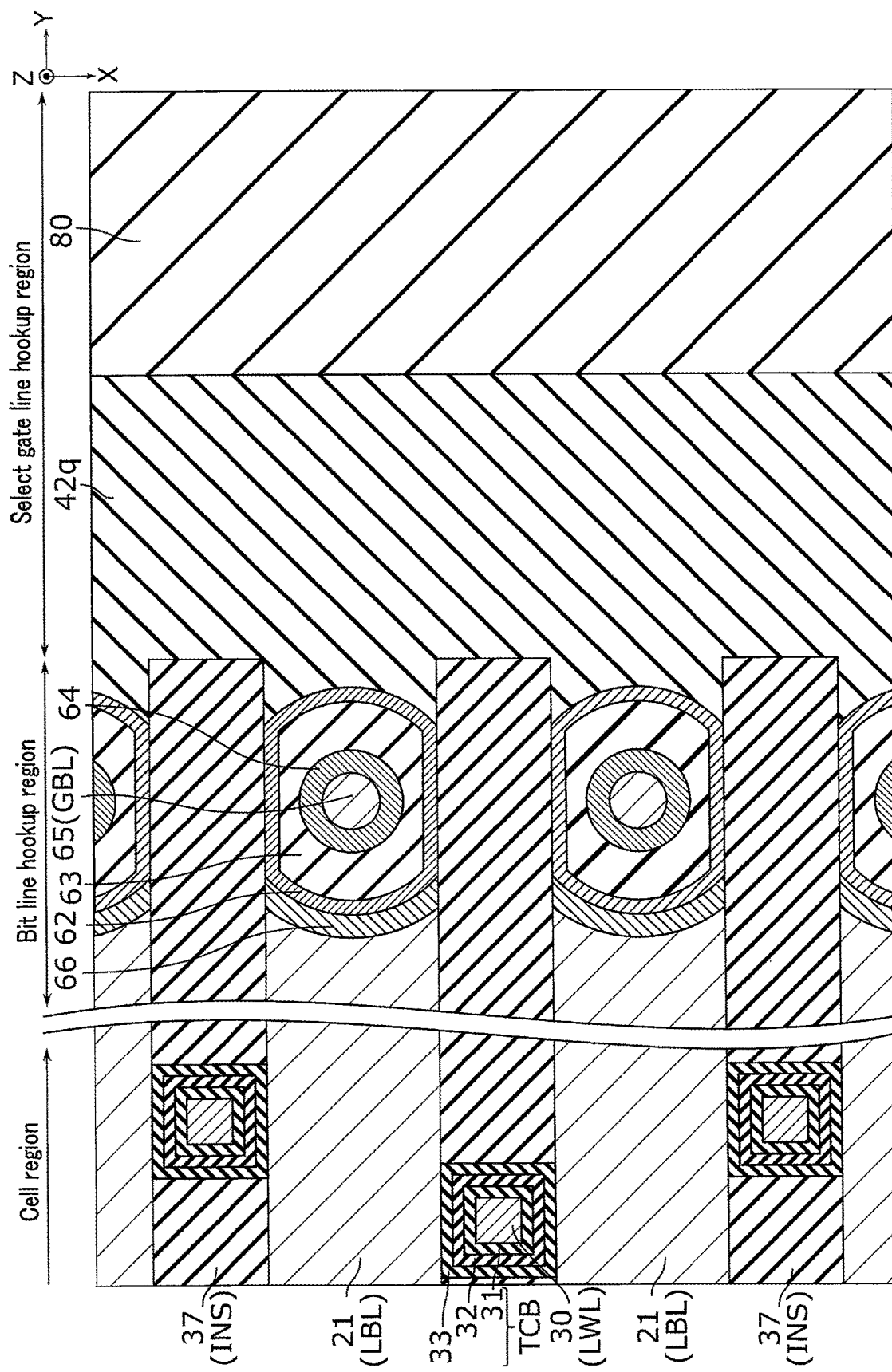
FIG. 89 is a sectional view of the memory cell array, taken along the line LXXXIX-LXXXIX indicated in FIG. 88.

Thereafter, as shown in FIG. 88, and also in FIG. 89 which is a sectional view of the memory cell array 10 taken along the line LXXXIX-LXXXIX indicated in FIG. 88, the process step as in the first embodiment shown in FIG. 16 is performed. This fills the spaces created by the removal of the sacrificial members 42p and 44p with the conductors 21 and 22, respectively. Accordingly, the conductor 21 and the conductor 65 are connected via the n-type impurity-containing semiconductor 64, the p-type impurity-containing semiconductor 62 (portions 62p), and the n-type impurity-containing semiconductor 66.

Figure 90:
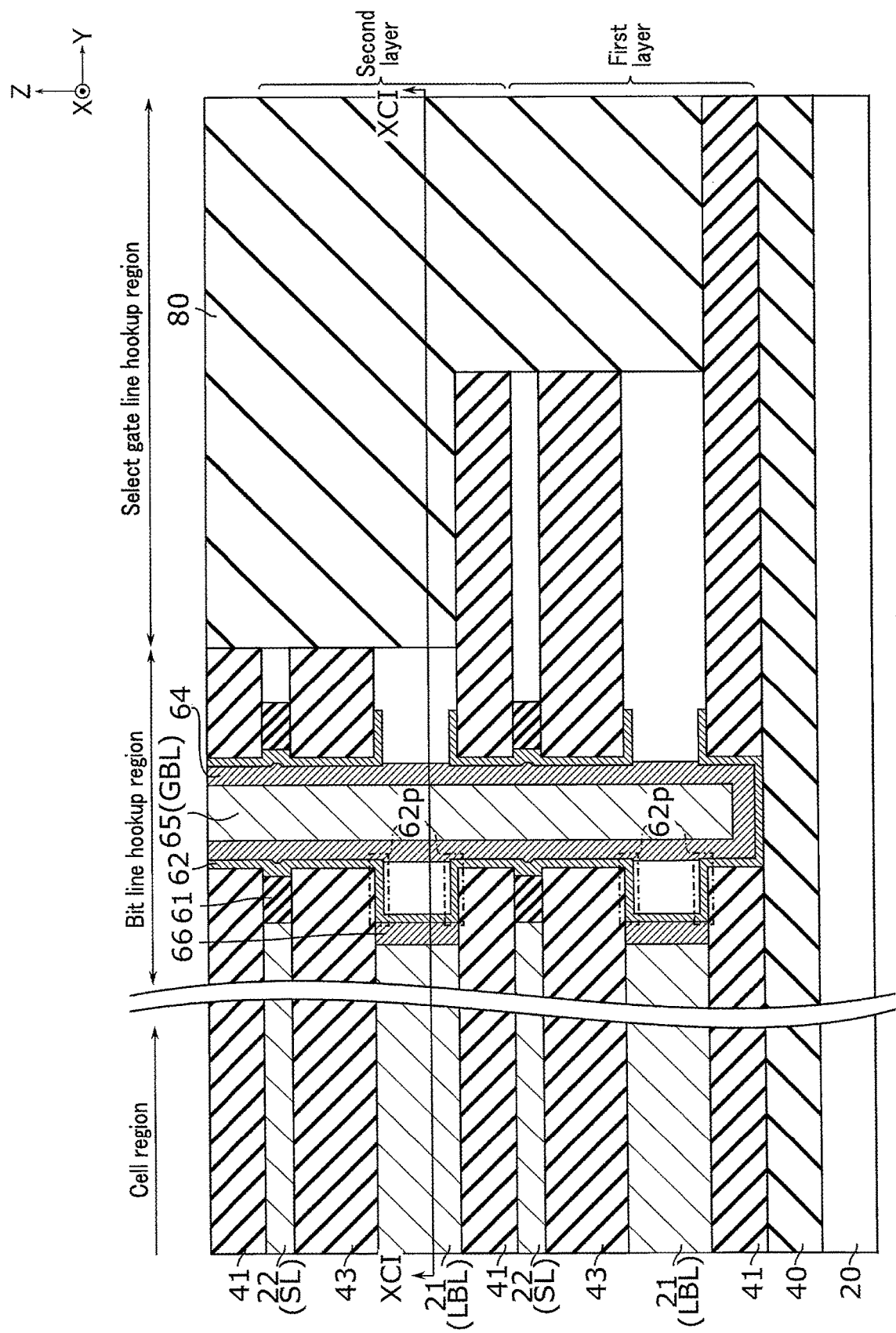
FIG. 90 is a sectional view of the memory cell array as an illustration for explaining a process for producing the memory device according to the fifth embodiment.

Next, as can be seen from FIG. 90, one or more holes (not illustrated) penetrating through all the sacrificial members 42q and 44q stacked along the Z direction are formed to expose the sacrificial members 42q and 44q. The sacrificial members 42q and 44q are then selectively removed by wet etching or dry etching via the holes. Accordingly, the surface of the semiconductor 62 on the side of the gate line hookup region is exposed in the space created by the removal of the respective sacrificial member 42q, and the surface of the insulator 61 on the side of the gate line hookup region is exposed in the space created by the removal of the respective sacrificial member 44q.

Subsequently, further wet etching or dry etching is performed via said one or more holes (not illustrated) so that the surface portions of the semiconductor 62 that are exposed to the one or more holes are selectively removed. Accordingly, the associated sacrificial members 63 each covering the semiconductor 64 are exposed.

Then, the further wet etching or dry etching is carried on via said one or more holes so that the sacrificial members 63 are selectively removed. This exposes, in each layer, the two portions 62p of the semiconductor 62, i.e., the portion provided on the upper surface of the insulator 41 and the portion provided on the lower surface of the insulator 43, and also the portion of the semiconductor 62 that is provided on the semiconductor 66 and connects these two portions 62p together.

Figure 91:
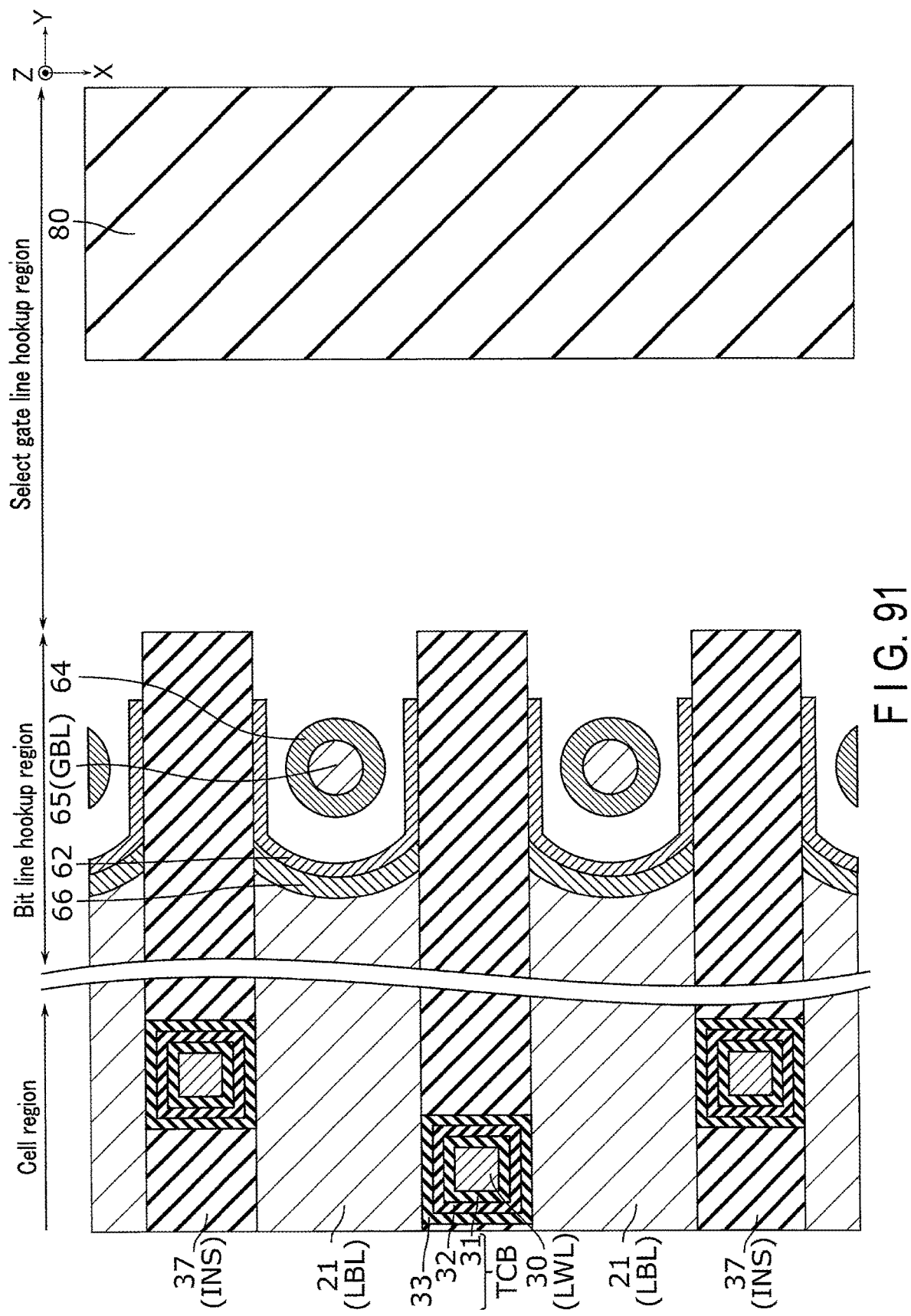
FIG. 91 is a sectional view of the memory cell array, taken along the line XCI-XCI indicated in FIG. 90.

FIG. 91 is a sectional view of the memory cell array 10, taken along the line XCI-XCI indicated in FIG. 90. As shown in FIG. 91, upon removal of the associated sacrificial member 63, a space is created between the semiconductor 64 and the portion of the semiconductor 62 that is formed on the semiconductor 66, and this space is continuous with the space created by the removal of the sacrificial member 42g.

Next, as shown in FIG. 92, insulators 67 are formed on the inner walls defining the spaces created by the removal of the sacrificial members 42q and 44q, the portions of the semiconductor 62, and the sacrificial members 63, via the one or more holes (not illustrated) used for creating these spaces. Accordingly, the insulators 67 cover the surfaces of the semiconductors 62 and 64, the insulators 41 and 43, and the interlayer insulating film 80, which are exposed at the height corresponding to the respective conductor 21, as well as the surfaces of the insulators 41, 43, and 61, and the interlayer insulating film 80, which are exposed at the height corresponding to the respective conductor 22. The film formation in this process step may use, for example, LPCVD. Note that the portion of the semiconductors 67, which is in contact with the portions 62p of the semiconductor 62, will, in the final form, function as a gate insulating film for the corresponding select transistor ST.

FIG. 93 is a sectional view of the memory cell array 10, taken along the line XCIII-XCIII indicated in FIG. 92. As shown in FIG. 93, the insulators 67 are also formed on the end portions of the multiple structures INS arranged along the X direction, at the height corresponding to the conductor 21. As such, for the multiple select transistors ST arranged along the X direction, the insulators 67 are formed as a continuous film.

Figure 94:
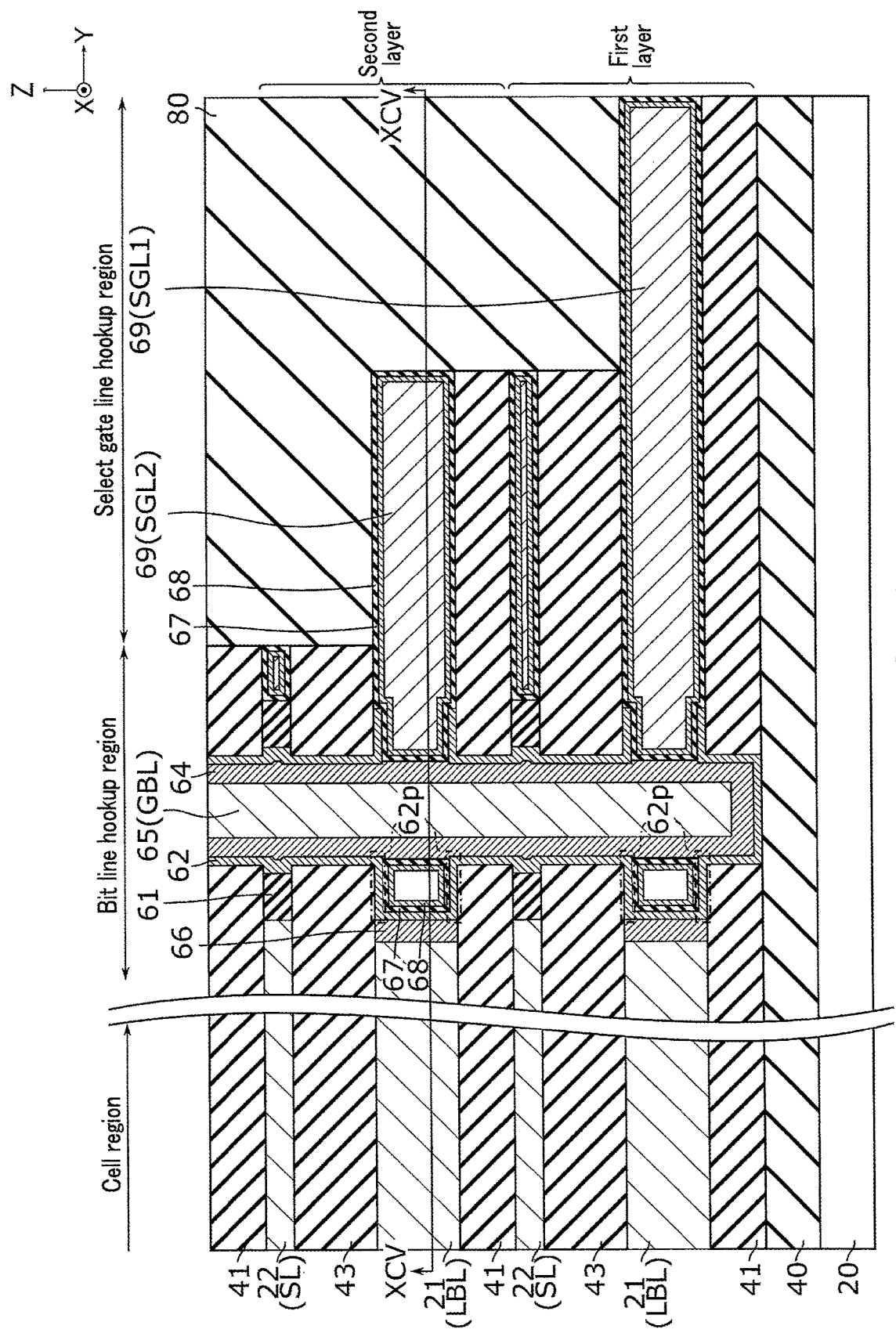
FIG. 94 is a sectional view of the memory cell array as an illustration for explaining a process for producing the memory device according to the fifth embodiment.

Next, as shown in FIG. 94, semiconductors 68 are formed on the entire surfaces of the exposed insulators 67 via the one or more holes (not illustrated) used for forming the insulators 67. Accordingly, at least the portions of the insulators 67 which are formed on the portions 62p of the semiconductor 62 are covered by the semiconductor 68. The film formation in this process step may use, for example, LPCVD.

Subsequently, conductors 69 are formed on the exposed semiconductors 68, at least for the portions on the side of the select gate line hookup region, via the one or more holes (not illustrated) used for forming the semiconductors 68 so that the spaces after the removal of the sacrificial members 42q are filled. The film formation in this process step may use, for example, LPCVD or PCVD.

Figure 95:
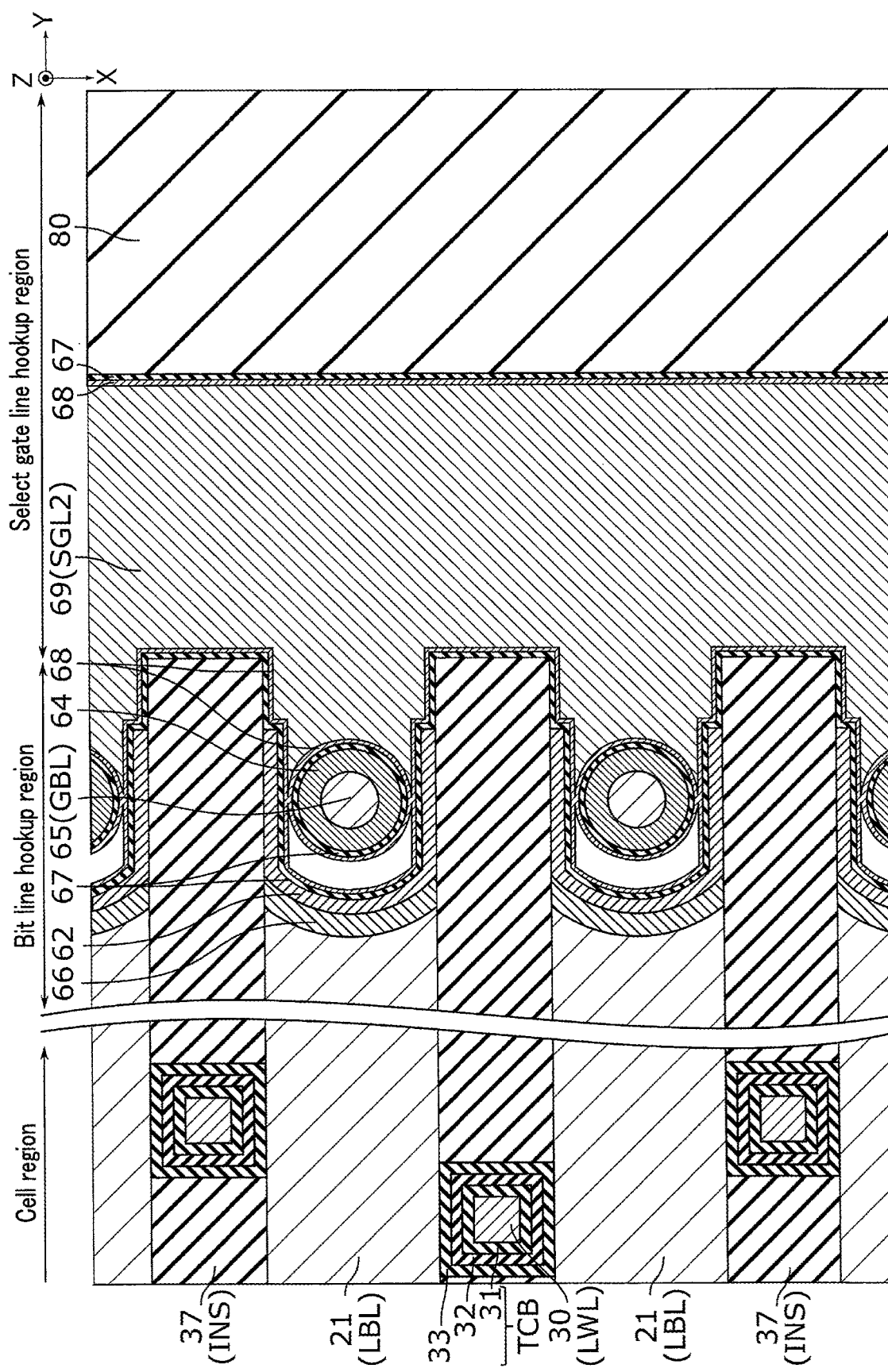
FIG. 95 is a sectional view of the memory cell array, taken along the line XCV-XCV indicated in FIG. 94.

FIG. 95 is a sectional view of the memory cell array 10, taken along the line XCV-XCV indicated in FIG. 94. As shown in FIG. 95, the semiconductors 68 are formed as a continuous film for the multiple select transistors ST arranged along the X direction, similar to the insulators 67. Note that the example shown in FIG. 95 assumes a constitution where the semiconductor 68 formed on the insulator 67 on one side of the associated structure INS and the semiconductor 68 formed on the insulator 67 on the side of the conductor 65 join together, which has consequently closed the part of the space after the removal of the sacrificial member 63 on the side of the cell region with respect to the conductor 65. Here, the conductor 69 is not formed in the closed spaces. However, the portion of the semiconductor 68 that sandwiches the insulator 67 with the respective portion 62p of the semiconductor 62 is electrically connected to the conductor 69, and therefore, can function as a gate of the select transistor ST.

Next, as shown in FIG. 96, a hole is formed for each layer such that the hole penetrates through the interlayer insulating film 80, the insulator 67, and the semiconductor 68 to reach the corresponding conductor 69, and the holes are each filled with a conductor 70.

Figure 97:
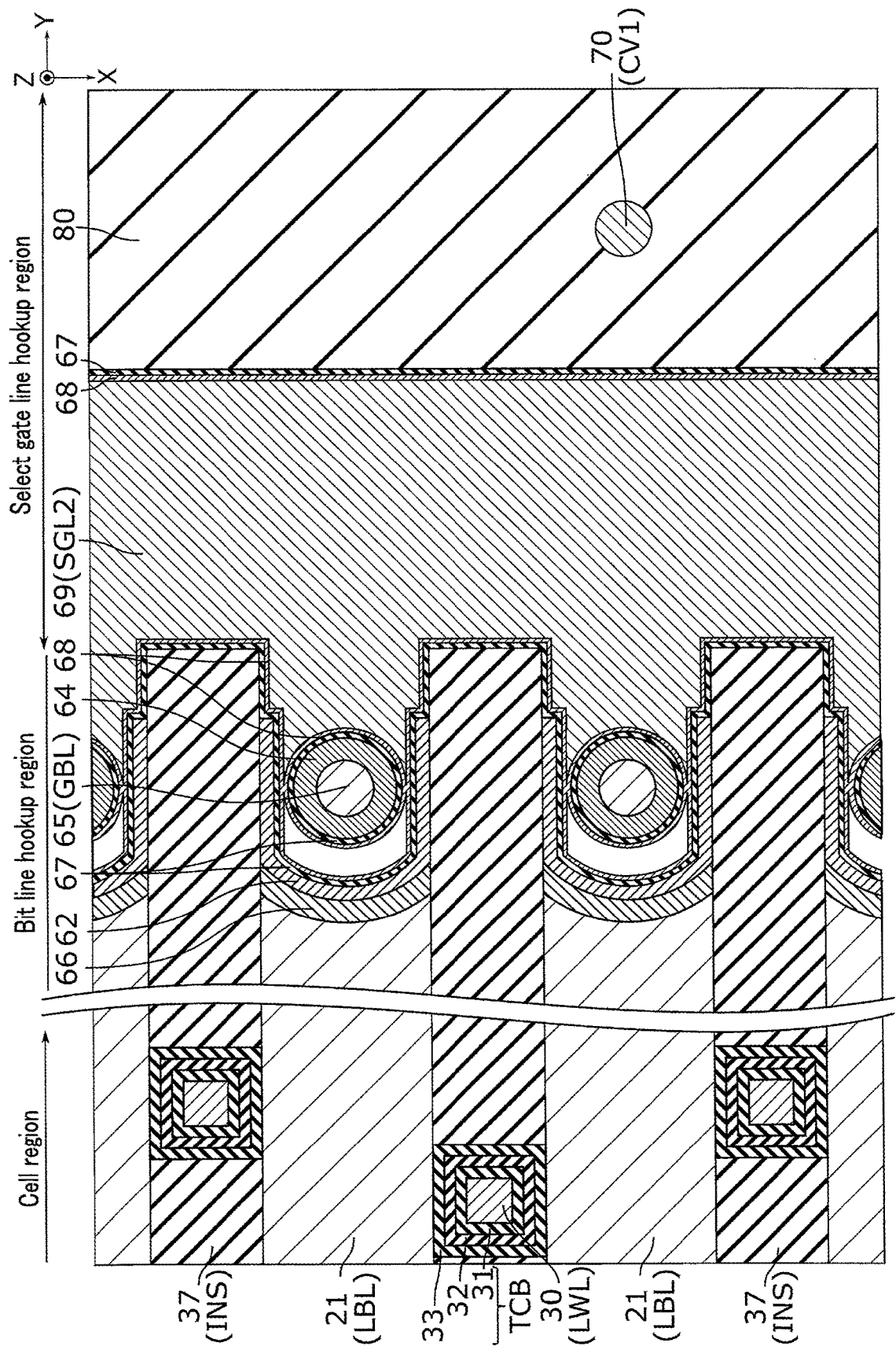
FIG. 97 is a sectional view of the memory cell array, taken along the line XCVII-XCVII indicated in FIG. 96.

FIG. 97 is a sectional view of the memory cell array 10, taken along the line XCVII-XCVII indicated in FIG. 96. As shown in FIG. 97, the conductor 70 extends along the Z direction within the interlayer insulating film 80 without interfering the conductor 69 of the upper layer, and thus, the select gate line SGL can be pulled out higher than the memory cell array 10. Note that, since the conductor 69 has common connections to all the select transistors ST in one layer, providing one conductor 70 for each layer suffices.

The bit line hookup region and the select gate line hookup region are therefore formed. Thereafter, a step of forming conductors 23 and 24 in the cell region, a step of forming contacts to the conductors 21 and 22 and to various circuitry components formed in the insulator 40, a heat treatment step, etc. are performed so that the memory cell array 10 is formed.

Note that the production process described above is only an example. It is possible to adopt modifications such as inserting other processes between the process steps and changing the order of the steps as long as a problem does not occur.

5.5 Effects of Embodiment

According to the fifth embodiment, a string STS includes one select transistor ST for each layer, and each of the select transistors ST is selected by a select gate line SGL provided for shared use in the respective layer. This can reduce the number of the bit line drivers 131 to the number equal to the number of memory cells arranged along the X direction. The number of memory cells arranged along the X direction does not depend on the number of memory cell transistors MT stacked in the Z direction (that is, the number of layers). Accordingly, the number of layers can be increased while suppressing the upsizing of the regions occupied by the bit line drivers 131.

Together, the area occupied by the bit line drivers 131, which is arranged below the memory cell array 10, can be kept from exceeding the area occupied by the memory cell array 10 when viewed from above. Accordingly, increase in the area of the memory cell array 10 for preventing such an excess area can be avoided, and it is possible to obviate an unintended increase in the length of interconnects. This contributes to the prevention against increased resistance and capacitance, and consequently, the memory cell array 10 can be prevented from deteriorating its performance.

6. Others

The foregoing first to fifth embodiments tolerate various modifications.

For example, while the first to fifth embodiments have assumed the instances where the global word lines GWL are formed above the memory cell array 10, this is not a limitation. As another example, the global word lines GWL may be formed in advance between the insulator 40 in which various circuitry components are formed and the memory cell array 10, and then pulled upward using contacts. For such cases, each structure MP may be subjected to an etching step after the formation of the lamination film TCB and before the formation of the local word line LWL, so that the lower portion of the lamination film TCB is opened to expose the global word line GWL. The local word line LWL is then formed. Accordingly, the local word line LWL and the global word line GWL can be electrically connected together at the position below the structure MP.

Also, while the fifth embodiment has assumed the instances where the cell-region side part of the space created by the removal of the sacrificial member 63 is closed by the formation of the semiconductor 68, this is not a limitation. This part of the space may be, for example, continuous with the space in the select gate line hookup region after the semiconductor 68 is formed. Also, the part may be filled with the conductor 69 by the subsequent step of forming the conductor 69.

Moreover, while the fifth embodiment has assumed the instances where the structure to become the stack STK adopts a constitution similar to that described for the first embodiment, this is not a limitation. For example, the structure to become the stack STK may adopt a constitution similar to any of the second to fourth embodiments. Here, adopting the constitution of, in particular, the second embodiment involves sacrificial members 46 contained in the structure to become the stack STK, which is not preferable. To cope with this, one or more holes penetrating through all the sacrificial members 46 stacked in the bit line hookup region may be formed after providing the structure to become the stack STK and before starting the formation of the string STS. Then, the sacrificial members 46 are substituted by, for example, insulators containing silicon oxide, to the extent not affecting the cell region. Upon this processing, the process steps similar to those in the fifth embodiment can be conducted thereafter.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory device comprising:
    a first conductor and a charge storage film extending along a first direction crossing a surface of a substrate;
    a first semiconductor of a first conductive type;
    a second semiconductor and a third semiconductor each of a second conductive type; and
    a first stack comprising a second conductor, a first insulator, and a third conductor sequentially stacked along the first direction and each extending along a second direction in a first plane parallel to the surface of the substrate,
    wherein
    the first conductor, the charge storage film, the first semiconductor, and the first stack are above the substrate and arranged in this order along a third direction crossing the second direction in the first plane,
    the second semiconductor is in contact with the first semiconductor and the second conductor, between the second conductor or the first insulator and the charge storage film, and
    the third semiconductor is in contact with the first semiconductor and the third conductor, between the third conductor or the first insulator and the charge storage film.

2. The memory device according to claim 1, wherein
    the second semiconductor is in contact with a first side surface of the second conductor along the second direction, and
    the third semiconductor is in contact with a first side surface of the third conductor along the second direction.

3. The memory device according to claim 2, wherein
    the second semiconductor is in contact with a lower surface of the first semiconductor, and
    the third semiconductor is in contact with an upper surface of the first semiconductor.

4. The memory device according to claim 3, wherein
    the first semiconductor, the second semiconductor, and the third semiconductor extend along the second direction.

5. The memory device according to claim 4, further comprising:
    a fourth semiconductor of the first conductive type; and
    a fifth semiconductor and a sixth semiconductor each of the second conductive type,
    wherein
    the fifth semiconductor is in contact with the fourth semiconductor and the second conductor, between the second conductor or the first insulator and the charge storage film,
    the sixth semiconductor is in contact with the fourth semiconductor and the third conductor, between the third conductor or the first insulator and the charge storage film,
    the first semiconductor and the fourth semiconductor sandwich the first insulator along the third direction,
    the second semiconductor and the fifth semiconductor sandwich the second conductor along the third direction, and
    the third semiconductor and the sixth semiconductor sandwich the third conductor along the third direction.

* * * * *